US009607301B2

(12) United States Patent
Gaudiana et al.

(10) Patent No.: US 9,607,301 B2
(45) Date of Patent: Mar. 28, 2017

(54) PHOTOVOLTAIC SENSOR FACILITIES IN A HOME ENVIRONMENT

(75) Inventors: Russell Gaudiana, Merrimack, NH (US); Daniel Patrick McGahn, Sudbury, MA (US); Charles H. Cella, Pembroke, MA (US)

(73) Assignee: MERCK PATENT GMBH, Drmstadt (DE)

( * ) Notice: Subject to any disclaimer, the term of this patent is extended or adjusted under 35 U.S.C. 154(b) by 1852 days.

(21) Appl. No.: 11/167,763

(22) Filed: Jun. 27, 2005

(65) Prior Publication Data

US 2007/0012349 A1 Jan. 18, 2007

(51) Int. Cl.
*H01L 31/042* (2014.01)
*H02N 6/00* (2006.01)
*G06Q 30/00* (2012.01)

(52) U.S. Cl.
CPC .................................... *G06Q 30/00* (2013.01)

(58) Field of Classification Search
USPC .................................................. 136/243–293
See application file for complete search history.

(56) References Cited

U.S. PATENT DOCUMENTS 3,778,312 A 12/1973 Karius
3,817,477 A * 6/1974 Luther et al. .............. 244/172.7
4,114,307 A * 9/1978 Liebeskind ................... 446/487
4,158,775 A 6/1979 Frosch et al.
4,174,978 A 11/1979 Lidorenko et al.
4,281,053 A 7/1981 Tang
4,434,510 A * 2/1984 Lemelson ..................... 398/168
4,555,585 A 11/1985 Behrens et al.
4,574,160 A 3/1986 Cull et al.
4,636,578 A 1/1987 Feinberg
4,636,579 A 1/1987 Hanak et al.
5,010,317 A * 4/1991 Schwendeman et al. ... 340/7.26
5,198,657 A 3/1993 Trost et al.
5,201,961 A 4/1993 Yoshikawa et al.
5,217,296 A 6/1993 Tanner
5,768,370 A 6/1998 Maatta et al.
6,198,217 B1 3/2001 Suzuki et al.
6,291,763 B1 9/2001 Nakamura
6,295,818 B1 10/2001 Ansley
6,441,298 B1 8/2002 Thio
6,586,906 B1 7/2003 Bessa et al.
6,675,580 B2 1/2004 Ansley
6,812,397 B2 11/2004 Lambey
(Continued)

FOREIGN PATENT DOCUMENTS

DE 10127292 * 12/2002 ........... H01L 31/045
EP 0 468 440 A2 1/1992
(Continued)

OTHER PUBLICATIONS

English translation of DE 10127292.*

*Primary Examiner* — Thanh-Truc Trinh
(74) *Attorney, Agent, or Firm* — Bowditch & Dewey, LLP; Roger P. Zimmerman

(57) ABSTRACT

Photovoltaic cells, facilities, systems and methods, as well as related compositions, are disclosed. Embodiments involve providing a sensor in association with a photovoltaic facility to form a sensor-pv facility; and providing the sensor-pv facility in a kit adapted for purchase by a consumer to be deployed in a home environment.

2 Claims, 126 Drawing Sheets

(56) References Cited

U.S. PATENT DOCUMENTS

| | | | | |
|---|---|---|---|---|
| 7,576,282 | B2 | 8/2009 | Heidenreich | |
| 2002/0046764 | A1 | 4/2002 | Ansley | |
| 2002/0069980 | A1 | 6/2002 | Floyd | |
| 2002/0171391 | A1* | 11/2002 | Batts-Gowins | 320/103 |
| 2003/0070705 | A1 | 4/2003 | Hayden et al. | |
| 2003/0188777 | A1 | 10/2003 | Gaudiana et al. | |
| 2004/0009729 | A1 | 1/2004 | Hill et al. | |
| 2004/0033375 | A1 | 2/2004 | Mori | |
| 2004/0046497 | A1 | 3/2004 | Schaepkens et al. | |
| 2004/0069341 | A1* | 4/2004 | Heidrich | 136/244 |
| 2004/0118444 | A1 | 6/2004 | Duggal | |
| 2004/0216777 | A1 | 11/2004 | Pan | |
| 2005/0178428 | A1 | 8/2005 | Laaly | |
| 2005/0178429 | A1 | 8/2005 | McCaskill | |
| 2005/0178430 | A1 | 8/2005 | McCaskill | |

FOREIGN PATENT DOCUMENTS

| | | | |
|---|---|---|---|
| EP | 0 566 736 | A1 | 10/1993 |
| WO | WO 92/18804 | | 10/1992 |
| WO | WO 2006/003133 | A1 | 1/2006 |

* cited by examiner

3208 B

8700

Photovoltaic Drapery

Venetian Blind with photovoltaic fabric powering clock

Home Detector

Hazards
- Fire
- Smoke
- Hazardous waste
- Acid
- Electricity
- Gas
- Chemical
- Structural Non-hazardous
- Mail arrival
- Email alert

11302

Government Facility Detector

Hazardous
- Fire
- Smoke
- Hazardous waste
- Acid
- Electricity
- Gas
- Chemical
- Structural Non-hazardous
- Mail arrival
- Email alert

11402

Office Building Facility Detector

Hazardous
• Fire
• Smoke
• Hazardous waste
• Acid
• Electricity
• Gas
• Chemical
• Structural Non-hazardous
• Mail arrival
• Email alert

11502

Hospital Environment Detector

| Hazardous | Non-hazardous | Biometric |
|---|---|---|
| • Fire | • Mail arrival | • Heart |
| • Smoke | • Email alert | • Oxygen |
| • Hazardous waste | | |
| • Acid | | |
| • Electricity | | |
| • Gas | | |
| • Chemical | | |
| • Structural | | |

11602

Industrial Facility Detector

Hazardous
- Fire
- Smoke
- Hazardous waste
- Acid
- Electricity
- Gas
- Chemical
- Structural Non-hazardous
- Mail arrival
- Email alert

11702

Storage Facility Detector

Hazardous
- Fire
- Smoke
- Hazardous waste
- Acid
- Electricity
- Gas
- Chemical
- Structural Non-hazardous
- Mail arrival
- Email alert

11802

Hazardous Reclamation Detector

Hazardous
• Fire
• Smoke
• Hazardous waste
• Acid
• Electricity
• Gas
• Chemical
• Structural Non-hazardous
• Vehicle speed
• Tire pressure

12002

- Bus Station
- Subway Station
- Train Station
- Taxi Station
- Airport terminal
- Shipping Port

PHOTOVOLTAIC SENSOR FACILITIES IN A HOME ENVIRONMENT

TECHNICAL FIELD

The invention relates to photovoltaic cells, systems and methods, as well as related compositions.

BACKGROUND

Photovoltaic cells, sometimes called solar cells, can convert light, such as sunlight, into electrical energy.

One type of photovoltaic cell is commonly referred to as a dye-sensitized solar cell (DSSC). As shown in FIG. 1, a DSSC 100 can include a charge carrier layer 140 (e.g., including an electrolyte, such as an iodide/iodine solution) and a photoactive layer 145 disposed between electrically conductive layers 120 (e.g., an ITO layer or tin oxide layer) and 150 (e.g., an ITO layer or tin oxide layer). Photoactive layer 145 typically includes a semiconductor material, such as $TiO_2$ particles, and a photosensitizing agent, such as a dye. In general, the photosensitizing agent is capable of absorbing photons within a wavelength range of operation (e.g., within the solar spectrum). DSSC 100 also includes a substrate 160 (e.g., a glass or polymer substrate) and a substrate 110 (e.g., a glass or polymer substrate). Electrically conductive layer 150 is disposed on an inner surface 162 of substrate 160, and electrically conductive layer 120 is disposed on an inner surface 112 of substrate 110. DSSC 100 further includes a catalyst 130 (e.g., formed of platinum), which can catalyze a redox reaction in charge carrier layer 140. Catalyst layer 130 is typically disposed on a surface 122 of electrically conductive layer 120. Electrically conductive layers 120 and 150 are electrically connected across an external electrical load 170.

During operation, in response to illumination by radiation in the solar spectrum, DSSC 100 can undergo cycles of excitation, oxidation, and reduction that produce a flow of electrons across load 170. Incident light can excite photosensitizing agent molecules in photoactive layer 145. The photoexcited photosensitizing agent molecules can then inject electrons into the conduction band of the semiconductor in layer 145, which can leave the photosensitizing agent molecules oxidized. The injected electrons can flow through the semiconductor material, to electrically conductive layer 150, then to external load 170. After flowing through external load 170, the electrons can flow to layer 120, then to layer 130 and subsequently to layer 140, where the electrons can reduce the electrolyte material in charge carrier layer 140 at catalyst layer 130. The reduced electrolyte can then reduce the oxidized photosensitizing agent molecules back to their neutral state. The electrolyte in layer 140 can act as a redox mediator to control the flow of electrons from layer 120 to layer 150. This cycle of excitation, oxidation, and reduction can be repeated to provide continuous electrical energy to external load 170.

Another type of photovoltaic cell is commonly referred to a polymer photovoltaic cell. As shown in FIG. 2, a polymer photovoltaic cell 200 can include a first substrate 210 (e.g., a glass or polymer substrate), a first electrically conductive layer 220 (e.g., an ITO layer or tin oxide layer), a hole blocking layer 230 (e.g., a lithium fluoride or metal oxide layer), a photoactive layer 240, a hole carrier layer 250 (e.g., a polymer layer), a second electrically conductive layer 260 (e.g., an ITO layer or tin oxide layer), and a second substrate 270 (e.g., a glass or polymer substrate).

Light can interact with photoactive layer 240, which generally includes an electron donor material (e.g., a polymer) and an electron acceptor material (e.g., a fullerene). Electrons can be transferred from the electron donor material to the electron acceptor material. The electron acceptor material in layer 240 can transmit the electrons through hole blocking layer 230 to electrically conductive layer 220. The electron donor material in layer 240 can transfer holes through hole carrier layer 250 to electrically conductive layer 260. First and second electrically conductive layers 220 and 260 are electrically connected across an external load 280 so that electrons pass from electrically conductive layer 260 to electrically conductive layer 220.

SUMMARY

The invention relates to photovoltaic cells, facilities, systems and methods, as well as related compositions. An aspect of the present invention relates to associating photovoltaics with sensors.

In embodiments a photovoltaic sensor system may be provided comprising at least one photovoltaic facility and at least one electrical sensor. The photovoltaic facility may provide energy for the electrical sensor. In other embodiments, a method of a photovoltaic sensor system may be provided comprising providing at least one photovoltaic facility and using at least one electric interference sensor. The photovoltaic facility may provide energy for the electric interference sensor.

In other embodiments, a method of a photovoltaic sensor system may be provided comprising providing at least one photovoltaic facility and using at least one sensor. The sensor may be at least one of a voltage sensor, a current sensor, a resistance sensor, a thermistor sensor, an electrostatic sensor, a frequency sensor, a temperature sensor, a heat sensor, a thermostat, a thermometer, a light sensor, a differential light sensor, an opacity sensor, a scattering light sensor, a diffractional sensor, a refraction sensor, a reflection sensor, a polarization sensor, a phase sensor, a florescence sensor, a phosphorescence sensor, an optical activity sensor, an optical sensor array, an imaging sensor, a micro mirror array, a pixel array, a micro pixel array, a rotation sensor, a velocity sensor, an accelerometer, an inclinometer and a momentum sensor. The photovoltaic facility may provide energy for the sensor.

Also disclosed is a method of providing printed material which may comprise taking a material with printed content and associating a photovoltaic facility with the printed material. The photovoltaic facility may provide energy for an item that is associated with the content. The item may be a lighted display or an animated display. The content may include an advertisement. The material may be at least one of a magazine or a book.

Also disclosed is a method of making a beverage container which may comprise taking a beverage container, associating a photovoltaic facility with the beverage container and associating a display with the beverage container and the photovoltaic facility. The photovoltaic facility may provide power to the display. The display may include an advertisement. The method may further comprise providing a thermosensor and a processor configured to detect and display an indication of a temperature of a liquid in the beverage container.

In embodiments, a method of providing a packaging may comprise providing a packaging for an electronic device and associating a photovoltaic facility with the packaging. The electronic device may include an energy source and at least one electronic try me feature powered by the energy source. The photovoltaic facility may convert ambient light into electrical energy to recharge the energy source. The electronic device may include one or more of a game, a toy, an instrument or a personal electronic device.

Also disclosed is a method for fabricating an RFID device which may comprise providing an RFID device including an energy source and printing a photovoltaic facility on an exterior surface of the RFID device. The photovoltaic facility may provide electrical energy to recharge the energy source in response to incident light. In another embodiment, a portable power supply may comprise a case, one or more photovoltaic facilities stored within the case and adapted to be deployed from the case to provide electrical energy and a power conversion system within the case adapted to receive electrical energy from the one or more photovoltaic facilities and provide a converted electrical output. The portable power supply may further comprise a plurality of outputs from the power conversion system conforming to a plurality of industrial standards for electrical supply. The portable power supply may further comprise an energy storage device. The portable power supply may further comprise a control circuitry to provide user feedback. The portable power supply may further comprise a control panel for selecting a type of electrical output.

In embodiments, a device may comprise a case adapted to hold a portable electronic device, one or more photovoltaic facilities adapted to be deployed from the case and a power conversion system within the case. The power conversion system may be configured to receive electrical energy from the photovoltaic facilities and may output electrical energy in a form suitable for use by the portable electronic device. The portable electronic device may include a portable computer. The device may further comprise one or more photovoltaic cells integrated into an exterior surface of the case. The device may further comprise one or more photovoltaic cells integrated into an exterior surface of the portable electronic device.

In embodiments, a method for monitoring perishable goods may comprise providing a monitoring system for perishable goods, associating the monitoring system with one or more packages of the perishable goods, disposing a photovoltaic facility on an exterior of the one or more packages, powering the monitoring system with electricity from the photovoltaic facility and displaying a status of the perishable goods. The exterior may include an exterior of a container holding one or more packages. The monitoring system may include one or more sensors. The monitoring system may include a radio frequency communications system.

A cooling device may comprise an insulated container, an electric cooling device for cooling an interior of the insulated container and a photovoltaic facility that provides electrical energy to the electric cooling device in response to incident light. The photovoltaic facility may fold into a compact form for storage. The photovoltaic facility may roll into a compact form for storage. The cooling device may further comprise a controller for managing the operation of the electric cooling device.

In embodiments, a method for agricultural monitoring may comprise providing a monitoring system including one or more sensors for agricultural monitoring, placing the monitoring system in an agricultural environment and powering the monitoring system with a collapsible photovoltaic facility. The method may further comprise displaying a status of the agricultural environment on a display associated with the monitoring system. The method may further comprise disposing a plurality of monitoring systems in the agricultural environment to form an agricultural monitoring network.

In embodiments, a device may be provided comprising a shade formed of one or more photovoltaic facilities and a power system to capture electrical energy generated when the shade is exposed to sunlight. The shade may be used to shade tobacco on a tobacco farm. The shade may comprise a tent.

A device may be provided comprising a covering for a sports venue formed of one or more photovoltaic facilities and a power system to capture electrical energy generated when the covering is exposed to sunlight. The sports venue may be one of a stadium, a dome or an arena.

In embodiments, a method may be provided for generating electricity comprising providing a mound of material sensitive to an environmental condition, covering the mound with one or more photovoltaic facilities to protect the mound from the environmental condition and capturing electrical energy generated when the covering is exposed to sunlight. The mound of material may include landfill material or salt. The environmental condition may include sunlight or rain.

In embodiments, a method may be provided for providing a photovoltaic plant, comprising providing a photovoltaic leaf and providing a conductive core. The photovoltaic leaf may be associated with the photovoltaic core. A method for measuring flex may also be provided comprising comparing an electrical output with a reference electrical output. The electrical output may be powered by a photovoltaic facility and the reference electrical output may be powered by a photovoltaic facility. In other embodiments, the method for determining flex may comprise observing an electrical output. The electrical output may be binary with both a logical transition associated with a flexible facility being flexed beyond a first degree of flex and a logical transition associated with the flexible facility being relaxed beyond a second degree of flex. The electrical output may be powered by a photovoltaic facility.

A method of sensing may be provided comprising generating a sensor output. The sensor output may be associated with the operation of a nanoscale cantilever sensor. The nanoscale cantilever sensor may be powered by a photovoltaic facility. A method of generating power may also be provided which may comprise providing a self-orienting, omni-directional photovoltaic facility. The self-orientation of the photovoltaic facility may be with respect to the surface of a planet.

In embodiments, a method of providing power to a sensor may be provided which may comprise associating a sensor with a photovoltaic fabric. A method for providing a solar powered sensor network may also be provided which may comprise associating a photovoltaic facility with a sensor node. The sensor node may comprise a communication facility and may be operatively coupled to another like sensor node via the communication facility. The sensor node may be powered by the photovoltaic facility.

A method for providing a warning facility is also provided which may comprise associating a photovoltaic facility with an accumulator and disposing the photovoltaic facility on an item worn by a person. A method of providing a photovoltaic smoke detector system may comprise providing at least one photovoltaic facility and associating at least one smoke sensor with the at least one photovoltaic facility. The sensor may be a smoke detector in a home, a smoke detector in a non-home environment or a smoke detector in an industrial environment. The at least one photovoltaic facility and the at least one smoke sensor may comprise a mobile unit.

In embodiments, a method of providing a photovoltaic fire detector system may be provided comprising providing at least one photovoltaic facility and associating at least one fire sensor with the at least one photovoltaic facility. The sensor may be a fire detector in a home, a fire detector in a non-home environment or a fire detector in an industrial environment. The at least one photovoltaic facility and the at least one fire sensor may comprise a mobile unit. A method of providing a photovoltaic heat detector system may comprise providing at least one photovoltaic facility and associating at least one heat sensor with the at least one photovoltaic facility. The sensor may be a heat detector in a home, a heat detector in a non-home environment or a heat detector in an industrial environment. The at least one photovoltaic facility and the at least one heat sensor may comprise a mobile unit.

A method of providing a hybrid detection system may comprise providing at least one photovoltaic facility and associating at least one sensor with at least two of the following functionalities: smoke sensor, fire sensor and heat sensor. A method of providing a photovoltaic vapor detection system may comprise providing at least one photovoltaic facility and associating at least one vapor sensor with the at least one photovoltaic facility. The vapor sensor may detect certain characteristics of the vapor such as composition, moisture level, pressure, temperature, direction, speed, dispersion, density, reactivity, inertness, acidity, concentration and source.

In embodiments, a method of providing a photovoltaic gas detection system may be provided which may comprise providing at least one photovoltaic facility and associating at least one gas sensor with the at least one photovoltaic facility. The gas sensor may detect certain characteristics of the gas such as composition, moisture level, pressure, temperature, direction, speed, dispersion, density, reactivity, inertness, acidity, concentration and source.

A method of providing a signal sensor may comprise providing at least one photovoltaic facility and associating at least one signal sensor with the at least one photovoltaic facility. The signal sensor may sense any one or more of the following signals: a signal from another sensor, a cable signal, a phone signal, a satellite signal, a telecommunications signal, a voice signal, an analog signal, a digital signal, an electrical signal and a mechanical signal.

A method of providing a photovoltaic gas detection system may comprise providing at least one photovoltaic facility and associating at least one wireless signal sensor with the at least one photovoltaic facility. The wireless sensor may detect at least one of the following signals: IEEE 802.11, jNetX, Bluetooth, Blackberry or TracerPlus. A cellular signal sensor may be substituted for the wireless signal sensor. A Wi-Fi signal sensor may be substituted for the wireless signal sensor. An internet signal sensor may be substituted for the wireless signal sensor. The internet sensor may detect internet protocol information such as bandwidth, encryption type, security information or the network being accessed.

In other embodiments, a method of providing a photovoltaic gas detection system may comprise providing at least one photovoltaic facility and associating at least one touch signal sensor with the at least one photovoltaic facility. The touch sensor may detect if an object contacts another object. The method may result in activation and/or deactivation of a device. A method of providing a photovoltaic gas detection system may comprise providing at least one photovoltaic facility and associating at least one contact signal sensor with the at least one photovoltaic facility. The contact sensor may detect if an object contacts another object. The method may be used for security.

A method of providing a photovoltaic gas detection system may comprise providing at least one photovoltaic facility and associating at least one viscosity sensor with the at least one photovoltaic facility. The viscosity sensor may measure a fluid. A method of providing a photovoltaic gas detection system may also comprising providing at least one photovoltaic facility and associating at least one position sensor with the at least one photovoltaic facility. The position sensor may measure magnetic fields. The position sensor may measure a GPS signal.

A method of providing a photovoltaic gas detection system may comprising providing at least one photovoltaic facility and associating at least one height sensor with the at least one photovoltaic facility. The height sensor may measure height in relation to a reference point. The method of providing a photovoltaic gas detection system may also comprise providing at least one photovoltaic facility and associating at least one ray sensor with the at least one photovoltaic facility. The ray sensor may be for detecting gamma rays. The ray sensor may be for detecting X-rays. The method of providing a photovoltaic gas detection system may also comprising providing at least one photovoltaic facility and associating at least one microwave sensor with the at least one photovoltaic facility. The microwave sensor may be for object detection.

Embodiments of the present invention relate to systems and methods of providing flexible photovoltaic facilities. The systems and methods may involve providing a first photovoltaic cell; providing a second photovoltaic cell; and electrically and mechanically associating the first and second photovoltaic cells; wherein the association provides a mechanically flexible photovoltaic facility, forming a flexible photovoltaic facility. In embodiments the flexible photovoltaic facility is foldable. In embodiments the flexible photovoltaic facility is bendable. In embodiments the flexible photovoltaic facility is adapted to be mounted on a flexible surface. In embodiments the flexible photovoltaic facility is folded and provided in a kit. In embodiments the flexible photovoltaic facility is directly deployable from the kit. In embodiments the deployment involves fully expanding the cells. In embodiments at least one of the photovoltaic cells is a flexible cell. In embodiments the first photovoltaic cell comprises a dye-sensitized solar cell. In embodiments the dye-sensitized solar cell further comprises dye. In embodiments the dye is formed into a pattern. In embodiments the first photovoltaic cell includes a semiconductor material in the form of nanoparticles. In embodiments the first photovoltaic cell includes an electrically conductive layer. In embodiments the electrically conductive layer is transparent. In embodiments the electrically conductive layer is semi-transparent. In embodiments the electrically conductive material is translucent. In embodiments the electrically conductive material is opaque. In embodiments the electrically conductive material contains a discontinuity. In embodiments the electrically conductive material forms a mesh. In embodiments the first photovoltaic cell is formed on a roll-to-roll process. In embodiments the cell is slit. In embodiments the first photovoltaic cell comprises a polymer photovoltaic cell. In embodiments the methods and systems further comprise powering a sensor with the flexible photovoltaic facility. In embodiments the sensor facility includes a network. In embodiments the sensor facility includes a processor. In embodiments the sensor facility includes memory. In embodiments the sensor includes a transmitter. In embodiments the sensor facility includes a receiver. In embodiments the sensor facility comprises a MEMS sensor facility. In embodiments the sensor facility comprises an electrical sensor facility. In embodiments the sensor facility comprises a mechanical sensor facility. In embodiments the sensor facility comprises a chemical sensor facility. In embodiments the sensor facility comprises an optical sensor facility.

An aspect of the present invention relates to systems and methods for deploying sensor photovoltaic facilities in a home environment. In embodiments, the methods and systems involve providing a sensor in association with a photovoltaic facility to form a sensor-pv facility; and providing the sensor-pv facility in a kit adapted for purchase by a consumer to be deployed in a home environment. The systems and methods may involve providing an energy storage facility for storing energy generated by the photovoltaic facility. The systems and methods may involve providing a feedback loop from the sensor to control the sensor-pv facility. In embodiments, the sensor is a smoke detector, fire detector, a hazard detector, a hazardous waste detector, a gas detector, a mechanical sensor, an electrical sensor, a biological sensor, a chemical sensor, an optical sensor, an ozone sensor, a carbon monoxide sensor, is a lead sensor, an asbestos sensor, a mold sensor, bacteria sensor, a temperature sensor, or other sensor. In embodiments the photovoltaic facility is flexible. The photovoltaic facility may foldable, rotatable, or other flexible format. In embodiments, the photovoltaic facility may be a dye-sensitized solar cell. The dye-sensitized solar cell may include dye. The dye may be formed into a pattern. In embodiments, the photovoltaic facility includes a semiconductor material in the form of nanoparticles. In embodiments, the photovoltaic facility includes an electrically conductive layer. The electrically conductive layer may be transparent. The electrically conductive layer may be semi-transparent. The electrically conductive material may be translucent. The electrically conductive material may be opaque. The electrically conductive material may contain a discontinuity. The electrically conductive material may form a mesh. The photovoltaic facility may be formed on a roll-to-roll process. The cell may be slit. In embodiments, the photovoltaic facility comprises a polymer photovoltaic facility. In embodiments, the methods and systems may also involve powering the sensor with the photovoltaic facility. The sensor facility may include a network. The sensor facility may include a processor, memory, a transmitter, a receiver, or other active and or passive circuitry. In embodiments, the sensor facility may be a MEMS sensor facility.

An aspect of the present invention relates to systems and methods for adapting a photovoltaic facility for a home environment. In embodiments, the methods and systems may involve providing a sensor in association with a photovoltaic facility to form a sensor-pv facility; and adapting the sensor-pv facility for a home environment; wherein the photovoltaic facility is adapted to provide energy for the sensor. The methods and systems may also involve providing an energy storage facility for storing energy generated by the photovoltaic facility. The methods and systems may also involve providing a feedback loop from the sensor to control the sensor-pv facility. The systems and methods may involve providing an energy storage facility for storing energy generated by the photovoltaic facility. The systems and methods may involve providing a feedback loop from the sensor to control the sensor-pv facility. In embodiments, the sensor is a smoke detector, fire detector, a hazard detector, a hazardous waste detector, a gas detector, a mechanical sensor, an electrical sensor, a biological sensor, a chemical sensor, an optical sensor, an ozone sensor, a carbon monoxide sensor, is a lead sensor, an asbestos sensor, a mold sensor, bacteria sensor, a temperature sensor, or other sensor. In embodiments the photovoltaic facility is flexible. The photovoltaic facility may foldable, rotatable, or other flexible format. In embodiments, the photovoltaic facility may be a dye-sensitized solar cell. The dye-sensitized solar cell may include dye. The dye may be formed into a pattern. In embodiments, the photovoltaic facility includes a semiconductor material in the form of nanoparticles. In embodiments, the photovoltaic facility includes an electrically conductive layer. The electrically conductive layer may be transparent. The electrically conductive layer may be semi-transparent. The electrically conductive material may be translucent. The electrically conductive material may be opaque. The electrically conductive material may contain a discontinuity. The electrically conductive material may form a mesh. The photovoltaic facility may be formed on a roll-to-roll process. The cell may be slit. In embodiments, the photovoltaic facility comprises a polymer photovoltaic facility. In embodiments, the methods and systems may also involve powering the sensor with the photovoltaic facility. The sensor facility may include a network. The sensor facility may include a processor, memory, a transmitter, a receiver, or other active and or passive circuitry. In embodiments, the sensor facility may be a MEMS sensor facility. Features and advantages of the invention are in the description, drawings and claims.

BRIEF DESCRIPTION OF DRAWINGS

FIG. 118 illustrates a photovoltaic sensor facility in a hazard reclamation environment according to the principles of the present invention.

FIG. 119 illustrates a photovoltaic sensor facility in a garage environment according to the principles of the present invention.

FIG. 120 illustrates a photovoltaic sensor facility in a station environment according to the principles of the present invention.

DETAILED DESCRIPTION

Figure 1:
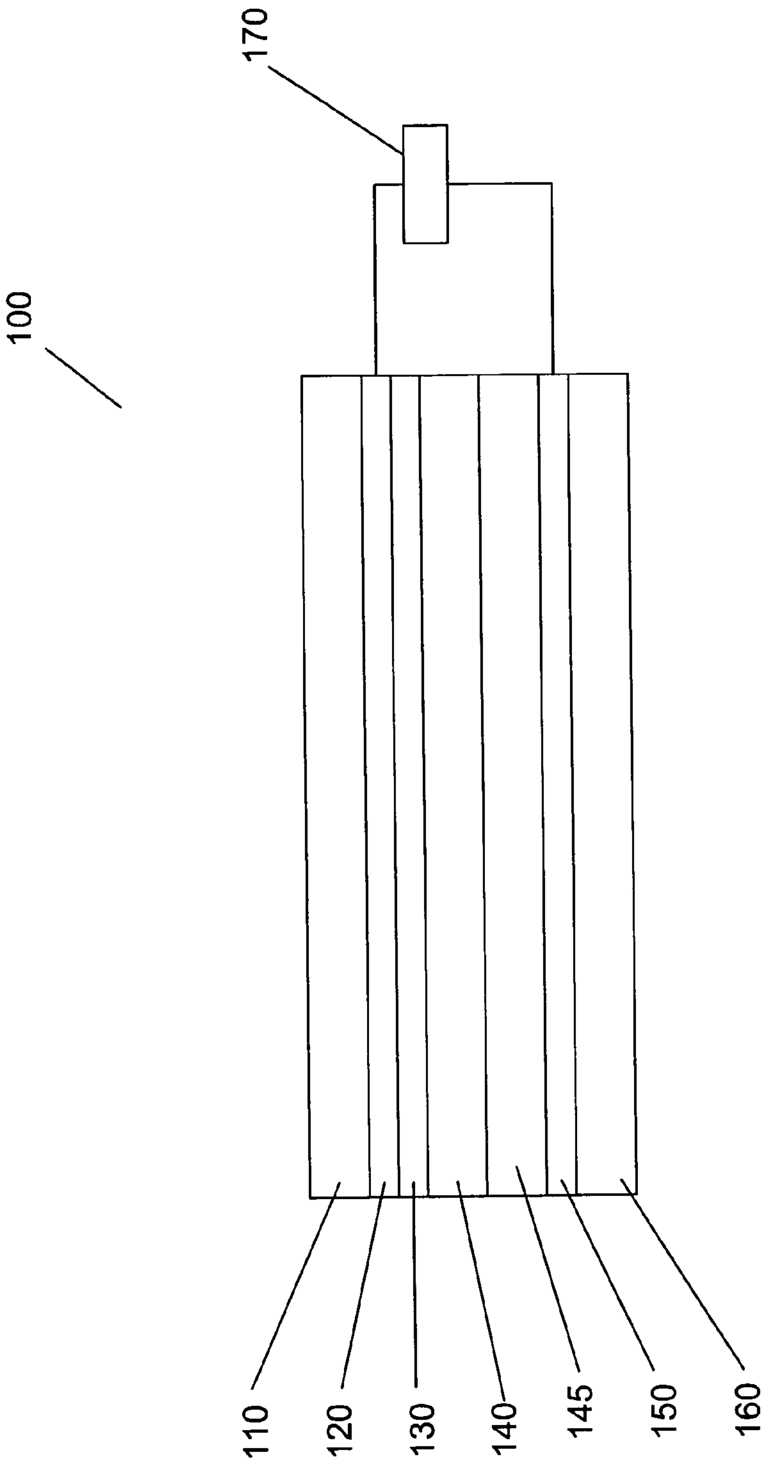
FIG. 1 is a cross-sectional view of an embodiment of a DSSC.
Figure 2:
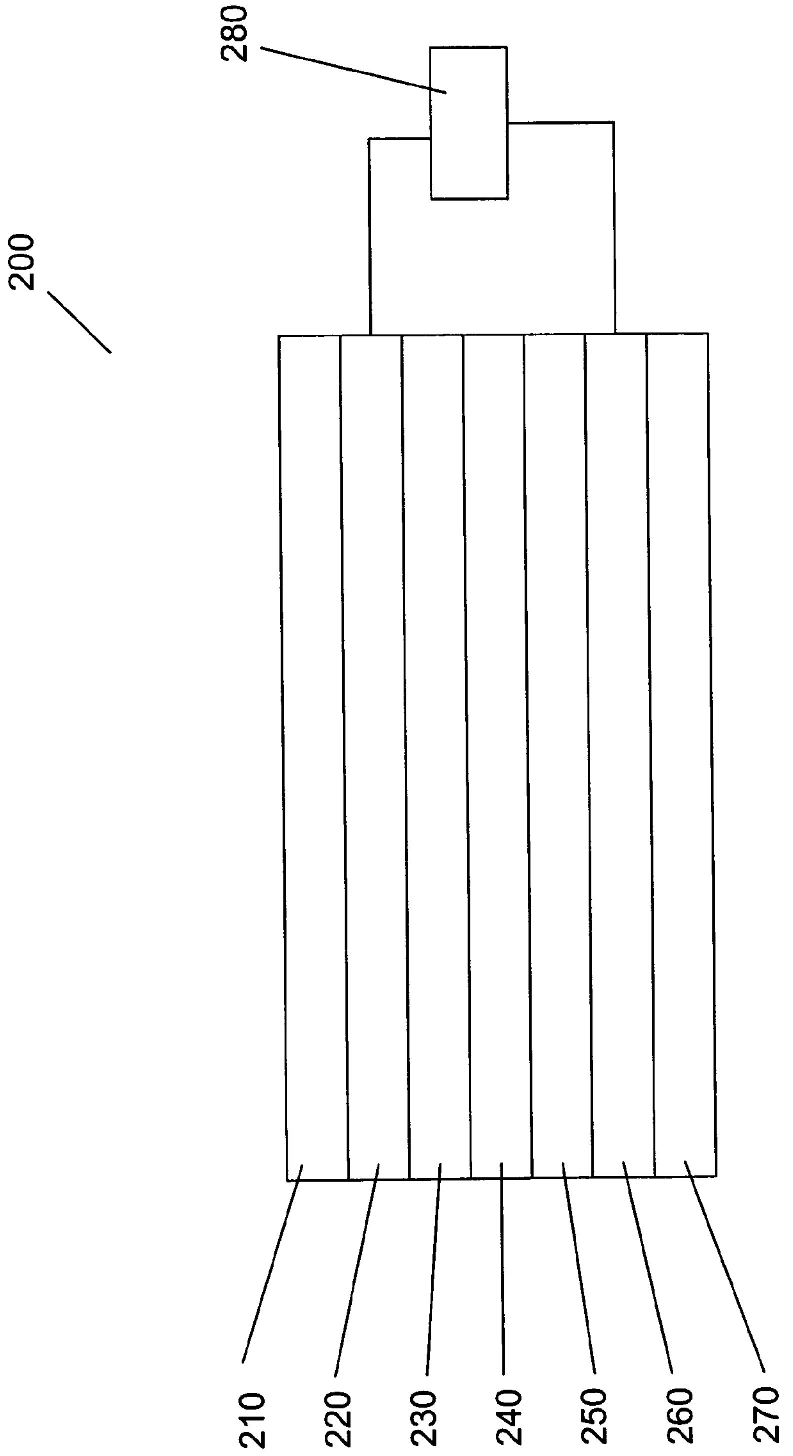
FIG. 2 is a cross-sectional view of an embodiment of a polymer photovoltaic cell.
Figure 3:
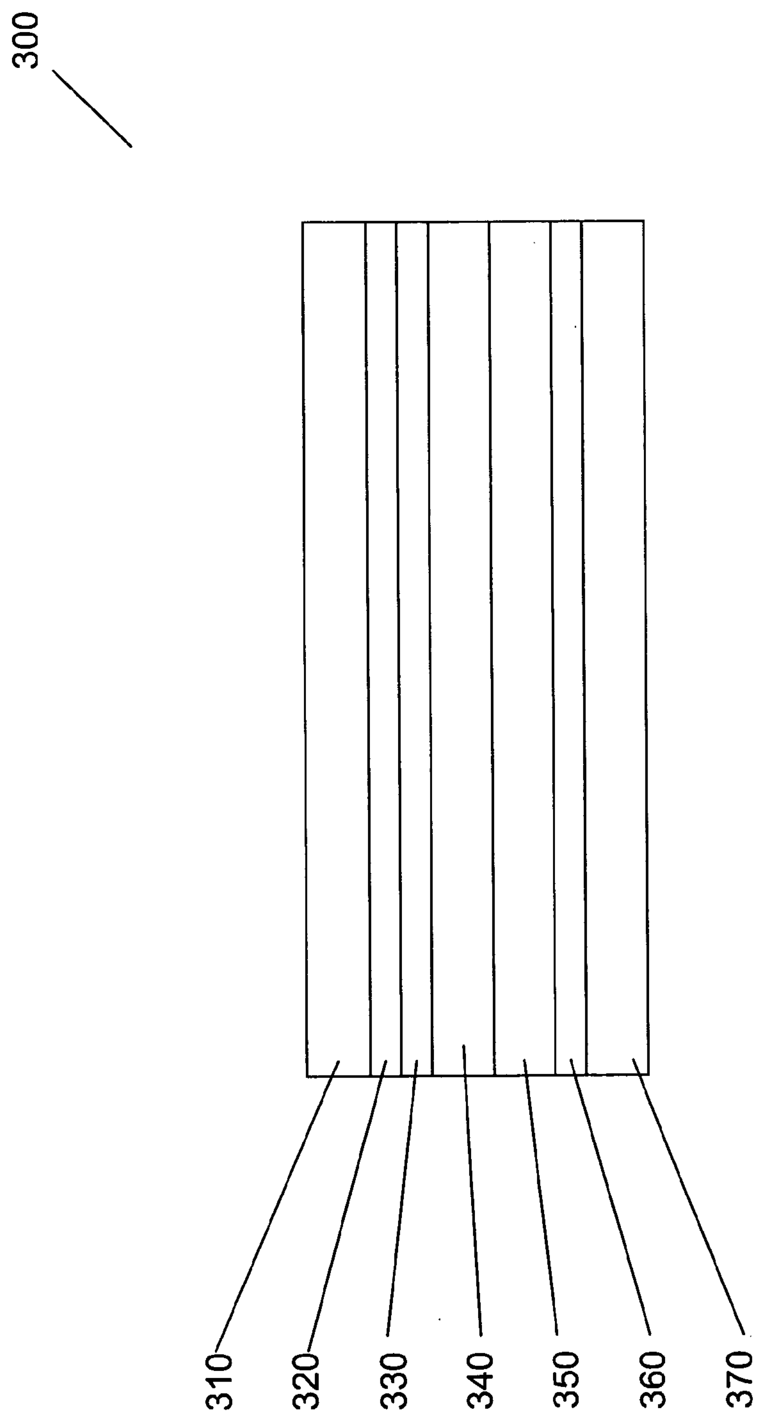
FIG. 3 is a cross-sectional view of an embodiment of a DSSC.

FIG. 3 is a cross-sectional view of a DSSC 300 including substrates 310 and 370, electrically conductive layers 320 and 360, a catalyst layer 330, a charge carrier layer 340, and a photoactive layer 350.

Photoactive layer 350 generally includes one or more dyes and a semiconductor material associated with the dye.

Examples of dyes include black dyes (e.g., tris(isothiocyanato)-ruthenium (II)-2,2':6',2"-terpyridine-4,4',4"-tricarboxylic acid, tris-tetrabutylammonium salt), orange dyes (e.g., tris(2,2'-bipyridyl-4,4'-dicarboxylato) ruthenium (II) dichloride, purple dyes (e.g., cis-bis(isothiocyanato)bis-(2, 2'-bipyridyl-4,4'-dicarboxylato)-ruthenium (II)), red dyes (e.g., an eosin), green dyes (e.g., a merocyanine) and blue dyes (e.g., a cyanine). Examples of additional dyes include anthocyanines, porphyrins, phthalocyanines, squarates, and certain metal-containing dyes.

In some embodiments, photoactive layer 350 can include multiple different dyes that form a pattern. Examples of patterns include camouflage patterns, roof tile patterns and shingle patterns. In some embodiments, the pattern can define the pattern of the housing a portable electronic device (e.g., a laptop computer, a cell phone). In certain embodiments, the pattern provided by the photovoltaic cell can define the pattern on the body of an automobile. Patterned photovoltaic cells are disclosed, for example, in co-pending and commonly owned U.S. Ser. No. 60/638,070, filed Dec. 21, 2004, which is hereby incorporated by reference.

Examples of semiconductor materials include materials having the formula $M_xO_y$, where M may be, for example, titanium, zirconium, tungsten, niobium, lanthanum, tantalum, terbium, or tin and x and y are integers greater than zero. Other suitable materials include sulfides, selenides, tellurides, and oxides of titanium, zirconium, tungsten, niobium, lanthanum, tantalum, terbium, tin, or combinations thereof. For example, $TiO_2$, $SrTiO_3$, $CaTiO_3$, $ZrO_2$, $WO_3$, $La_2O_3$, $Nb_2O_5$, $SnO_2$, sodium titanate, cadmium selenide (CdSe), cadmium sulphides, and potassium niobate may be suitable materials.

Typically, the semiconductor material contained within layer 350 is in the form of nanoparticles. In some embodiments, the nanoparticles have an average size between about two nm and about 100 nm (e.g., between about 10 nm and 40 nm, such as about 20 nm). Examples of nanoparticle semiconductor materials are disclosed, for example, in co-pending and commonly owned U.S. Ser. No. 10/351,249, which is hereby incorporated by reference.

The nanoparticles can be interconnected, for example, by high temperature sintering, or by a reactive linking agent.

In certain embodiments, the linking agent can be a non-polymeric compound. The linking agent can exhibit similar electronic conductivity as the semiconductor particles. For example, for $TiO_2$ particles, the agent can include Ti—O bonds, such as those present in titanium alkoxides. Without wishing to be bound by theory, it is believed that titanium tetraalkoxide particles can react with each other, with $TiO_2$ particles, and with a conductive coating on a substrate, to form titanium oxide bridges that connect the particles with each other and with the conductive coating (not shown). As a result, the cross-linking agent enhances the stability and integrity of the semiconductor layer. The cross-linking agent can include, for example, an organometallic species such as a metal alkoxide, a metal acetate, or a metal halide. In some embodiments, the cross-linking agent can include a different metal than the metal in the semiconductor. In an exemplary cross-linking step, a cross-linking agent solution is prepared by mixing a sol-gel precursor agent, e.g., a titanium tetraalkoxide such as titanium tetrabutoxide, with a solvent, such as ethanol, propanol, butanol, or higher primary, secondary, or tertiary alcohols, in a weight ratio of 0-100%, e.g., about 5 to about 25%, or about 20%. Generally, the solvent can be any material that is stable with respect to the precursor agent, e.g., does not react with the agent to form metal oxides (e.g. $TiO_2$). The solvent preferably is substantially free of water, which can cause precipitation of $TiO_2$. Such linking agents are disclosed, for example, in published U.S. Patent Application 2003-0056821 [UMASS application], which is hereby incorporated by reference.

In some embodiments, a linking agent can be a polymeric linking agent, such as poly(n-butyl titanate). Examples of polymeric linking agents are disclosed, for example, in co-pending and commonly owned U.S. Ser. No. 10/350,913, which is hereby incorporated by reference.

Linking agents can allow for the fabrication of an interconnected nanoparticle layer at relatively low temperatures (e.g., less than about 300° C.) and in some embodiments at room temperature. The relatively low temperature interconnection process may be amenable to continuous (e.g., roll-to-roll) manufacturing processes using polymer substrates.

The interconnected nanoparticles are generally photosensitized by the dye(s). The dyes facilitates conversion of incident light into electricity to produce the desired photovoltaic effect. It is believed that a dye absorbs incident light resulting in the excitation of electrons in the dye. The energy of the excited electrons is then transferred from the excitation levels of the dye into a conduction band of the interconnected nanoparticles. This electron transfer results in an effective separation of charge and the desired photovoltaic effect. Accordingly, the electrons in the conduction band of the interconnected nanoparticles are made available to drive an external load.

The dye(s) can be sorbed (e.g., chemisorbed and/or physisorbed) on the nanoparticles. A dye can be selected, for example, based on its ability to absorb photons in a wavelength range of operation (e.g., within the visible spectrum), its ability to produce free electrons (or electron holes) in a conduction band of the nanoparticles, its effectiveness in complexing with or sorbing to the nanoparticles, and/or its color.

In some embodiments, photoactive layer 350 can further include one or more co-sensitizers that adsorb with a sensitizing dye to the surface of an interconnected semiconductor oxide nanoparticle material, which can increase the efficiency of a DSSC (e.g., by improving charge transfer efficiency and/or reducing back transfer of electrons from the interconnected semiconductor oxide nanoparticle material to the sensitizing dye). The sensitizing dye and the co-sensitizer may be added together or separately when forming the photosensitized interconnected nanoparticle material. The co-sensitizer can donate electrons to an acceptor to form stable cation radicals, which can enhance the efficiency of charge transfer from the sensitizing dye to the semiconductor oxide nanoparticle material and/or can reduce back electron transfer to the sensitizing dye or co-sensitizer. The co-sensitizer can include (1) conjugation of the free electron pair on a nitrogen atom with the hybridized orbitals of the aromatic rings to which the nitrogen atom is bonded and, subsequent to electron transfer, the resulting resonance stabilization of the cation radicals by these hybridized orbitals; and/or (2) a coordinating group, such as a carboxy or a phosphate, the function of which is to anchor the co-sensitizer to the semiconductor oxide. Examples of suitable co-sensitizers include aromatic amines (e.g., color such as triphenylamine and its derivatives), carbazoles, and other fused-ring analogues. Examples of photoactive layers including co-sensitizers are disclosed, for example, in co-pending and commonly owned U.S. Ser. No. 10/350,919, which is hereby incorporated by reference.

In some embodiments, photoactive layer 350 can further include macroparticles of the semiconductor material, where at least some of the semiconductor macroparticles are chemically bonded to each other, and at least some of the semiconductor nanoparticles are bonded to semiconductor macroparticles. The dye(s) are sorbed (e.g., chemisorbed and/or physisorbed) on the semiconductor material. Macroparticles refers to a collection of particles having an average particle size of at least about 100 nanometers (e.g., at least about 150 nanometers, at least about 200 nanometers, at least about 250 nanometers). Examples of photovoltaic cells including macroparticles in the photoactive layer are disclosed, for example, in co-pending and commonly owned U.S. Ser. No. 60/589,423, which is hereby incorporated by reference.

In certain embodiments, a DSSC can include a coating that can enhance the adhesion of a photovoltaic material to a base material (e.g., using relatively low process temperatures, such as less than about 300° C.). Such photovoltaic cells and methods are disclosed, for example, in co-pending and commonly owned U.S. Ser. No. 10/351,260, which is hereby incorporated by reference.

The composition and thickness of electrically conductive layer 320 is generally selected based on desired electrical conductivity, optical properties, and/or mechanical properties of the layer. In some embodiments, layer 320 is transparent. Examples of transparent materials suitable for forming such a layer include certain metal oxides, such as indium tin oxide (ITO), tin oxide, and a fluorine-doped tin oxide. In some embodiments, electrically conductive layer 320 can be formed of a foil (e.g., a titanium foil). Electrically conductive layer 320 may be, for example, between about 100 nm and 500 nm thick, (e.g., between about 150 nm and 300 nm thick).

In certain embodiments, electrically conductive layer 320 can be opaque (i.e., can transmit less than about 10% of the visible spectrum energy incident thereon). For example, layer 320 can be formed from a continuous layer of an opaque metal, such as copper, aluminum, indium, or gold. In some embodiments, an electrically conductive layer can have an interconnected nanoparticle material formed thereon. Such layers can be, for example, in the form of strips (e.g., having a controlled size and relative spacing, between first and second flexible substrates). Examples of such DSSCs are disclosed, for example, in co-pending and commonly owned U.S. Ser. No. 10/351,251, which is hereby incorporated by reference.

In some embodiments, electrically conductive layer 320 can include a discontinuous layer of a conductive material. For example, electrically conductive layer 320 can include an electrically conducting mesh. Suitable mesh materials include metals, such as palladium, titanium, platinum, stainless steels and alloys thereof. In some embodiments, the mesh material includes a metal wire. The electrically conductive mesh material can also include an electrically insulating material that has been coated with an electrically conducting material, such as a metal. The electrically insulating material can include a fiber, such as a textile fiber or monofilament. Examples of fibers include synthetic polymeric fibers (e.g., nylons) and natural fibers (e.g., flax, cotton, wool, and silk). The mesh electrically conductive layer can be flexible to facilitate, for example, formation of the DSSC by a continuous manufacturing process. Photovoltaic cells having mesh electrically conductive layers are disclosed, for example, in co-pending and commonly owned U.S. Ser. Nos. 10/395,823; 10/723,554 and 10/494,560, each of which is hereby incorporated by reference.

The mesh electrically conductive layer may take a wide variety of forms with respect to, for example, wire (or fiber) diameters and mesh densities (i.e., the number of wires (or fibers) per unit area of the mesh). The mesh can be, for example, regular or irregular, with any number of opening shapes. Mesh form factors (such as, e.g., wire diameter and mesh density) can be chosen, for example, based on the conductivity of the wire (or fibers) of the mesh, the desired optical transmissivity, flexibility, and/or mechanical strength. Typically, the mesh electrically conductive layer includes a wire (or fiber) mesh with an average wire (or fiber) diameter in the range from about one micron to about 400 microns, and an average open area between wires (or fibers) in the range from about 60% to about 95%.

Catalyst layer 330 is generally formed of a material that can catalyze a redox reaction in the charge carrier layer positioned below. Examples of materials from which catalyst layer can be formed include platinum and polymers, such as polythiophenes, polypyrroles, polyanilines and their derivatives. Examples of polythiophene derivatives include poly(3,4-ethylenedioxythiophene) ("PEDOT"), poly(3-butylthiophene), poly[3-(4-octylphenyl)thiophene], poly(thieno[3,4-b]thiophene) ("PT34bT"), and poly(thieno[3,4-b]thiophene-co-3,4-ethylenedioxythiophene) ("PT34bT-PEDOT"). Examples of catalyst layers containing one or more polymers are disclosed, for example, in co-pending and commonly owned U.S. Ser. Nos. 10/897,268 and 60/637,844, both of which are hereby incorporated by reference.

Substrate 310 can be formed from a mechanically-flexible material, such as a flexible polymer, or a rigid material, such as a glass. Examples of polymers that can be used to form a flexible substrate include polyethylene naphthalates (PEN), polyethylene terephthalates (PET), polyethyelenes, polypropylenes, polyamides, polymethylmethacrylate, polycarbonate, and/or polyurethanes. Flexible substrates can facilitate continuous manufacturing processes such as web-based coating and lamination. However, rigid substrate materials may also be used, such as disclosed, for example, in co-pending and commonly owned U.S. Ser. No. 10/351,265, which is hereby incorporated by reference.

The thickness of substrate 310 can vary as desired. Typically, substrate thickness and type are selected to provide mechanical support sufficient for the DSSC to withstand the rigors of manufacturing, deployment, and use. Substrate 310 can have a thickness of from about six microns to about 5,000 microns (e.g., from about 6 microns to about 50 microns, from about 50 microns to about 5,000 microns, from about 100 microns to about 1,000 microns). In embodiments where electrically conductive layer 320 is transparent, substrate 310 is formed from a transparent material. For example, substrate 310 can be formed from a transparent glass or polymer, such as a silica-based glass or a polymer, such as those listed above. In such embodiments, electrically conductive layer 320 may also be transparent.

Substrate 370 and electrically conductive layer 360 can be as described above regarding substrate 310 and electrically conductive layer 320, respectively. For example, substrate 370 can be formed from the same materials and can have the same thickness as substrate 310. In some embodiments however, it may be desirable for substrate 370 to be different from 310 in one or more aspects. For example, where the DSSC is manufactured using a process that places different stresses on the different substrates, it may be desirable for substrate 370 to be more or less mechanically robust than substrate 310. Accordingly, substrate 370 may be formed from a different material, or may have a different thickness that substrate 310. Furthermore, in embodiments where only one substrate is exposed to an illumination source during use, it is not necessary for both substrates and/or electrically conducting layers to be transparent. Accordingly, one of substrates and/or corresponding electrically conducting layer can be opaque.

Generally, charge carrier layer 340 includes a material that facilitates the transfer of electrical charge from a ground potential or a current source to photoactive layer 350. A general class of suitable charge carrier materials include solvent-based liquid electrolytes, polyelectrolytes, polymeric electrolytes, solid electrolytes, n-type and p-type transporting materials (e.g., conducting polymers) and gel electrolytes. Examples of gel electrolytes are disclosed, for example, in co-pending and commonly owned U.S. Ser. No. 10/350,912, which is hereby incorporated by reference. Other choices for charge carrier media are possible. For example, the charge carrier layer can include a lithium salt that has the formula LiX, where X is an iodide, bromide, chloride, perchlorate, thiocyanate, trifluoromethyl sulfonate, or hexafluorophosphate.

The charge carrier media typically includes a redox system. Suitable redox systems may include organic and/or inorganic redox systems. Examples of such systems include cerium(III) sulphate/cerium(IV), sodium bromide/bromine, lithium iodide/iodine, $Fe^{2+}/Fe^{3+}$, $Co^{2+}/Co^{3+}$, and viologens. Furthermore, an electrolyte solution may have the formula $M_iX_j$, where i and j are greater than or equal to one, where X is an anion, and M is lithium, copper, barium, zinc, nickel, a lanthanide, cobalt, calcium, aluminum, or magnesium. Suitable anions include chloride, perchlorate, thiocyanate, trifluoromethyl sulfonate, and hexafluorophosphate.

In some embodiments, the charge carrier media includes a polymeric electrolyte. For example, the polymeric electrolyte can include poly(vinyl imidazolium halide) and lithium iodide and/or polyvinyl pyridinium salts. In embodiments, the charge carrier media can include a solid electrolyte, such as lithium iodide, pyridimum iodide, and/or substituted imidazolium iodide.

The charge carrier media can include various types of polymeric polyelectrolytes. For example, suitable polyelectrolytes can include between about 5% and about 95% (e.g., 5-60%, 5-40%, or 5-20%) by weight of a polymer, e.g., an ion-conducting polymer, and about 5% to about 95% (e.g., about 35-95%, 60-95%, or 80-95%) by weight of a plasticizer, about 0.05 M to about 10 M of a redox electrolyte of organic or inorganic iodides (e.g., about 0.05-2 M, 0.05-1 M, or 0.05-0.5 M), and about 0.01 M to about 1 M (e.g., about 0.05-0.5 M, 0.05-0.2 M, or 0.05-0.1 M) of iodine. The ion-conducting polymer may include, for example, polyethylene oxide (PEO), polyacrylonitrile (PAN), polymethylmethacrylate (PMMA), polyethers, and polyphenols. Examples of suitable plasticizers include ethyl carbonate, propylene carbonate, mixtures of carbonates, organic phosphates, butyrolactone, and dialkylphthalates.

In some embodiments, charge carrier layer 340 can include one or more zwitterionic compounds. In general, the zwitterionic compound(s) have the formula:

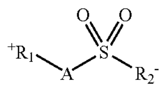

$R_1$ is a cationic heterocyclic moiety, a cationic ammonium moiety, a cationic guanidinium moiety, or a cationic phosphonium moiety. $R_1$ can be unsubstituted or substituted (e.g., alkyl substituted, alkoxy substituted, poly(ethyleneoxy) substituted, nitrogen-substituted). Examples of cationic substituted heterocyclic moieties include cationic nitrogen-substituted heterocyclic moieties (e.g., alkyl imidazolium, piperidinium, pyridinium, morpholinium, pyrimidinium, pyridazinium, pyrazinium, pyrazolium, pyrrolinium, thiazolium, oxazolium, triazolium). Examples of cationic substituted ammonium moieties include cationic alkyl substituted ammonium moieties (e.g., symmetric tetraalkylammonium). Examples of cationic substituted guanidinium moieties include cationic alkyl substituted guanidinium moieties (e.g., pentalkyl guanidinium. $R_2$ is an anoinic moiety that can be:

$O^-$ 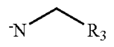 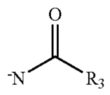 or 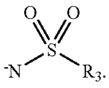

where $R_3$ is H or a carbon-containing moiety selected from $C_x$ alkyl, $C_{x+1}$ alkenyl, $C_{x+1}$ alkynyl, cycloalkyl, heterocyclyl and aryl; and x is at least 1 (e.g., two, three, four, five, six, seven, eight, nine, 10, 11, 12, 13, 14, 15, 16, 17, 18, 19, 20). In some embodiments, a carbon-containing moiety can be substituted (e.g., halo substituted). A is $(C(R_3)_2)_n$, where: n is zero or greater (e.g., one, two, three, four, five, six, seven, eight, nine, 10, 11, 12, 13, 14, 15, 16, 17, 18, 19, 20); and each $R_3$ is independently as described above. Charge carrier layers including one or more zwitterionic compounds are disclosed, for example, in co-pending and commonly owned U.S. Ser. No. 11/000,276, which is hereby incorporated by reference.

Figure 4:
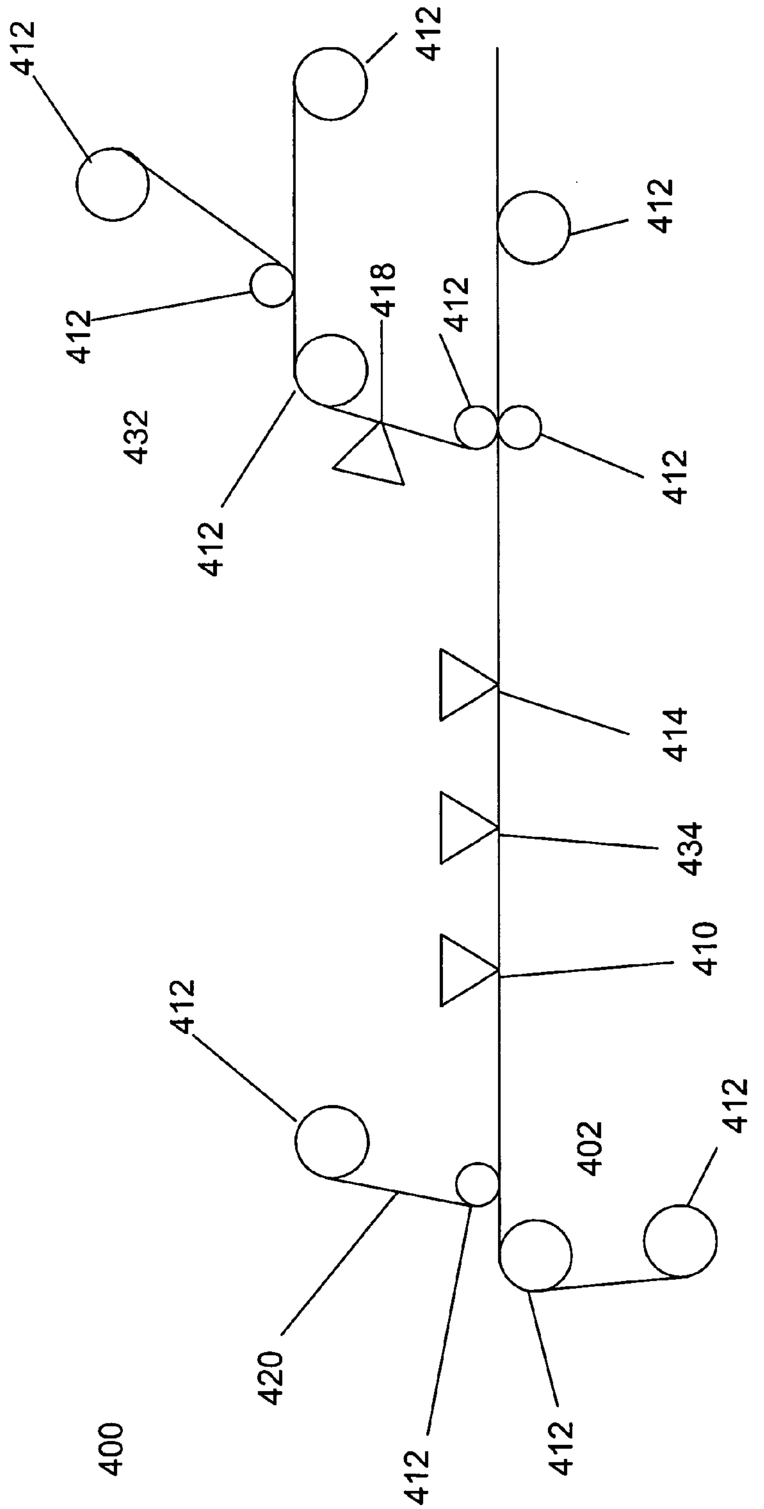
FIG. 4 illustrates a method of making a DSSC.

FIG. 4 shows a process (a roll-to-roll process) 400 for manufacturing a DSSC by advancing a substrate 402 between rollers 412. Substrate 402 can be advanced between rollers 430 continuously, periodically, or irregularly during a manufacturing run.

An electrically conductive layer 420 (e.g., a titanium foil) is attached to substrate 402 adjacent location 428.

An interconnected nanoparticle material is then formed on the electrically conductive layer adjacent location 410. The interconnected nanoparticle material can be formed by applying a solution containing a linking agent (e.g., polymeric linking agent, such as poly(n-butyl titanate)) and metal oxide nanoparticles (e.g., titania). In some embodiments, the polymeric linking agent and the metal oxide nanoparticles are separately applied to form the interconnected nanoparticle material. The polymeric linking agent and metal oxide nanoparticles can be heated (e.g., in an oven present in the system used in the roll-to-roll process) to form the interconnected nanoparticle material.

One or more dyes are then applied (e.g., using silk screening, ink jet printing, or gravure printing) to the interconnected nanoparticle material adjacent location 434 to form a photoactive layer.

A charge carrier layer is deposited onto the patterned photoactive layer adjacent location 414. The charge carrier layer can be deposited using known techniques, such as those noted above.

An electrically conductive layer 422 (e.g., ITO) is attached to substrate 424 adjacent location 432.

A catalyst layer precursor is deposited on electrically conductive layer 422 adjacent location 418. The catalyst layer precursor can be deposited on electrically conductive layer 422 using, for example, electrochemical deposition using chloroplatinic acid in an electrochemical cell, or pyrolysis of a coating containing a platinum compound (e.g., chloroplatinic acid). In general, the catalyst layer precursor can be deposited using known coating techniques, such as spin coating, dip coating, knife coating, bar coating, spray coating, roller coating, slot coating, gravure coating, screen coating, and/or ink jet printing. The catalyst layer precursor is then heated (e.g., in an oven present in the system used in the roll-to-roll process) to form the catalyst layer. In some embodiments, electrically conductive material 360 can be at least partially coated with the catalyst layer before attaching to advancing substrate 424. In certain embodiments, the catalyst layer is applied directly to electrically conductive layer 422 (e.g., without the presence of a precursor).

In some embodiments, the method can include scoring the coating of a first coated base material at a temperature sufficiently elevated to part the coating and melt at least a portion of the first base material, and/or scoring a coating of a second coated base material at a temperature sufficiently elevated to part the coating and at least a portion of the second base material, and optionally joining the first and second base materials to form a photovoltaic module. DSSCs with metal foil and methods for the manufacture are disclosed, for example, in co-pending and commonly owned U.S. Ser. No. 10/351,264, which is hereby incorporated by reference.

In certain embodiments, the method can include slitting (e.g., ultrasonic slitting) to cut and/or seal edges of photovoltaic cells and/or modules (e.g., to encapsulate the photoactive components in an environment substantially impervious to the atmosphere). Examples of such methods are disclosed, for example, in co-pending and commonly owned U.S. Ser. No. 10/351,250, which is hereby incorporated by reference.

Figure 5:
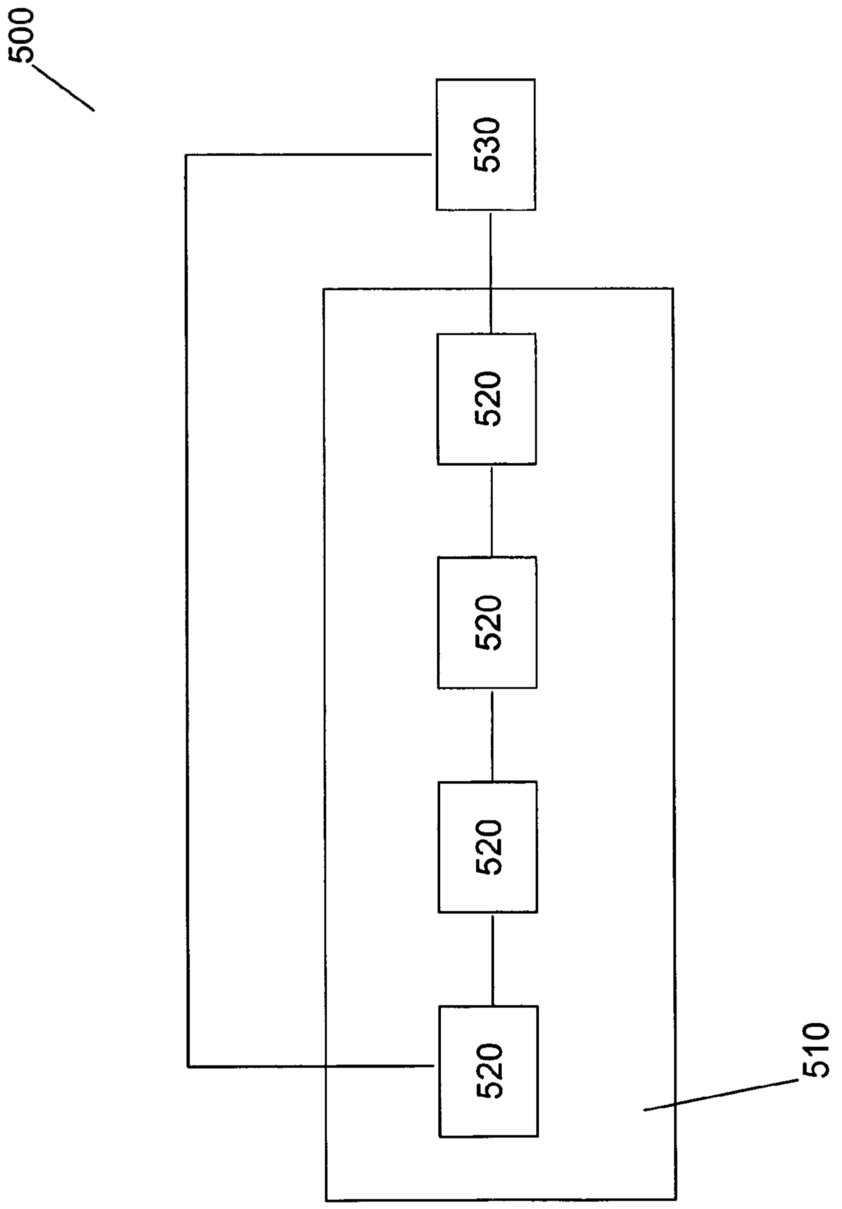
FIG. 5 is a schematic view of a module containing multiple photovoltaic cells.
Figure 6:
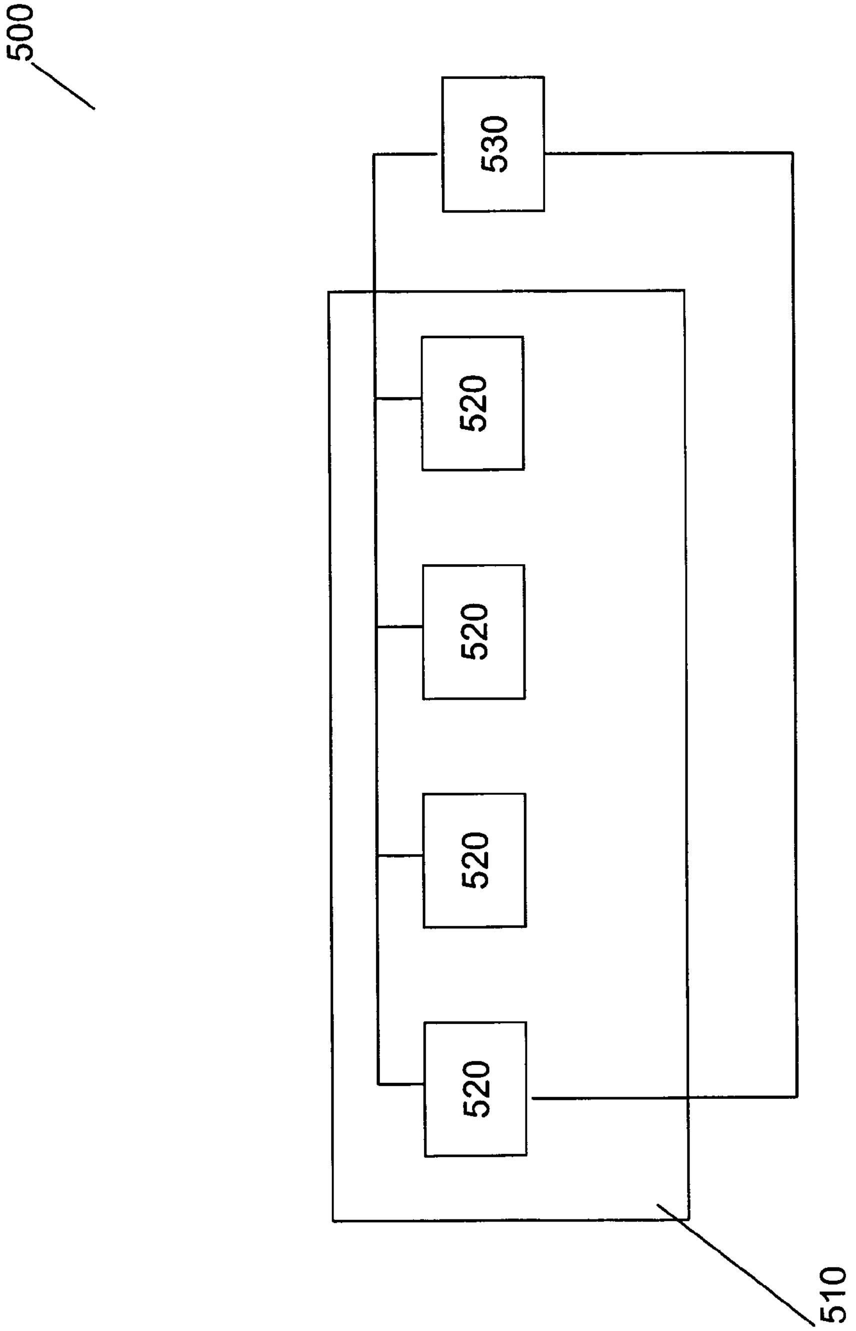
FIG. 6 is a schematic view of a module containing multiple photovoltaic cells.

In general, multiple photovoltaic cells can be electrically connected to form a photovoltaic system. As an example, FIG. 5 is a schematic of a photovoltaic system 500 having a module 510 containing photovoltaic cells 520. Cells 520 are electrically connected in series, and system 500 is electrically connected to a load 530. As another example, FIG. 6 is a schematic of a photovoltaic system 500 having a module 510 that contains photovoltaic cells 520. Cells 520 are electrically connected in parallel, and system 500 is electrically connected to a load 530. In some embodiments, some (e.g., all) of the photovoltaic cells in a photovoltaic system can have one or more common substrates. In certain embodiments, some photovoltaic cells in a photovoltaic system are electrically connected in series, and some of the photovoltaic cells in the photovoltaic system are electrically connected in parallel. In certain embodiments, adjacent cell can be in electrical contact via a wire. Photovoltaic modules having such architectures are disclosed, for example, in co-pending and commonly owned U.S. Ser. No. 10/351,298, which is hereby incorporated by reference. In some embodiments, adjacent cells can be in electrical contact via a conductive interconnect (e.g., a stitch) that is disposed in an electrically conductive layer in each of the adjacent cells. Photovoltaic modules having such architecture are disclosed, for example, in co-pending and commonly owned U.S. Ser. No. 60/575,971, which is hereby incorporated by reference. In certain embodiments, adjacent cells can be electrically connected by disposing a shaped (e.g., dimpled, embossed) portion in an electrically conductive layer of one of the cells, where the shaped portion extends through an adhesive and makes electrical contact with an electrically conductive layer in an adjacent cell. With this arrangement, the cells can be in electrical contact without using a separate interconnect component. Photovoltaic modules having such architecture are disclosed, for example, in co-pending and commonly owned U.S. Ser. No. 60/590,312, which is hereby incorporated by reference. In some embodiments, adjacent cells can be electrically connected via an adhesive material and a mesh partially disposed in the adhesive material. Photovoltaic modules having such architecture are disclosed, for example, in co-pending and commonly owned U.S. Ser. No. 60/590,313, which is hereby incorporated by reference. In certain embodiments, a first group of photovoltaic modules are formed on a first region of a substrate, while a second group of photovoltaic modules are formed on a second region of the same substrate. The substrate may then be physically divided, or in some embodiments folded, to combine the respective photovoltaic module portions to produce a final photovoltaic module. The interconnections between the photovoltaic cells of the final module can be parallel, serial, or a combination thereof. Photovoltaic cells having such architecture are disclosed, for example, in U.S. Pat. No. 6,706,963, which is hereby incorporated by reference.

Figure 7:
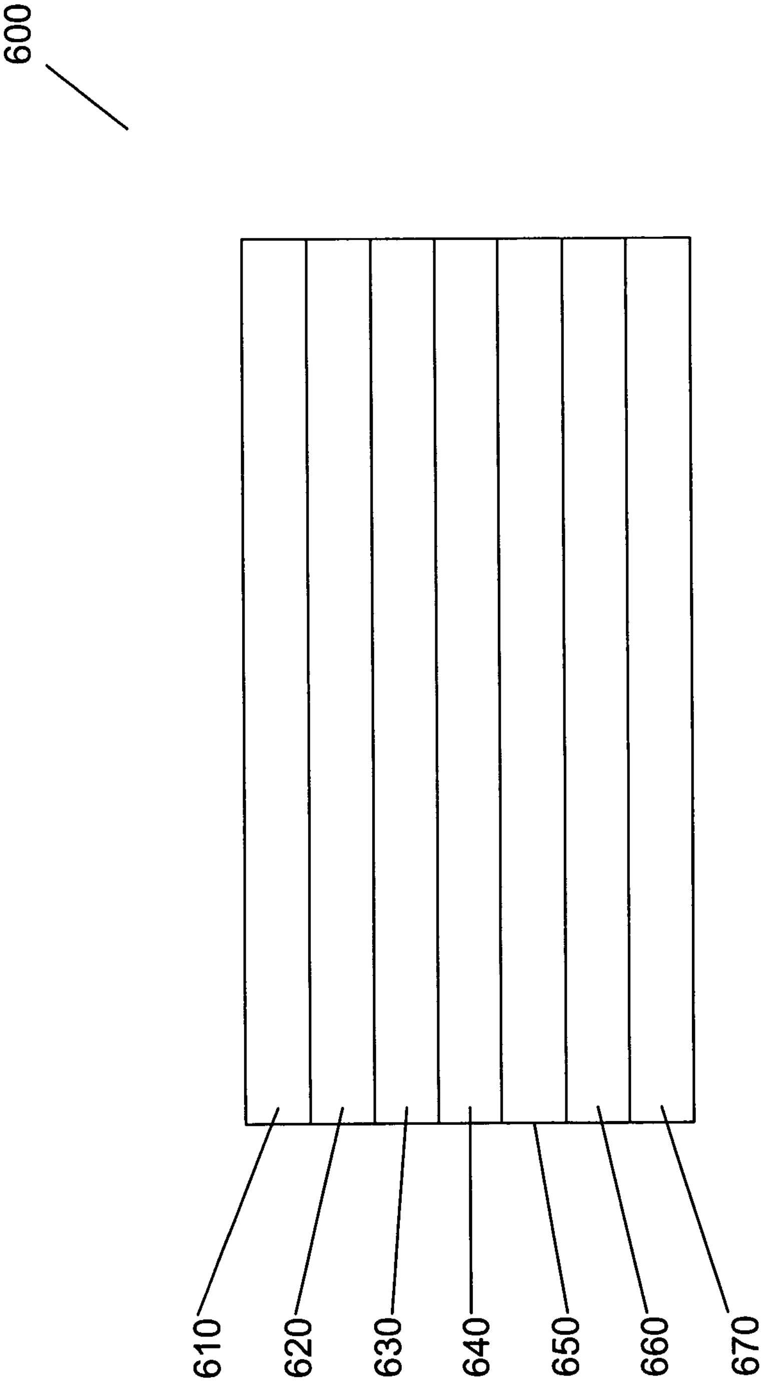
FIG. 7 is a cross-sectional view of an embodiment of a polymer photovoltaic cell.

FIG. 7 shows a polymer photovoltaic cell 600 that includes substrates 610 and 670, electrically conductive layers 620 and 660, a hole blocking layer 630, a photoactive layer 640, and a hole carrier layer 650.

In general, substrate 610 and/or substrate 670 can be as described above with respect to the substrates in a DSSC. Exemplary materials include polyethylene tereplithalate (PET), polyethylene naphthalate (PEN), or a polyimide. An example of a polyimide is a KAPTON® polyimide film (available from E. I. du Pont de Nemours and Co.).

Generally, electrically conductive layer 620 and/or electrically conductive layer 670 can be as described with respect to the electrically conductive layers in a DSSC.

Hole blocking layer 630 is generally formed of a material that, at the thickness used in photovoltaic cell 600, transports electrons to electrically conductive layer 620 and substantially blocks the transport of holes to electrically conductive layer 620. Examples of materials from which layer 630 can be formed include LiF, metal oxides (e.g., zinc oxide, titanium oxide) and combinations thereof. While the thickness of layer 630 can generally be varied as desired, this thickness is typically at least 0.02 micron (e.g., at least about 0.03 micron, at least about 0.04 micron, at least about 0.05 micron) thick and/or at most about 0.5 micron (e.g., at most about 0.4 micron, at most about 0.3 micron, at most about 0.2 micron, at most about 0.1 micron) thick. In some embodiments, this distance is from 0.01 micron to about 0.5 micron. In some embodiments, layer 630 is a thin LiF layer. Such layers are disclosed, for example, in co-pending and commonly owned U.S. Ser. No. 10/258,708, which is hereby incorporated by reference.

Hole carrier layer 650 is generally formed of a material that, at the thickness used in photovoltaic cell 600, transports holes to electrically conductive layer 660 and substantially blocks the transport of electrons to electrically conductive layer 660. Examples of materials from which layer 650 can be formed include polythiophenes (e.g., PEDOT), polyanilines, polyvinylcarbazoles, polyphenylenes, polyphenylvinylenes, polysilanes, polythienylenevinylenes, polyisothianaphthanenes and combinations thereof. While the thickness of layer 650 can generally be varied as desired, this thickness is typically at least 0.01 micron (e.g., at least about 0.05 micron, at least about 0.1 micron, at least about 0.2 micron, at least about 0.3 micron, at least about 0.5 micron) and/or at most about five microns (e.g., at most about three microns, at most about two microns, at most about one micron). In some embodiments, this distance is from 0.01 micron to about 0.5 micron.

Photoactive layer 640 generally includes an electron acceptor material and an electron donor material.

Examples of electron acceptor materials include formed of fullerenes, oxadiazoles, carbon nanorods, discotic liquid crystals, inorganic nanoparticles (e.g., nanoparticles formed of zinc oxide, tungsten oxide, indium phosphide, cadmium selenide and/or lead sulphide), inorganic nanorods (e.g., nanorods formed of zinc oxide, tungsten oxide, indium phosphide, cadmium selenide and/or lead sulphide), or polymers containing moieties capable of accepting electrons or forming stable anions (e.g., polymers containing CN groups, polymers containing $CF_3$ groups). In some embodiments, the electron acceptor material is a substituted fullerene (e.g., PCBM). In some embodiments, the fullerenes can be derivatized. For example, a fullerene derivative can includes a fullerene (e.g., PCBG), a pendant group (e.g., a cyclic ether such as epoxy, oxetane, or furan) and a linking group that spaces the pendant group apart from the fullerene. The pendant group is generally sufficiently reactive that fullerene derivative may be reacted with another compound (e.g., another fullerene derivative) to prepare a reaction product. Photoactive layers including derivatized fullerenes are disclosed, for example, in co-pending and commonly owned U.S. Ser. No. 60/576,033, which is hereby incorporated by reference. Combinations of electron acceptor materials can be used.

Examples of electron donor materials include discotic liquid crystals, polythiophenes, polyphenylenes, polyphenylvinylenes, polysilanes, polythienylvinylenes, and polyisothianaphthalenes. In some embodiments, the electron donor material is poly(3-hexylthiophene). In certain embodiments, photoactive layer 640 can include a combination of electron donor materials.

In some embodiments, photoactive layer 640 includes an oriented electron donor material (e.g., a liquid crystal (LC) material), an electroactive polymeric binder carrier (e.g., a poly(3-hexylthiophene) (P3HT) material), and a plurality of nanocrystals (e.g., oriented nanorods including at least one of ZnO, $WO_3$, or $TiO_2$). The liquid crystal (LC) material can be, for example, a discotic nematic LC material, including a plurality of discotic mesogen units. Each unit can include a central group and a plurality of electroactive arms. The central group can include at least one aromatic ring (e.g., an anthracene group). Each electroactive arm can include a plurality of thiophene moieties and a plurality of alkyl moities. Within the photoactive layer, the units can align in layers and columns. Electroactive arms of units in adjacent columns can interdigitate with one another facilitating electron transfer between units. Also, the electroactive polymeric carrier can be distributed amongst the LC material to further facilitate electron transfer. The surface of each nanocrystal can include a plurality of electroactive surfactant groups to facilitate electron transfer from the LC material and polymeric carrier to the nanocrystals. Each surfactant group can include a plurality of thiophene groups. Each surfactant can be bound to the nanocrystal via, for example, a phosphonic end-group. Each surfactant group also can include a plurality of alkyl moieties to enhance solubility of the nanocrystals in the photoactive layer. Examples of photovoltaic cells are disclosed, for example, in co-pending and commonly owned U.S. Ser. No. 60/664,298, filed Mar. 22, 2005, which is hereby incorporated by reference.

In certain embodiments, the electron donor and electron acceptor materials in layer 640 can be selected so that the electron donor material, the electron acceptor material and their mixed phases have an average largest grain size of less than 500 nanometers in at least some sections of layer 640. In such embodiments, preparation of layer 640 can include using a dispersion agent (e.g., chlorobenzene) as a solvent for both the electron donor and the electron acceptor. Such photoactive layers are disclosed, for example, in co-pending and commonly owned U.S. Ser. No. 10/258,713, which is hereby incorporated by reference.

Generally, photoactive layer 640 is sufficiently thick to be relatively efficient at absorbing photons impinging thereon to form corresponding electrons and holes, and sufficiently thin to be relatively efficient at transporting the holes and electrons to the electrically conductive layers of the device. In certain embodiments, layer 640 is at least 0.05 micron (e.g., at least about 0.1 micron, at least about 0.2 micron, at least about 0.3 micron) thick and/or at most about one micron (e.g., at most about 0.5 micron, at most about 0.4 micron) thick. In some embodiments, layer 640 is from 0.1 micron to about 0.2 micron thick.

In some embodiments, the transparency of photoactive layer 640 can change as an electric field to which layer 640 is exposed changes. Such photovoltaic cells are disclosed, for example, in co-pending and commonly owned U.S. Ser. No. 10/486,116, which is hereby incorporated by reference.

In some embodiments, cell 600 can further include an additional layer (e.g., formed of a conjugated polymer, such as a doped poly(3-alkylthiophene)) between photoactive layer 640 and electrically conductive layer 620, and/or an additional layer (e.g., formed of a conjugated polymer) between photoactive layer 640 and electrically conductive layer 660. The additional layer(s) can have a band gap (e.g., achieved by appropriate doping) of 1.8 eV. Such photovoltaic cells are disclosed, for example, in U.S. Pat. No. 6,812,399, which is hereby incorporated by reference.

Optionally, cell 600 can further include a thin LiF layer between photoactive layer 640 and electrically conductive layer 660. Such layers are disclosed, for example, in co-pending and commonly owned U.S. Ser. No. 10/258,708, which is hereby incorporated by reference.

In some embodiments, cell 600 can be prepared as follows. Electrically conductive layer 620 is formed upon substrate 610 using conventional techniques. Electrically conductive layer 620 is configured to allow an electrical connection to be made with an external load. Layer 630 is formed upon electrically conductive layer 620 using, for example, a solution coating process, such as slot coating, spin coating or gravure coating. Photoactive layer 640 is formed upon layer 630 using, for example, a solution coating process. Layer 650 is formed on photoactive layer 640 using, for example, a solution coating process, such as slot coating, spin coating or gravure coating. Electrically conductive layer 620 is formed upon layer 650 using, for example, a vacuum coating process, such as evaporation or sputtering.

In certain embodiments, preparation of cell 600 can include a heat treatment above the glass transition temperature of the electron donor material for a predetermined treatment time. To increase efficiency, the heat treatment of the photovoltaic cell can be carried out for at least a portion of the treatment time under the influence of an electric field induced by a field voltage applied to the electrically conductive layers of the photovoltaic cell and exceeding the no-load voltage thereof. Such methods are disclosed, for example, in co-pending and commonly owned U.S. Ser. No. 10/509,935, which is hereby incorporated by reference.

In general, a module containing multiple polymer photovoltaic cells can be arranged as described above with respect to DSSC modules containing multiple DSSCs.

Generally, polymer photovoltaic cells can be arranged with the architectures described above with respect to the architectures of DSSCs.

While certain embodiments of photovoltaic cells have been described, other embodiments are also known.

Figure 8:
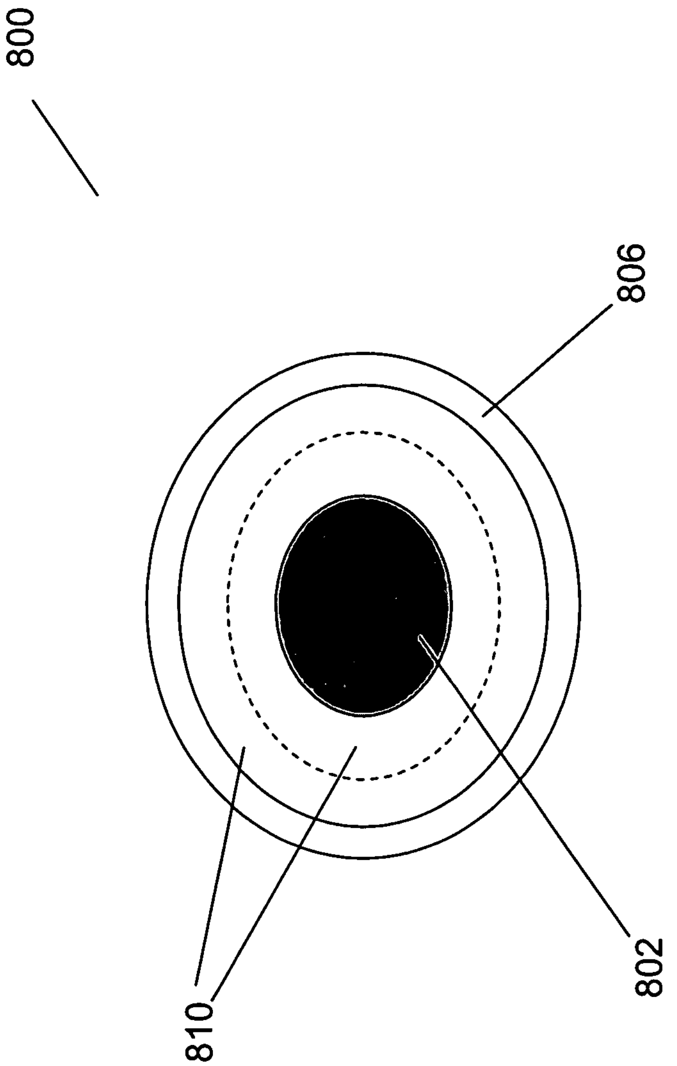
FIG. 8 is a cross-sectional view of an embodiment of a photovoltaic fiber.

As an example, a photovoltaic cell can be in the shape of a fiber (e.g., a flexible fabric or textile). Examples of such photovoltaic cells are described, for example, in co-pending and commonly owned U.S. Ser. No. 10/351,607, which is hereby incorporated by reference. FIG. 8 depicts an illustrative embodiment of photovoltaic fiber 800 that includes an electrically conductive fiber core 802, a significantly light transmitting electrical conductor 806, and a photoconversion material 810, which is disposed between the electrically conductive fiber core 802 and the significantly light transmitting electrical conductor 806.

The electrically conductive fiber core 802 may take many forms. In the embodiment illustrated in FIG. 8, the electrically conductive fiber core 802 is substantially solid. In other embodiments, electrically conductive fiber core 802 may be substantially hollow. The photoconversion material 810 may include a photosensitized nanomatrix material and a charge carrier material. The charge carrier material may form a layer, be interspersed with the photosensitized nanomatrix material, or be a combination of both. The photosensitized nanomatrix material is adjacent to the electrically conductive fiber core. The charge carrier material is adjacent to the electrically conductive fiber core.

Figure 9:
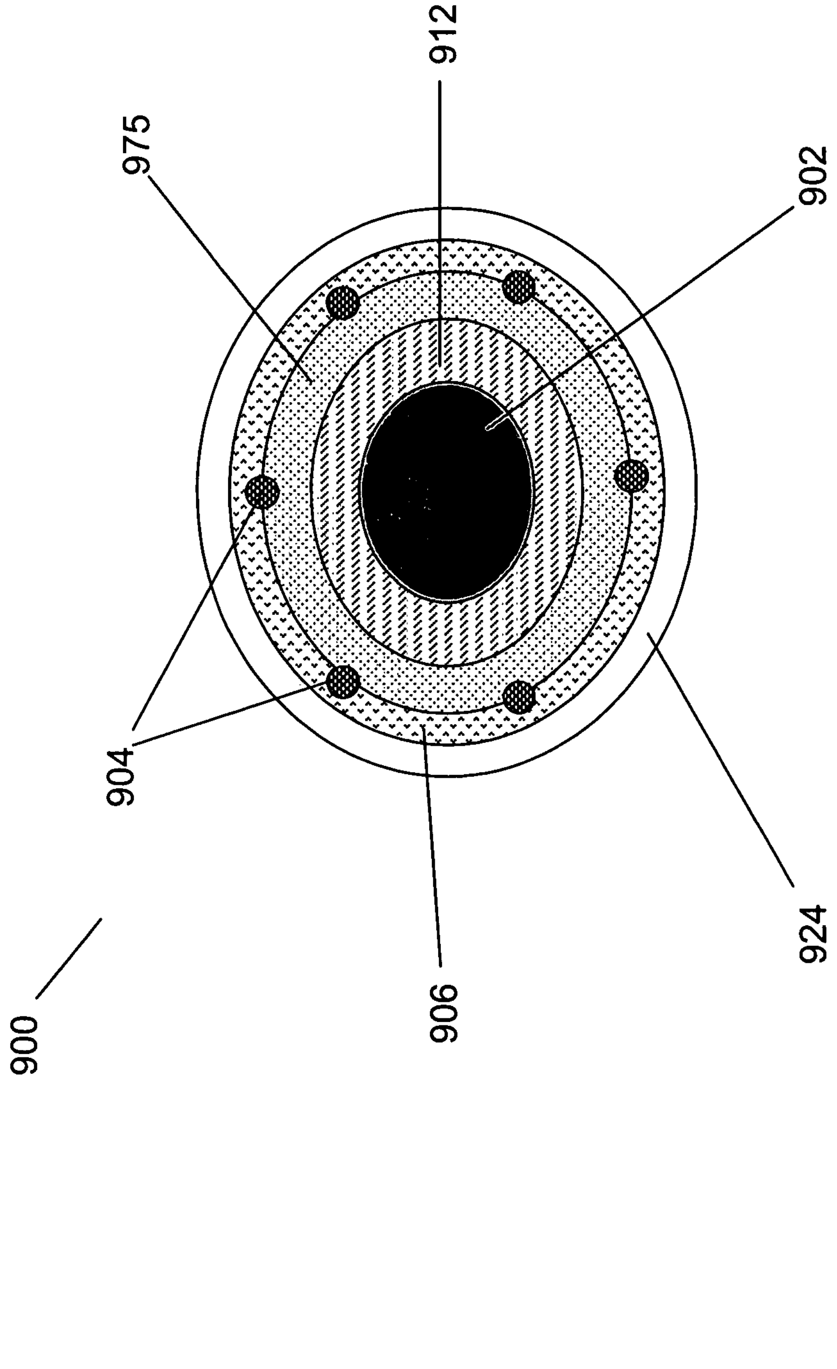
FIG. 9 is a cross-sectional view of another embodiment of a photovoltaic fiber.

FIG. 9 depicts a photovoltaic material 900 that includes a fiber 902, one or more wires 904 that are imbedded in a significantly light transmitting electrical conductor 906, a photosensitized nanomatrix material 912, a charge carrier material 915, and a protective layer 924. The wires 904 may also be partially imbedded in the charge carrier material 915 to, for example, facilitate electrical connection of the photovoltaic material 900 to an external load, to reinforce the significantly light transmitting electrical conductor 906, and/or to sustain the flexibility of the photovoltaic material 900. Preferably, the wire 904 is an electrical conductor and, in particular, a metal electrical conductor. Suitable wire 904 materials include, but are not limited to, copper, silver, gold, platinum, nickel, palladium, iron, and alloys thereof. In one illustrative embodiment, the wire 904 is between about 0.5 μm and about 100 μm thick. In another illustrative embodiment, the wire 904 is between about 1 μm and about 10 μm thick.

Figure 10:
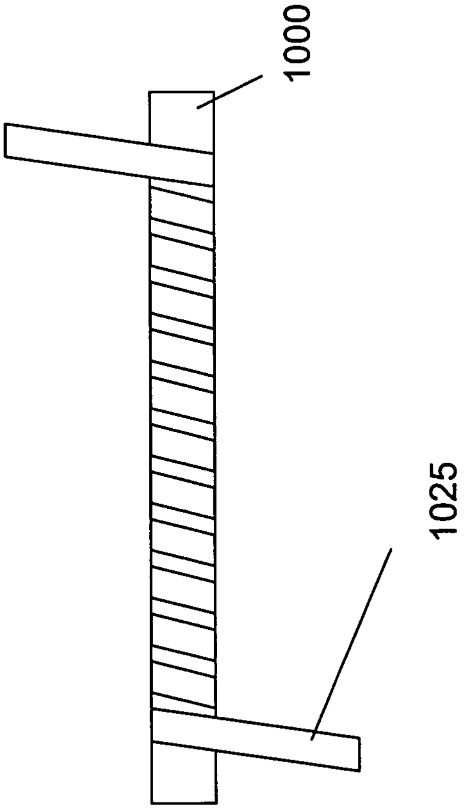
FIG. 10 is illustrates a method of forming a photovoltaic fiber.

FIG. 10 shows a method of forming a photovoltaic material 1000 that has an electrically conductive fiber core, a significantly light transmitting electrical conductor, and a photoconversion material, which is disposed between the electrically conductive fiber core and the significantly light transmitting electrical conductor. According to the method, the outer surface of the conductive fiber core is coated with titanium dioxide nanoparticles. The nanoparticles are then interconnected by, for example, sintering, or preferably by contacting the nanoparticles with a reactive polymeric linking agent such as, for example, poly(n-butyl titanate), which is described in more detail below. The interconnected titanium dioxide nanoparticles are then contacted with a photosensitizing agent, such as, for example, a 3×10−4 M N3-dye solution for 1 hour, to form a photosensitized nanomatrix material. A charge carrier material that includes a gelled electrolyte is then coated on the photosensitized nanomatrix material to complete the photoconversion material. A strip 625 of transparent polymer from about 2.5 μm to about 6 μm thick, coated with a layer of ITO that in turn has been platinized, is wrapped in a helical pattern about the photovoltaic material 1000 with the platinized side of the strip 1025 in contact with the charge carrier material. In this illustrative embodiment, the strip 1025 of transparent polymer is the significantly light transmitting electrical conductor. In other illustrative embodiments, the significantly light transmitting electrical conductor is formed using the materials described in connection with this application and the applications that are incorporated by reference.

Figure 11:
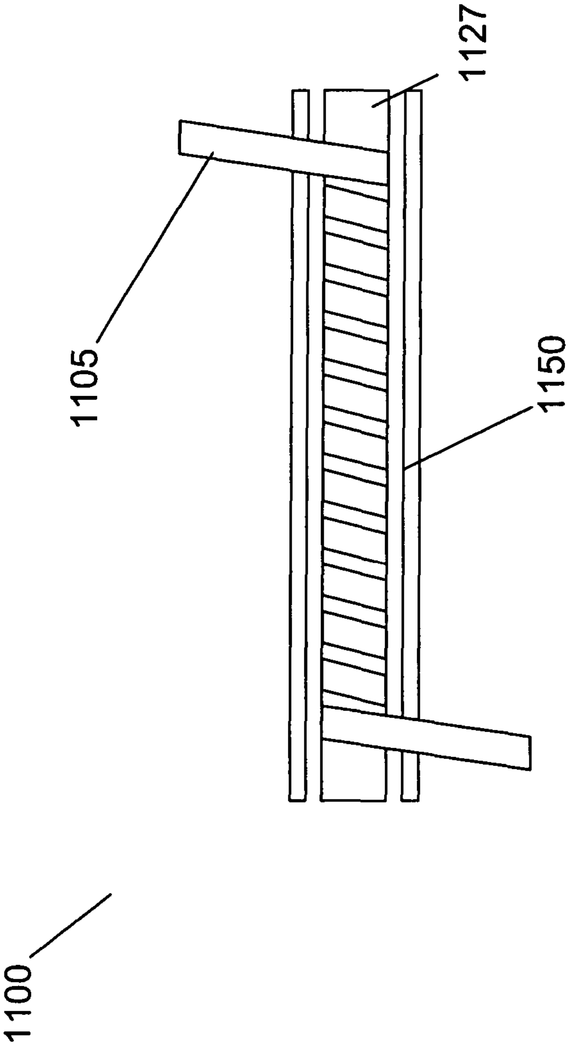
FIG. 11 is illustrates another method of forming a photovoltaic fiber.

Referring to FIG. 11, in another illustrative embodiment, a photovoltaic material 1100 is formed by wrapping a platinum or platinized wire 1105 around a core 1127 including a photoconversion material disposed on either an electrically conductive fiber core or on an inner electrical conductor in turn disposed on an insulative fiber. A strip 1150 of transparent polymer coated with a layer of ITO, which has been platinized, is wrapped in a helical pattern about the core 1127 with the platinized side of the strip 1150 in contact with the wire 1105 and the charge carrier material of the core 1127.

Figures 12A, 12B, 12C:
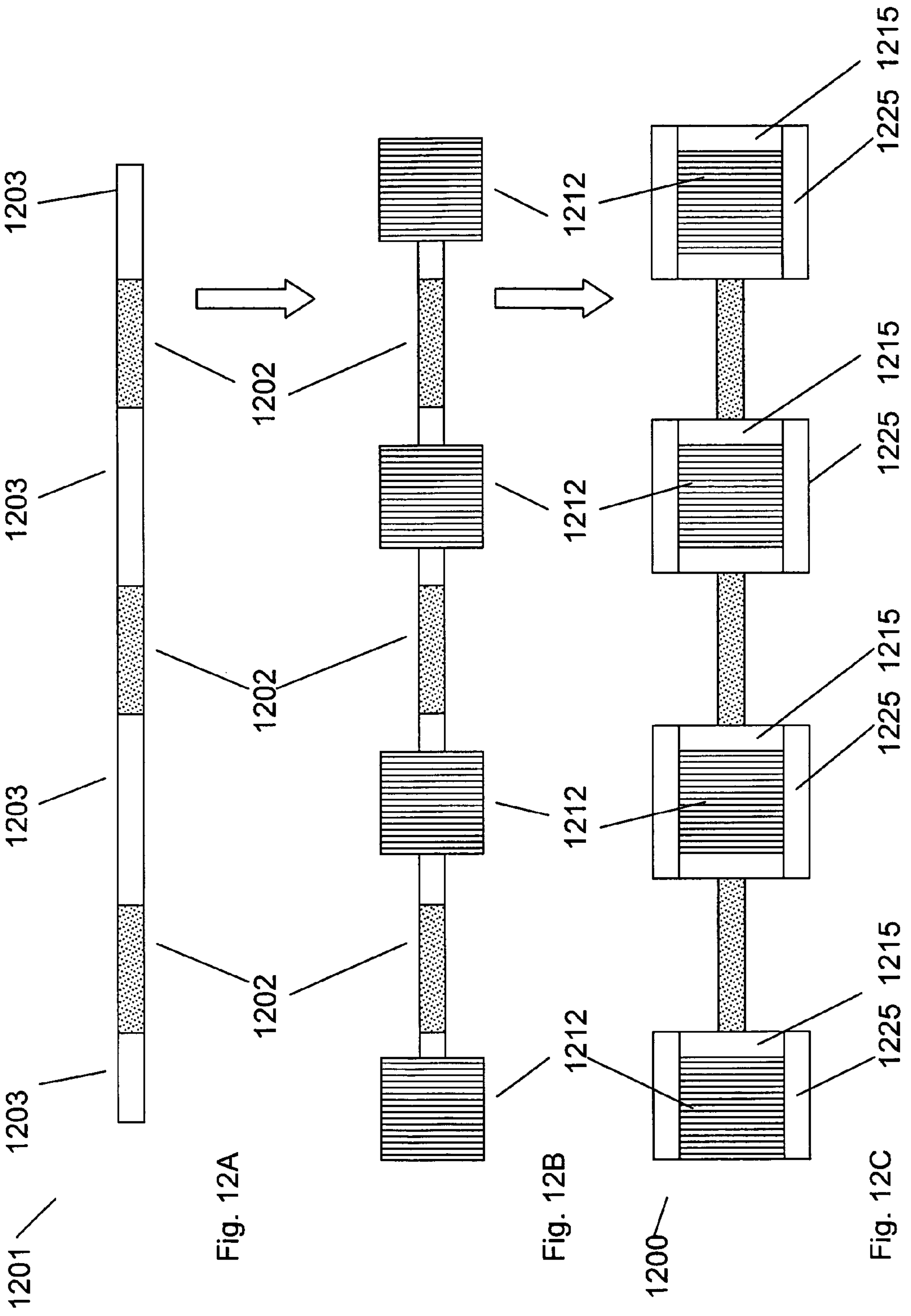
FIG. 12A-12C illustrate another method of forming a photovoltaic fiber.

FIGS. 12A, 12B, and 12C depict other illustrative embodiments of a photovoltaic material 1200, constructed in accordance with the invention. The photovoltaic material 1200 includes a metal-textile fiber 1201, which has metallic electrically conductive portions 1202 and textile portions 1203. The textile portions 1203 may be electrically conductive or may be insulative and coated with an electrical conductor. Referring to FIG. 12B, a dispersion of titanium dioxide nanoparticles is coated on the outer surface of portions of the textile portions 1203 of the metal-textile fiber 1201. The particles are then interconnected preferably by contacting the nanoparticles with a reactive polymeric linking agent such as poly(n-butyl titanate), which is further described below. The interconnected titanium dioxide nanoparticles are then contacted with a photosensitizing agent, such as a N3 dye solution, for 1 hour to form a photosensitized nanomatrix material 1212.

Referring to FIG. 12C, a charge carrier material 1215 including a solid electrolyte is then coated on the textile portions 1203. A strip 1225 of PET coated with ITO, that in turn has been platinized, is disposed on the photosensitized nanomatrix material 1212 and the charge carrier material 1215. The platinized ITO is in contact with the charge carrier material 1215.

As indicated, the photovoltaic fibers may be utilized to form a photovoltaic fabric. The resultant photovoltaic fabric may be a flexible, semi-rigid, or rigid fabric. The rigidity of the photovoltaic fabric may be selected, for example, by varying the tightness of the weave, the thickness of the strands of the photovoltaic materials used, and/or the rigidity of the photovoltaic materials used. The photovoltaic materials may be, for example, woven with or without other materials to form the photovoltaic fabric. In addition, strands of the photovoltaic material, constructed according to the invention, may be welded together to form a fabric.

Figure 13:
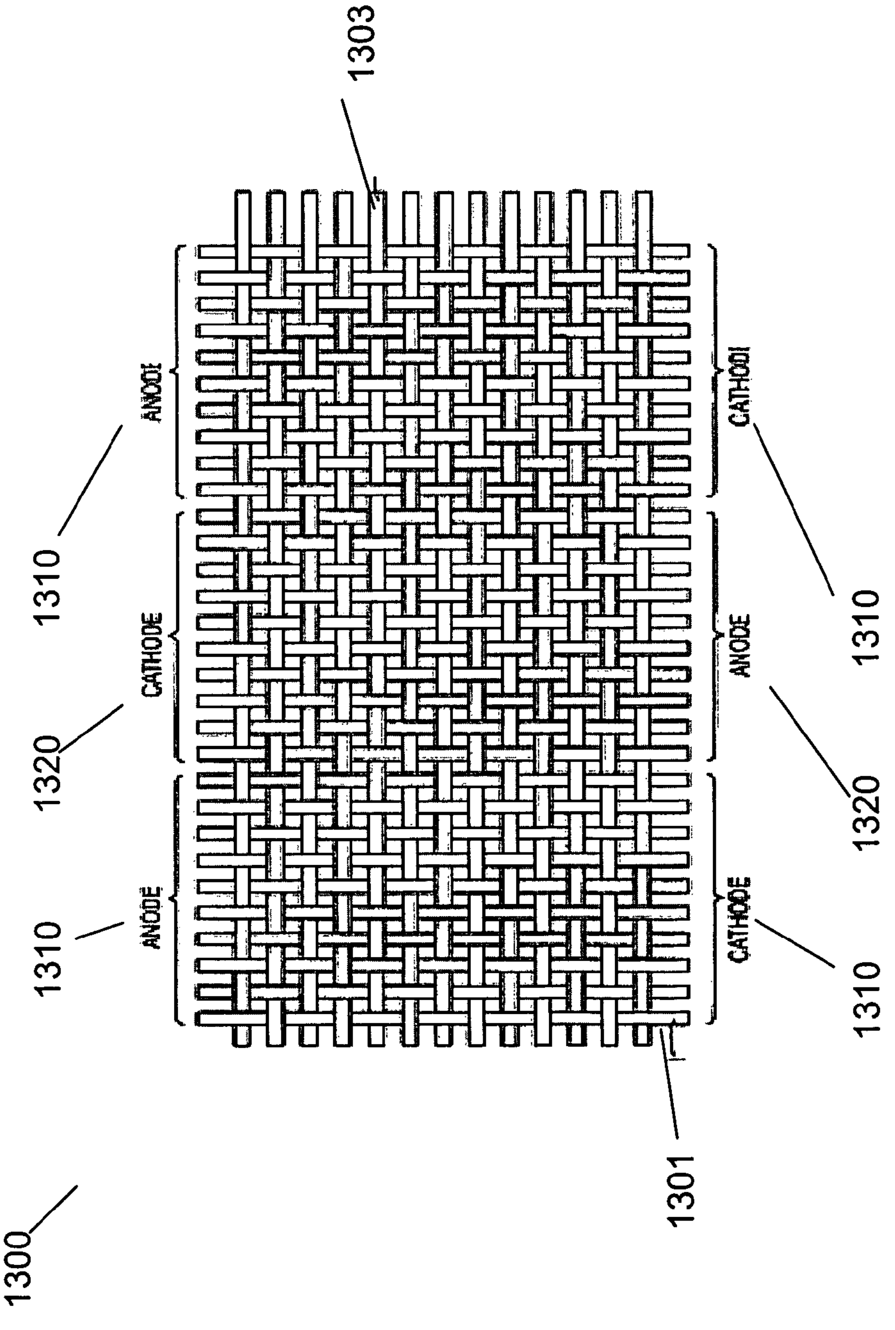
FIG. 13 illustrates an embodiment of a photovoltaic fabric containing photovoltaic fibers.

FIG. 13 depicts one illustrative embodiment of a photovoltaic fabric 1300 that includes photovoltaic fibers 1301, according to the invention. As illustrated, the photovoltaic fabric 1300 also includes non-photovoltaic fibers 1303. In various illustrative embodiments, the non-photovoltaic fibers 1303 may be replaced with photovoltaic fibers. FIG. 13 also illustrates anodes 1310 and cathodes 1320 that are formed on the photovoltaic fabric 1300 and that may be connected to an external load to form an electrical circuit. The anodes 1310 may be formed by a conductive fiber core or an electrical conductor on an insulative fiber, and the cathodes 1320 may be formed by significantly light transmitting electrical conductors. In FIG. 13, each edge of the photovoltaic fabric 1300 is constructed in an alternating fashion with the anodes 1310 and cathodes 1320 formed from photovoltaic fibers 1301. In another illustrative embodiment, each edge of photovoltaic fabric 1300 is constructed from just one anode or just one cathode, both of which are formed from either photovoltaic fibers, non-photovoltaic fibers, or a combination of both.

Figure 14:
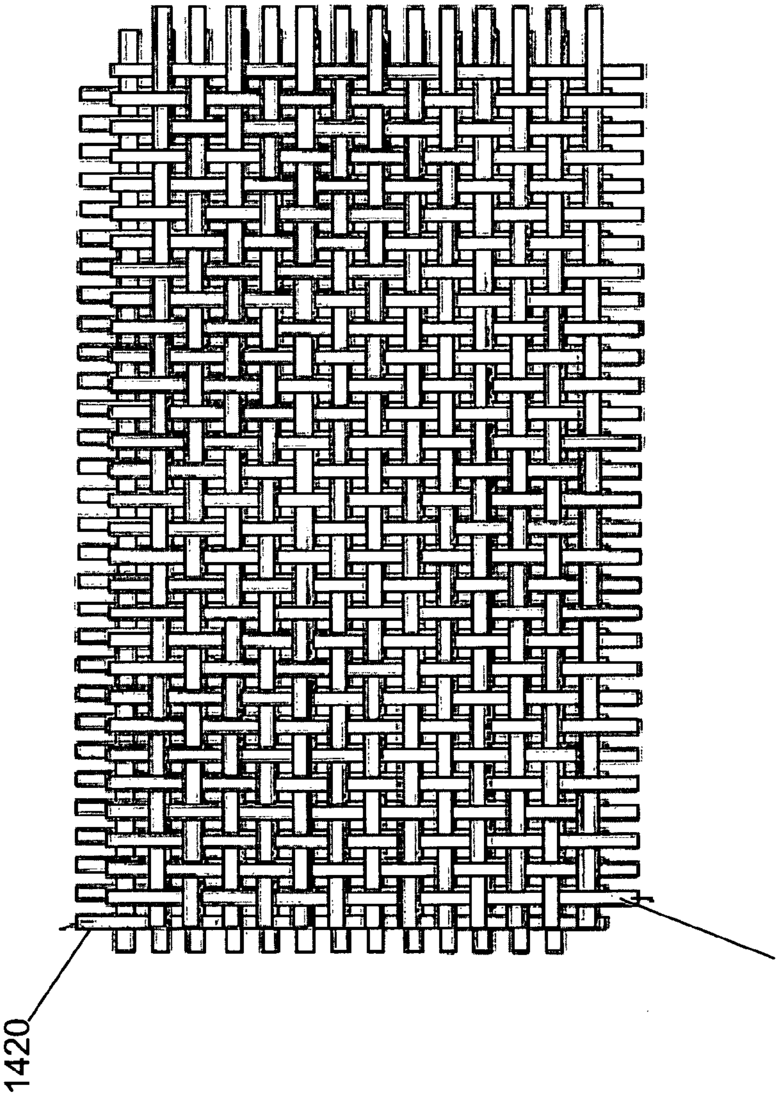
FIG. 14 illustrates another embodiment of a photovoltaic fabric containing photovoltaic fibers.

FIG. 14 shows a photovoltaic fabric 1400 formed by a two-component photovoltaic material. According to the illustrative embodiment, each component is formed by a mesh, where one mesh serves as the anode 1410 and the other as the cathode 1420. Each mesh (or component) is connected to a different busbar, which in turn may be connected to opposite terminals of an external load. Hence, a single large-area, fabric-like photovoltaic cell is produced.

According to the illustrated embodiment, the mesh material may be any material suitable as a fiber material. For example, the mesh material may include electrically conductive fiber cores, electrically insulative fiber cores coated with an electrical conductor, or a combination of both. In one embodiment, the anode mesh is made of a metal fiber with a redox potential approximately equal to that of ITO. In another embodiment, the mesh is composed of a plastic fiber, e.g., nylon that is metalized by, for example, vacuum deposition or electroless deposition.

In one illustrative embodiment, the anode 1410 mesh of the photovoltaic fabric 1400 is formed by coating the mesh with a dispersion of titanium dioxide nanoparticles by, for example, dipping or slot coating in a suspension. The titanium dioxide nanoparticles are interconnected, for example, by a sintering, or preferably by a reactive polymeric linking agent, such as poly(n-butyl titanate) described in more detail below. After coating with the titania suspension, but prior to either sintering or crosslinking, an air curtain can be used to remove excess titania from the spaces between the fibers of the mesh. Likewise, this, or some other functionally equivalent method, may be used to clear these spaces of excess material after each of the subsequent steps in the preparation of the final photovoltaic fabric. Subsequently, the mesh is slot coated or dipped in a photosensitizing agent solution, such as N3 dye, followed by washing and drying. A charge carrier including a solid electrolyte (e.g., a thermally-reversible polyelectrolyte) is applied to the mesh to from the anode 1410 mesh. In another illustrative embodiment, the cathode 1420 mesh of the photovoltaic fabric 1400 is formed as a platinum-coated mesh, such as, for example, a platinum-coated conductive fiber core mesh or a platinum-coated plastic mesh.

To form the photovoltaic fabric 1400, the anode 1410 mesh and cathode 1420 mesh are brought into electrical contact and aligned one over the other, so that the strands of each mesh are substantially parallel to one another. Perfect alignment is not critical. In fact, it may be advantageous from the standpoint of photon harvesting to slightly misalign the two meshes. The photovoltaic fabric 1400 may be coated with a solution of a polymer that serves as a protective, transparent, flexible layer.

One of the advantages of the photovoltaic fabric 1400 is its relative ease of construction and the ease with which the anode 1410 and cathode 1420 may be connected to an external circuit. For example, the edges of each mesh, one edge, multiple edges, or all edges may be left uncoated when the coating operations described above are performed. The anode 1410 and cathode 1420 are each electrically connected to its own metal busbar. An advantage of this illustrative embodiment is the elimination of the possibility that severing one wire would disable the entire photovoltaic fabric.

As another example, a photovoltaic cell may further include one or more spacing elements disposed between the electrically conductive layers. Examples of spacing elements include spheres, mesh(es) and porous membrane(s). In certain embodiments, the spacing element(s) can maintain a distance (e.g., a substantially constant and/or substantially uniform distance) between electrically conductive layers of different charge (e.g., during operation and/or bending of a photovoltaic cell). This can, for example, reduce the likelihood that the electrically conductive layer and photoactive material will contact each other. Photovoltaic cells having one or more spacing elements are disclosed, for example, in co-pending and commonly owned U.S. Ser. No. 11/033,217, filed Jan. 10, 2005, which is hereby incorporated by reference.

As an additional example, in certain embodiments, a photovoltaic cell can have an absorption maximum that is at relatively long wavelength region and/or relatively high layer efficiency. Such cells are disclosed, for example, in published international application WO04/025746, which is hereby incorporated by reference.

As a further example, in some embodiments, the photoactive layer can include at least one mixture of two different fractions of a functional polymer (e.g., contained in a solvent). Such photovoltaic cells are disclosed, for example, in co-pending and commonly owned U.S. Ser. No. 10/515,159, which is hereby incorporated by reference.

As an additional example, in certain embodiments, a photovoltaic cell can be a tandem cell in which two or more photoactive layers are arranged in tandem. Such cells can include of an optical and electrical series connection of two photoactive layers. The cells can have at least one shared electrically conductive layer (e.g., placed between two photovoltaically active layers). Such photovoltaic cells are disclosed, for example, in published international application WO 2003/107453, which is hereby incorporated by reference.

As another example, in some embodiments, a photovoltaic cell can optionally include an additional layer having an asymmetric conductivity is placed between at least one of the electrically conductive layers and the photoactive layer. Such photovoltaic cells are disclosed, for example, in published international application WO 2004/112162, which is hereby incorporated by reference.

As an additional example, in some embodiments, the electrically conductive layers can be formed of spherical allotropes (e.g., silicon and/or carbon nanotubes). The electrically conductive layers can either exclusively contain allotropes and/or contain allotropes that are embedded in an organic functional polymer. Such photovoltaic cells are disclosed, for example, in published international application WO03/107451, which is hereby incorporated by reference.

As another example, in certain embodiments, one or more layers of a photovoltaic cell can be structured. Such photovoltaic cells are disclosed, for example, in published international application WO04/025747, which is hereby incorporated by reference.

As a further example, in some embodiments, a photovoltaic cell can include an improved top electrically conductive layer and to a production method therefor. The top electrically conductive layer is made of an organic material that is applied, for example, by using printing techniques. Such photovoltaic cells are disclosed, for example, in published international application WO2004/051,756, which is hereby incorporated by reference.

Moreover, the photovoltaic devices and modules including the photovoltaic devices can generally be used as a component in any intended system. Examples of such systems include roofing, package labeling, battery chargers, sensors, window shades and blinds, awnings, opaque or semitransparent windows, and exterior wall panels. As an example, one or more photovoltaic cells are incorporated into eyeglasses (e.g., sunglasses). Such sunglasses are disclosed, for example, in co-pending and commonly owned U.S. Ser. No. 10/504,091, which is hereby incorporated by reference. As another example, one or more photovoltaic cells are incorporated into a thin film energy system. The thin film energy system can include one or more thin film energy converters that each include one or more photovoltaic cells. Such systems are disclosed, for example, in co-pending and commonly owned U.S. Ser. No. 10/498,484, which is hereby incorporated by reference. As an additional example, a photovoltaic cell can be used in a flexible display (e.g., the photovoltaic cell can serve as a power source for the flexible display). Examples of such flexible displays are disclosed, for example, in co-pending and commonly owned U.S. Ser. No. 10/350,812, which is hereby incorporated by reference. As a further example, one or more photovoltaic cells are integrated into a chip card. Such chip cards are disclosed, for example, in co-pending and commonly owned WO 2004/017256, PCT/DE2003/002463, which is hereby incorporated by reference. As another example, a photovoltaic cell can be used to power a multimedia greeting card or smart card. Such photovoltaic cells and systems are disclosed, for example, in U.S. Ser. No. 10/350,800, which is hereby incorporated by reference.

While DSSCs and polymer cells have been described, more generally any type of photovoltaic cells can include one or more of the features described above. As an example, in some embodiments, one or more hybrid photovoltaic cells can be used. In general, a hybrid photovoltaic cell has a photoactive layer that includes one or more semiconductors, such as a nanoparticle semiconductor; materials (e.g., one or more of the semiconductor materials described above); and one or more polymer materials that can act as an electron donor (e.g., one or more of the polymer materials described above).

An aspect of the present invention relates to combining photovoltaic facilities with sensors and other sensing facilities. While many of the photovoltaic/sensor embodiments described herein describe particular photovoltaic facilities and or particular sensor facilities, these embodiments are merely examples; the applicants of the present invention envision many equivalent systems and methods which are encompassed by the present invention. For example, a photovoltaic sensor facility embodiment herein below may include a photovoltaic facility described herein above; however, such photovoltaic facility may also comprise a photovoltaic facility that is not described herein.

Figure 15:
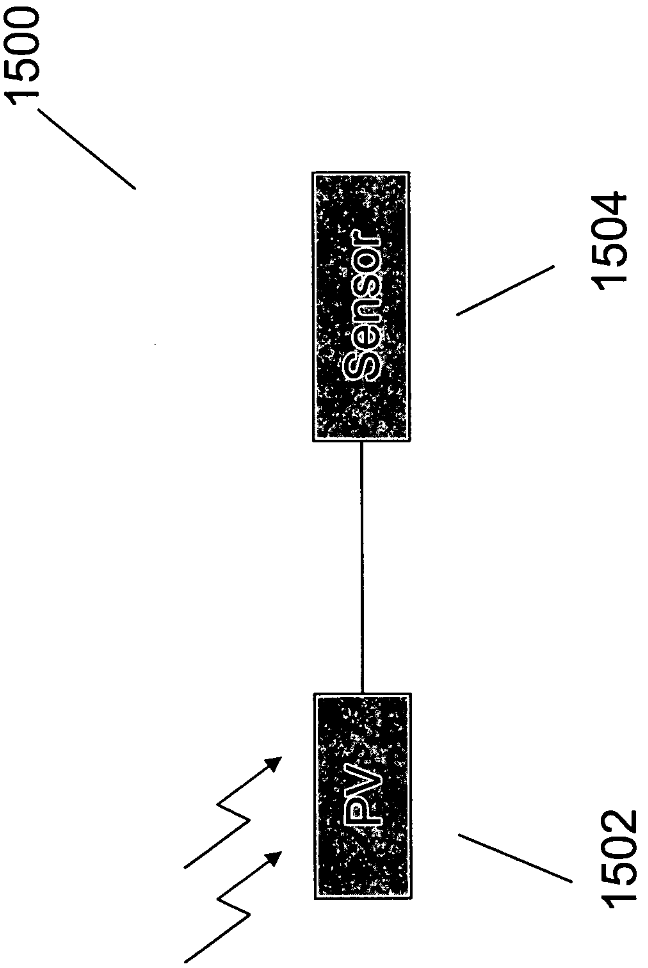
FIG. 15 illustrates a photovoltaic sensor facility according to the principles of the present invention.

FIG. 15 illustrates a photovoltaic sensor facility 1500 according to the principles of the present invention. In embodiments, the photovoltaic sensor facility 1500 includes a photovoltaic facility 1502 and a sensing facility 1504. In embodiments, the photovoltaic facility 1502 may be a photovoltaic facility described herein above, such as those described in connection with FIGS. 1-7, and it may be another type of photovoltaic facility adapted to generate electricity from light. In embodiments, the sensing facility 1504 may be a facility adapted to sense, measure, assess, quantify, qualify, evaluate, monitor, gauge, calculate, determine, or otherwise sense. Examples of certain sensing facilities 1504 are included in the embodiments below for further illustrative purposes; however, these examples should not be construed as limiting; the applicants of the present invention envision many equivalents, and such equivalents are encompassed by the present invention. In embodiments, the photovoltaic facility 1502 is adapted to power and is associated with the sensor facility 1504. For example, a sensor may require power to perform a certain function, and the photovoltaic facility may be adapted to generate the requisite power and may be connected to the sensor. In embodiments, the association between the photovoltaic facility 1502 and the sensor facility 1504 may be continuous, intermittent, wired, wireless, or otherwise configured.

Figure 16:
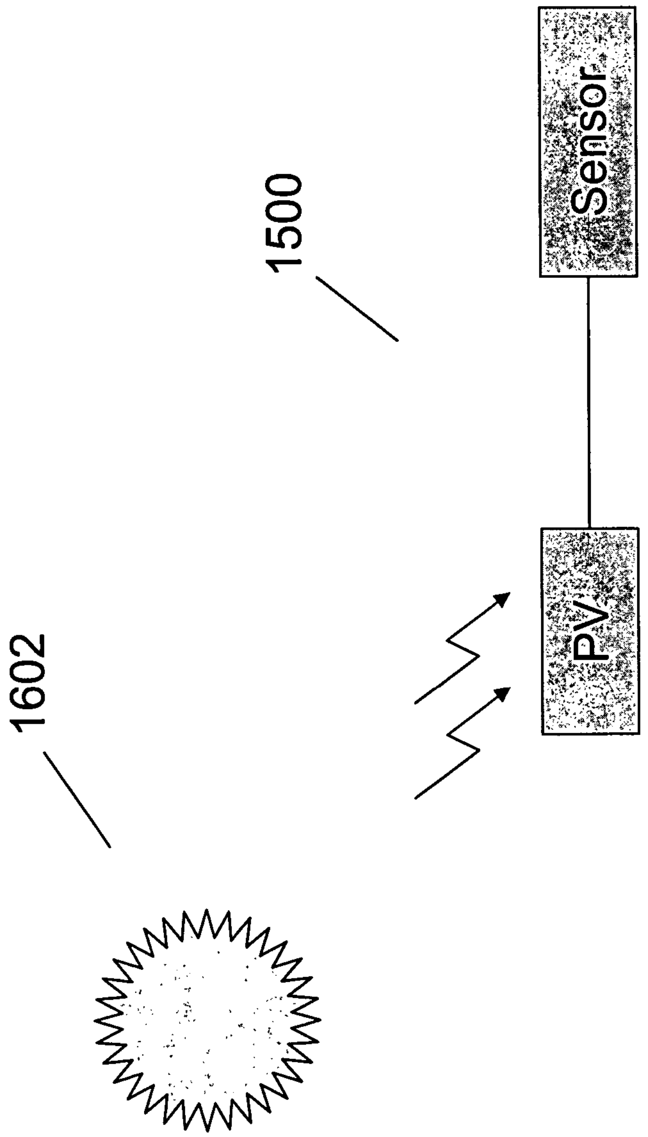
FIG. 16 illustrates a photovoltaic sensor facility in the presence of sunlight according to the principles of the present invention.

FIG. 16 illustrates a photovoltaic sensor facility 1500 in the presence of sunlight 1602 according to the principles of the present invention. In embodiments, the photovoltaic sensor facility 1500 may obtain its power from the sun. In embodiments, the sunlight may be reflected sunlight, refracted sunlight, direct sunlight, or otherwise directed to the photovoltaic facility 1500. In embodiments, the light may be a phenomenon that occurs at the nearinfrared, infrared, near uv, uv, or other non-visible radiation.

Figure 17:
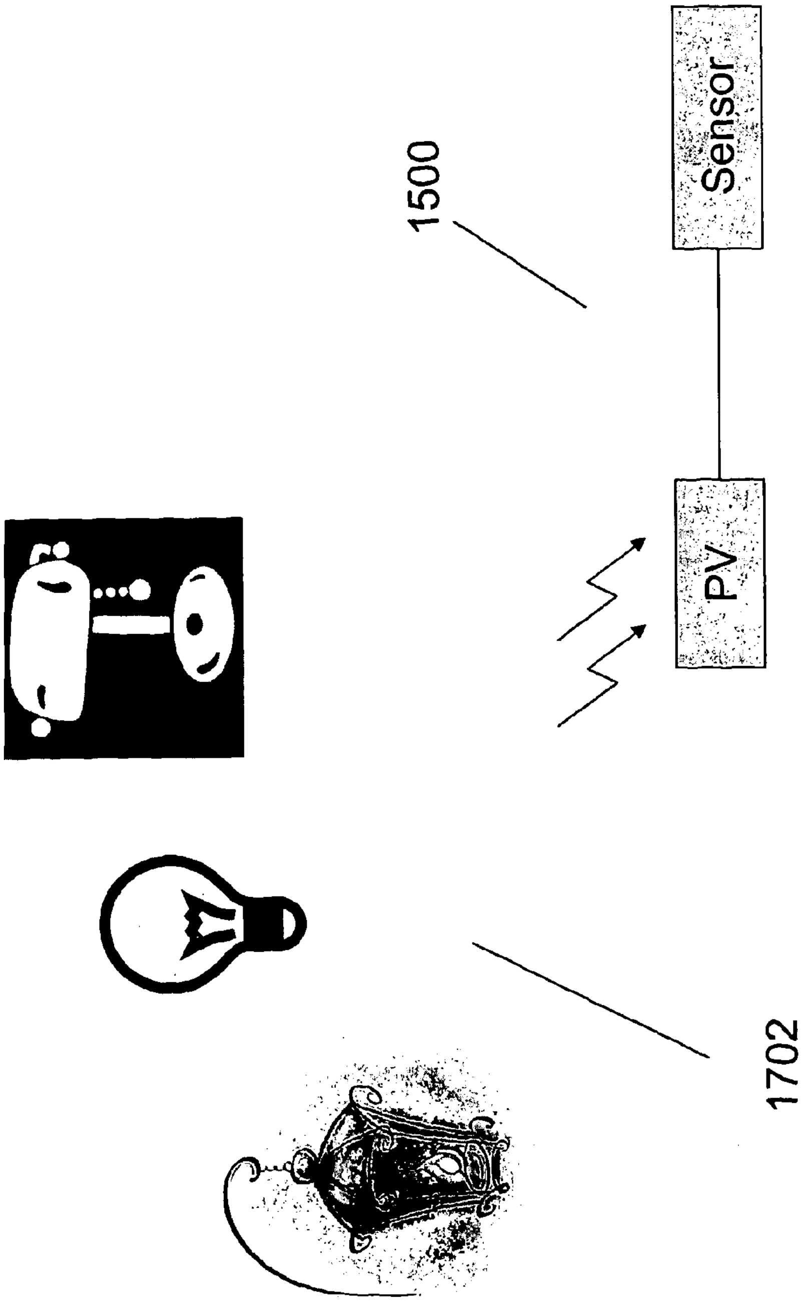
FIG. 17 illustrates a photovoltaic sensor facility in the presence of artificial light according to the principles of the present invention.

FIG. 17 illustrates a photovoltaic sensor facility 1500 in the presence of artificial light 1702 according to the principles of the present invention. In embodiments, the photovoltaic sensor facility 1500 may obtain its power from an artificial light source, such as a light, lighting fixture, incandescent light, halogen light, fluorescent light, HID light, LED light, display, OLED light, plasma light, plasma display, LCD, LCD display, computer display, pda display, mobile phone display, or other facility that generates light.

In embodiments, the photovoltaic may be tuned to a specific wavelength, frequency, bandwidth, and other light spectrum or radiation. For example, a uniform, undergarment, blanket, jacket, or other fabric or facility may be tuned to a particular light source. In embodiments, the tuned spectrum may be used to activate and or power the photovoltaic system.

For example, a tuned photovoltaic panel may be mated to specific light, and, when the compatible light is present, the sensor may respond because it understands that the light belongs to this panel. In embodiments, the light is an addressing facility for addressing this photovoltaic by tuning between the light source and the photovoltaic. In embodiments, the tuning is a type of communication protocol. For example, to communicate to it wirelessly one transmits at this wavelength. In embodiments, the addressing scheme is used for security. For example, it may be used to generate a card key. If the user has a photovoltaic light pulse that is read by the photovoltaic facility, then a light activated lock may open.

Figure 18:
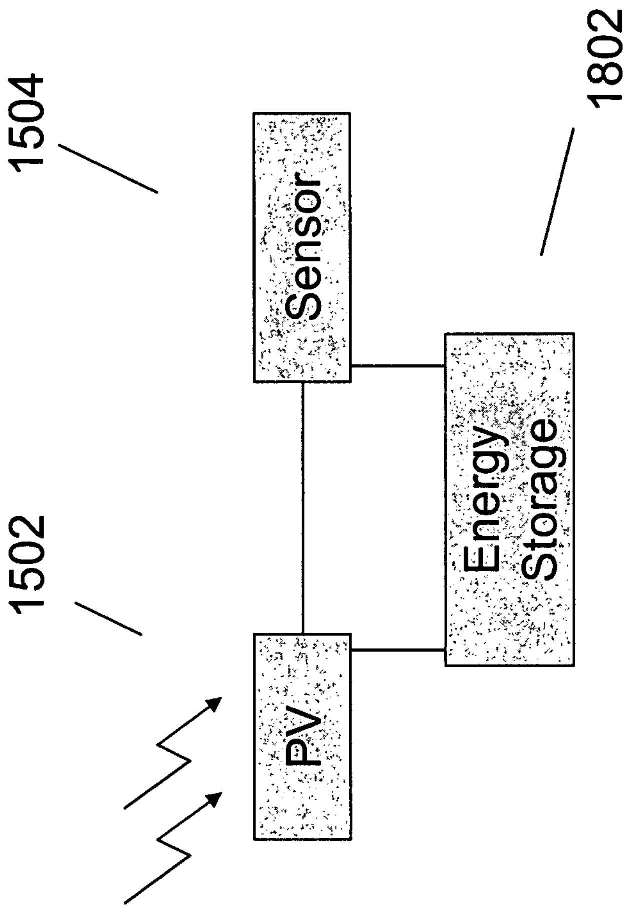
FIG. 18 illustrates a photovoltaic sensor facility including a photovoltaic facility, a sensing facility, and an energy storage facility according to the principles of the present invention.

FIG. 18 illustrates a photovoltaic sensor facility including a photovoltaic facility 1502, a sensing facility 1504, and an energy storage facility 1802 according to the principles of the present invention. In embodiments, the energy storage facility 1802 stores energy for the photovoltaic sensing facility. In embodiments, the energy storage facility 1802 is adapted to be connected to the photovoltaic facility 1502 and or the sensing facility. In embodiments, the connection may be continuous, intermittent, wired, wireless, or otherwise configured. In embodiments the energy storage facility 1802 may be adapted in parallel, series or other connection topology. In embodiments, the storage facility 1802 stores energy generated by the photovoltaic facility 1502 or delivers energy to the sensing facility 1504, or it may both store and deliver energy. For example, the energy storage facility may be and/or include a battery, chargeable cell, rechargeable cell, energy retention cell, capacitor, capacitance facility, inductor, inductance facility, hydrogen storage facility, split water facility, electrochemical storage facility, potential energy storage facility, mechanical energy storage (e.g. spring), or other facility adapted to store energy. In embodiments, the energy storage facility 1802 may be a super capacitor. For example, a super capacitor may generate high peak energies, but the photovoltaic facility may operate at a lower level.

In embodiments a vending machine is associated with a photovoltaic facility as described herein. For example, it may be a self-powered vending machine; it may have a lower power requirement; and/or the power requirement may come in discrete bursts. In embodiments, the photovoltaic facility may be associated with advertising. For example, such a system may be used to know what is on a shelf. In embodiments, the photovoltaic facility may be associated with traceability of a product. For example, the system may be employed with an RFID system, or other ID system, including a transmitting ID system, associated with a product to trace the product through its life cycle, including through manufacturing, distribution, use, and disposal. In embodiments, such a photovoltaic ID system may be linked to point of purchase. In embodiments, an ID facility (e.g. RFID, ID transmission, keyed ID transmission, data enabled ID transmission) may be combined with a sensor and or a photovoltaic facility.

Figure 19:
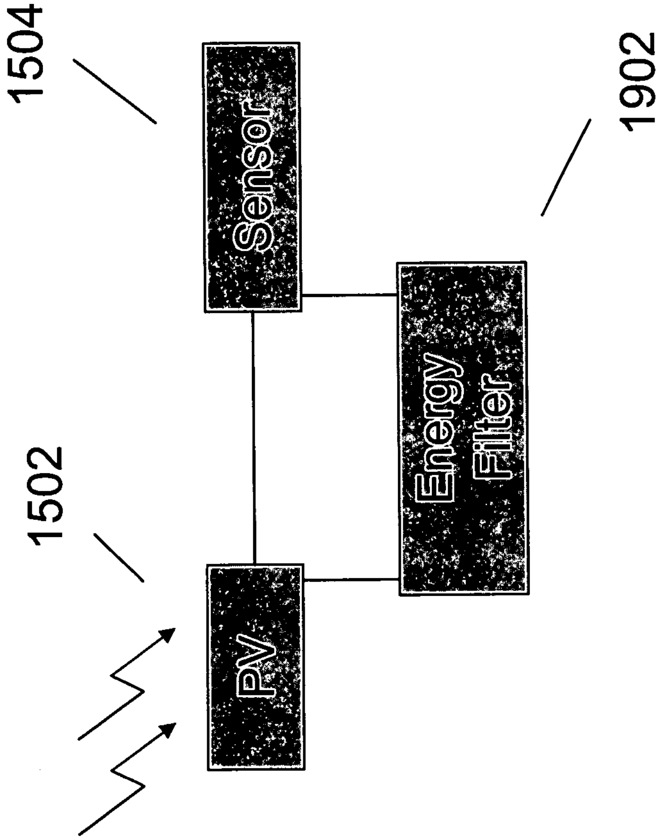
FIG. 19 illustrates a photovoltaic sensor facility including a photovoltaic facility, a sensing facility, and an energy filtering facility according to the principles of the present invention.

FIG. 19 illustrates a photovoltaic sensor facility including a photovoltaic facility 1502, a sensing facility 1504, and an energy filtering facility 1902 according to the principles of the present invention. In embodiments, the energy filtering facility 1902 filters energy, voltage, current, power, or other energy for the photovoltaic sensing facility. In embodiments, the energy filtering facility 1902 is adapted to be connected to the photovoltaic facility 1502 and or the sensing facility. In embodiments, the connection may be continuous, intermittent, wired, wireless, or otherwise configured. In embodiments, the energy filtering facility 1902 may be adapted in parallel, series, or other connection topology. In embodiments, the energy filtering facility 1902 filters energy generated by the photovoltaic facility 1502 and/or delivers filtered energy to the sensing facility 1504. For example, the energy filtering facility 1902 may be and/or include a capacitor, capacitance facility, inductor, inductance facility, processor adapted to filter, circuit adapted to filter, transformer circuit, or other facility adapted to filter energy. In embodiments, the energy filtering facility 1902 is adapted to remove noise from the power. For example, when the photovoltaic system is powered by light, it is difficult to predict the incoming power quality; the energy filtering facility 1902 may be adapted to remove noise from the power. In embodiments, algorithms may be employed (e.g. through a processor described below) to predict and or manipulate the power output for battery charging or power applications. In embodiments, the algorithms may use simulations based on the type of photovoltaic facility material to improve the predictions and regulations.

Figure 20:
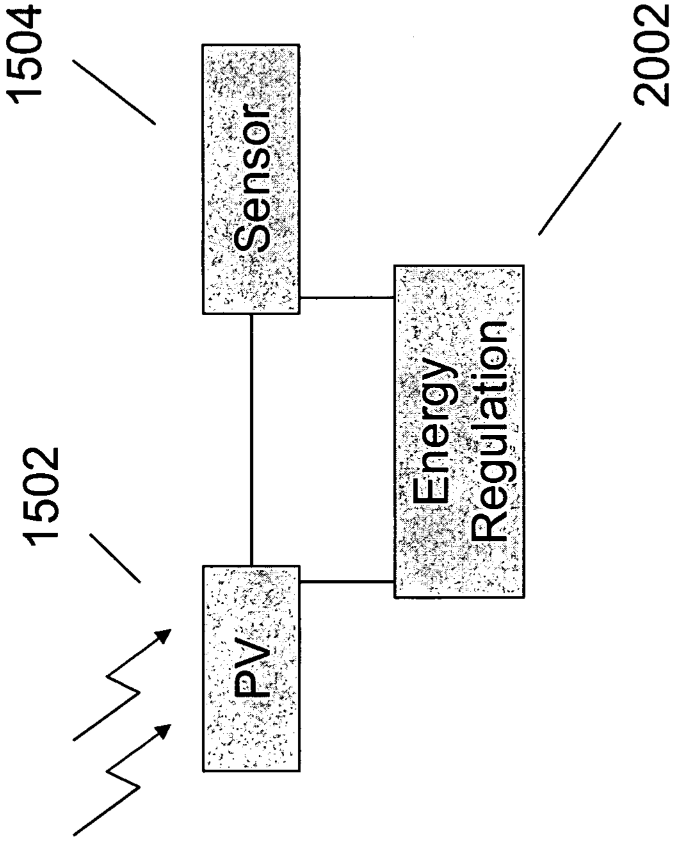
FIG. 20 illustrates a photovoltaic sensor facility including a photovoltaic facility, a sensing facility, and an energy regulation facility according to the principles of the present invention.

FIG. 20 illustrates a photovoltaic sensor facility including a photovoltaic facility 1502, a sensing facility 1504, and an energy regulation facility 2002 according to the principles of the present invention. In embodiments, the energy regulation facility 2002 regulates energy, voltage, current, power, or other energy for the photovoltaic sensing facility. In embodiments, the energy regulation facility 2002 is adapted to be connected to the photovoltaic facility 1502 and/or the sensing facility. In embodiments, the connection may be continuous, intermittent, wired, wireless, or otherwise configured. In embodiments, the energy regulation facility 2002 may be adapted in parallel, series, or other connection topology. In embodiments, the energy regulation facility 2002 regulates energy generated by the photovoltaic facility 1502 and/or delivers regulated energy to the sensing facility 1504. For example, the energy regulation facility 2002 may be and/or include a capacitor, capacitance facility, inductor, inductance facility, processor adapted to regulate, circuit adapted to regulate, transformer circuit, or other facility adapted to filter energy.

Figure 21:
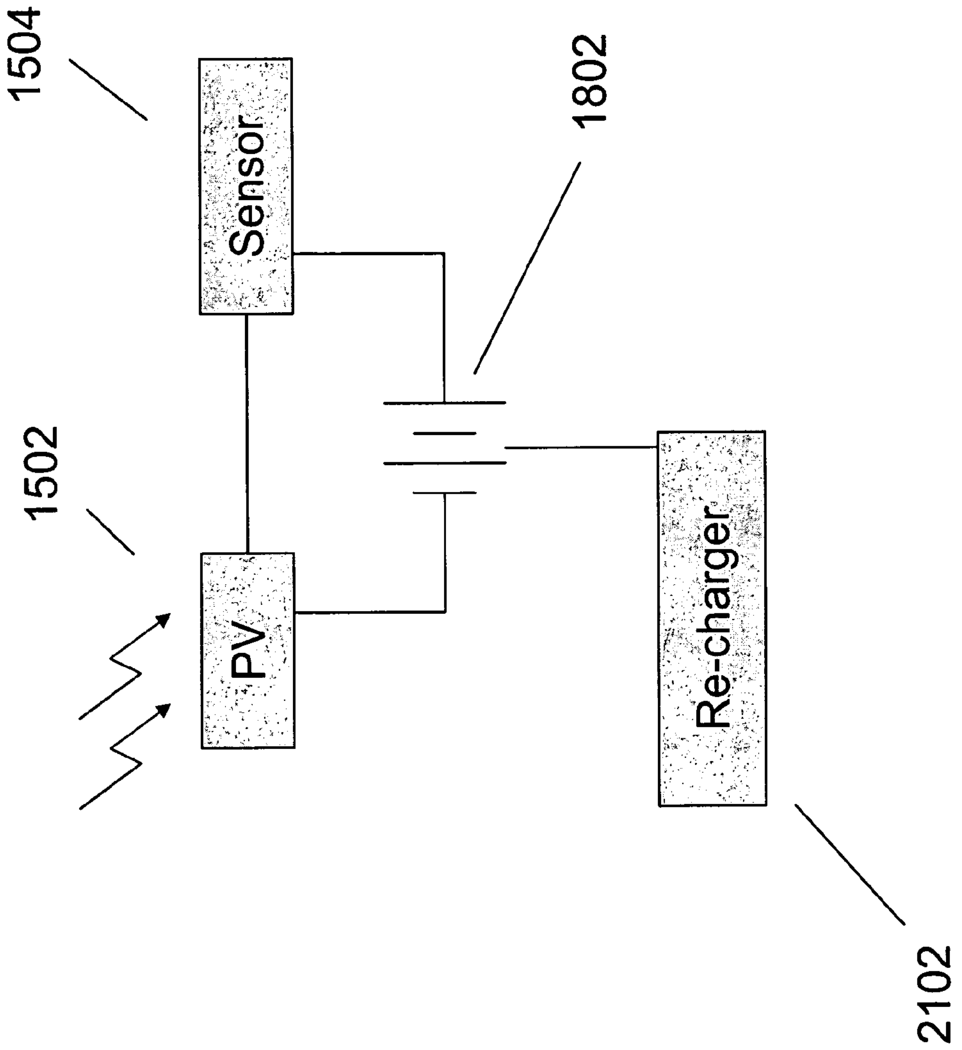
FIG. 21 illustrates a photovoltaic sensor facility including a photovoltaic facility, a sensing facility, an energy storage facility, and a recharging facility according to the principles of the present invention.

FIG. 21 illustrates a photovoltaic sensor facility including a photovoltaic facility 1502, a sensing facility 1504, an energy storage facility 1802, and a recharging facility 2102 according to the principles of the present invention. In embodiments, the recharging facility 2102 is adapted to recharge energy, voltage, current, power, or other energy associated with the photovoltaic sensing facility. In embodiments, the recharging facility 2102 is adapted to be connected to the photovoltaic facility 1502, the energy storage facility 1802, and/or the sensing facility 1504. In embodiments, the connections may be continuous, intermittent, wired, wireless, or otherwise configured. In embodiments, the recharging facility 2102 may be adapted in parallel, series, or other connection topology. In embodiments, the recharging facility 2102 recharges energy stored by the energy storage facility. For example, the recharging facility 2102 may be and/or include a capacitive recharger, inductive recharger, mechanical recharger, electrical recharger, motion recharger, sensor recharger, or other recharging facility. In embodiments, the recharging facility may be adapted to receive power from ac sources, dc sources, photovoltaic sources, rf sources, inductively coupled sources, capacitively coupled sources, or other power sources. In embodiments, the recharging facility is adapted to receive power from multiple sources.

Figure 22:
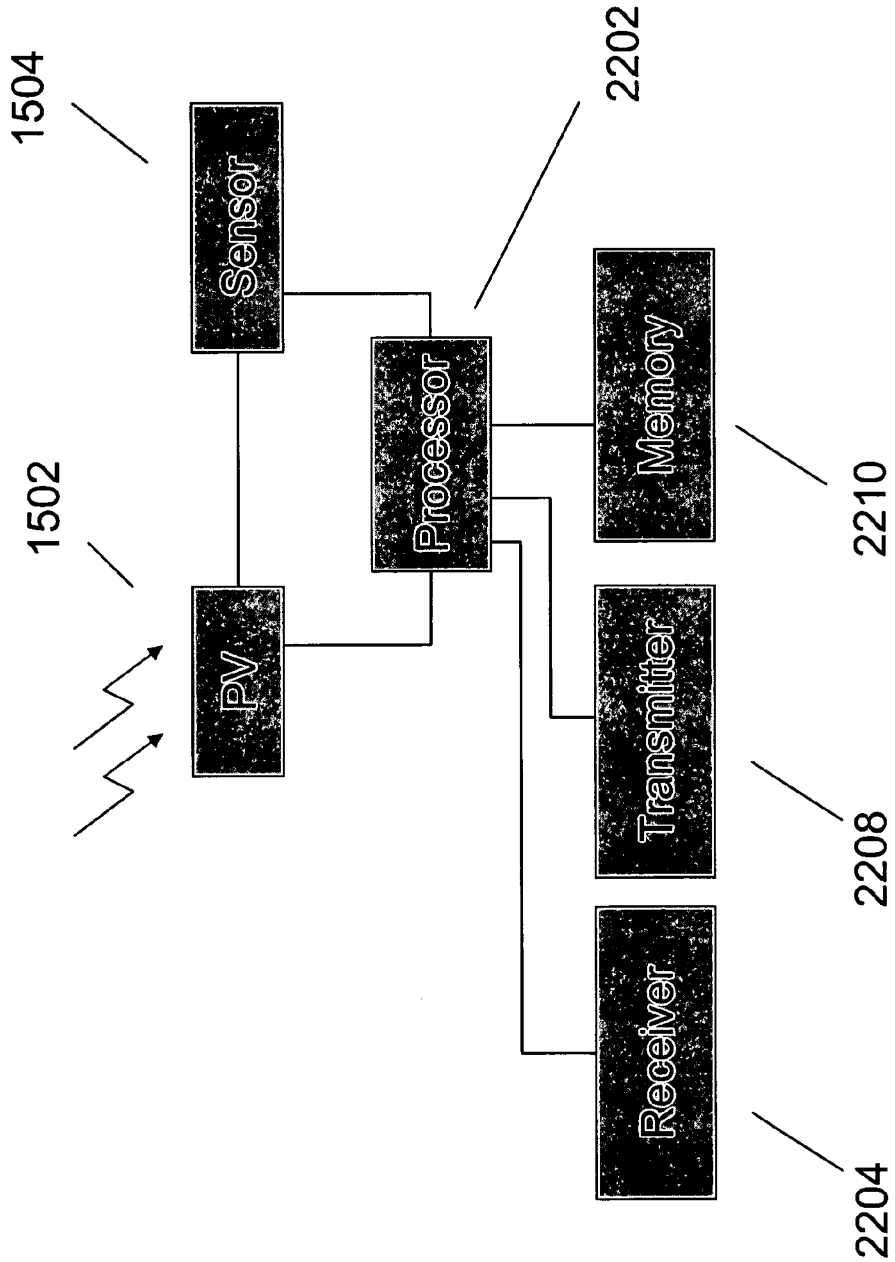
FIG. 22 illustrates a photovoltaic sensor facility including a photovoltaic facility, a sensing facility, a processing facility, a receiving facility, a transmitting facility, and a memory facility according to the principles of the present invention.

FIG. 22 illustrates a photovoltaic sensor facility including a photovoltaic facility 1502, a sensing facility 1504, a processing facility 2202, a receiving facility 2204, a transmitting facility 2208, and a memory facility 2210 according to the principles of the present invention. In embodiments, the processing facility 2202 may process signals received from external sources and/or process signals from the sensing and/or photovoltaic facilities. In embodiments, the processing facility 2202 may be associated with a transmitting facility 2208 adapted to transmit data, information, signals, and the like. In embodiments, the processing facility may be associated with a receiving facility 2204 adapted to receive data, information, signals, and the like. In embodiments, the processing facility 2202 may be associated with a memory facility 2210 adapted to store data, information, signals, and the like. In embodiments, the connections among the several facilities may be continuous, intermittent, wired, wireless, or otherwise configured. In embodiments, the facilities may be connected in parallel, series, or other connection topology. In embodiments, the processor may be a microprocessor, a circuit, a passive circuit, an active circuit, or other facility adapted for processing data, signals, information and the like. For example, the receiver may be adapted to receive an initiation signal to initiate a sensor function in a wireless or wired fashion. Once the signal is received by the receiving facility, the receiving facility may communicate information, data, a signal, or the like to the processor, and the processor may initiate a sensing function. In embodiments, the transmitter is adapted to transmit as directed by the processor. For example, the processor may collect data from the sensing facility and transmit the data, or indication from the data, through the transmitter in a wireless or wired fashion. In embodiments, the processor stores data, information, signals, and/or the like in the memory facility 2210. For example, the processor may store data associated with a signal received by the receiving facility, data associated with a signal transmitted by the transmitting facility, and/or data gathered from the photovoltaic facility and/or the sensing facility. For example, the sensing facility may produce data, and the processor may store the data in memory. By way of another example, data may be received that relate to the system, and the processor may save information relating to the received information. The received information may be calibration information, initiation information, termination information, collection information, or other information.

Figure 23:
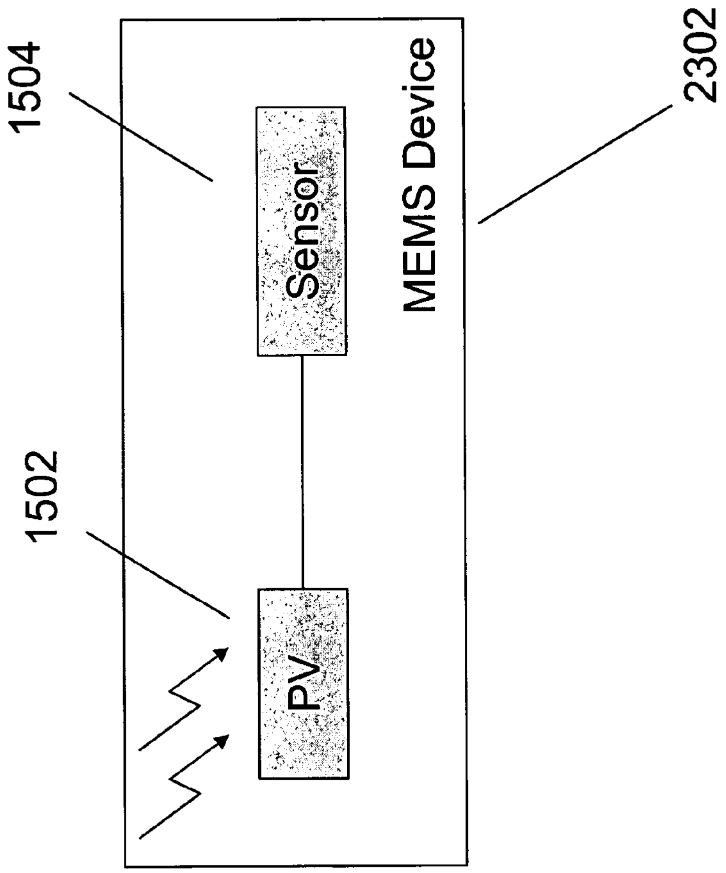
FIG. 23 illustrates a photovoltaic sensor facility including a photovoltaic facility, a sensing facility, and an MEMS facility according to the principles of the present invention.

FIG. 23 illustrates a photovoltaic sensor facility including a photovoltaic facility 1502, a sensing facility 1504, and an MEMS facility 2302 according to the principles of the present invention. In embodiments, the photovoltaic sensor facility may be incorporated with, incorporated onto, and/or associated with an MEMS facility 2302.

Figure 24:
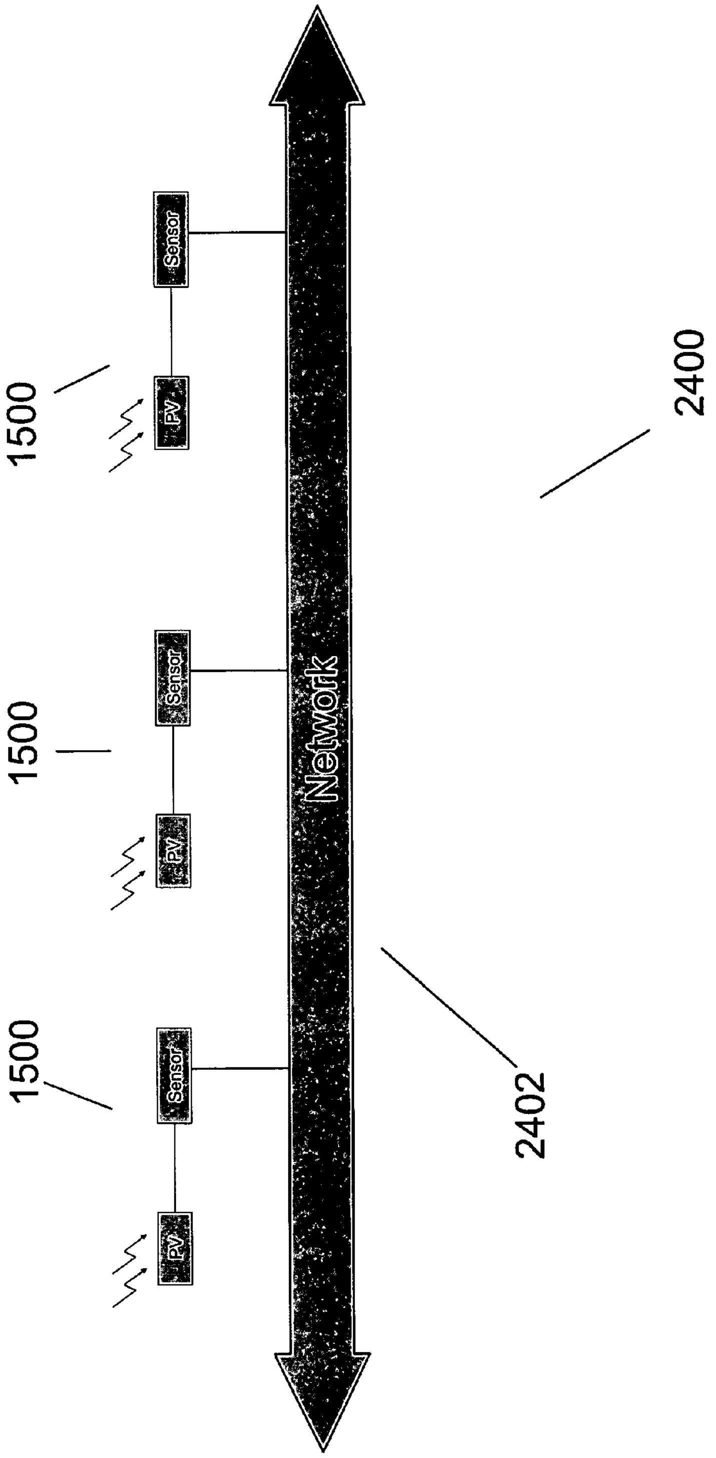
FIG. 24 illustrates a photovoltaic sensor facility network according to the principles of the present invention.

FIG. 24 illustrates a photovoltaic sensor facility network 2400 according to the principles of the present invention. In embodiments, a photovoltaic sensor facility(ies) 1500 or a photovoltaic sensor facility associated with other facilities (e.g. those facilities described in connection with FIGS. 15-23) may be associated with a network 2402. For example, a plurality of photovoltaic sensor facilities may be adapted to be connected to a network. The photovoltaic sensors for example may include transmitters and/or addressable controllers. The network may be a local area network, personal area network, wide area network, the Internet, or other network facility. For example, a network of temperature sensors may be deployed in greenhouses to monitor the temperature conditions within the greenhouses. In embodiments, the photovoltaic sensing facilities are tuned to respond to spectra that are associated with the plants' growth. For example, the particular plants may be adapted to respond favorably to blue and red light, and the photovoltaic sensor facilities may be adapted to respond to blue and/or green light. Other useful networking examples include use in military drones, automotive networks, buoys, espionage, homeland security, reservoir monitoring, sensitive industrial plants, and nuclear waste management. In embodiments, the photovoltaic sensor facilities may include wireless communication facilities such as Bluetooth, ZigBee, or other personal area technologies.

Figure 25:
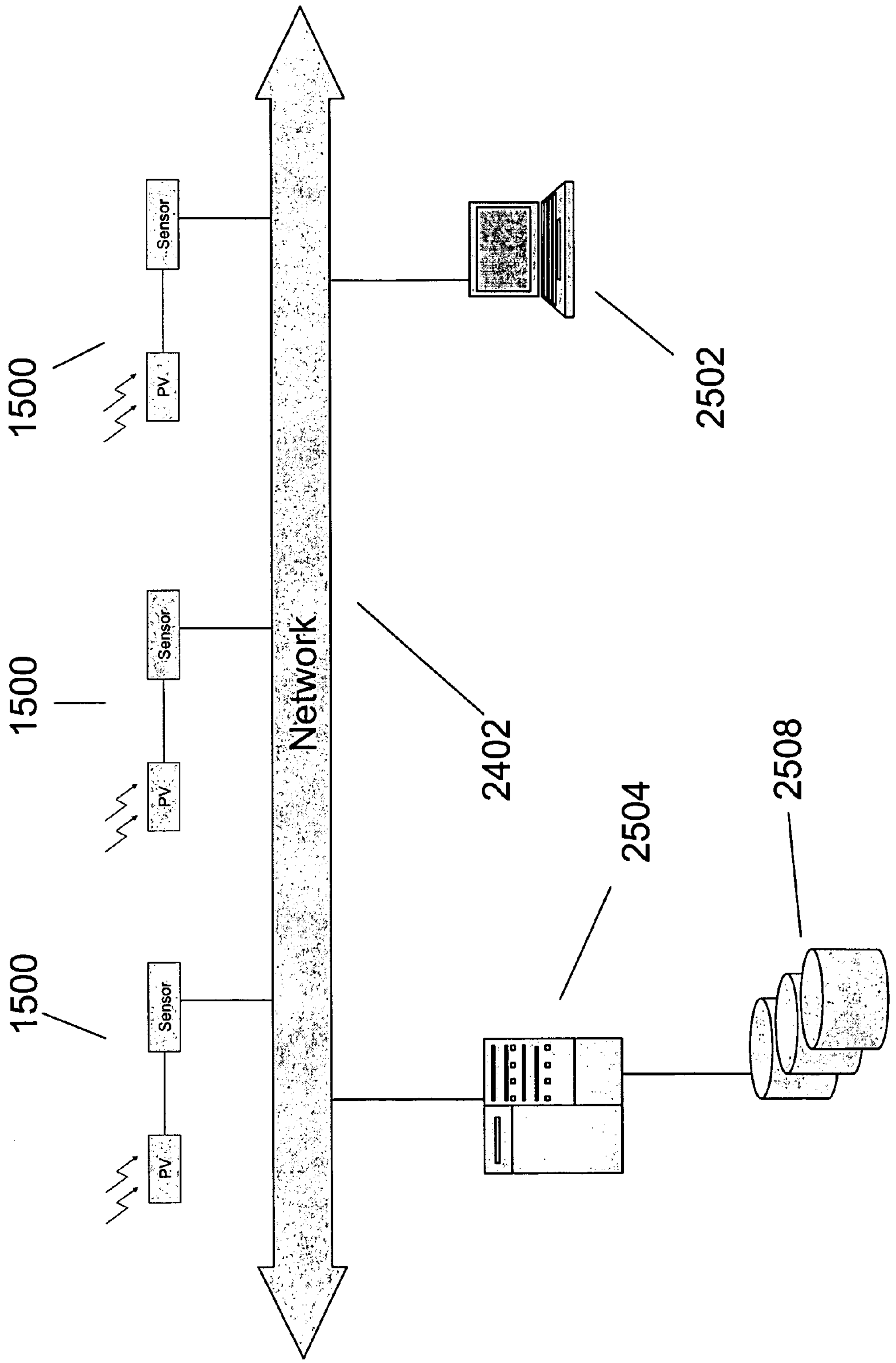
FIG. 25 illustrates a photovoltaic sensor facility network according to the principles of the present invention.

FIG. 25 illustrates a photovoltaic sensor facility network according to the principles of the present invention. In embodiments, a photovoltaic sensor facility(ies) 1500, or a photovoltaic sensor facility associated with other facilities (e.g. those facilities described in connection with FIGS. 15-23) may be associated with a network 2402. For example, a plurality of photovoltaic sensor facilities may be adapted to be connected to a network. The photovoltaic sensors for example may include transmitters and/or addressable controllers. The network may be a local area network, personal area network, wide area network, the Internet, or other network facility. In embodiments, the network 2402 is associated with a server 2504 and a client computing facility 2502. In embodiments, the server 2504 may be associated with a database and/or set of databases 2508. For example, the photovoltaic sensing facilities may communicate information through a network 2402, and the client computing facility may collect the information directly and/or through the server 2504. The server and/or the client computing facility may be adapted to interact with the photovoltaic sensing facilities for a number of activities. For example, the interaction may initiate acquisition or termination of a process, collect information relating to the sensed information, or collect information relating to a component of the photovoltaic sensing facility (e.g. an energy storage facility condition).

Figure 26:
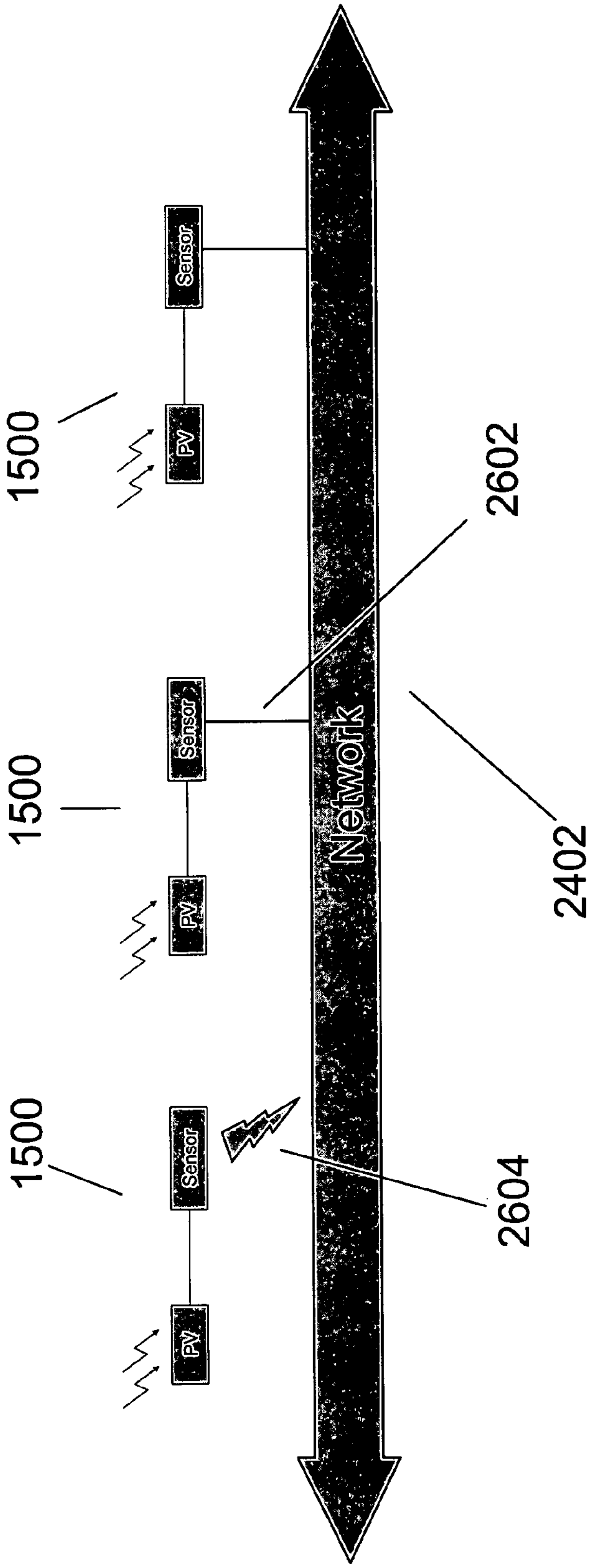
FIG. 26 illustrates a photovoltaic sensor facility network according to the principles of the present invention.

FIG. 26 illustrates a photovoltaic sensor facility network according to the principles of the present invention. In embodiments, a photovoltaic sensor facility(ies) 1500, or a photovoltaic sensor facility associated with other facilities (e.g. those facilities described in connection with FIGS. 15-23) may be associated with a network 2402. For example, a plurality of photovoltaic sensor facilities may be adapted to be connected to a network. In embodiments, photovoltaic sensor facilities may be adapted to connect (e.g. transmit and/or receive) to the network through wired transmission 2602 or wireless transmission 2604.

Figure 27:
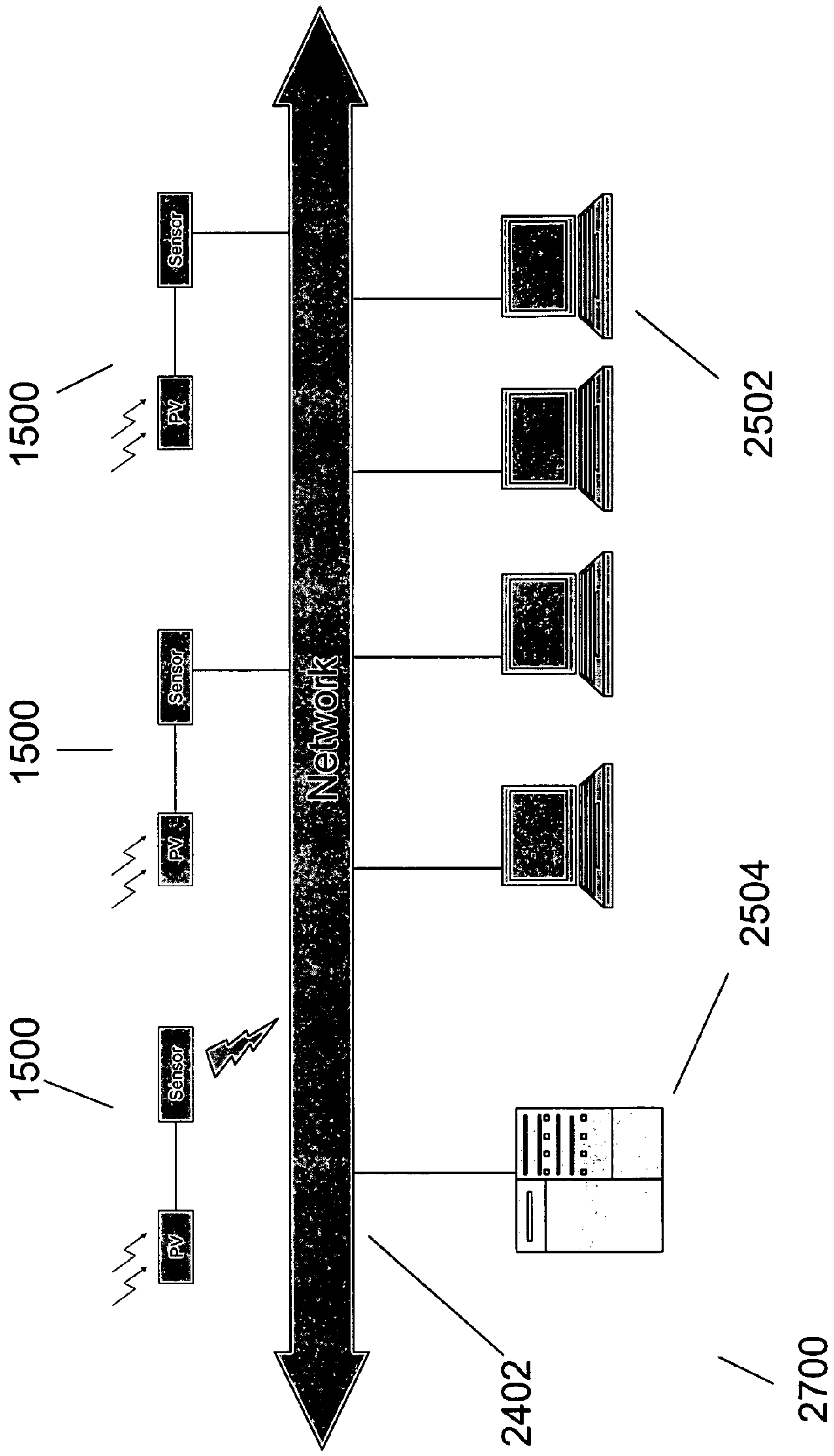
FIG. 27 illustrates a photovoltaic sensor facility network according to the principles of the present invention.

FIG. 27 illustrates a photovoltaic sensor facility network 2700 according to the principles of the present invention. In embodiments, a photovoltaic sensor facility(ies) 1500, or a photovoltaic sensor facility associated with other facilities (e.g. those facilities described in connection with FIGS. 15-23) may be associated with a network 2402. In embodiments, the network 2402 may be a local area network where individual computers 2502 are adapted to communicate via the network and/or communicate with a server.

Figure 28:
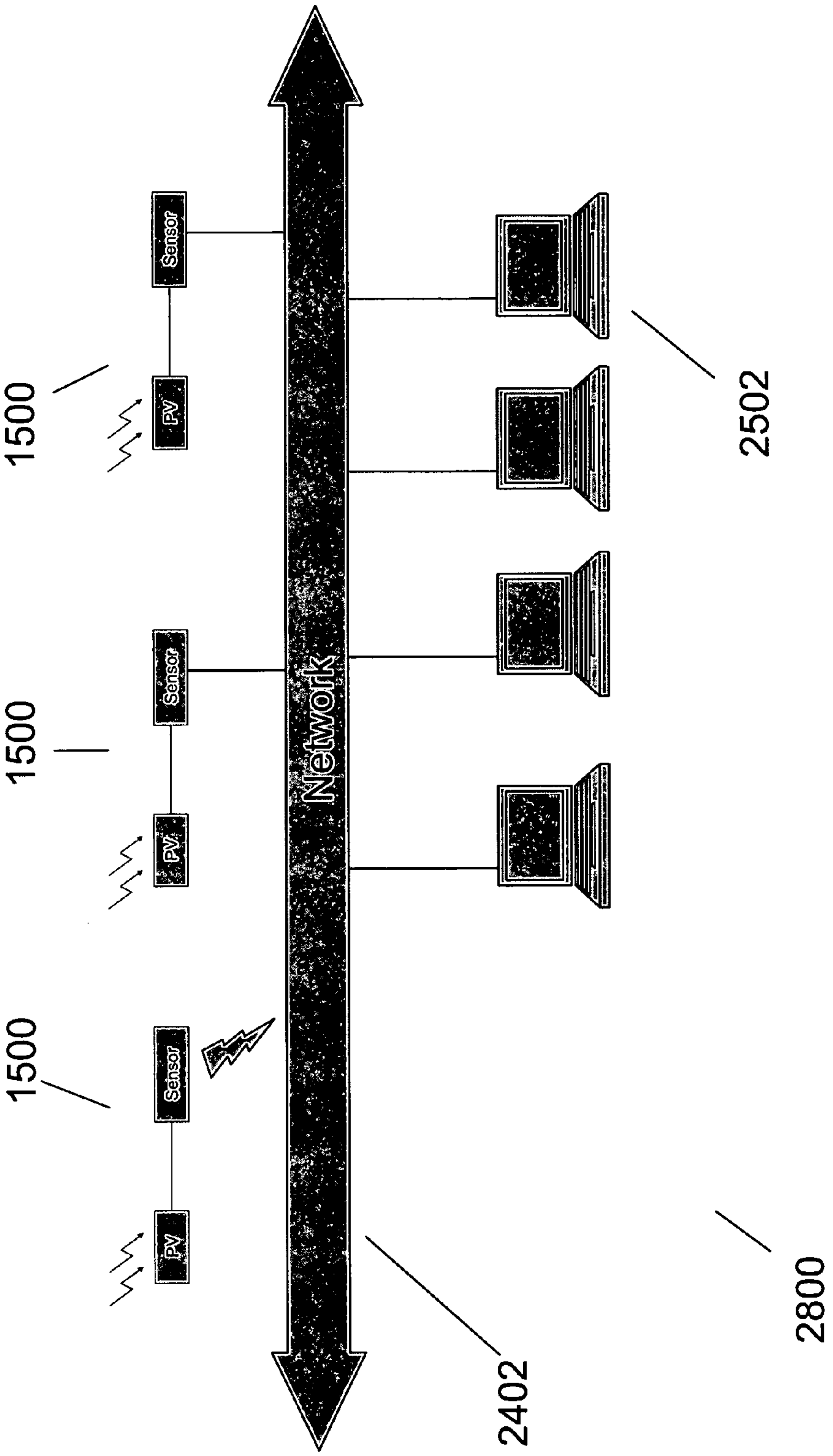
FIG. 28 illustrates a photovoltaic sensor facility peer-to-peer network according to the principles of the present invention.

FIG. 28 illustrates a photovoltaic sensor facility peer-to-peer network 2800 according to the principles of the present invention. In embodiments, a photovoltaic sensor facility(ies) 1500, or a photovoltaic sensor facility associated with other facilities (e.g. those facilities described in connection with FIGS. 15-23) may be associated with a peer-to-peer network 2402.

Figure 29:
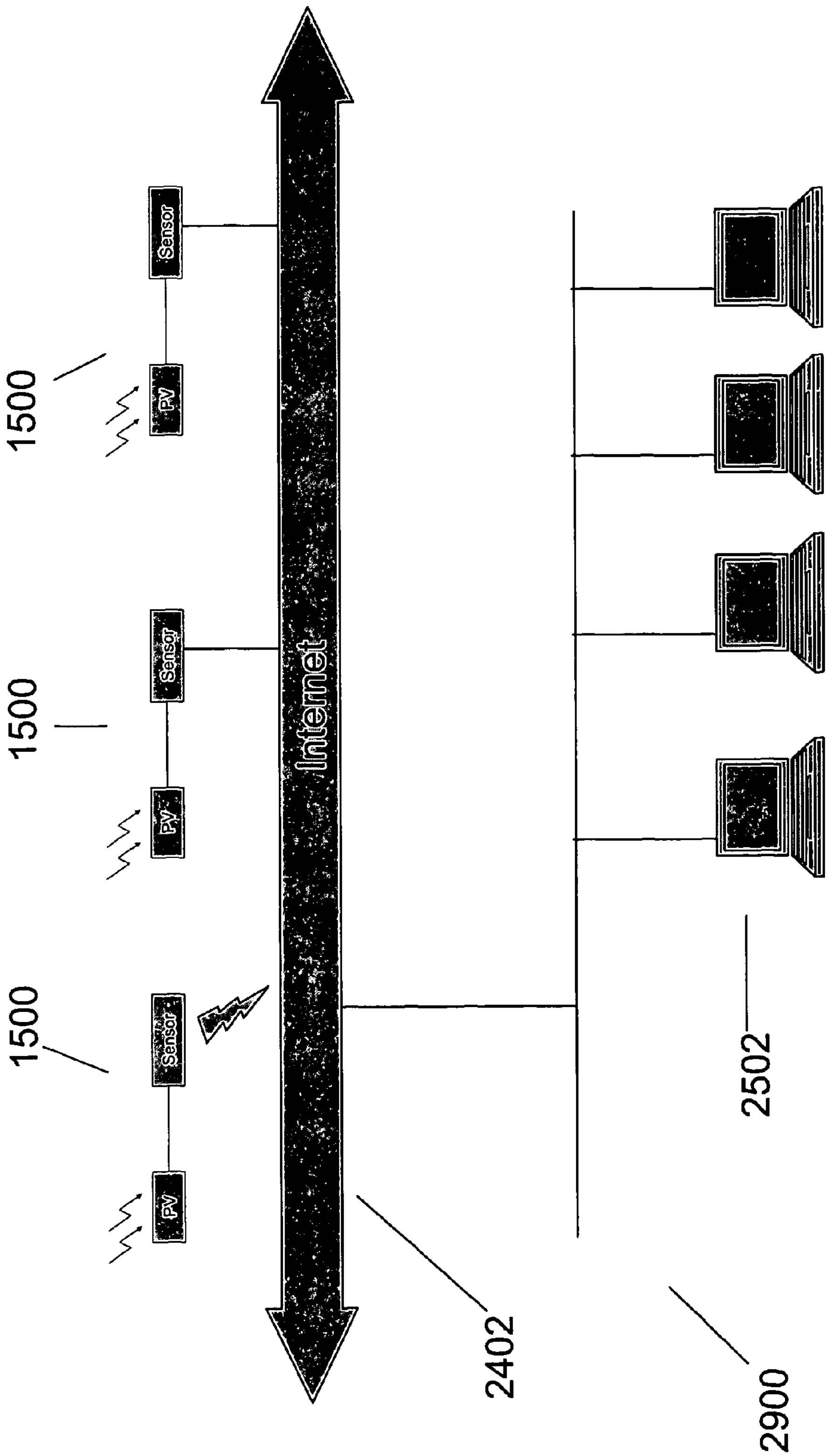
FIG. 29 illustrates a photovoltaic sensor facility network wherein the communication between devices involves the internet according to the principles of the present invention.

FIG. 29 illustrates a photovoltaic sensor facility network 2900 wherein the communication between devices involves the internet according to the principles of the present invention. In embodiments, a photovoltaic sensor facility(ies)

1500 or a photovoltaic sensor facility associated with other facilities (e.g. those facilities described in connection with FIGS. 15-23) may be associated with the internet 2402.

Figure 30:
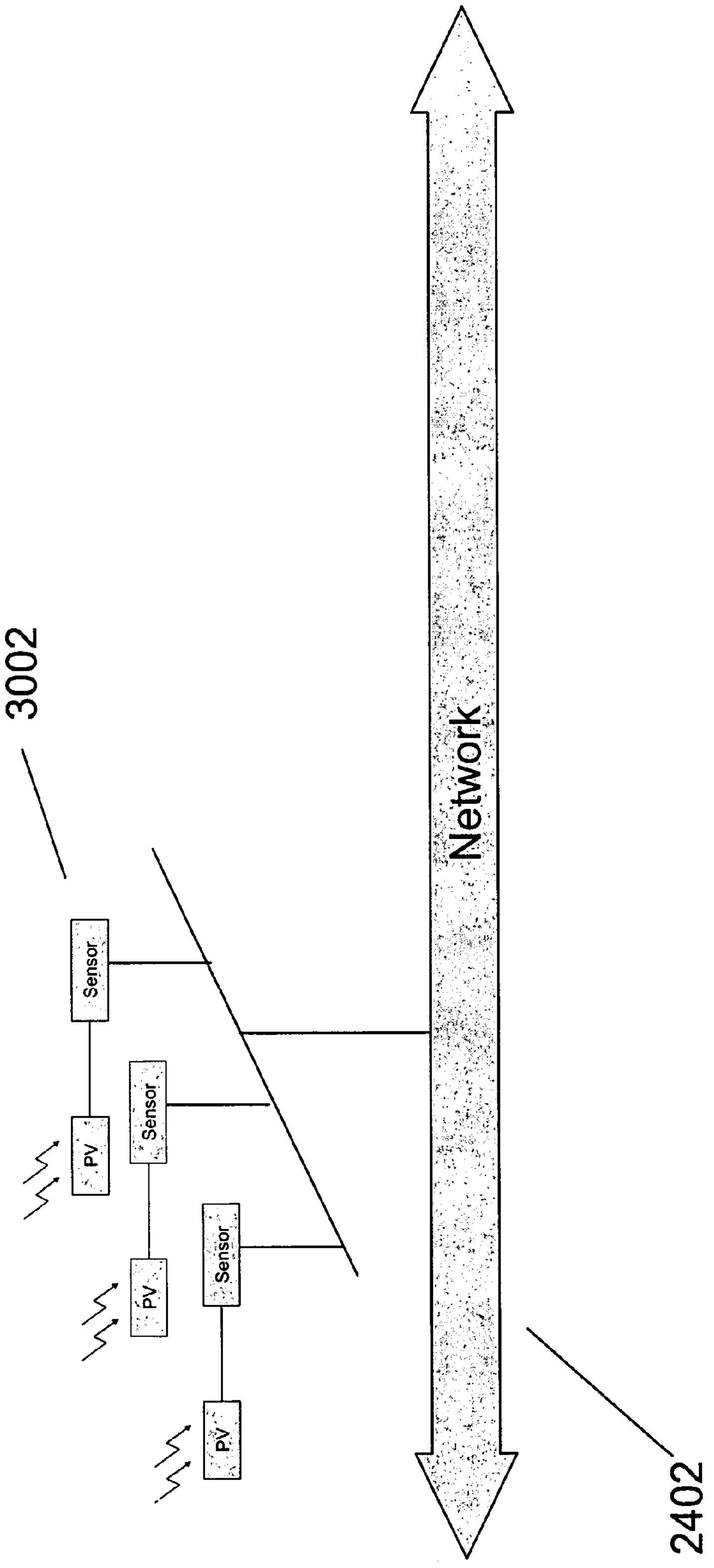
FIG. 30 illustrates a photovoltaic sensor facility array in communication with a network according to the principles of the present invention.

FIG. 30 illustrates a photovoltaic sensor facility array 3002 in communication with a network 2402 according to the principles of the present invention. In embodiments, a photovoltaic sensor facility(ies) 1500, or a photovoltaic sensor facility associated with other facilities (e.g. those facilities described in connection with FIGS. 15-23) may associated in an array, and the array of photovoltaic sensors may be associated with the network 2402.

Figure 31:
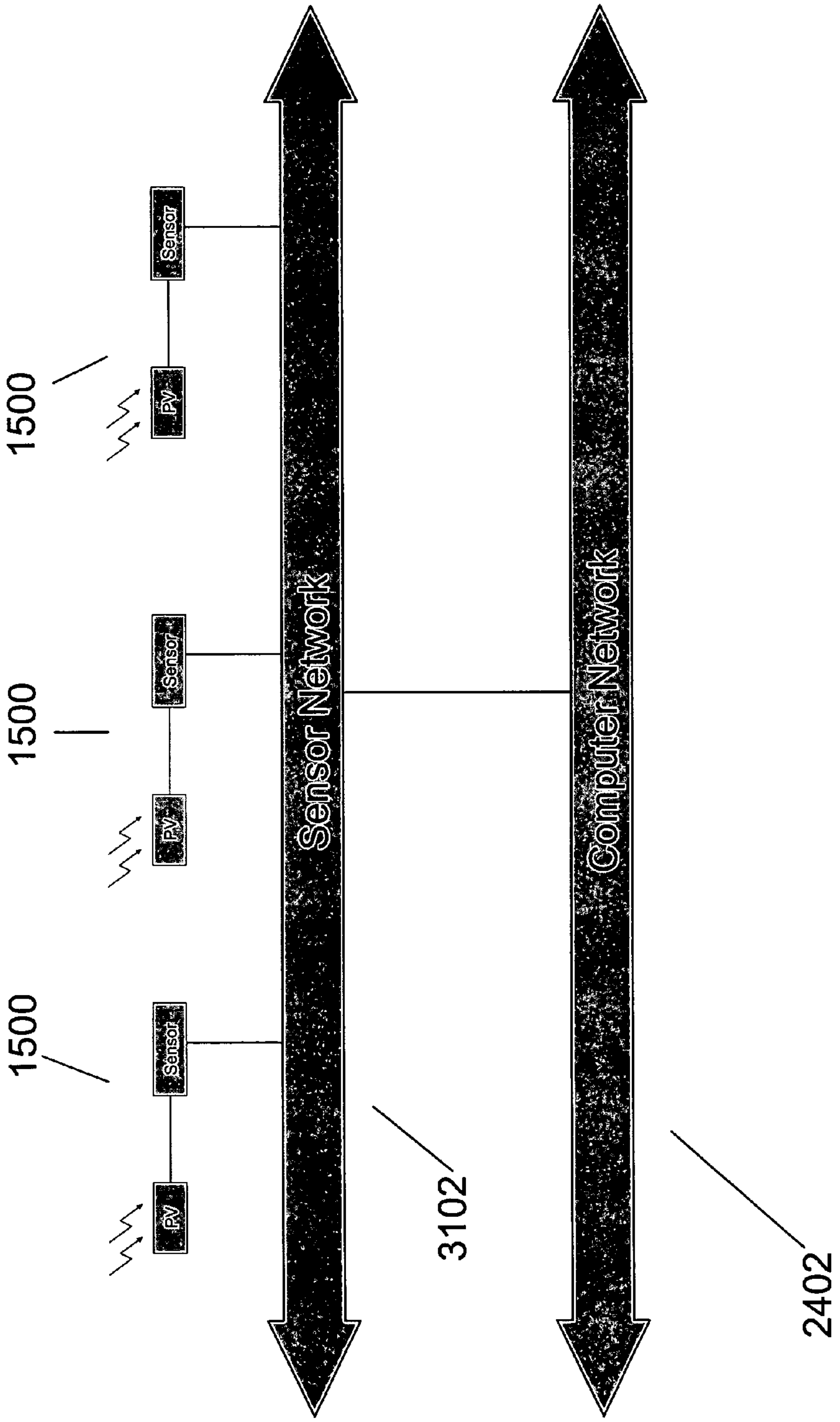
FIG. 31 illustrates several photovoltaic sensor facilities arranged on a sensor network wherein the network of sensors is in communication with a computer network according to the principles of the present invention.
Figure 32A:
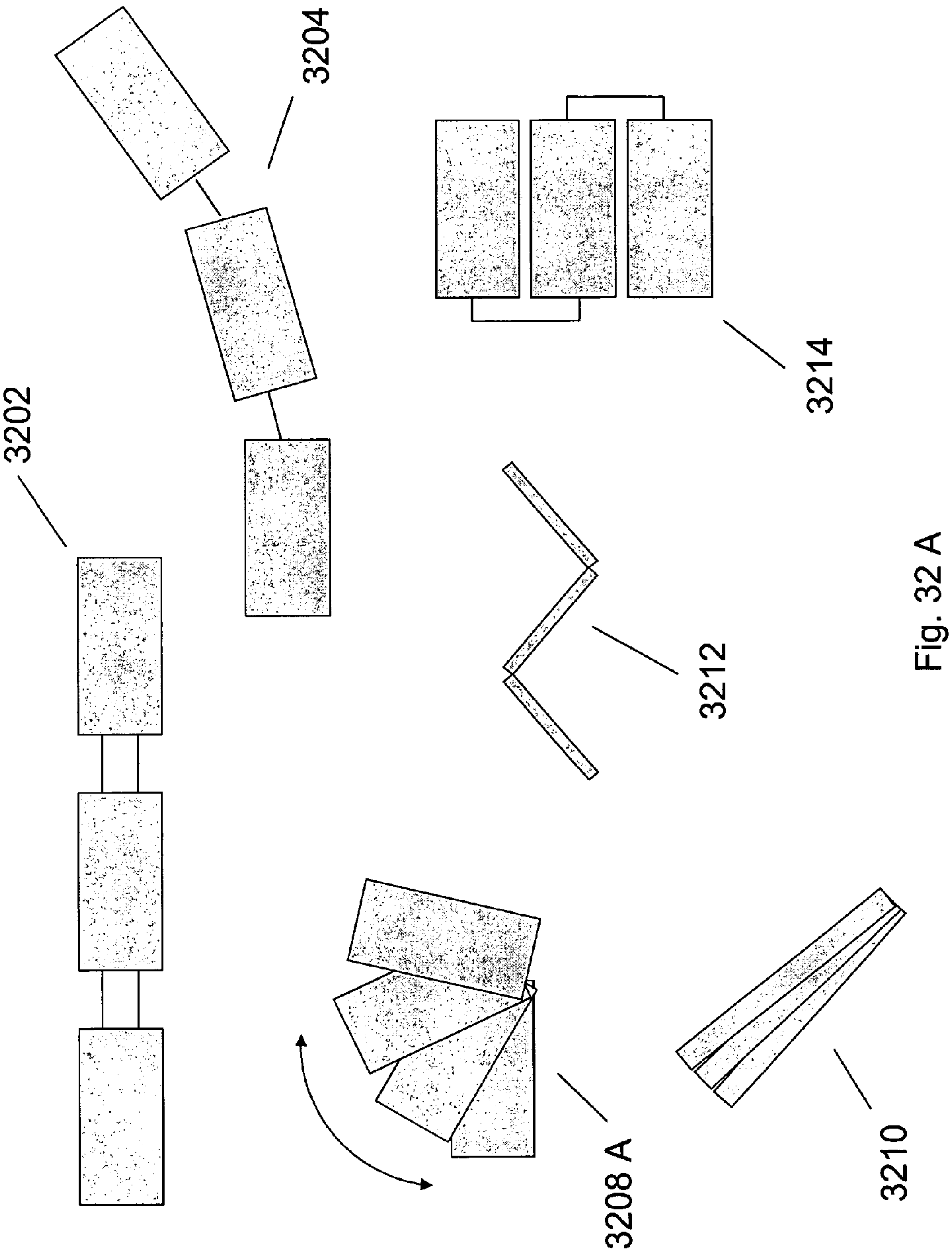
FIGS. 32 A, B, C, and D illustrate several variable photovoltaic structures according to the principles of the present invention.
Figure 32B:
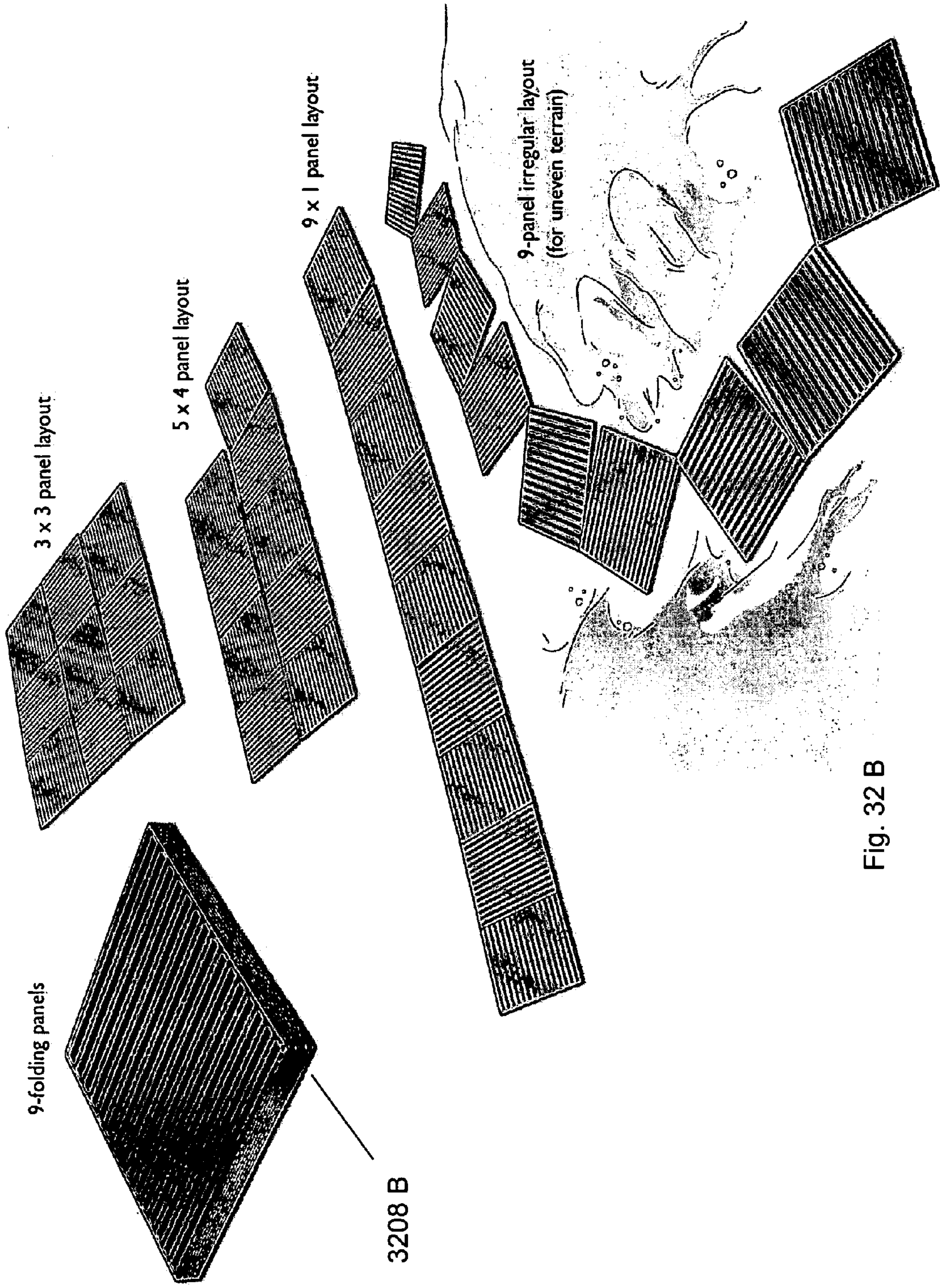
Figure 32C:
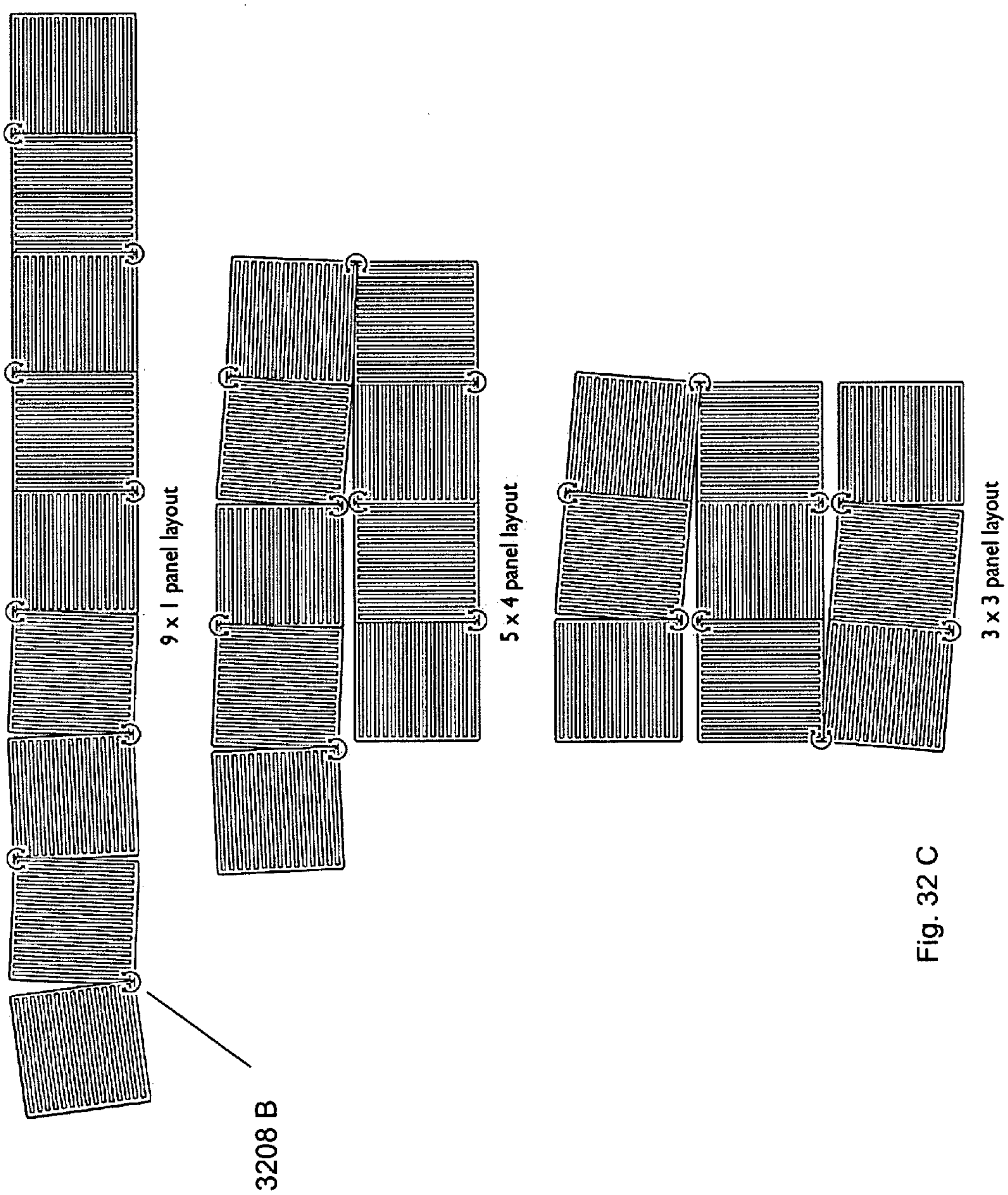
Figure 32D:
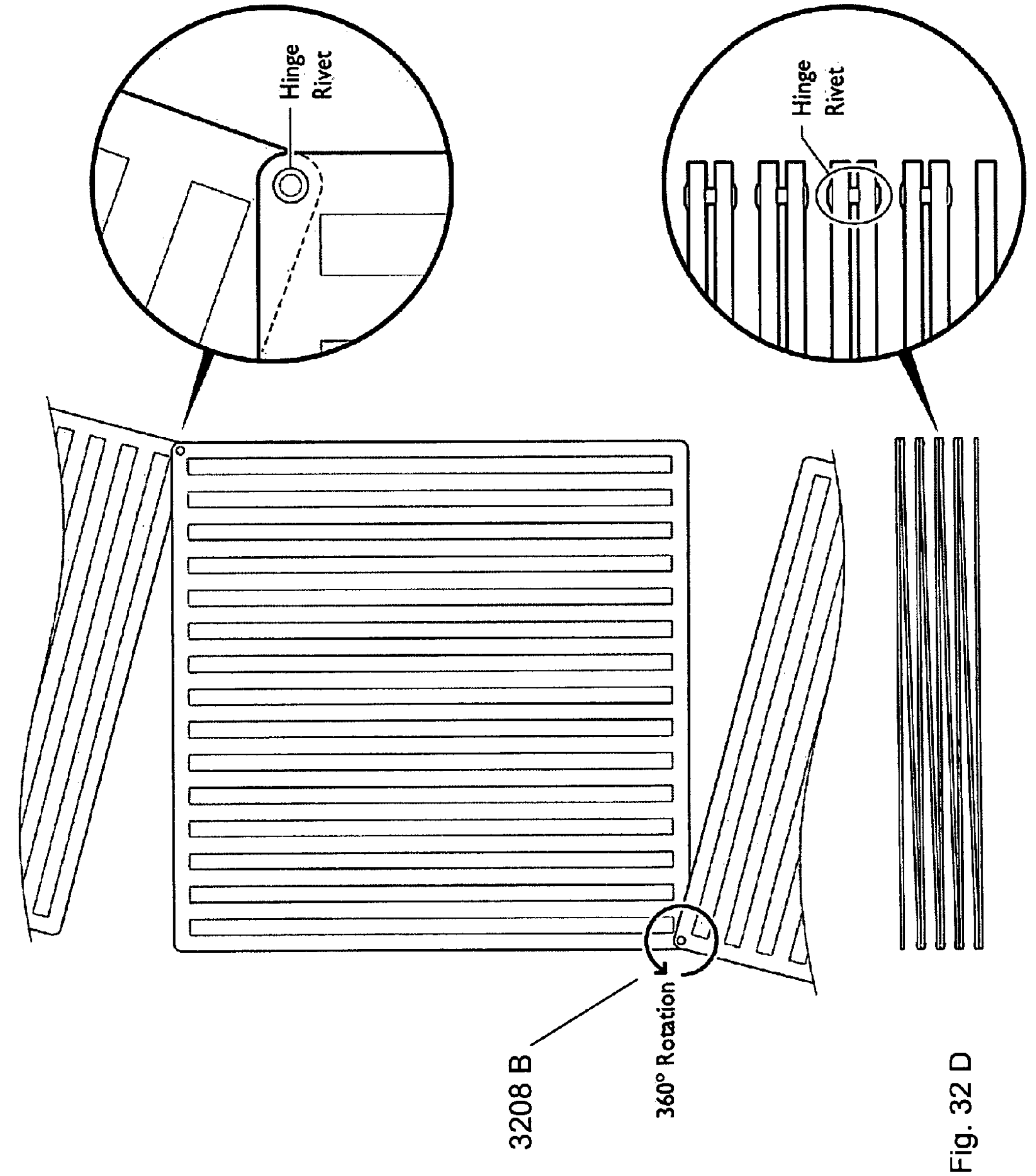

FIG. 31 illustrates several photovoltaic sensor facilities arranged on a sensor network 3102 wherein the network of sensors is in communication with a computer network 2402 according to the principles of the present invention. In embodiments, a photovoltaic sensor facility(ies) 1500, or a photovoltaic sensor facility associated with other facilities (e.g. those facilities described in connection with FIGS. 15-23) may associated in an array, through a sensor network, and the array of photovoltaic sensors may be associated with the computer network 2402.

An aspect of the present invention relates to photovoltaic variable structures. In embodiments, variable structures may take the form of variable shaped structures. For example, photovoltaic structures may be provided to allow expansion and contraction to fit a particular application, or variable structures may be provided to allow the available power to be varied. In embodiments, variable structures may take the form of folding photovoltaics, flexible photovoltaics, expandable photovoltaics, bendable photovoltaics, shifting structures, and other structures adapted to provide variable structures.

FIGS. 32 A, B, C, and D illustrate several variable photovoltaic structures according to the principles of the present invention. For example, variable structure 3202 illustrates several photovoltaic elements connected through flexible segments. The flexible segments may allow the structure to be folded, bent, curved, or otherwise shaped to fit a particular device, application, or environment. In embodiments, the flexible segments also provide for variable power, voltage, and/or current delivery from the photovoltaic. For example, if one photovoltaic element is folded over another, leaving less exposed active surface area, the photovoltaic will produce less power, voltage, and/or current. In embodiments, this variable structure provides flexible power control suitable to the application, device, and or environment. In embodiments, variable structure photovoltaics include multiple connections, such as variable structure 3202, and some include single element connections, such as 3204. There are many variations to the methods of connecting elements of the photovoltaic structures, for example parallel, series, or other connections, and the present invention is not limited to any particular connection method, and such variants are encompassed by the present invention.

Variable structure 3208 (A) has several photovoltaic elements joined at one corner to provide a fan-like variable photovoltaic structure. Variable structure 3208 (B) has several photovoltaic elements connected together by joining a first and second corner of several photovoltaic elements. Variable structure 3210 has several photovoltaic elements joined at one corner to provide a fan-like variable photovoltaic structure with narrow elements or wings. Variable structure 3214 illustrates an alternating series connection topology connecting several photovoltaic elements. Variable structure 3212 illustrates a compact foldable photovoltaic system where the photovoltaic elements are close together.

Figure 33:
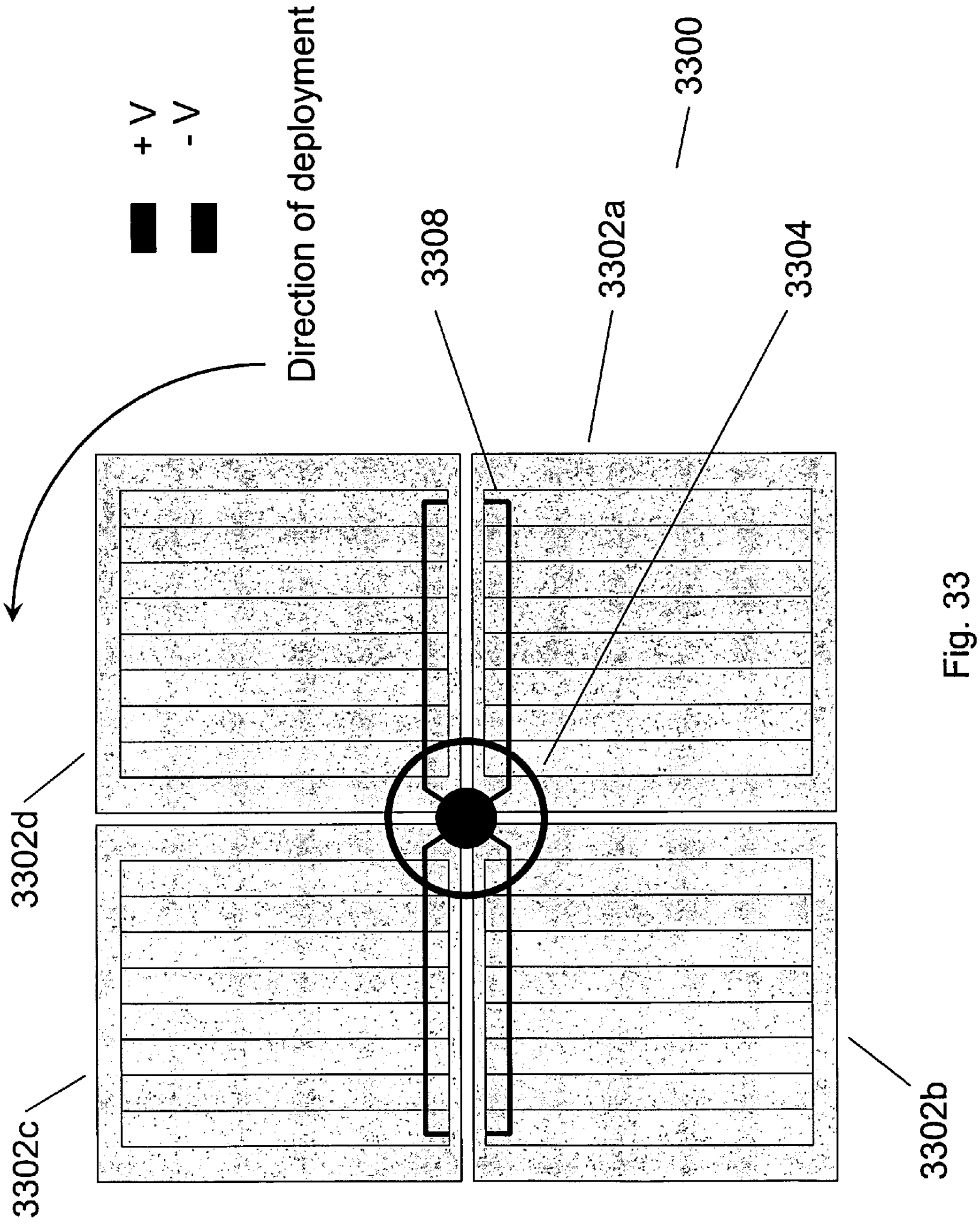
FIG. 33 illustrates a variable photovoltaic structure wherein the variable photovoltaic structure includes multiple photovoltaic segments connected through electrical segments which can rotate or be rotated according to the principles of the present invention.

FIG. 33 illustrates a variable photovoltaic structure 3300 wherein the variable photovoltaic structure includes multiple photovoltaic segments 3302 connected through electrical segments which can rotate or be rotated 3304 and 3308. In embodiments, the photovoltaic segments 3302*a-d* rotate over one another (e.g. in the indicated direction of rotation). The electrical connections 3304 and 3308 for the photovoltaic segments 3302*a-d* are adapted to remain in electrical association with the photovoltaic segments during rotation. For example, electrical connection 3304 is circular to retain connection with the negative poles of the photovoltaic segments while the segments are rotated, and electrical segments 3308 are linear and connect with a center rotational point to remain electrically connected with the positive poles of the photovoltaic segments. It should be appreciated that the present invention is not limited to any particular electrical or mechanical connection facility, and there are many other electrical connections envisioned and encompassed by the present invention. For example, each photovoltaic segment may be connected to positive and negative electrical connections, and the several electrical connections may be attached directly or without secondary rotational components. A connection facility may also involve capacitive, inductive, or other electrical connection facilities. In embodiments, the rotatable segments may be provided for a flexibly shaped photovoltaic facility. In embodiments, the rotatable segments may be provided to provide a variable power photovoltaic facility. For example, as the photovoltaic segments are rotated over one another, the exposed surface area may be reduced, and the reduction in exposed surface area may result in reduced power generation.

Figure 34:
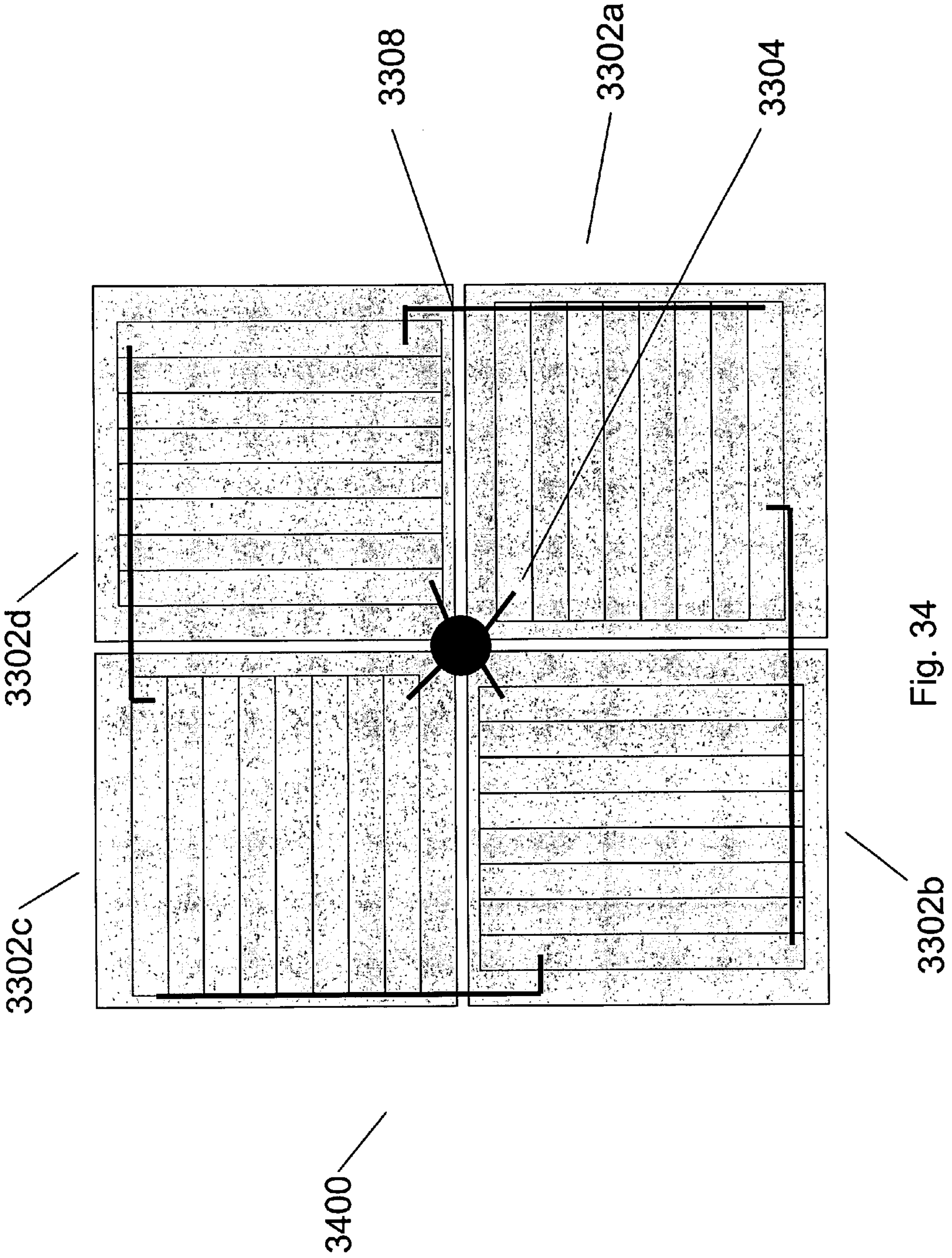
FIG. 34 illustrates another variable photovoltaic structure wherein the variable photovoltaic structure includes multiple photovoltaic segments connected through foldable electrical segments according to the principles of the present invention.

FIG. 34 illustrates another variable photovoltaic structure 3400 wherein the variable photovoltaic structure includes multiple photovoltaic segments 3302 connected through foldable electrical segments 3304 and 3308. In this embodiment, the several segments may be folded over one another. In embodiments, the foldable segments may provide a variable power photovoltaic facility. For example, as the photovoltaic segments are folded over one another, the exposed surface area may be reduced, and the reduction in exposed surface area may result in reduced power generation.

Figure 35:
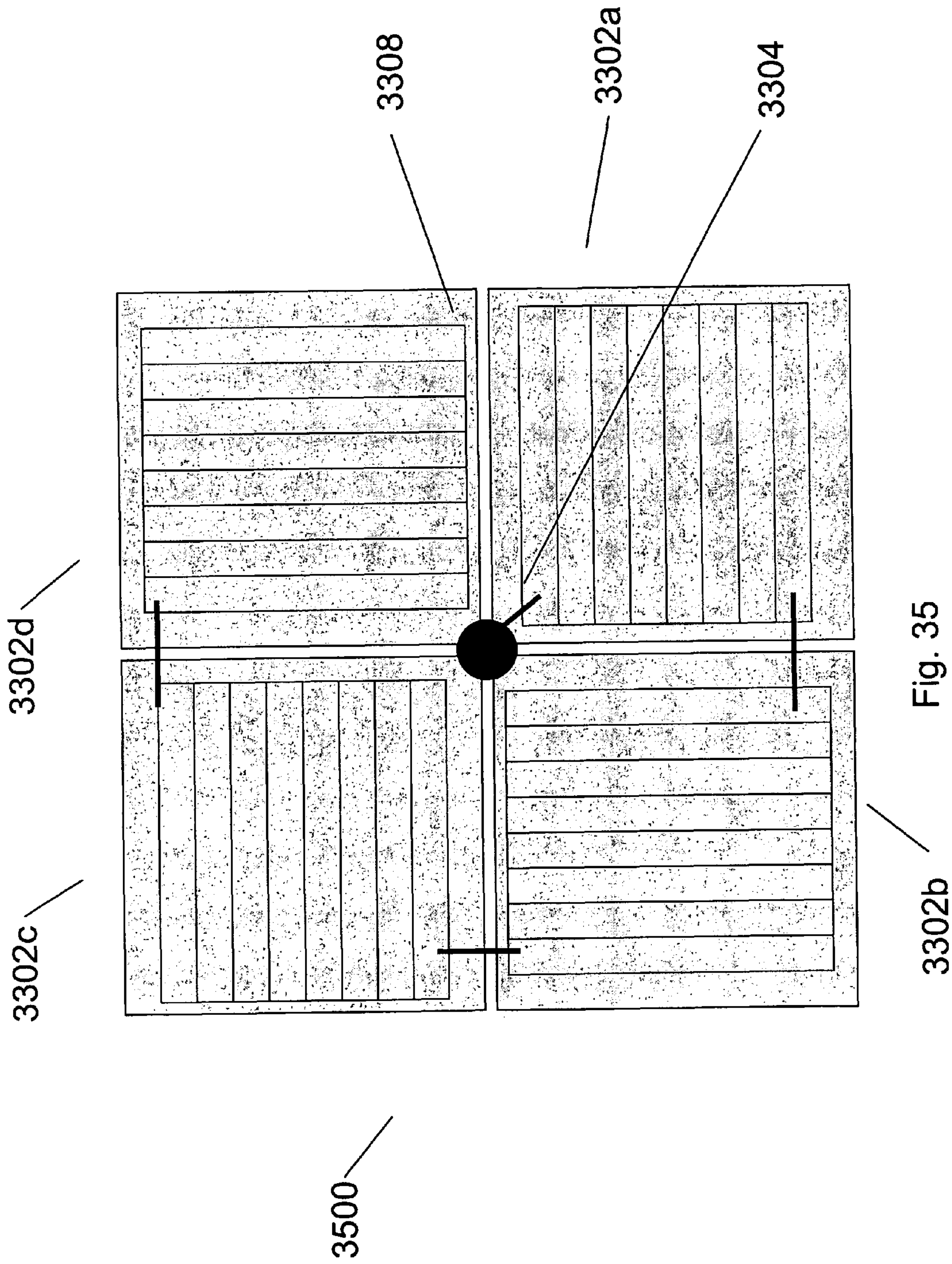
FIG. 35 illustrates another variable photovoltaic structure wherein the variable photovoltaic structure includes multiple photovoltaic segments connected through foldable electrical segments according to the principles of the present invention.

FIG. 35 illustrates another variable photovoltaic structure 3500 wherein the variable photovoltaic structure includes multiple photovoltaic segments 3302 connected through foldable electrical segments 3304 and 3308. In this embodiment, the several segments may be folded over one another. In embodiments, the foldable segments may provide a variable power photovoltaic facility. For example, as the photovoltaic segments are folded over one another, the exposed surface area may be reduced, and the reduction in exposed surface area may result in reduced power generation.

Figure 36:
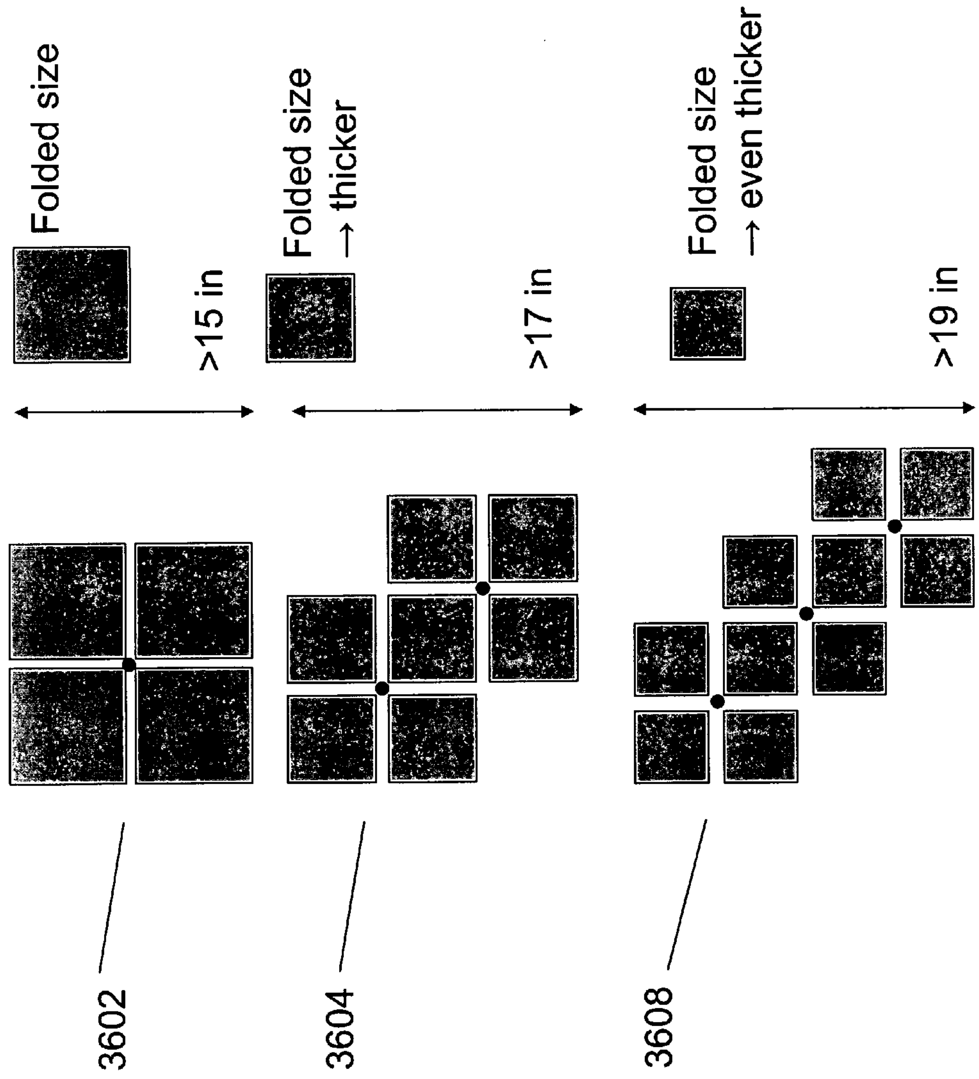
FIG. 36 illustrates several variable photovoltaic structures according to the principles of the present invention.

FIG. 36 illustrates several variable photovoltaic structures according to the principles of the present invention. In embodiments, the variable photovoltaic structures may be produced in a number of shapes with various sizes. For example, foldable photovoltaic structure 3602 includes four foldable photovoltaic segments; foldable photovoltaic structure 3604 includes seven foldable segments, and foldable photovoltaic structure 3608 includes ten foldable segments. While the illustrations in FIG. 36 indicate the structures with more segments can be folded into a smaller footprint, this is not required for all embodiments. For example, a variable photovoltaic structure may include photovoltaic segments similar in size to those of foldable photovoltaic structure 3602 but include seven, ten, more or less segments, which when folded take up approximately the same footprint of a folded foldable photovoltaic structure 3602. In embodiments, some or all of the segments may be folded to reduce the footprint and/or reduce the power generation. In embodiments, the foldable segments may be arranged to reduce the footprint but retain approximately the original exposed photovoltaic area to retain the original generation ability. In embodiments, foldable photovoltaic segments may be folded like a paper airplane, including many variants.

Figure 37:
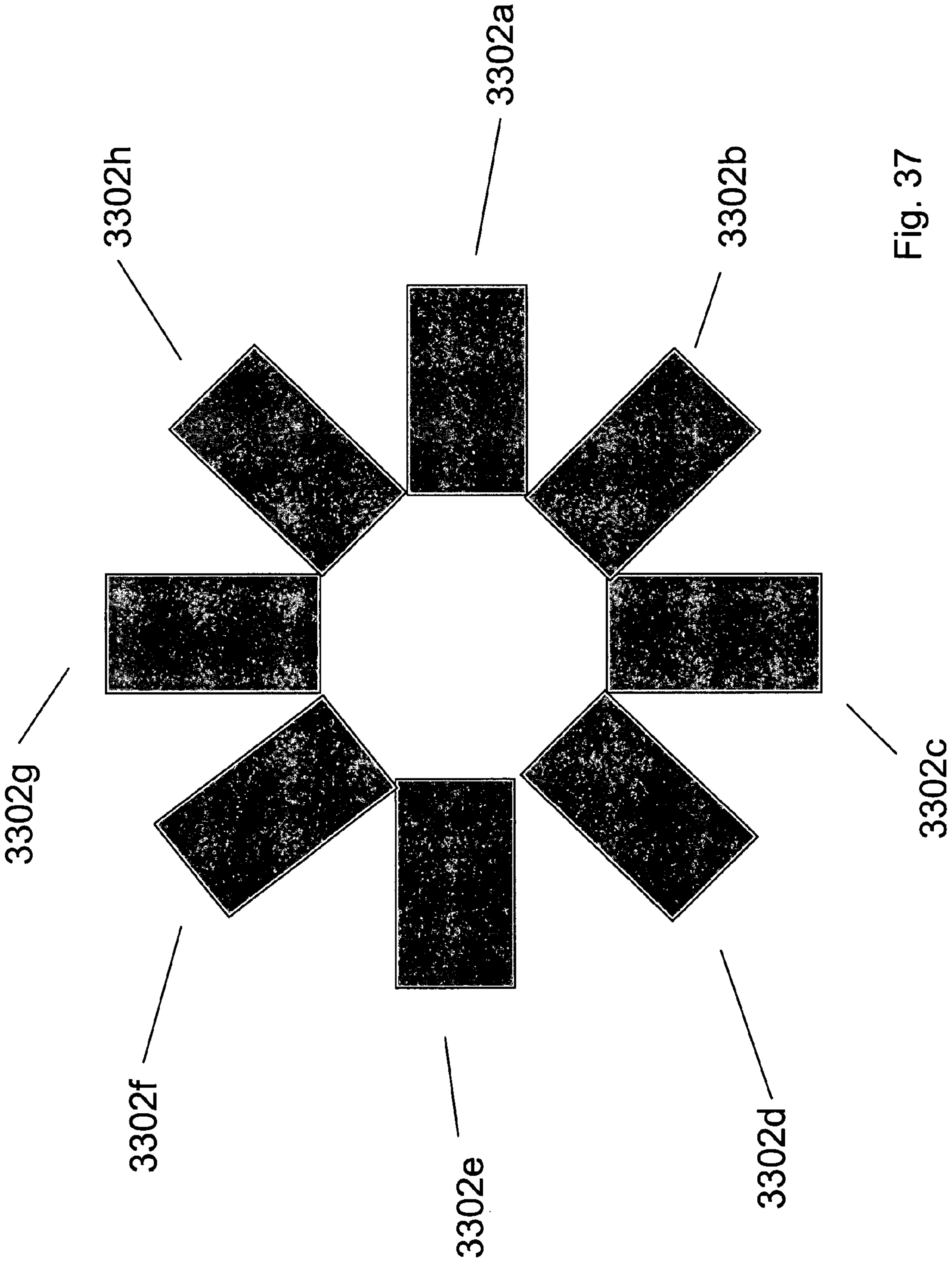
FIG. 37 illustrates a variable photovoltaic structure with eight foldable segments according to the principles of the present invention.

FIG. 37 illustrates a variable photovoltaic structure 3700 with eight foldable segments 3302. In embodiments, the foldable segments 3302*a-h* may be individually folded, folded in groups, folded as a group, folded in a forward direction, folded in a reverse direction, partially folded in a forward direction and partially folded in a reverse direction, or otherwise folded.

Figure 38:
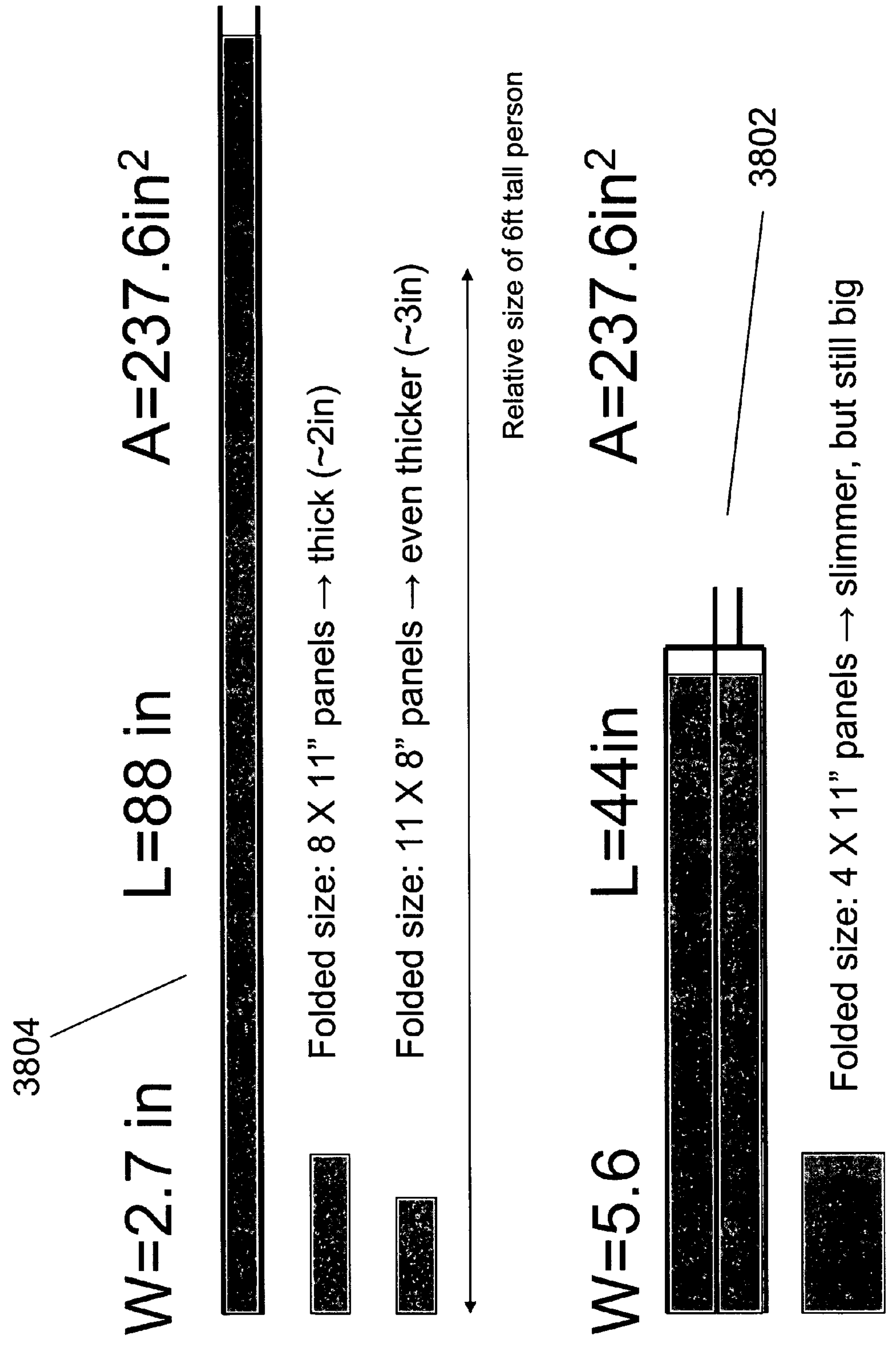
FIG. 38 illustrates several variable photovoltaic structures according to the principles of the present invention according to the principles of the present invention.

FIG. 38 illustrates several variable photovoltaic structures according to the principles of the present invention. For example, foldable photovoltaic structure 3802 may include four eleven inch panels and fully extend to forty-four inches. Foldable photovoltaic structure 3804 may include eight eleven-inch panels and fully extend to eighty-eight inches. Foldable photovoltaic structure may include eleven eight-inch segments and fully extend to eighty-eight inches. In embodiments, the foldable photovoltaic structures may be fully extended, or fully unfolded, and/or partially extended.

In embodiments a variable photovoltaic structure may be formed with a printed flexible circuit as substrate (e.g. in an array). In embodiments, the photovoltaic segments in the variable photovoltaic structure may be electrically connected in series or in parallel, a combination of series and parallel connections, or other suitable electrical connection scheme.

In embodiments, a variable photovoltaic structure may be formed to fit in pockets, on a desk, on a surface, on a device, on a notebook computer, or on, in, or around another device. In embodiments, a variable photovoltaic structure may be offered that provides flexibility in producing certain voltage, current, and/or power based on the flexible layout and/or footprint.

In embodiments, a variable photovoltaic structure may take on a form similar to a fan. The structure may be foldable for example, and/or it may rotate around an axis that lies in the plane of the module. The fan may rotate outside the plane that the module lies in. The structure may include a central electrical component in which the panels can fan out into a desired orientation. In embodiments, the electrical connections may be on opposite vertices (e.g. on squares, rectangles, etc). In embodiments, the variable structure may be optimized for volume stored and/or footprint stored.

In embodiments, a fan may include a preset X dimension (e.g. to determine voltage) but not have a preset Y dimension, to allow for the optimization of Y and Z dimensions. That is, trade off one dimension of a panel versus the thickness of the stack.

In embodiments, square photovoltaic structures are connected at opposite vertices and may have as many as one wants, folded or fanned, and with or without shadowing. In embodiments, the structure may open about a Z axis; they may stack and then open up around that axis. In embodiments, a stack of cells that is movably disposed about a Z axis is provided.

In embodiments, the photovoltaic structures are provided in a stack but not connected while in the stack. They can be removed from the stack like a deck of cards and then reconnected through plugs and/or other connection facilitators. The structures may also include clips that mechanically hold the structures together.

In embodiments, the variable photovoltaic structures are provided in a form similar to a Chinese Fan, and the fan may spread out in angles up to 360 degrees, depending on the structure and/or desired effect. In embodiments, the fan structure does not use segments that are parallel edged.

In embodiments, a variable photovoltaic structure may be shipped in a deployable format (e.g. stacked up into a package that folds up and is deployable on removal from the package). For example, if tension is applied on the two vertices in opposite directions, the structure folds and unfolds on itself without mechanical intervention. Embodiments include a sensor in a box (e.g. it builds itself out as you open it up). In embodiments, a stack may deploy without breaking, may deploy itself, and may also perform self-orientation.

In embodiments, the variable photovoltaic structure is formed as an accordion. Not every membrane is supported by a piece of plastic—don't support every piece with injection-molded plastic and piano-type hinges.

In an embodiment, a flexible photovoltaic may have a certain output under flex and a different output when not flexed.

An aspect of the present invention involves providing a sensor-feedback tracking of a light source. In embodiments, a sensor is provided to sense light intensity and a positioning facility (e.g. a motor) may be used to reposition the photovoltaic segment. In embodiments, the repositioning is performed to obtain optimal light intensity exposure, some light intensity exposure, constant light exposure, variable light exposure, reduced light exposure, or other reason.

Figure 39:
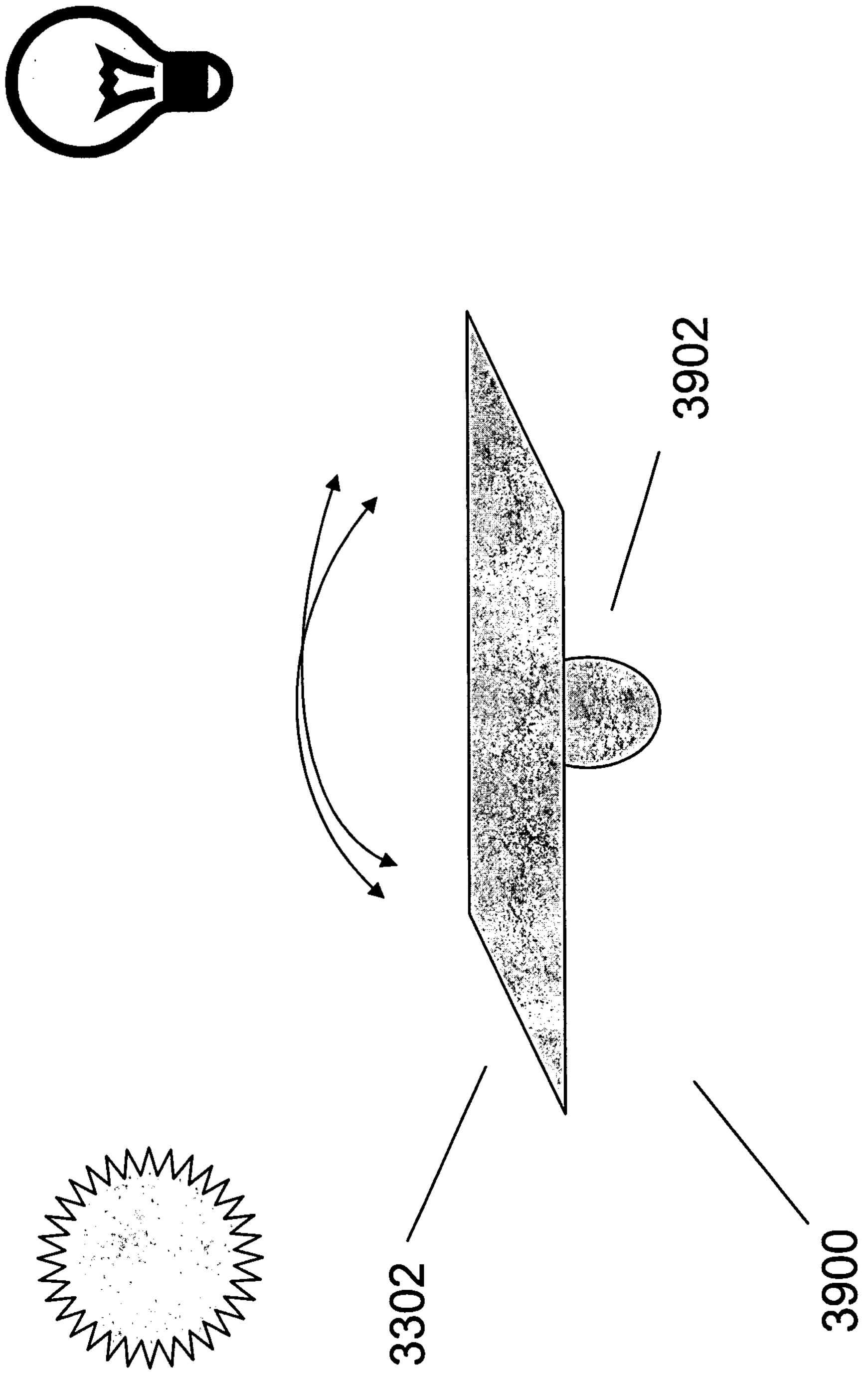
FIG. 39 illustrates a variable photovoltaic structure adapted to sense light and position itself in relation to the light in accordance with the principles of the present invention according to the principles of the present invention.

FIG. 39 illustrates a variable photovoltaic structure 3900 adapted to sense light and position itself in relation to the light in accordance with the principles of the present invention. For example, the variable photovoltaic structure may include a photovoltaic panel 3302, a light sensor (not shown), and a positioning facility 3902 (e.g. a motor, micro-motor, MEMS motor, servo, rotating member, or movable member), and the information from the light sensor may be fed back into a processor (not shown). The processor may then adjust the position of the photovoltaic panel 3302 in relation to the information received from the light sensor. In embodiments, the panel is movable in one plane, two planes, multiple planes, continuous planes, discrete planes, discrete positions, or other suitable positions. In embodiments, the variable photovoltaic structure 3900 may be adapted to measure light from more than one light source and adjust its position accordingly.

An aspect of the present invention relates to providing sensors in combination with pv facilities. Illustrative embodiments are described below that include various pv sensor facilities either alone or in combination with other facilities, environments, applications, products, and the like. It is envisioned that each of the below embodiments may include a pv facility described herein above (e.g. those described in connection with FIGS. 1-7) or other style of pv facility. In addition, each of the below described embodiments may include systems for energy storage, energy filtering, energy regulation, rechargeable pv systems, processors, transmitters, receivers, memory, MEMS facilities, networks and the like as described herein above (e.g. those described in connection with FIGS. 15-31). For simplification of illustration, each variant of the embodiments may not be restated below; however, such with combinations are envisioned by the applicants and are encompassed by the present invention.

Figure 40:
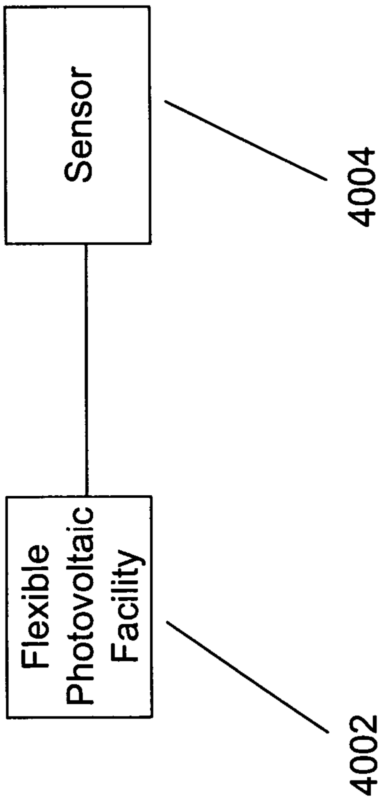
FIG. 40 illustrates a flexible photovoltaic facility in association with a sensor facility according to the principles of the present invention.

FIG. 40 illustrates a flexible photovoltaic facility 4002 (e.g. the flexible photovoltaic facilities associated with FIGS. 32-39) in association with a sensor facility 4004.

Figure 41:
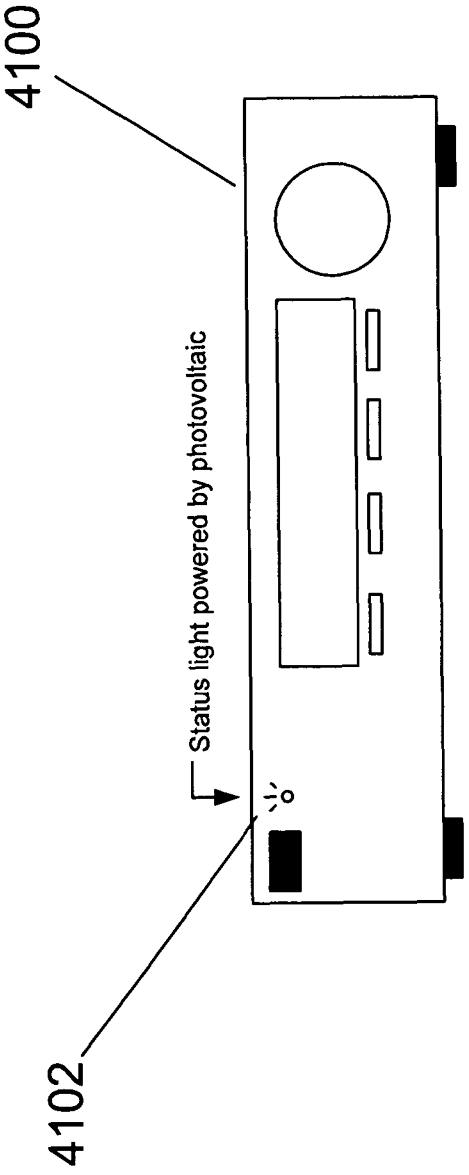
FIG. 41 illustrates an electrical sensor may detect the presence of electrical inputs such as voltage or current according to the principles of the present invention.

In embodiments of the invention, an electrical sensor may detect the presence of electrical inputs such as voltage or current in a device 4100 as shown in FIG. 41. In embodiments there may be an indicator 4102 in a device. In embodiments the electrical sensor may provide an indication that a device has electrical power and may indicate, for example, that the device has been turned on, off, or is in sleep mode. In an embodiment the provided indication may be a steady light, a blinking light, a steady sound, a sound with varying intensity or duration, a vibration with varying intensity or duration, or other method to alert a user that power is present in the device. In embodiments the electrical sensor may detect either AC or DC electrical power of various power, voltage, current, or frequency of various power lines.

In embodiments, an electrical sensor associated with a photovoltaic facility may be disposed in a variety of devices to indicate one or more conditions of the device (such as "on" or "off" status, level of power consumption, or the like). Such devices may include computers, monitors, copiers, televisions, radios, CD players, tape players, electronic games, cell phones, answering machines, automobile dashboard indicators, house power meters, electrical power transformers, stove burners, music amplifiers, smoke detectors, motion detectors, portable heaters, emergency lighting, cameras, camera flash attachments, electrical razors, or other devices that may require an indication that electrical power is present.

In embodiments, home electronic sensors for consumer electronic devices, for example computers, monitors, copiers, televisions, radios, CD players, tape players, electronic games, and answering machines, may have photovoltaic cells disposed as a film or skin on an exposed surface of the device and may use the available lighting within a household. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, automobile indicators may have a photovoltaic facility, such as film, skin, cell, or other type of facility, on the interior (e.g. dashboard) or on the exterior (e.g. roof, hood, or trunk). In embodiments, outdoor devices such as house power meters and electrical power transformers may have photovoltaic facilities on any of the sides of the device for light exposure during any time of the day, or they may have photovoltaic facilities that can be movably pointed toward a light source as the light source moves. Other devices such as stove burners, music amplifiers, smoke detectors, motion detectors, portable heaters, emergency lighting, cameras, camera flash attachments, and electrical razors may have photovoltaic facilities on the exterior of the devices as part of the structure of the device and may be able to charge while in use or when idle. In embodiments, the photovoltaic may be expandable to allow for an increased surface area when the device is consuming electricity or increased electric load. In embodiments, the increased surface area may be manually, automatically, or semi-automatically achieved. For example, as the device begins to demand more energy, or predicts it is going to begin to need more energy, the device may expand the pv surface area.

Figure 42:
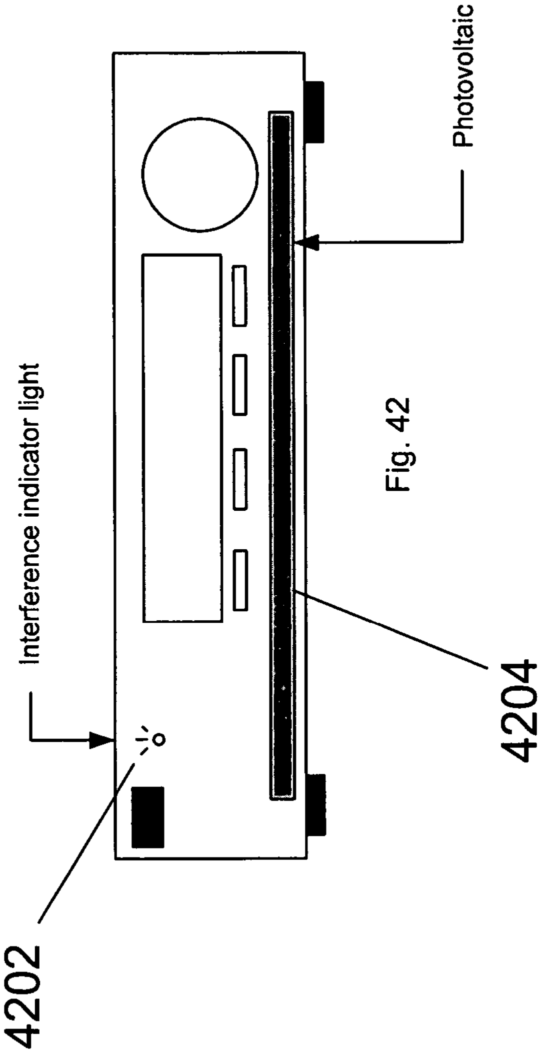
FIG. 42 shows an electrical interference sensor may detect the presence of electrical power according to the principles of the present invention.

In embodiments of the invention, an electrical interference sensor may detect the presence of electrical power that may create interference to another circuit as shown in FIG. 42. In embodiments, the electrical interference sensor (not shown) may detect electrical power interference from power cables, motors, transformers, radio transmitters, variable speed drives, discharge lighting, or other objects capable of large electrical fields. In embodiments, the system may also include an indicator light 4202 indicating interference. While there are many places on a device where the photovoltaic 4204 may be positioned, the device of FIG. 42 illustrates a pv on one of the device surfaces. In embodiments, the electrical interference sensor may provide a visual or audio signal that indicates interference is present or may provide feedback to a computer or network that a device is affected by an electrical interference. In embodiments, the device may be capable of determining the type of interference and providing feedback indicating the interference type. In embodiments, there may be more than one electrical interference sensor in a device or series of devices.

In embodiments, an electrical interference sensor associated with a photovoltaic facility may be disposed in a variety of devices to indicate electrical interference to a device. In embodiments, such devices may include electronic measuring devices (e.g. volt/current meters), radios, computers, monitors, printers, faxes, televisions, automobile electronic ignition systems, computer networks (e.g. wired, wireless, or microwave), digital clocks, electronic control systems, or other devices that may be sensitive to external power interference.

In embodiments, home electronic interference sensors such as computers, monitors, printers, faxes, televisions, radios, and digital clocks may have photovoltaic cells disposed as a film or skin on an exposed surface of the device and may use the available lighting within a household. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, an automobile interference sensor may have photovoltaic cells disposed as a film or skin on the interior (e.g. dashboard) or exterior (e.g. hood, trunk, or roof). In embodiments, other outside devices such as volt/current meters, electronic control systems, or network systems may have photovoltaic cells disposed as a skin or film on an exposed surface of the device or may use photovoltaic cells disposed on deployable units that may provide the required amount of power for the electronic interference sensors. The deployable units may unfold, fan out, be stacked in an offset pattern, be positioned on a flat surface, or may be angled to take advantage of a light source. The deployable photovoltaic facilities may be able to adjust the surface of units exposed to a light source manually or automatically. The photovoltaic facilities may be capable of automatically tracking a light source to maintain the required power to the electronic interference sensor.

Figure 43:
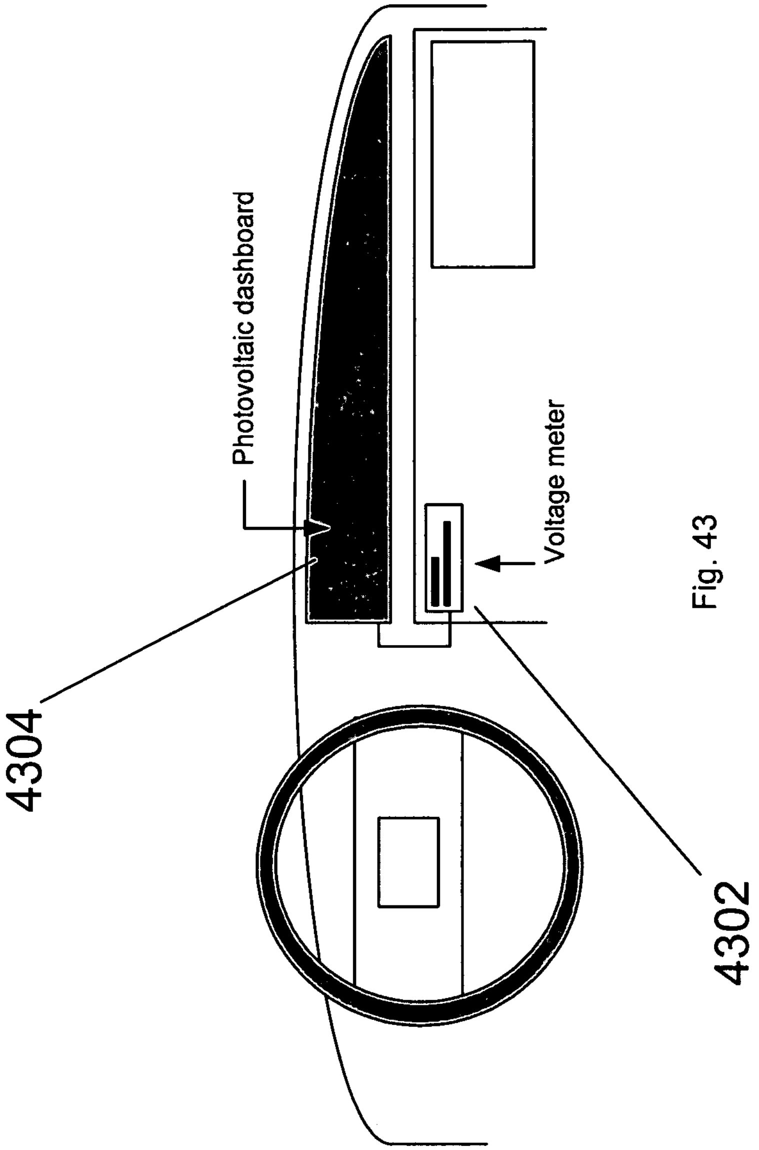
FIG. 43 shows an automobile voltage sensor associated with a photovoltaic cell(s) according to the principles of the present invention.

In embodiments of the invention, a voltage sensor may detect the presence of voltage in a circuit as shown in FIG. 43. In embodiments, the voltage sensor may detect voltage in a circuit and provide feedback by a visual display of lights, an audio signal, or signal to a computer or network of computers. In embodiments, voltage sensors may be used in a voltage meter, an automobile dashboard display, power generation stations, power sub stations, voltage protection devices, uninterruptible power supplies (UPS), power generators, portable power generators, computers, or other devices in which one must know the voltage in a system. In embodiments, there may be more than one voltage sensor in a device, and voltages may provide feedback to more than one display. In embodiments, the voltage sensor may provide a minimum voltage, maximum voltage, or display a range of voltages.

In embodiments, devices such as computers, UPS, or voltage meters may have photovoltaic cells disposed as a film or skin on an exposed surface of the device and may use the available lighting within a household. Alternatively, a photovoltaic may charge a re-charger for the device, where the re-charger has an interface to receive power from the photovoltaic facility and a charging interface for the device. The device may include an energy storage capacity, such as a rechargeable battery. As illustrated in the embodiment of FIG. 43, an automobile voltage sensor 4302 may have photovoltaic cell(s) 4304 disposed as a film or skin on the interior (e.g. dashboard) or exterior (e.g. hood, trunk, or roof). Devices such as power stations, power sub stations, power protection devices, power generators, and portable power generators may have photovoltaic cells disposed as a skin or film on an exposed surface of the device or may use photovoltaic cells disposed on deployable units that may provide the required amount of power for the voltage sensors. The deployable units may unfold, fan out, be stacked in an offset pattern, be positioned on a flat surface, or may be angled to take advantage of a light source. The deployable photovoltaic facilities may be able to adjust the surface of units exposed to a light source manually or automatically. The photovoltaic facilities may be capable of automatically tracking a light source to maintain the required power to the voltage sensor.

Figure 44:
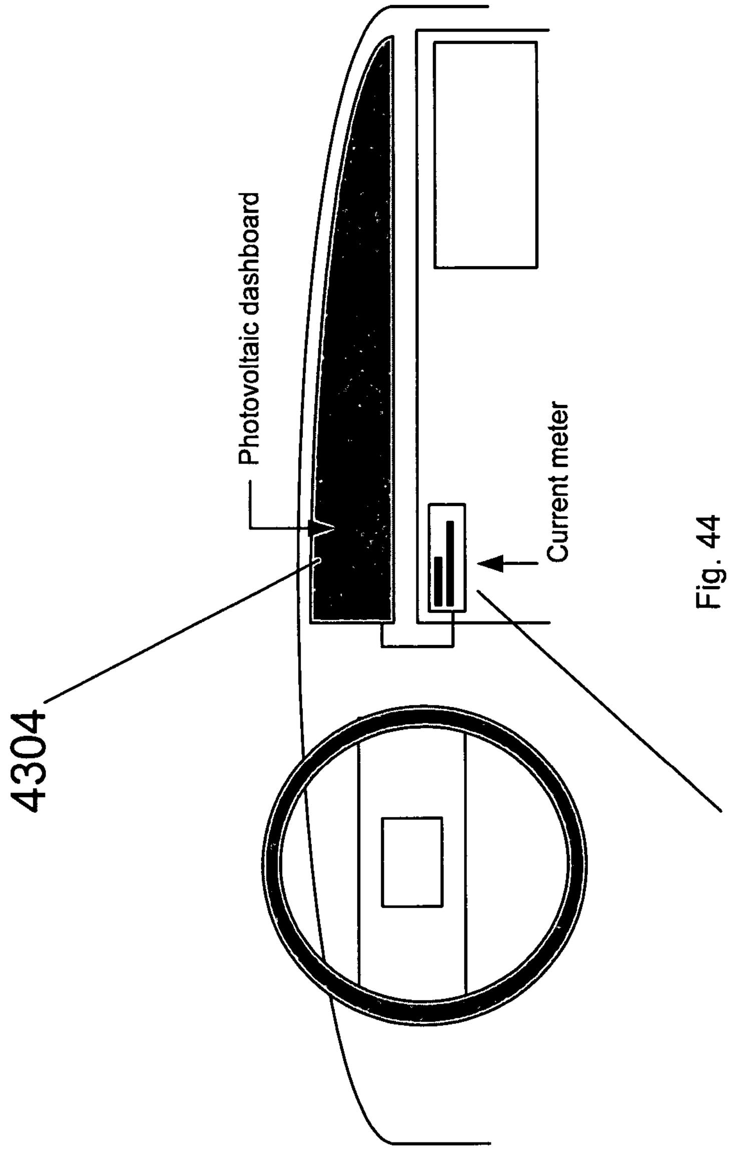
FIG. 44 illustrates a current sensor in association with a photovoltaic cell according to the principles of the present invention.

In embodiments of the invention, a current sensor may detect the presence of current in a circuit as shown in FIG. 44. In embodiments, the current sensor 4402 may detect current in a circuit and provide feedback by a visual display of lights, an audio signal, or signal to a computer or network of computers. In embodiments, current sensors may be used in a current meter, an automobile dashboard display, power generation stations, power sub stations, current protection devices, uninterruptible power supplies (UPS), power generators, portable power generators, computers, or other devices in which it is required to know the current in a system. In embodiments, there may be more than one current sensor in a device and currents may provide feedback to more than one display. In embodiments, the current sensor may provide a minimum current, maximum current, or display a range of currents.

In embodiments, devices such as computers, UPS, or current meters may have photovoltaic cells disposed as a film or skin on an exposed surface of the device and may use the available lighting within a household. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, an automobile current sensor may have photovoltaic cells disposed as a film or skin on a dashboard or surface of the hood, trunk, or roof. In embodiments, devices such as power stations, power sub stations, power protection devices, power generators, and portable power generators may have photovoltaic cells disposed as a skin or film on an exposed surface of the device or may use photovoltaic cells disposed on deployable units that may provide the required amount of power for the current sensors. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the current sensor.

Figure 45:
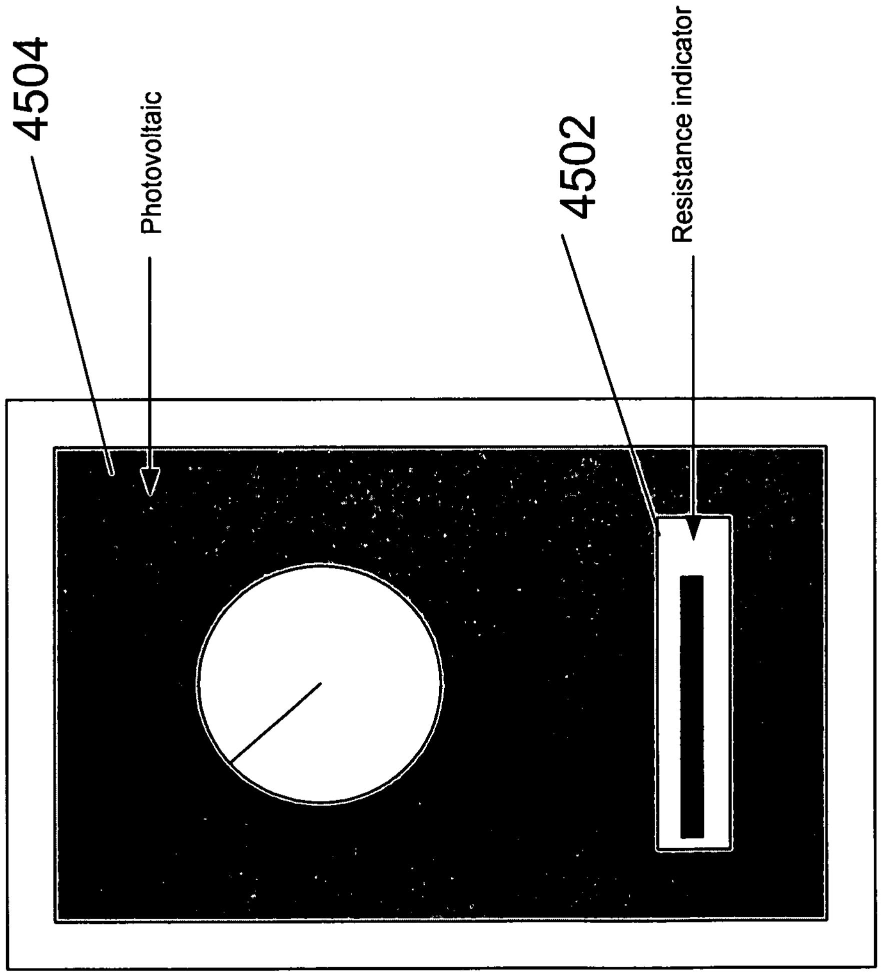
FIG. 45 shows a resistance sensor in association with a photovoltaic cell according to the principles of the present invention.

In embodiments of the invention, a resistance sensor may detect the electronic resistance in a circuit as shown in FIG. 45. In embodiments, the resistance sensor 4502 may detect resistance in a circuit and provide feedback by a visual display of lights, an audio signal, or a signal to a computer or network of computers. In embodiments, light and audio signals may increase and decrease in intensity based on the resistance measured by the sensor. In embodiments, resistance sensors may be used in a resistance meter, power generation stations, power sub stations, circuit protection devices, power generators, portable power generators, fuse boxes, electrical heating systems, electronic modeling systems, variable speed controllers, rheostats, or other devices in which it is required to know the resistance in a system. In embodiments, the resistance of an electrical system may indicate that an electrical system is in an overload state, or the resistance may be controlled to provide the proper amount of electrical current/voltage to a device. In embodiments, there may be more than one resistance sensor in a device or system and the resistance sensor may provide feedback to more than one display. In embodiments, the resistance sensor may provide a minimum resistance, maximum resistance, or display a range of resistances.

In embodiments, household devices such as fuse boxes, electrical heating systems, controllers, switches, thermostats, emergency switches, intercoms, light controls, security systems, security controls, appliances, lights, cabinets, cabinet lighting, windows, doors, walls, ceilings, floors, counters, tools, rheostats and other surfaces may have photovoltaic cells 4504 (e.g. disposed as a film or skin) on an exposed surface of the device and may use the available lighting within a household as an energy source. In other embodiments, the household device may have the photovoltaic cell disposed within the device and an internal lighting system may be used as an energy source. For example, the internal system may be used to charge an energy storage cell through the use of artificial light and a photovoltaic. In embodiments, a photovoltaic may charge a re-charger for the device, where the re-charger has an interface to receive power from the photovoltaic facility and a charging interface for the device. The device may include an energy storage capacity, such as a rechargeable battery. In embodiments, devices such as power generation stations, power sub stations, circuit protection devices, power generators, portable power generators, electronic modeling systems, and variable speed controllers may have photovoltaic cells disposed as a skin or film on an exposed surface of the device or may use photovoltaic cells disposed on deployable units that may provide the required amount of power for the resistance sensors. In embodiments, the deployable units may unfold, fan out, be stacked in an offset pattern, be positioned on a flat surface, or may be angled to take advantage of a light source. In embodiments, the deployable photovoltaic facilities may be able to adjust the surface area exposed to a light source manually or automatically. In embodiments, the photovoltaic facilities may be capable of automatically tracking a light source to maintain the required power to the resistance sensor.

Figure 46:
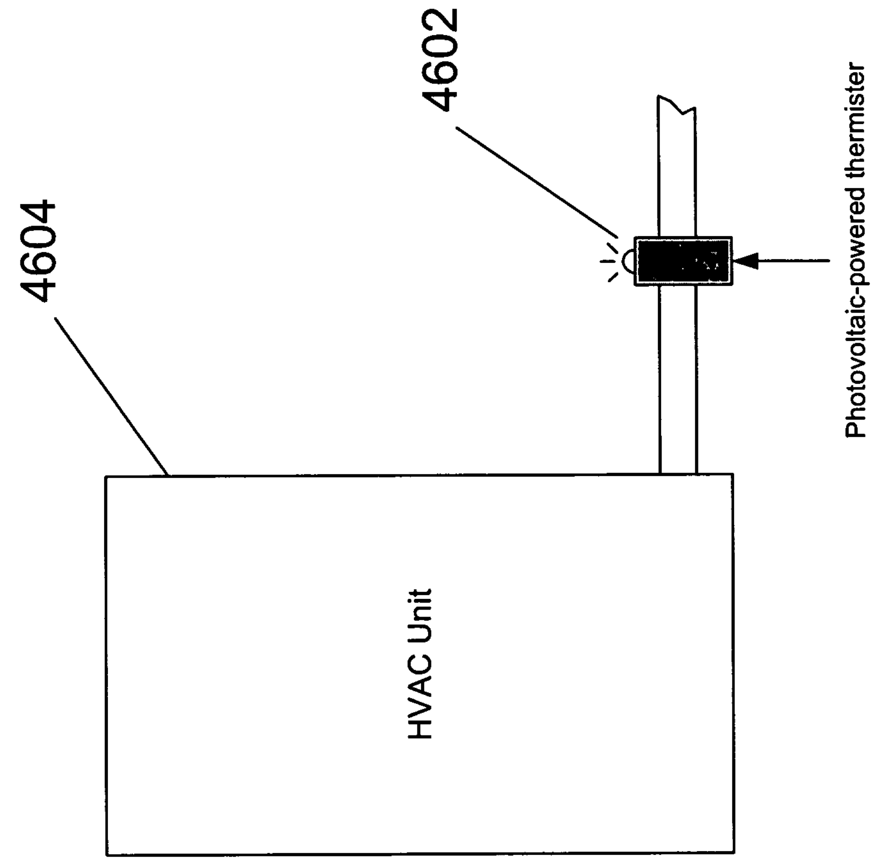
FIG. 46 illustrates a thermistor sensor in association with a photovoltaic cell according to the principles of the present invention.

In embodiments of the invention, a thermistor sensor may detect the changes in temperature by increasing/decreasing resistance directly related to the increase/decrease of temperature of an object as shown in FIG. 46. In embodiments, photovoltaic powered thermistor sensor(s) 4602 may be used to measure temperatures of fluids or gases. In embodiments, the thermistor sensor may change its resistance based on the temperature of the object being measured. In embodiments, the resistance may be converted to a temperature and provide feedback to a computer, network, network of computers, or another circuit.

In embodiments, thermistors may be used in devices such as air conditioners 4604, audio amplifiers, cellular telephones, clothes dryers, computer power supplies, dishwashers, electric blanket controls, electric water heaters, electronic thermometers, fire detectors, home weather stations, oven temperature controls, pool and spa controls, rechargeable battery packs, refrigerator and freezer temperature controls, small appliance controls, solar collector controls, thermostats, toasters, washing machines, audio amplifiers, automatic climate controls, coolant sensors, electric coolant fan temperature controls, emission controls, engine block temperature sensors, engine oil temperature sensors, intake air temperature sensors, oil level sensors, outside air temperature sensor, transmission oil temperature sensors, water level sensors, blood analysis equipment, blood dialysis equipment, blood oxygenator equipment, clinical fever thermometers, esophageal tubes, infant incubators, internal body temperature monitors, internal temperature sensors, intravenous injection temperature regulators, myocardial probes, respiration rate measurement equipment, skin temperature monitors, thermodilution catheter probes, commercial vending machines, crystal ovens, fluid flow measurements, gas flow indicators, HVAC equipment, industrial process controls, liquid level indicators, microwave power measurements, photographic processing equipment, plastic laminating equipment, solar energy equipment, thermal conductivity measurements, thermocouple compensation, thermoplastic molding equipment, thermostats, water purification equipment, and welding equipment. In embodiments, devices may use more than one thermistor sensor.

In embodiments, some of the above devices may be portable or handheld and may have photovoltaic cells disposed as a film or skin on an exposed surface of the device and may use available lighting. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, other devices listed above may be fixed in place and may have photovoltaic cells disposed as a skin or film on an exposed surface of the device. Photovoltaic cells may be disposed on deployable units that may provide the required amount of power for the thermistor sensors. The deployable units may unfold, fan out, be stacked in an offset pattern, be positioned on a flat surface, or may be angled to take advantage of a light source. The deployable photovoltaic facilities may be able to adjust the number of units exposed to a light source manually or automatically. The photovoltaic facilities may be capable of automatically tracking a light source to maintain the required power to the thermistor sensor.

Figure 47:
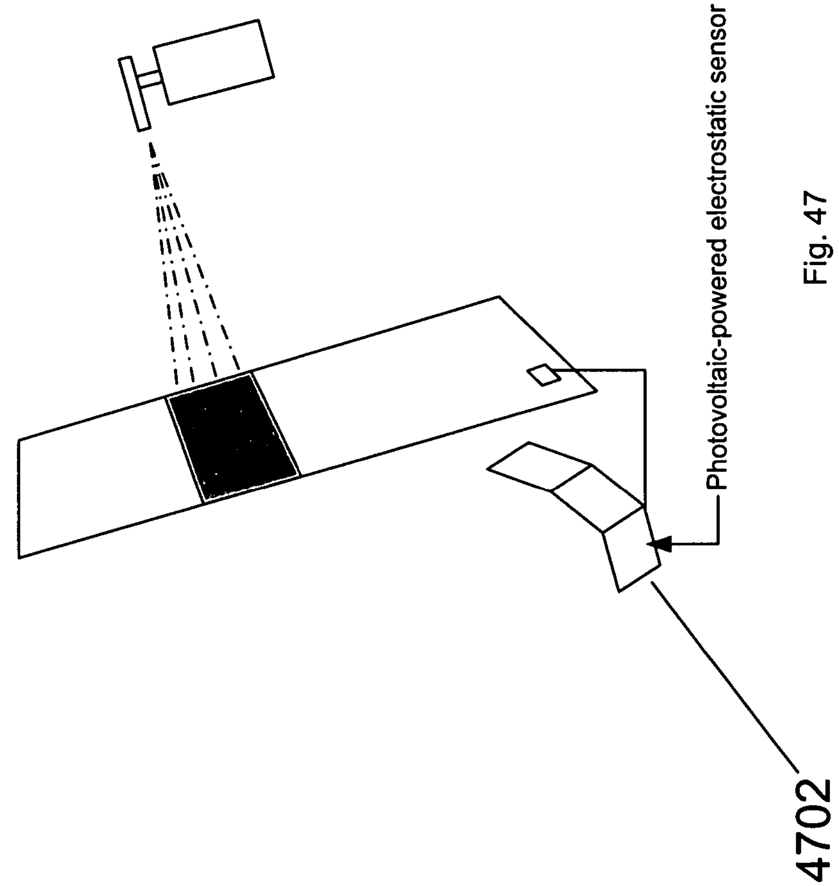
FIG. 47 shows an electrostatic sensor in association with a photovoltaic cell according to the principles of the present invention.

In embodiments of the invention, an electrostatic sensor may measure the amount of electrostatic charge on a surface, in an object, or in a field between charged objects as shown in FIG. 47. In embodiments, the photovoltaic powered electrostatic sensor 4702 may be able to measure the electrostatic charge or a change in the charge by direct contact with the object or by being within the electrostatic charge field. In an embodiment, the electrostatic sensor may provide an output to a measuring device, computer, computer network, or other device. In embodiments, the electrostatic sensor may be used for measuring the proper electrostatic charge for painting, testing printed circuit board connections, separation of materials (recycling), and security fencing by measuring the change in the electrostatic field by a person or object. As an example, proper electrostatic painting requires that the proper electrostatic charge be maintained for the proper coating of paint. In embodiments, the electrostatic sensor may measure the electrostatic charge before and during the painting process to assure the proper painting conditions. In another example, a security fence may be established by having powered lines establish an electrostatic field that can be measured by an electrostatic sensor. In embodiments, any object that enters the electrostatic field may disturb the field, and the changed field may be measured by the electrostatic sensor. In embodiments, a person or object may not need to touch the wires to change the electrostatic field.

In embodiments, devices such as a painting system or security fence described above may have photovoltaic cells which may be disposed on deployable units that may provide the required amount of power for the electrostatic sensors. In embodiments, for use in a manufacturing environment the photovoltaic facilities may be able to use ambient light within the facility, or the photovoltaic facility may be placed in a remote location that may have adequate lighting. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the electrostatic sensor.

Figure 48:
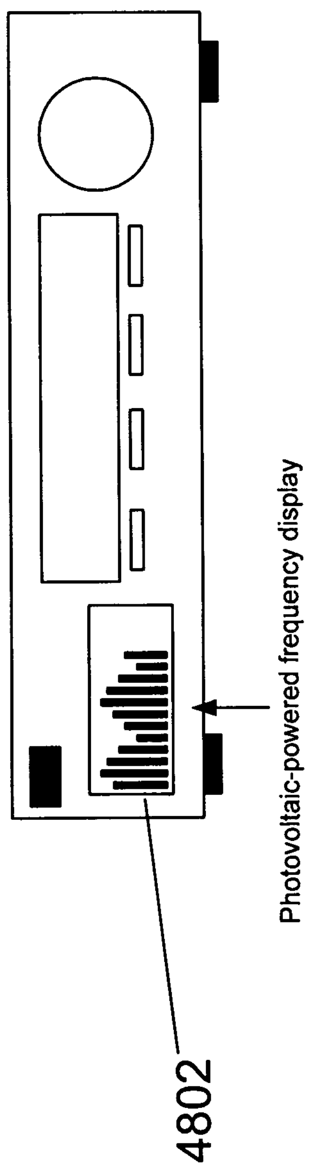
FIG. 48 shows a frequency sensor in association with a photovoltaic cell according to the principles of the present invention.

In embodiments of the invention, a frequency sensor may measure frequency created by mechanical or electronic means as shown in FIG. 48. In embodiments, a photovoltaic powered frequency sensor 4802 may be used to display different frequencies of sound for the purposes of sound detection (security), sound modulation, frequency adjustment, and display of a frequency for informational needs. In embodiments, the frequency sensor may provide feedback that may be displayed using analog gauges, light display based on the frequency, or display on a screen as numbers or a graph. In embodiments, sound is often composed of a number of frequencies, and there may be more than one frequency sensor to detect and display different frequencies. As an example, a stereo may have a display of the various output frequency ranges in the form of a color display. In embodiments, each frequency range may have a column of light indicators and may indicate the amplitude of the frequency by display of different colors on the frequency column. Another example may be a security system that may have a frequency sensor that will “listen” for noise in a room. In embodiments, an indication may be sent to the security system if there is any sound frequency above a certain level within the room. In embodiments, a musical instrument may be tuned with a device using a frequency sensor. In embodiments, the instrument may be played, and the tuning device may display the pitch that is played, allowing the instrument to be adjusted to achieve the correct pitch.

In embodiments, devices such as the music tuner or a stereo may be portable or may be household items and may have photovoltaic cells disposed as a film or skin on an exposed surface of the device and may use available lighting. Alternatively, a photovoltaic may charge a re-charger for the device, where the re-charger has an interface to receive power from the photovoltaic facility and a charging interface for the device. The device may include an energy storage capacity, such as a rechargeable battery. Devices may use a recharging unit with a photovoltaic facility and then be detached from the photovoltaic facility recharge unit for use. In embodiments, other non-portable devices (e.g. security systems) may have photovoltaic cells disposed as a skin or film on an exposed surface of the device. In embodiments, photovoltaic cells may be disposed on deployable units that may provide the required amount of power for the frequency sensors. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the frequency sensor.

Figure 49:
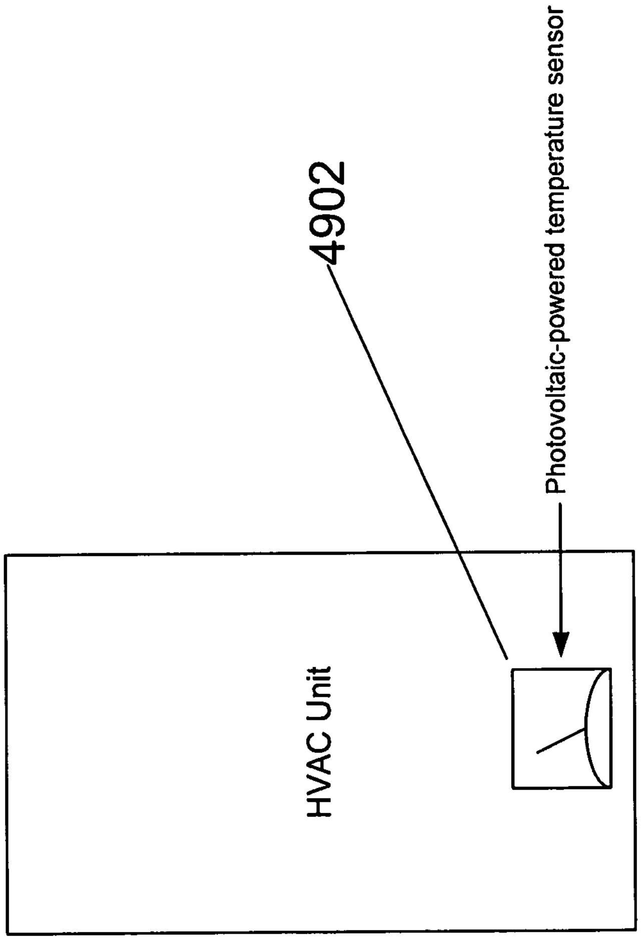
FIG. 49 illustrates a temperature sensor in association with a photovoltaic cell according to the principles of the present invention.

In embodiments of the invention, a temperature sensor may measure temperature of an object, fluid, gas, or air as shown in FIG. 49. In embodiments, photovoltaic powered temperature sensors 4902 may be able to measure the temperature in either analog or digital readings and provide outputs to both analog and digital displays. In embodiments, temperature sensors may measure a temperature and provide an output to a controller that may then make adjustments to the amount of heating/cooling. As an example, a heating unit may allow the setting of a temperature to maintain in a room. In embodiments, the temperature sensor may take continual temperature readings and provide an output to the heating unit. In embodiments, the heating unit logic may then determine if the heating of the room should be increased, decreased, or shut off.

In embodiments, temperature sensors may be used in other devices such as air conditioners, manufacturing furnaces, home ovens, automobile environmental controls, commercial building environmental controls, automobile engine temperature measurements, environmental emission control devices, computers, refrigeration controls, weather temperature measurements, medical thermometers, and other devices that require temperatures to be maintained to a requirement.

In embodiments, devices such as medical, cooking, and air thermometers may be portable or handheld and may have photovoltaic cells disposed as a film or skin on an exposed surface of the device and may use available lighting. Alternatively, a photovoltaic may charge a re-charger for the device, where the re-charger has an interface to receive power from the photovoltaic facility and a charging interface for the device. The device may include an energy storage capacity, such as a rechargeable battery. Some portable devices may use a recharging unit with a photovoltaic facility and then be detached from the photovoltaic facility recharge unit for use. In embodiments, non-portable devices such as environmental controls, emission control devices, and manufacturing furnaces may have photovoltaic cells disposed as a skin or film on an exposed surface of the device, or the photovoltaic cells may be disposed on deployable units that may provide the required amount of power for the temperature sensors. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the temperature sensor.

Figure 50:
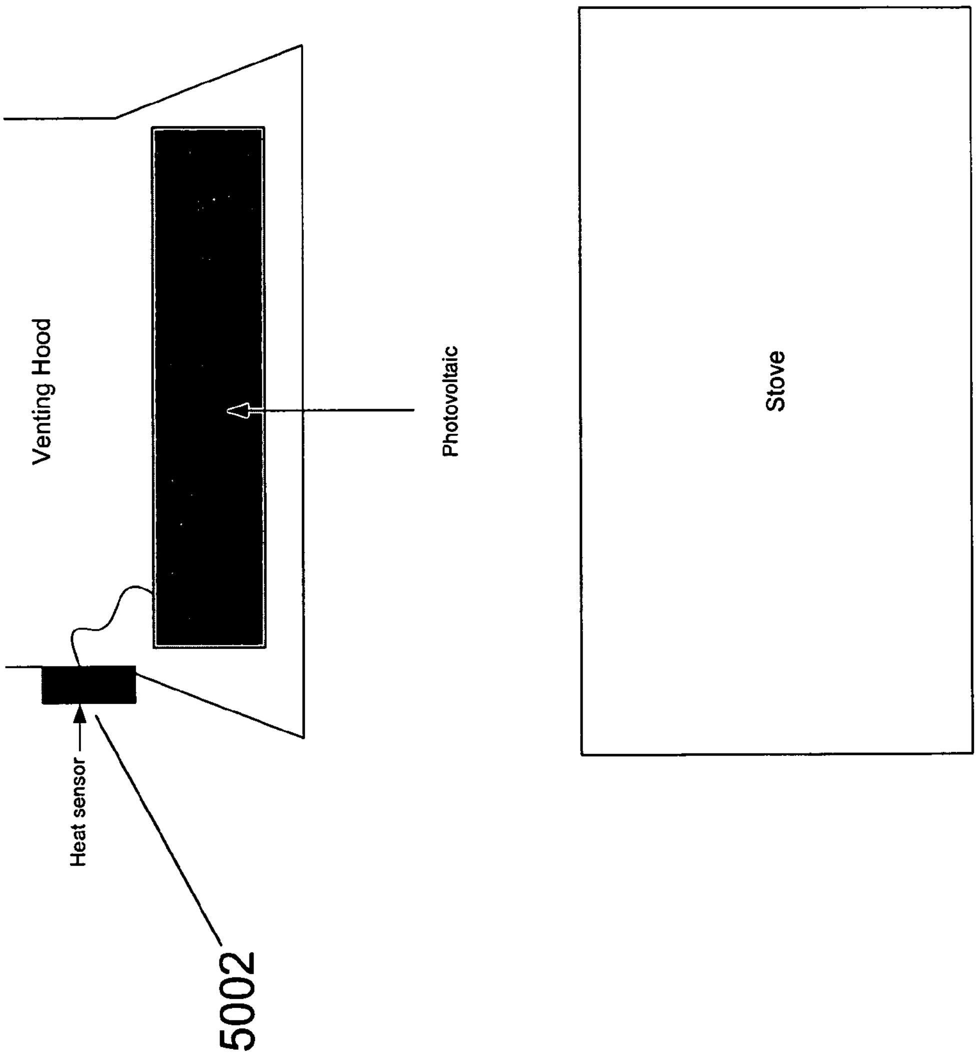
FIG. 50 shows a photovoltaic powered heat sensor according to the principles of the present invention.

In embodiments of the invention, a photovoltaic powered heat sensor may measure the heat of an object, fluid, gas, or air as shown in FIG. 50. In embodiments, the photovoltaic powered heat sensor 5002 may not need to touch the object, fluid, gas, or air to measure the heat. In embodiments, a heat sensor may be directional and may be able to “sense” the heat by being pointed in the direction of the heat. In embodiments, a heat sensor may also be in a device that measures the rate of heat increase as a security against fire or heat damage. As an example, a heat sensor may be part of a heat detector in a restaurant kitchen. In embodiments, the restaurant kitchen may normally be hot, and the heat may fluctuate during the course of the day. In embodiments, a rate of change detector with a heat detector may be able to determine when the rate of heat change indicates a dangerous fire rather than a normal cooking fire in a kitchen.

In embodiments, heat sensors may also be in devices such as infrared heat detectors for measuring heat loss, in manufacturing furnaces for temperature control, non-contact temperature devices, home heat detectors, non-contact mechanical machinery measurement, or other non-contact heat sensing devices.

In embodiments, devices such as infrared cameras and home heat detectors may have photovoltaic cells disposed as a skin or film on an exposed surface of the device. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, some portable devices may use a recharging unit with a photovoltaic facility and then be detached from the photovoltaic facility recharge unit for use. In embodiments, in an environment where there may not be enough ambient light for the proper power generation, such as a manufacturing facility, the photovoltaic cell facility may be located remotely in a location with acceptable light levels (e.g. outside a window, door, or on a roof). In embodiments, photovoltaic cells may be disposed on deployable units that may provide the required amount of power for the heat sensors. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the heat sensor.

Figure 51:
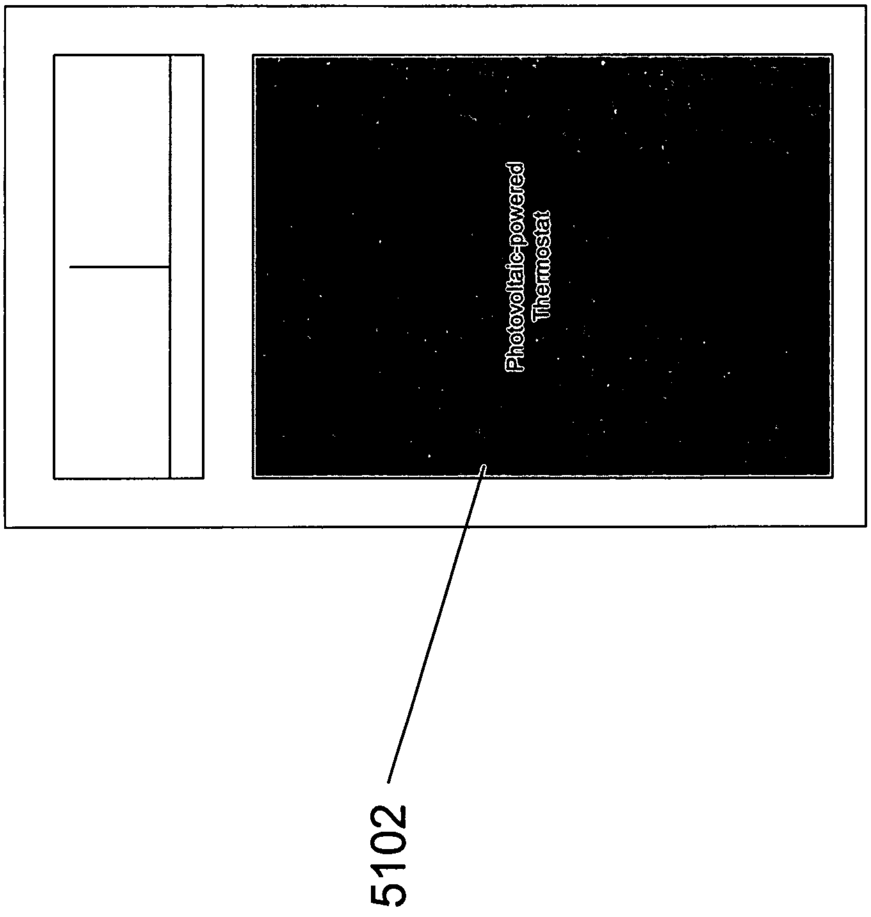
FIG. 51 illustrates a photovoltaic powered thermostat according to the principles of the present invention.

In embodiments of the invention, a photovoltaic powered thermostat 5102 may be used in a device to maintain the temperature of a fluid, gas, or air as shown in FIG. 51. In embodiments, thermostats are often used in facilities to provide input to controllers for maintaining a set temperature and determining if the temperature needs to be increased or decreased. An example is a thermostat in a room; the thermostat continuously measures the temperature of the room and sends output signals to a controller to maintain the set room temperature. In embodiments, thermostats may also be used in an automobile to control the temperature of the coolant.

In embodiments, thermostats may also be used in devices such as home ovens, commercial ovens, home furnaces, manufacturing furnaces, automobile environmental controls, building environmental controls, hot water heaters, or other locations that require the maintaining of a set temperature.

In embodiments, devices such as a home, automobile, or other system thermostat may have photovoltaic cells disposed as a skin or film on an exposed surface of the device. The automobile thermostat may have a skin or film on the automobile interior (e.g. dashboard) or the exterior (e.g. roof, trunk, or hood). Alternatively, a photovoltaic may charge a re-charger for the device, where the re-charger has an interface to receive power from the photovoltaic facility and a charging interface for the device. The device may include an energy storage capacity, such as a rechargeable battery. In embodiments, in an environment where there may not be enough ambient light for the proper power generation, such as a manufacturing facility (e.g. commercial ovens, manufacturing furnaces, building environmental controls, and hot water heaters), the photovoltaic cell facility may be located remotely in a location (e.g. outside a window, door, or on the roof) with acceptable light levels. In embodiments, photovoltaic cells may be disposed on deployable units that may provide the required amount of power for the thermostats. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the thermostat.

Figure 52:
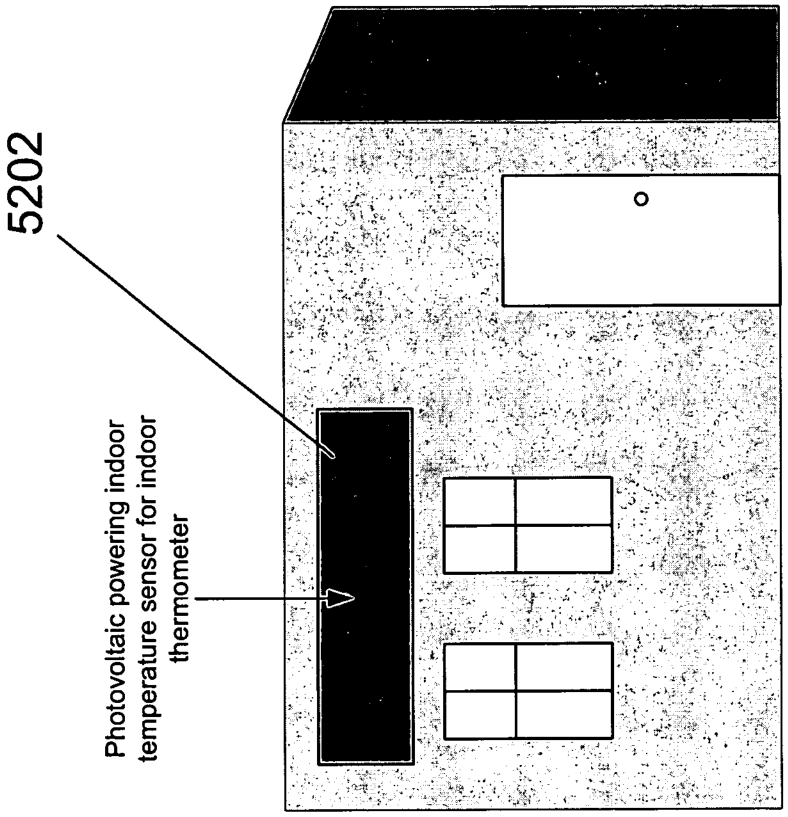
FIG. 52 shows a photovoltaic powered thermometer according to the principles of the present invention.

In embodiments of the invention, a photovoltaic powered thermometer 5202 may be used to measure the temperature of an object, fluid, gas, or air as shown in FIG. 52. In embodiments, a thermometer may be used to measure the outside/inside atmospheric temperature, a person's temperature, manufacturing processes (e.g. photo developers, oils, coating solutions, or plasma coating), automobile air temperatures inside/outside, automobile engine temperatures, jet engine temperatures, or other objects that require a temperature reading. In embodiments, the thermometer may output the temperature as an analog or digital signal.

In embodiments, devices such as portable thermometers may have photovoltaic cells disposed as a skin or film on an exposed surface of the device. The exposed surface may be an added shape at the end of the thermometer for the photovoltaic skin or film. Alternatively, a photovoltaic may charge a re-charger for the device, where the re-charger has an interface to receive power from the photovoltaic facility and a charging interface for the device. The device may include an energy storage capacity, such as a rechargeable battery. Some portable devices may use a recharging unit with a photovoltaic facility and then be detached from the photovoltaic facility recharge unit for use. In embodiments, in an environment where there may not be enough ambient light for the proper power generation, such as a commercial facility (e.g. photo developers, oils, coating solutions, or plasma coating), the photovoltaic cell facility may be located remotely in a location (e.g. outside a window, door, or on a roof) with acceptable light levels. In embodiments, photovoltaic cells may be disposed on deployable units that may provide the required amount of power for the thermometer. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the thermometer.

Figure 53:
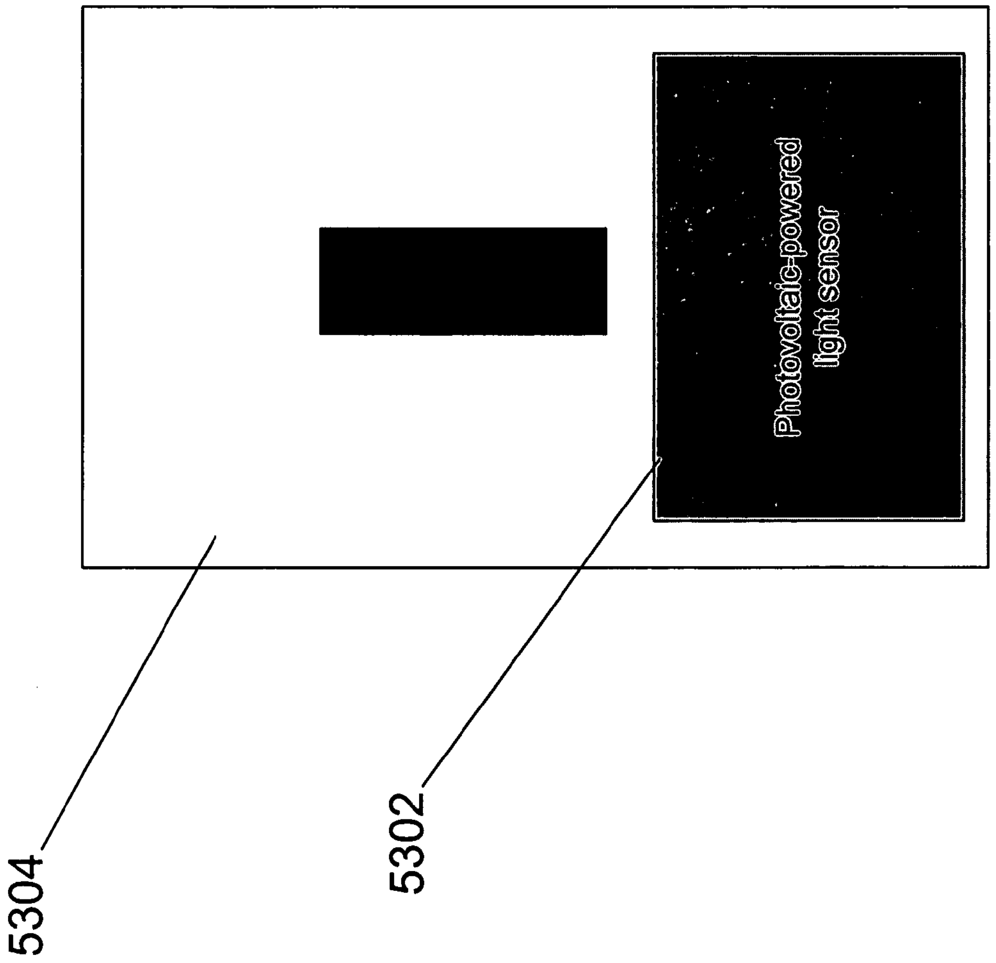
FIG. 53 shows a photovoltaic powered light sensor according to the principles of the present invention.

In embodiments of the invention, a photovoltaic powered light sensor 5302 may be used to measure the light from a source as shown in FIG. 53. In embodiments the light sensor may measure different light intensity and provide feedback based on the presence of light or the intensity of the light, based on a nominal intensity. In embodiments, light sensors may be in light switches 5304, garage door safety lights, in automobiles to sense on coming headlights, flame safety sensors, or other sight-sensing devices. In embodiments, light sensors may provide a feedback signal to a computer, computer network, controller, or other device.

In embodiments, devices such as light switches may have photovoltaic cells disposed as a film or skin on an exposed surface of the device and may use available lighting. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, other devices such as garage door safety lights, automobile headlight sensors, or flame sensors may have photovoltaic cells disposed as a skin or film on an exposed surface of the device or may be disposed on deployable units that may provide the required amount of power for the light sensors. In embodiments, devices such as the garage door safety lights may have photovoltaic facilities mounted on the outside of the garage door. In embodiments, the automobile headlight sensor may have a film or skin on the interior (e.g. dashboard) or exterior (e.g. roof, hood, or trunk). In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the light sensor.

Figure 54:
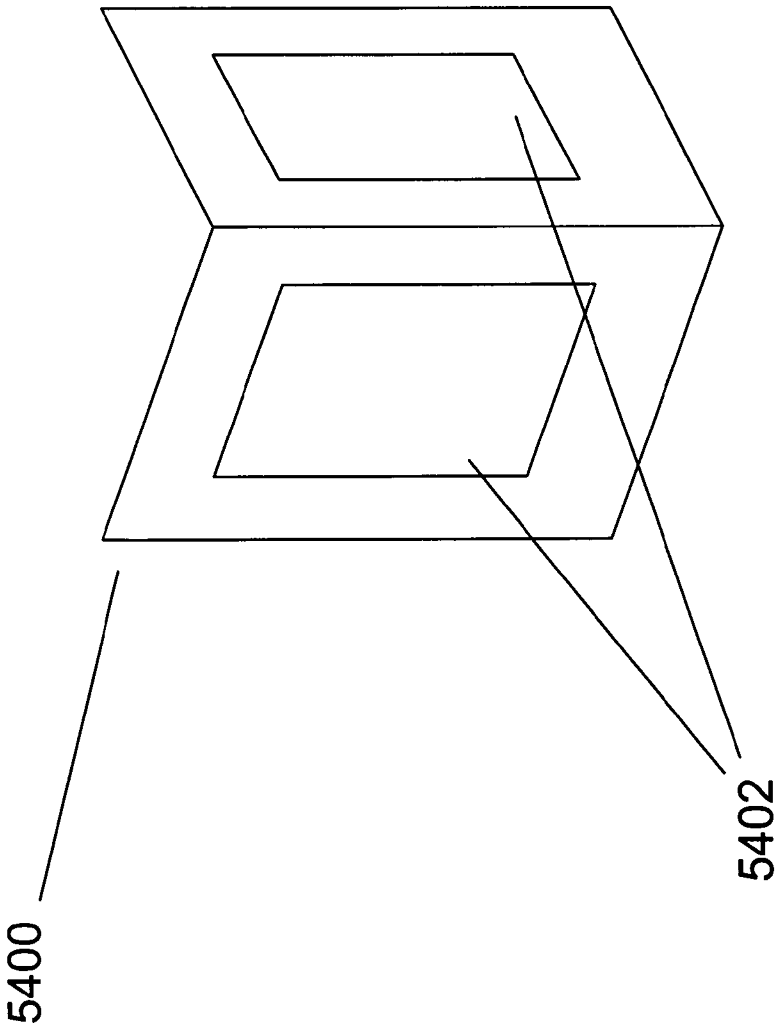
FIG. 54 shows a photovoltaic powered differential light sensor according to the principles of the present invention.

In embodiments of the invention, a photovoltaic powered differential light sensor 5400 may be used to measure a light source from more than one location for directional sensing as shown in FIG. 54. In embodiments, a directional light sensor(s) 5402 may allow for devices to rotate or move to point to the light source. In embodiments, devices with differential light sensors may be vision-based robotics. In embodiments, at least two different sensors separated by a distance may sense the light differently depending upon whether the light sensor is pointing at the light source. In embodiments, when the light intensity is the same for the differential light sensors, then the device may be pointing at the light source. In embodiments, differential light sensors may be used in manufacturing robotic arms (e.g. to locate an object), independent motion robots, object avoidance devices, auto-focusing devices, or other devices that require differential light sensing. In embodiments, the differential light sensor may provide feedback of the intensity of light to a logic circuit, computer, computer network, or controller.

In embodiments, devices such as independent motion robots (e.g. robots capable of independent movement and object avoidance) may have photovoltaic cells disposed as a film or skin on an exposed surface of the device and may use available lighting. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, other devices in an industrial setting, such as a vision pick and place robot, may have photovoltaic cells disposed as a skin or film on an exposed surface of the device or may be disposed on deployable units that may provide the required amount of power for the differential light sensors. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the differential light sensors.

Figure 55:
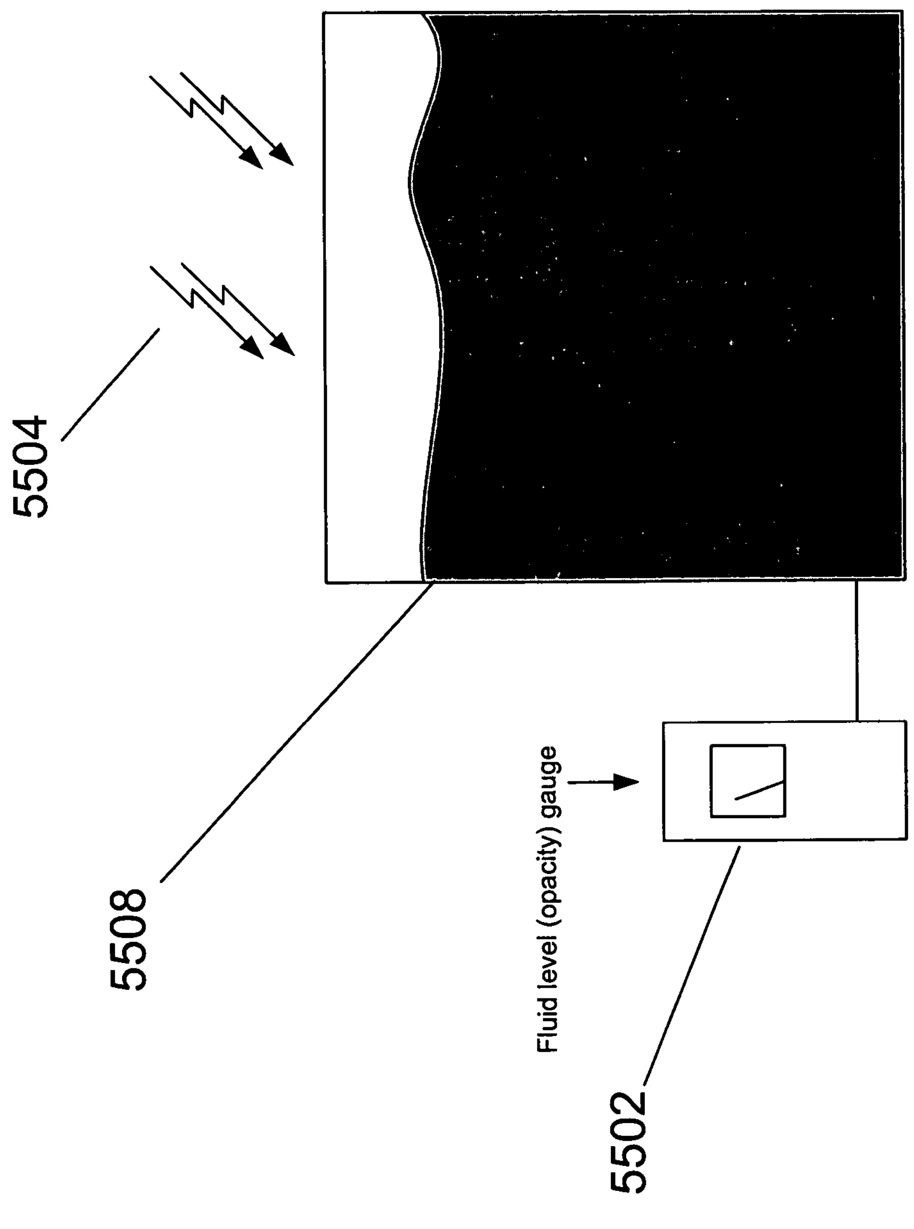
FIG. 55 shows a photovoltaic powered opacity sensor according to the principles of the present invention.

In embodiments of the invention, an photovoltaic powered opacity sensor 5502 may be used to measure a light intensity as the light is shown through a fluid as shown in FIG. 55. In embodiments, the opacity sensor may measure the light 5504 that is or is not absorbed by a fluid 5508 over a distance and may measure if the fluid is in a certain state. In embodiments, the light intensity may be compared to a nominal light setting. In embodiments, opacity devices may be a waste water analyzer, oil analyzer, environmental air analyzer, fluid level determination device, or other device to determine if a fluid is in a desired condition. In embodiments, the opacity sensor may provide feedback to a controller, computer, computer network, or logic circuit.

In embodiments, devices such as a fluid level device may determine if a fluid is at a max or min level (e.g. automobile washer fluid level, or coolant level); it may have photovoltaic cells disposed as a film or skin on an exposed surface of the device and may use available lighting. In embodiments, the automobile may have the skin or film on the interior (e.g. dashboard) or exterior (e.g. roof, hood, or trunk). Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, other devices such as a waste water, oil, or environmental air analyzer may have photovoltaic cells disposed as a skin or film on an exposed surface of the device or may be disposed on deployable units that may provide the required amount of power for the opacity sensor. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the opacity sensor.

Figure 56:
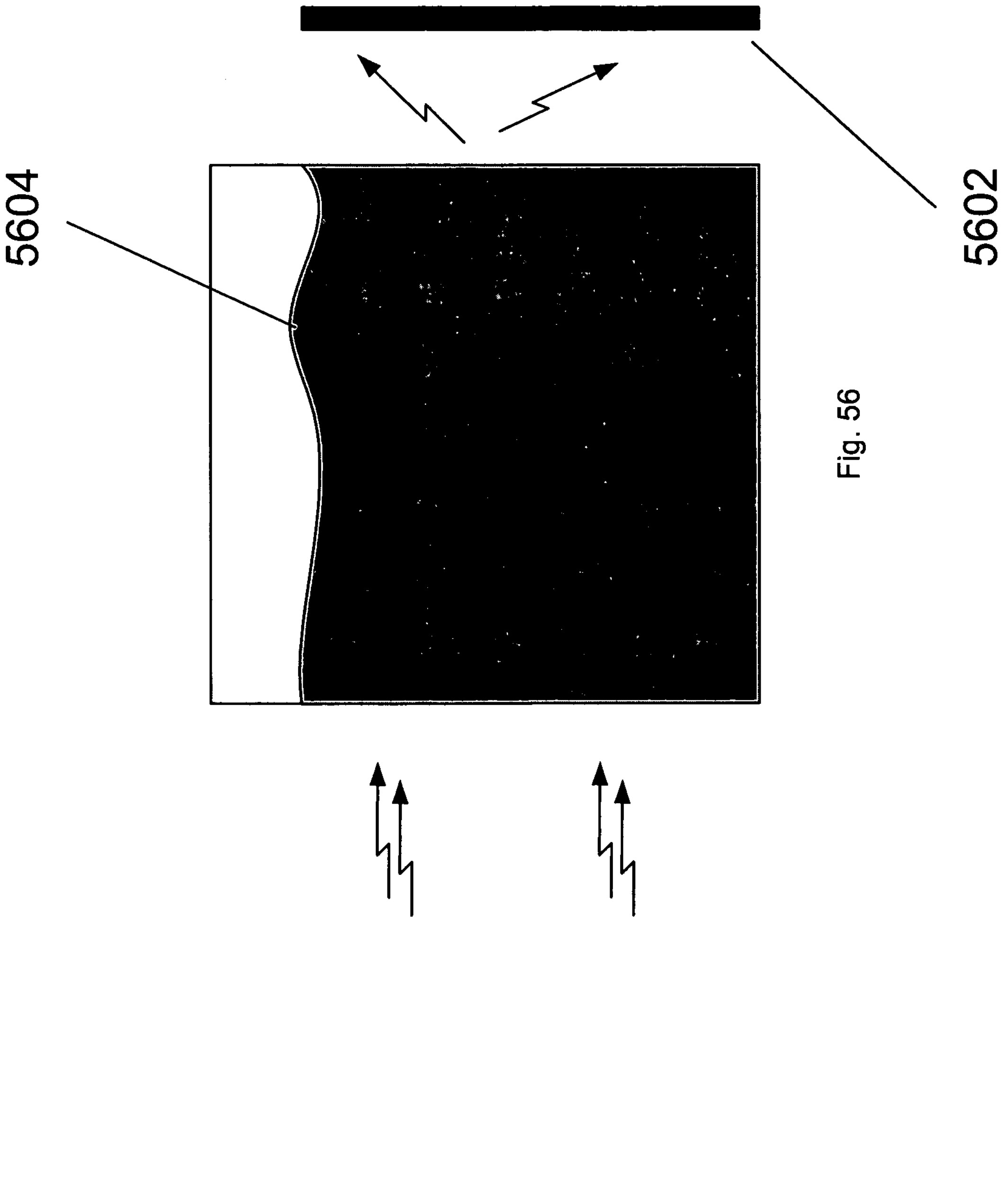
FIG. 56 shows a photovoltaic powered scattering light sensor according to the principles of the present invention.

In embodiments of the invention, a photovoltaic powered scattering light sensor 5602 may be used to measure a light intensity that may be scattered from a light source through a fluid, gas, or other material 5604 as shown in FIG. 56. In embodiments, the scattering light sensor may be offset from a light source as it is shown through a fluid. In embodiments, the scattering light sensor may measure the light that is scattered by particles in the fluid. In embodiments, the scattered light may be compared to a nominal light intensity for the fluid. In embodiments, scattering light devices may be a waste water analyzer, oil analyzer, or environmental air analyzer. In embodiments, these devices may provide a feed back to a controller, computer, or computer network.

In embodiments, devices such as a waste water, oil, or environmental air analyzer may have photovoltaic cells disposed as a skin or film on an exposed surface of the device or may be disposed on deployable units that may provide the required amount of power for the scattering light sensor. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the scattering light sensor.

Figure 57:
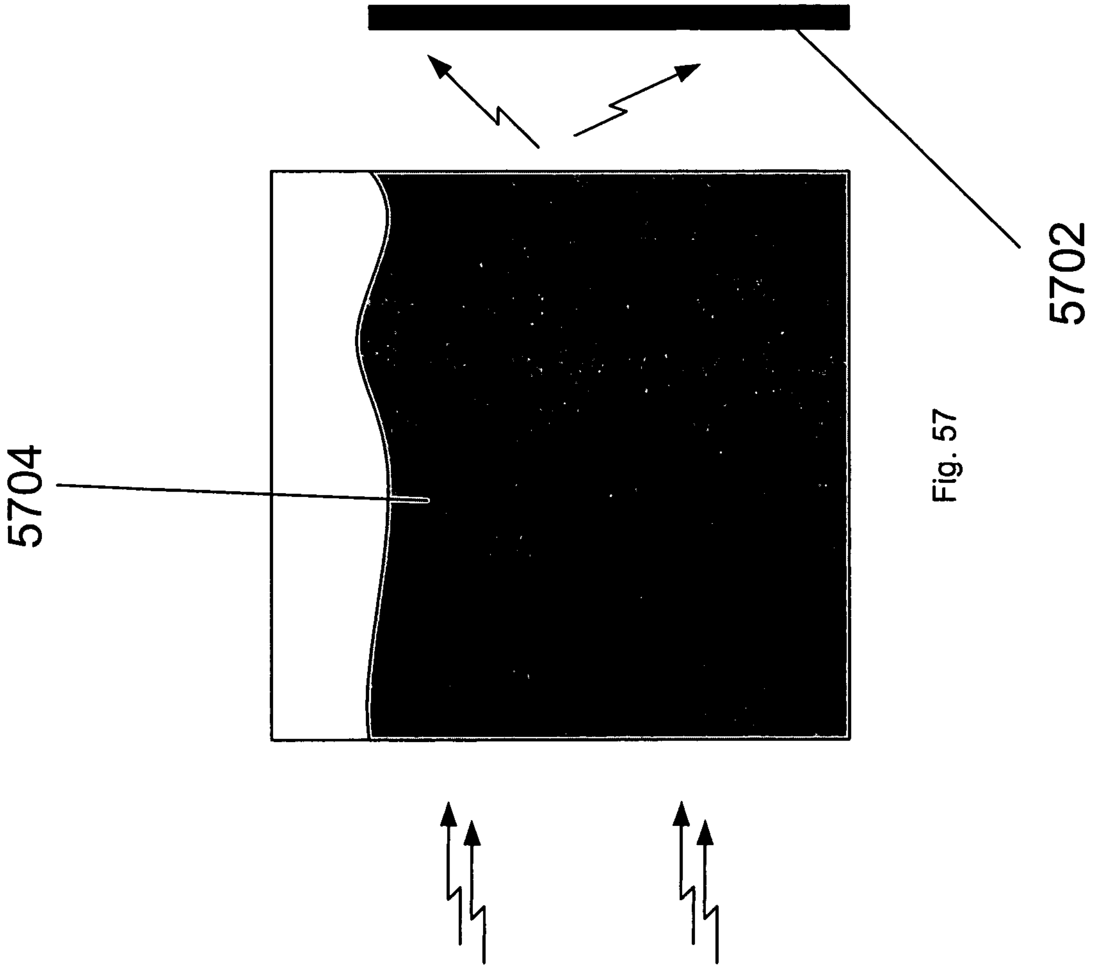
FIG. 57 shows a photovoltaic powered diffractional sensor according to the principles of the present invention.

In embodiments of the invention, a photovoltaic powered diffractional sensor 5702 may be used to measure light diffraction as a light is passed through a fluid or gas or other material 5704 as shown in FIG. 57. In embodiments, a diffractional sensor may measure the diffracted light from a light source passing through a medium. In embodiments, the diffracted light may provide information such as particle size or interaction between at least two molecules. In embodiments, diffractional devices may be chemical analyzers, commercial solution analyzers, biological or chemical molecular analyzers, or other devices that measure particle size. In embodiments, these devices may be used in photo solution mixers, pharmaceutical material mixers, biological research, and chemical analysis. In embodiments, feedback from a diffractional sensor may be related to the size of the particle being measured and may be provided to a computer or computer network for analysis.

In embodiments, devices such as particle size analyzers and molecular/chemical analyzers may have photovoltaic cells disposed as a skin or film on an exposed surface of the device or may be disposed on deployable units that may provide the required amount of power for the diffractional sensor. In embodiments a particle size analyzer may be a portable device that may work on a fluid sample. In embodiments, the particle size analyzer may have a skin or film photovoltaic facility or may use a charging unit for energy storage (e.g. battery). The charging unit may use photovoltaic facilities to provide power. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the diffractional sensor.

Figure 58:
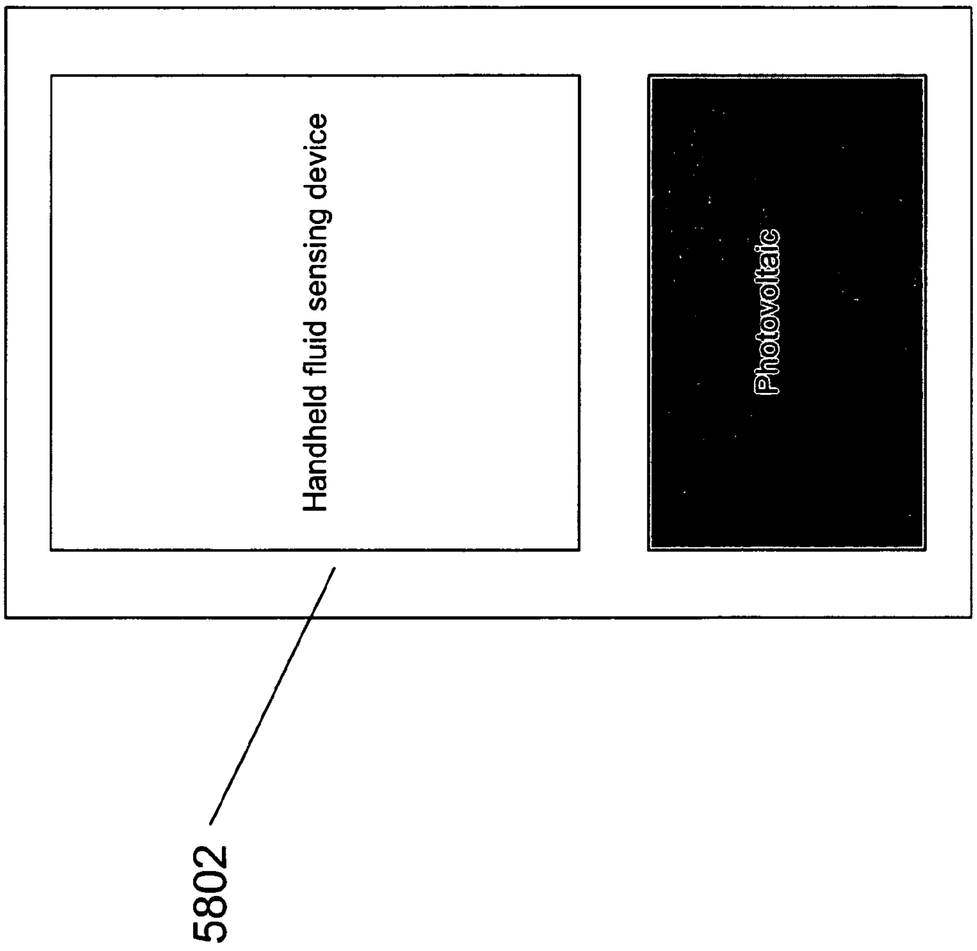
FIG. 58 shows a photovoltaic powered refraction sensor according to the principles of the present invention.

In embodiments of the invention, a photovoltaic powered refraction sensor 5802 may be used to measure the refraction properties of a fluid, gas, or other material to determine the fluid material as shown in FIG. 58. In embodiments, the refraction sensor may use a fluid or atmospheric refraction index for determination of the fluid type. In embodiments, refraction sensor devices may be a handheld computer (PDA) fluid analyzer, commercial fluid analyzer, pipeline fluid analyzer, atmospheric analyzer, or other device for distinguishing different types of fluids. In embodiments, the refraction sensors may provide feedback to computers or a computer network about the refraction index for the fluid. In embodiments, the refraction index may then determine the fluid being measured.

In embodiments, devices such as the handheld (e.g. PDA or Pocket PC) fluid analyzer may have photovoltaic cells disposed as a film or skin on an exposed surface of the handheld computer (e.g. PDA or Pocket PC) and may use available lighting. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, other devices such as a commercial fluid analyzer may have photovoltaic cells disposed as a skin or film on an exposed surface of the device or may be disposed on deployable units that may provide the required amount of power for the refraction sensor. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the refraction sensor.

Figure 59:
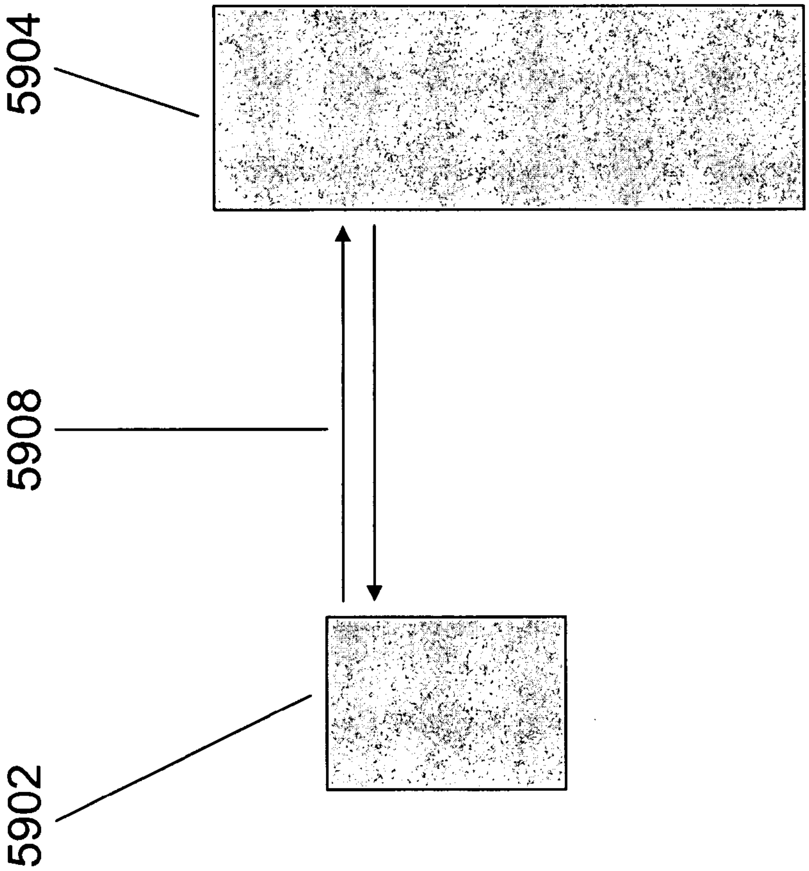
FIG. 59 shows a photovoltaic reflection sensor according to the principles of the present invention.

In embodiments of the invention, a photovoltaic reflection sensor 5902 may be used to determine the location of physical edges, corners, folds, bends or other attributes in objects 5904 through measured reflected light 5908 as shown in FIG. 59. In embodiments, reflection sensors may be used in optical devices for distance measurement or object identification by measuring the reflected light on a reflective surface. In embodiments, devices may be used for automotive robotic assembly, robot pick and place devices, quality control measurement devices (e.g. industrial quality control), or other devices for object measurement or identification. In embodiments, the reflection sensor may provide feedback about the distance to an object or the distance from more than one surface on an object.

In embodiments, devices such as robotic assembly, robotic pick and place, and quality control measurements may have photovoltaic cells disposed as a film or skin on an exposed surface of the device to power the reflection sensor and may use available lighting. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, these devices may have photovoltaic cells disposed on deployable units that may provide the required amount of power for the reflection sensor. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the reflection sensor.

Figure 60:
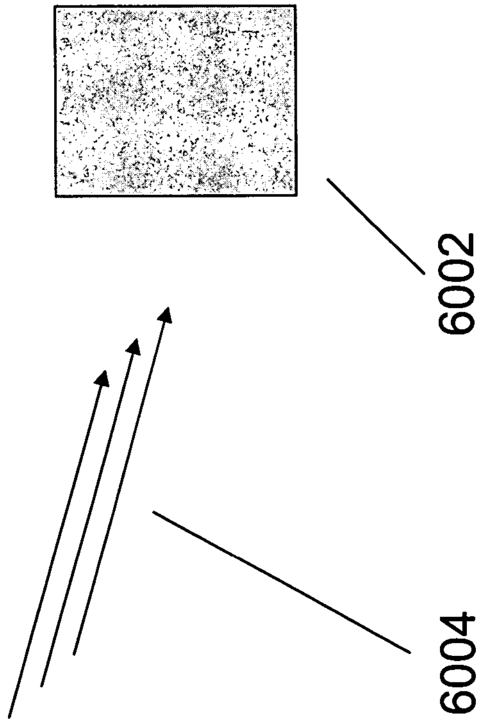
FIG. 60 shows a photovoltaic polarization sensor according to the principles of the present invention.

In embodiments of the invention, a photovoltaic polarization sensor 6002 may be used to measure the polarization of light 6004 as shown in FIG. 60. In embodiments, the polarization sensor may be used to determine if the light polarization has decayed over distance and time. In embodiments, the polarization sensor may measure for tracking purposes the polarization changes of light reflecting off a moving object. In embodiments, devices such as those used to track moving objects (e.g. planes, missiles, cars, trains), for fiber optic communication analysis (e.g. break down of signal detection), or other devices for measuring light polarization may be used. In embodiments, the polarization sensor may provide feedback about the change in the light polarization for further calculations by a computer or computer network.

In embodiments, devices such as those used for object tracking or fiber optic communication (e.g. substations for checking light decay) may have photovoltaic cells disposed as a film or skin on an exposed surface of the device and may use available lighting. In embodiments, object tracking devices may also be portable devices with photovoltaic cells disposed as a film or skin on an exposed surface of the device. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, these devices may have photovoltaic cells disposed on deployable units that may provide the required amount of power for the polarization sensor. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the polarization sensor.

Figure 61:
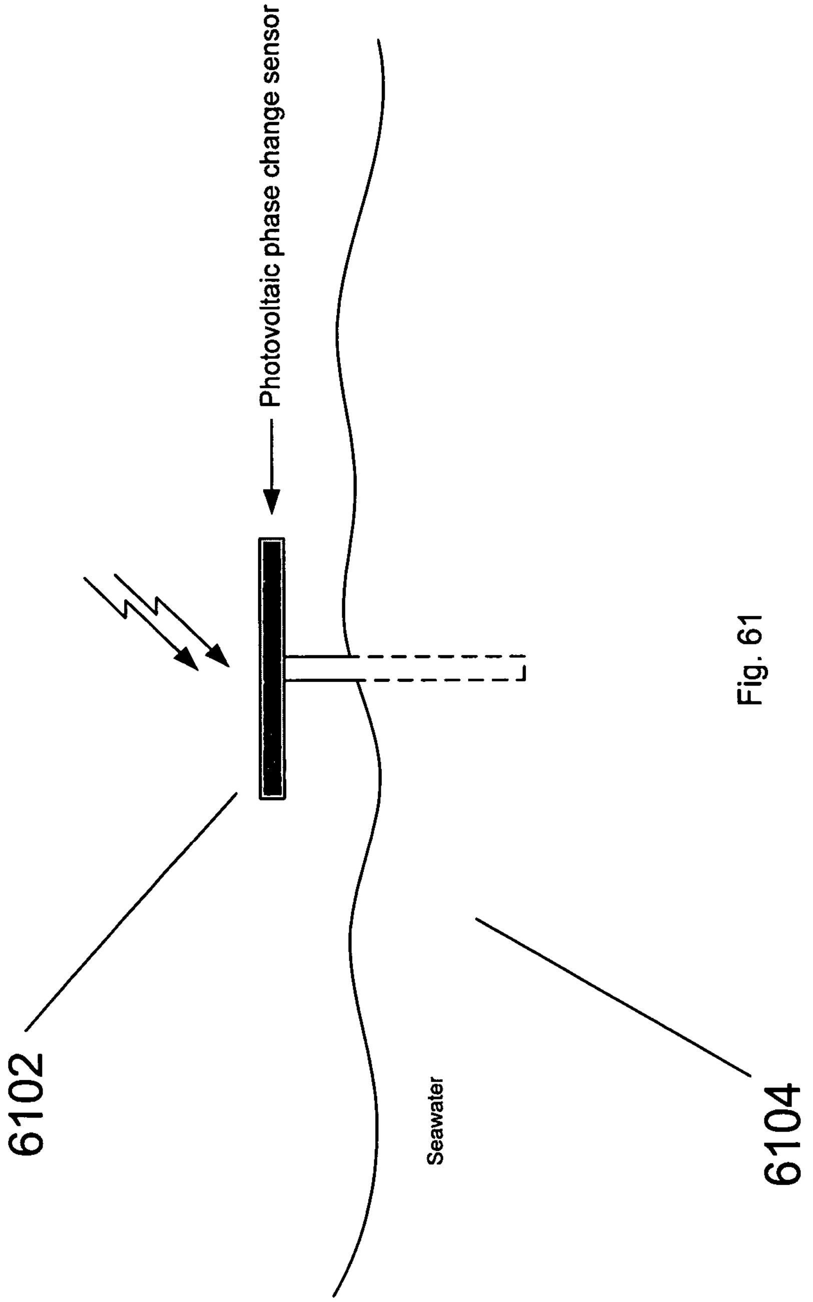
FIG. 61 shows a photovoltaic phase sensor according to the principles of the present invention.

In embodiments of the invention, a photovoltaic phase sensor 6102 may be used to determine a phase change of materials from solid/fluid/gas 6104 as shown in FIG. 61. In embodiments, the phase sensor may be used to analyze material phase changes in chemical metering, vapor testing, greenhouse controls, seawater testing, semi volatile chemical stability, gas analysis, chemical “sniffers” for target chemicals, atmospheric sensors, automobile exhaust analyzers, or other devices for sensing material phase changes. In embodiments, the phase sensor may be a contact sensor. In embodiments, the phase sensor may provide feedback that indicates the state of the material being tested or measured.

In embodiments, devices such as those used for chemical metering, vapor testing, greenhouse controls, seawater testing, semi volatile chemical stability analysis, gas analysis, chemical “sniffing” for target chemicals, atmospheric sensing, or automobile exhaust sensing may have photovoltaic cells disposed as a film or skin, on an exposed surface of the device and may use available lighting. In embodiments, the automobile exhaust sensor may be part of the automobile and may provide information to the automobile control system. The photovoltaic cells disposed as a skin or film may be on the interior (e.g. dashboard) or exterior (e.g. hood, roof, or trunk) of the automobile. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, these devices may also have photovoltaic cells disposed on deployable units that may provide the required amount of power for the phase sensor. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the phase sensor.

Figure 62:
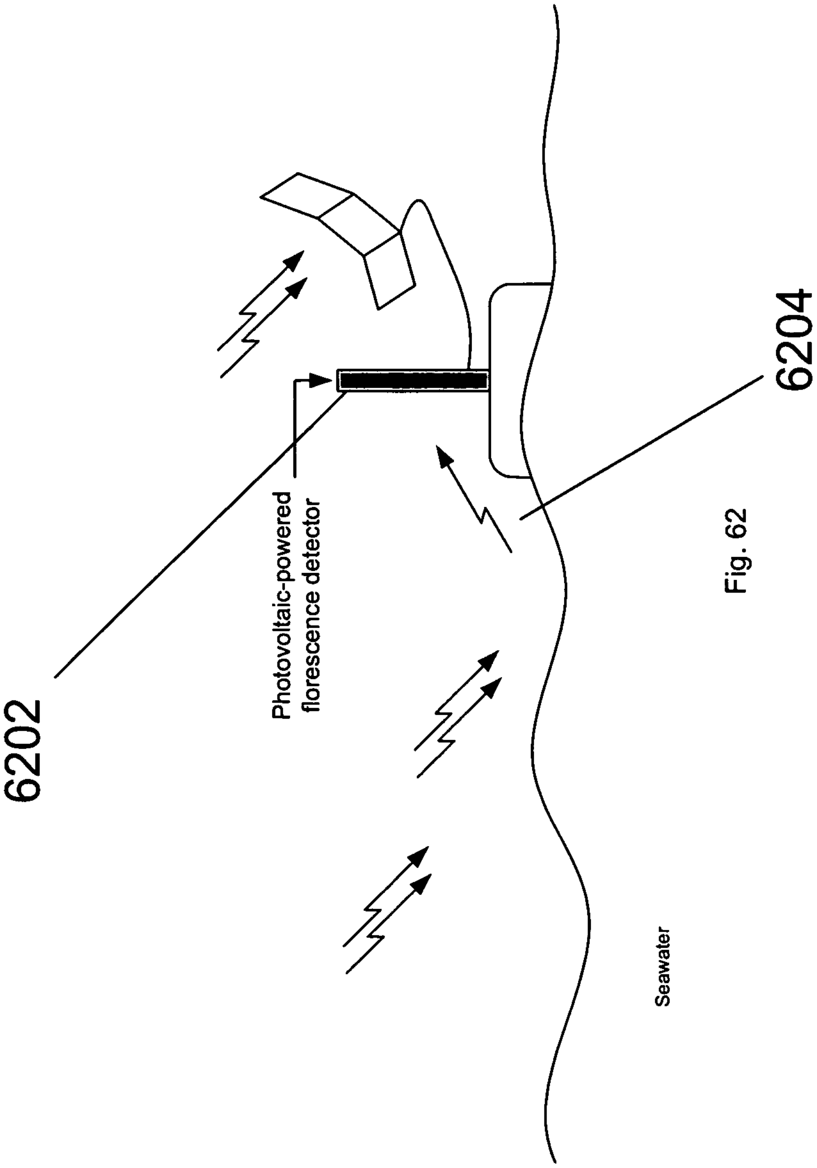
FIG. 62 shows a photovoltaic florescence sensor according to the principles of the present invention.

In embodiments of the invention, a photovoltaic florescence sensor 6202 may be used to identify biological materials/organisms based on reflected florescence light 6204 as shown in FIG. 62. In embodiments, florescence sensor devices such as those used for whole/broken grain identification (e.g. wheat or corn harvesting), seawater/water biological testing (e.g. plankton or biological contaminates), or bio-warfare agent detection (e.g. testing or detecting) may be used. In embodiments, the florescence sensor may provide feedback to a computer or network of computers about the florescence reflective wave length of the material/organisms for further analysis.

In embodiments, devices such as seawater/water biological testing (e.g. plankton or biological contaminates), bio-warfare agent detection (e.g. testing or detecting) may be portable and may have photovoltaic cells disposed as a film or skin on an exposed surface of the device and may use available lighting. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, devices such as those used for whole/broken grain identification (e.g. wheat or corn harvesting), seawater/water biological testing (e.g. plankton or biological contaminates), or bio-warfare agent detection (e.g. testing or detecting) may have photovoltaic cells disposed on deployable units that may provide the required amount of power for the florescence sensor. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the florescence sensor.

Figure 63:
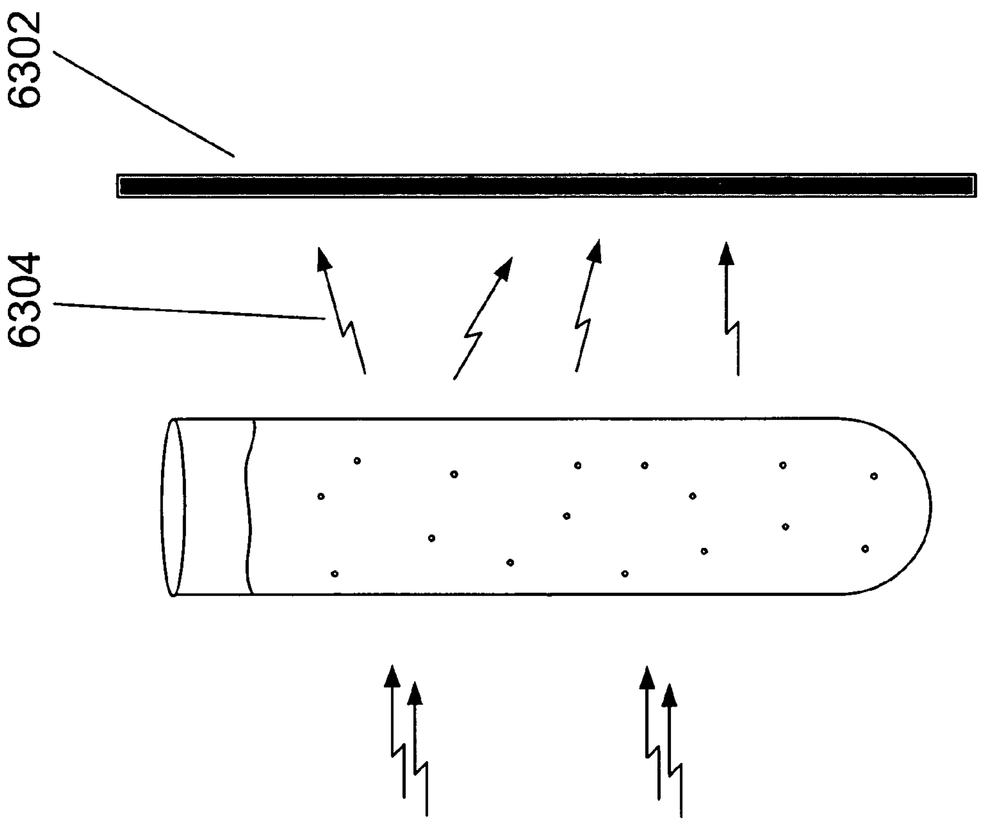
FIG. 63 shows a photovoltaic phosphorescence sensor according to the principles of the present invention.

In embodiments of the invention, a photovoltaic phosphorescence sensor 6302 may be used to identify biological materials/organisms based on long term emission of light 6304 as shown in FIG. 63. In embodiments, a phosphorescence sensor may detect the presence of biological substances based on a long term analysis. In embodiments, phosphorescence sensor devices may be used to determine trace constituents in a sample, analyze chemicals in chromatography (e.g. identification of chemicals in a solution), detect specific constituents in biological systems, remotely sense aspects of the environment (e.g. hydrologic, aquatic, and atmospheric biological testing), or other biological tests. In embodiments, the phosphorescence sensor may provide feedback to a computer or computer network about the emission light waves of biological objects.

In embodiments, devices such as those for constituent testing, chemical analysis in chromatography (e.g. identification of chemicals in a solution), or detection of specific constituents in biological systems may be portable and may have photovoltaic cells disposed as a film or skin on an exposed surface of the device and may use available lighting. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, devices such as those used for trace constituent testing, chemical analysis in chromatography (e.g. identification of chemicals in a solution), detection of specific constituents in biological systems, or environmental remote sensing (e.g. hydrologic, aquatic, and atmospheric biological testing) may have photovoltaic cells disposed on deployable units that may provide the required amount of power for the phosphorescence sensor. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the phosphorescence sensor.

Figure 64:
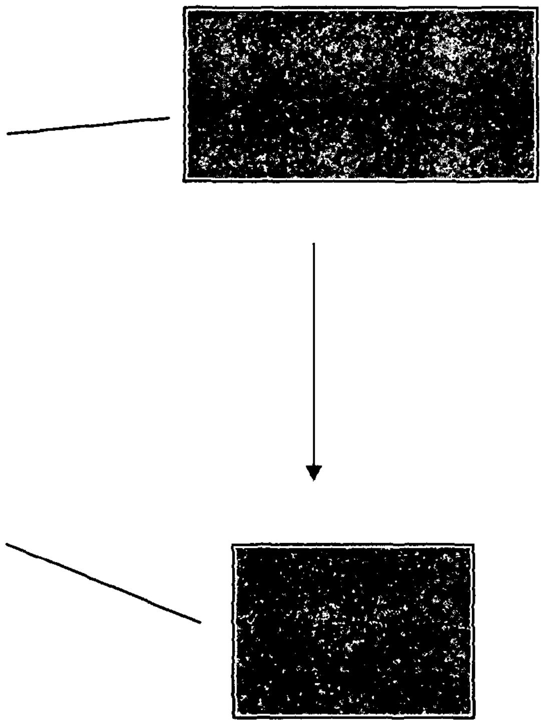
FIG. 64 shows a photovoltaic optical activity sensor according to the principles of the present invention.

In embodiments of the invention, an photovoltaic optical activity sensor 6402 may be used to measure chemical composition of an object 6404 as shown in FIG. 64. In embodiments, the optical activity sensor may be able to determine chemical composition beneath a surface. In embodiments, optical activity sensor devices may be used in bio-medical imaging (e.g. human/animal sub-surface imaging), neural imaging, neural activity measurement, or other devices to determine chemical composition or activity. In embodiments, the optical activity sensor may provide feedback as to the chemical activity of an object.

In embodiments, devices such as biomedical imaging (e.g. human/animal sub-surface imaging), neural imaging, and neural activity measurement may have photovoltaic cells disposed as a skin or film on an exposed surface of the device or may be disposed on deployable units that may provide the required amount of power for the optical activity sensor. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the optical activity sensor.

Figure 65:
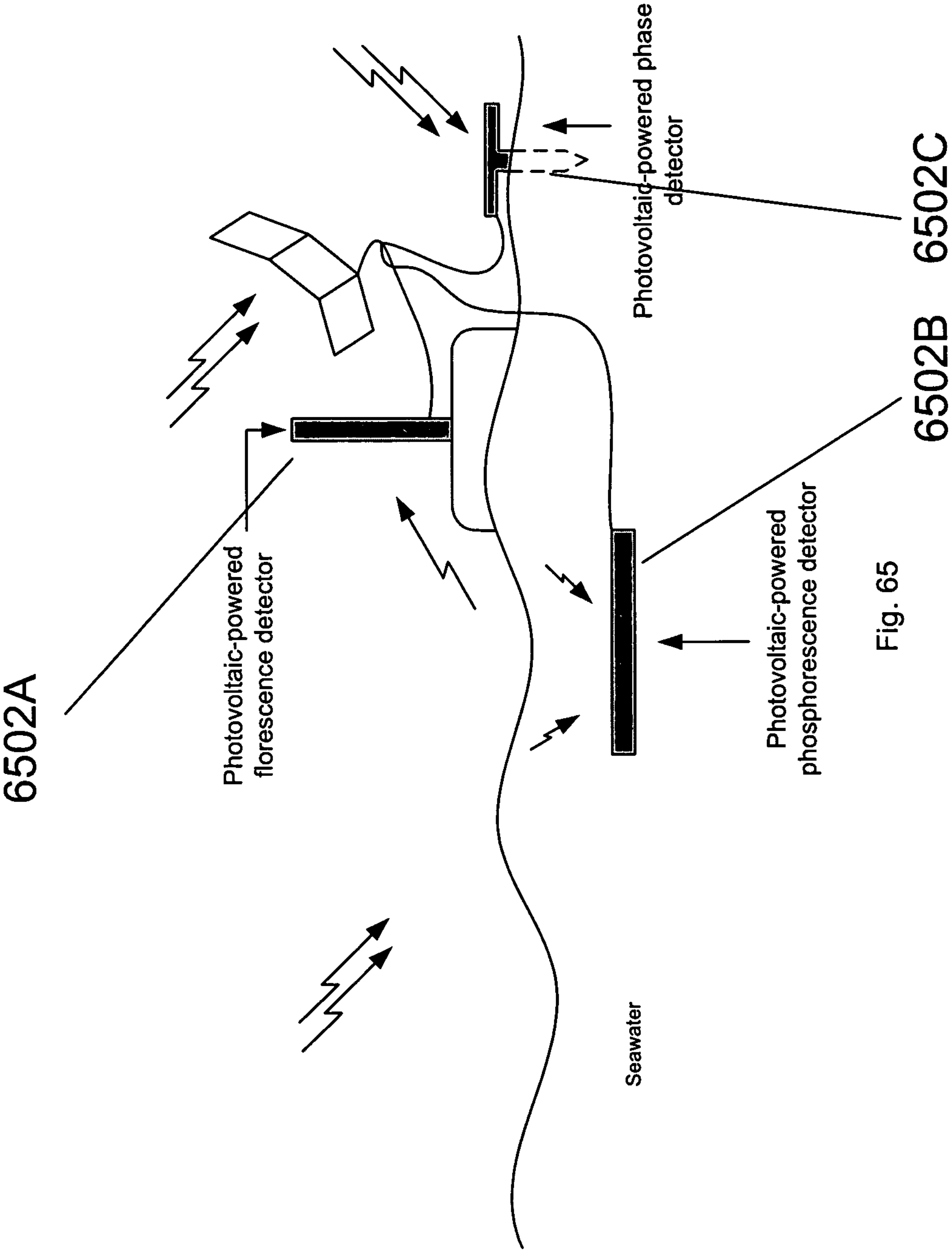
FIG. 65 shows a photovoltaic optical sensory array according to the principles of the present invention.

In embodiments of the invention, an photovoltaic optical sensory array may be used to have a plurality of sensors 6502A, 6502B, and 6502C in an array for measuring refraction, reflection, polarization, phase, florescence, phosphorescence, and optical activity as shown in FIG. 65. In embodiments, the optical sensor array may be an array of any optical sensor for providing a plurality of images at a time. In embodiments, optical sensor array devices may be chemical detection devices, biological detection devices, sub-surface imaging devices, or other optical array sensor systems as explained previously. In embodiments, these optical array sensors may be portable or handheld devices. In embodiments, an optical senor array may provide a plurality of images from the array sensors and may be used in pattern recognition.

In embodiments, devices such as chemical detection devices, biological detection devices, and sub-surface imaging devices may be portable or handheld and may have photovoltaic cells disposed as a film or skin on an exposed surface of the device and may use available lighting. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, these devices may have photovoltaic cells disposed on deployable units that may provide the required amount of power for the optical sensor array. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the optical sensor array.

Figure 66:
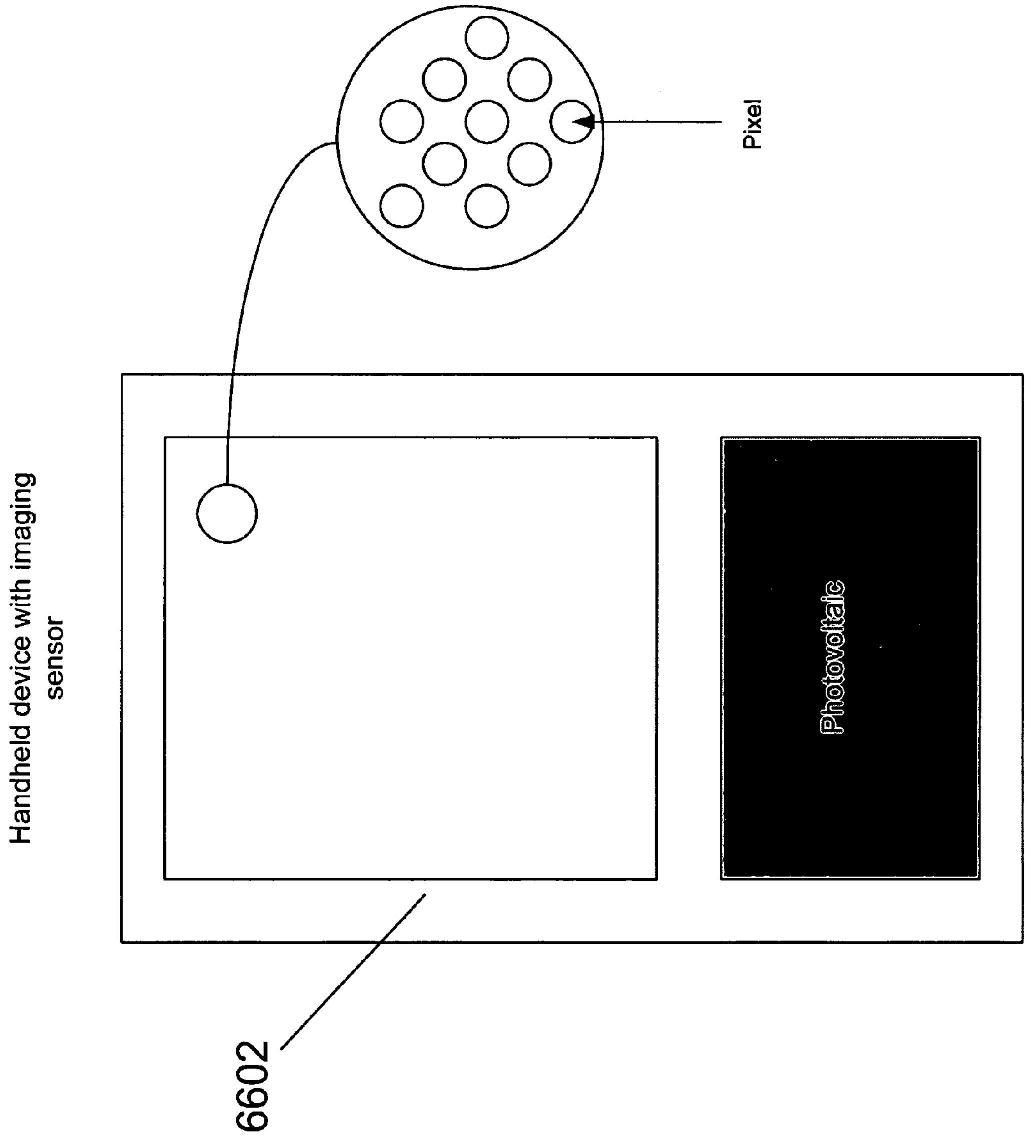
FIG. 66 shows a photovoltaic imaging sensor according to the principles of the present invention.

In embodiments of the invention, a photovoltaic imaging sensor 6602 may be used in a device that captures light on a grid of small pixels as shown in FIG. 66. In embodiments, imaging sensors may be used in any device that captures an image of light. In embodiments, an imaging sensor may be used in digital cameras, digital video cameras, cell phones, PDAs, dual mode digital cameras, automation vision systems, biometric tools for security (e.g. retina, fingerprint, facial, or palm recognition), video conferencing, security cameras, toys, satellites, or other devices capable of capturing an image.

In embodiments, devices such as digital cameras, digital video cameras, cell phones, PDAs, dual mode digital cameras, biometric tools for security (e.g. retina, fingerprint, facial, or palm recognition), video conferencing, security cameras, or toys may have photovoltaic cells disposed as a film or skin on an exposed surface of the device and may use available lighting. The use of photovoltaic cell facilities may allow these devices to be located at a remote location for long unattended periods. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, devices such as automation vision systems, video conferencing, security cameras, or satellites may have photovoltaic cells disposed as a skin or film on an exposed surface of the device or may be disposed on deployable units that may provide the required amount of power for the imaging sensor. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the imaging sensor.

Figure 67:
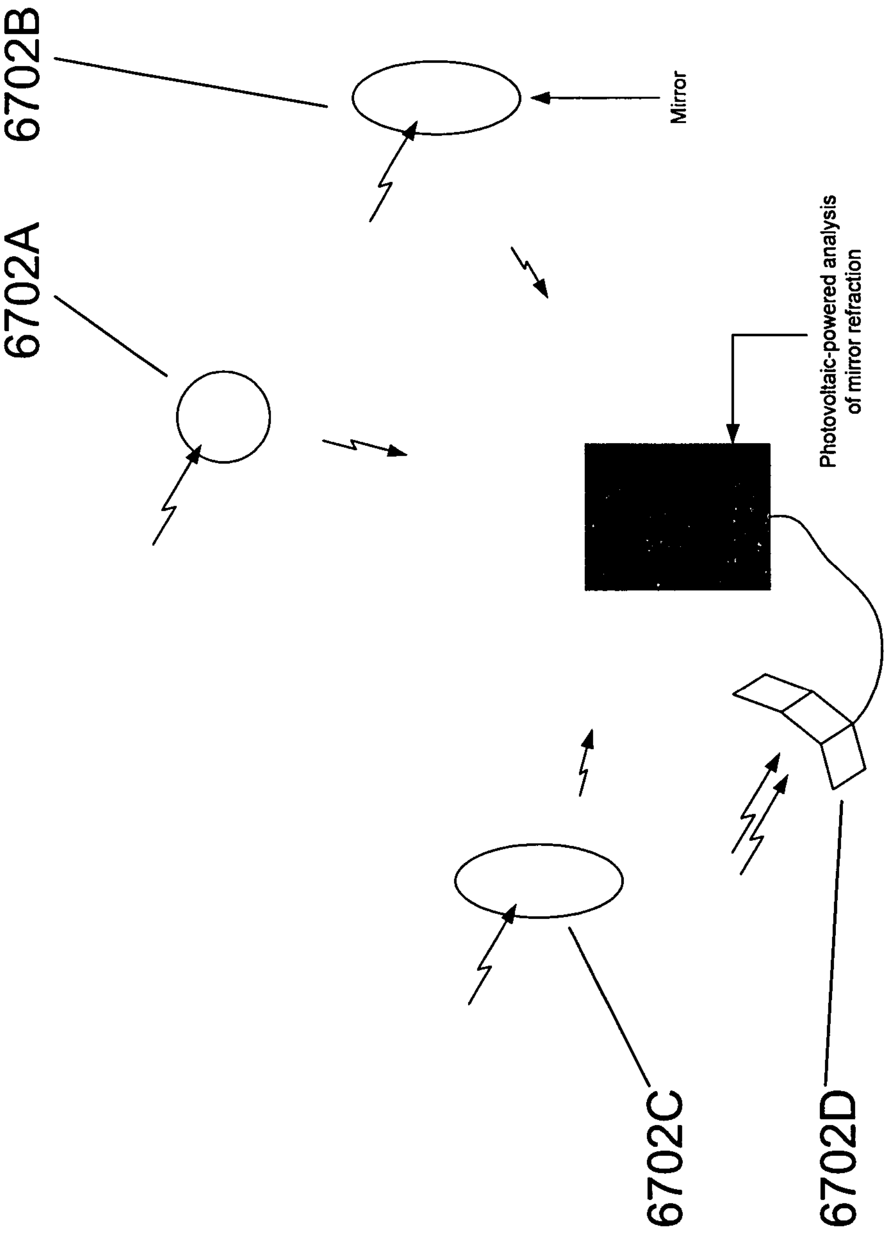
FIG. 67 shows a photovoltaic micro mirror array according to the principles of the present invention.

In embodiments of the invention, a photovoltaic micro mirror array may be an array of small mirrors 6702A, 6702B, 6702C, and 6702D that can individually reflect light to at least one path for analysis as shown in FIG. 67. In embodiments, the micro mirror array may be able to reflect light to a plurality of paths for analysis of the light by a plurality of sensors. In embodiments, micro mirror arrays may be used in devices such as telescopes, microscopes, satellites, chemical analyzers, or other devices that allow the analysis of at least one light. In embodiments, devices using micro mirror arrays may provide reflected light to other sensors for analysis.

In embodiments, devices such as telescopes, microscopes, satellites, and chemical analyzers may have photovoltaic cells disposed as a film or skin on an exposed surface of the device and may use available lighting. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, these devices may also have photovoltaic cells disposed on deployable units that may provide the required amount of power for the micro mirror array. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the micro mirror array.

Figure 68:
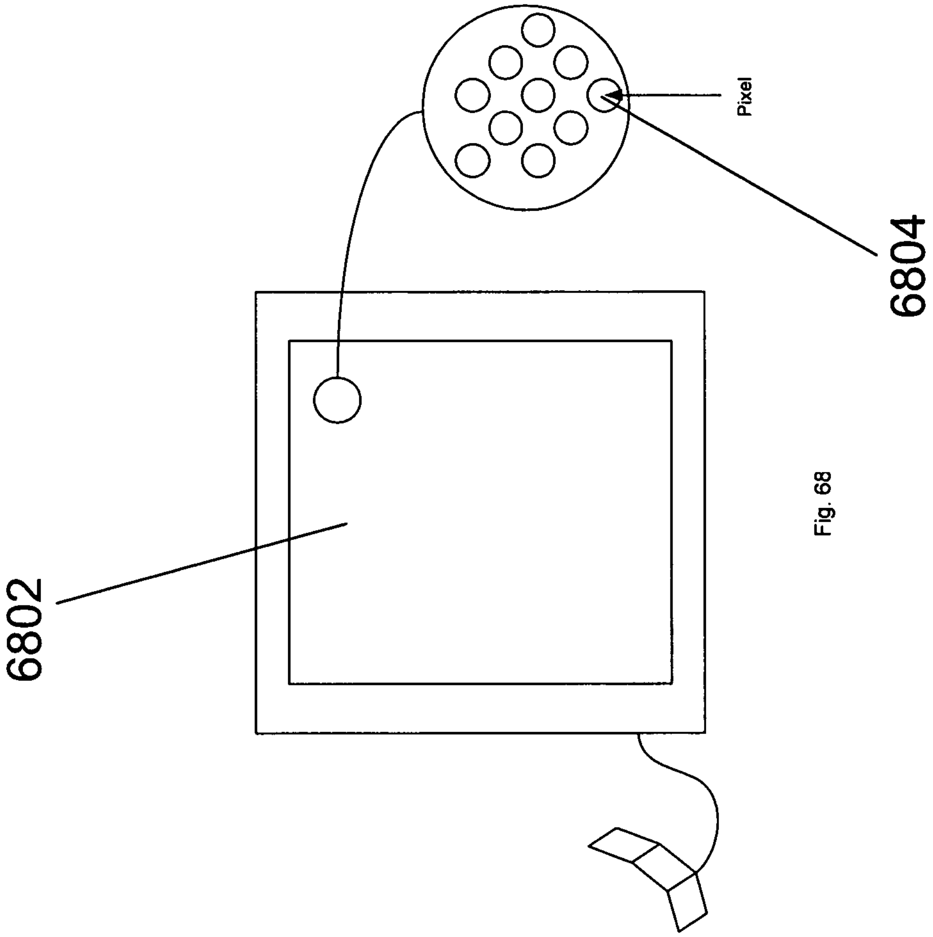
FIG. 68 shows photovoltaic pixel array according to the principles of the present invention.

In embodiments of the invention, a photovoltaic pixel array 6802 may be an array of pixels 6804 that is capable of capturing at least one light wavelength as shown in FIG. 68. In embodiments, a pixel array may have at least one type of pixel capable of collecting a range of light wavelengths. In embodiments, the pixel array may be able to collect light from a plurality of light wavelengths in the same array by using a plurality of pixel types and may enable the device to collect a plurality of data in the same instant. In an embodiment, the pixel array may be able to collect light from visible to near ultraviolet. In embodiments, pixel arrays may be used in devices such as telescopes, microscopes, security cameras, or other devices that may need to analyze light in a plurality of wavelengths at the same time. In embodiments, pixel arrays may provide image data to a processor capable of interpreting the pixel information.

In embodiments, devices such as telescopes, microscopes, and security cameras may have photovoltaic cells disposed as a film or skin on an exposed surface of the device and may use available lighting. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, these devices may have photovoltaic cells disposed on deployable units that may provide the required amount of power for the pixel array. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the pixel array.

Figure 69:
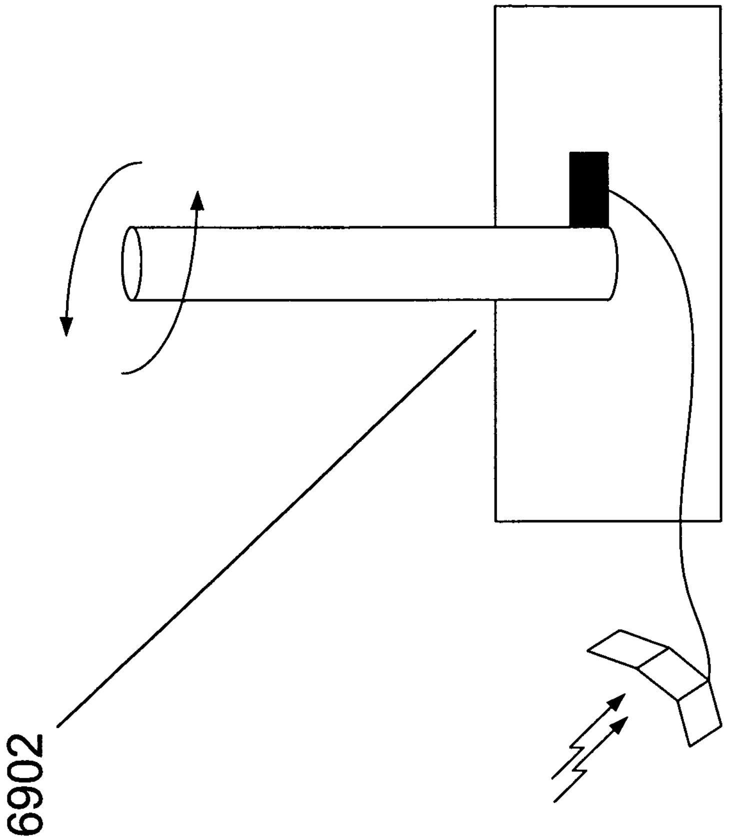
FIG. 69 shows a photovoltaic rotation sensor according to the principles of the present invention.

In embodiments of the invention, a photovoltaic rotation sensor 6902 may measure rotational torque, angle, speed, acceleration, relative angle, relative speed, and relative acceleration of an object on an axis as shown in FIG. 69. In embodiments, devices with rotation sensors may be able to measure these variables for any device that rotates on an axis. In embodiments, a rotational sensor may be used in devices such as bio-mechanical arms/legs, wheels of a automobile, manufacturing machinery, rotary engines, CD players, disk drives, or other devices that measure rotation around an axis. In embodiments, the rotation sensor may provide feedback of rotational torque, angle, speed, acceleration, relative angle, relative speed, and relative acceleration to a controller, computer, or network of computers for further analysis and possible adjustment.

In embodiments, devices such as wheels of a automobile, CD players, or disk drives may have photovoltaic cells disposed as a film or skin on an exposed surface of the device and may use available lighting. In embodiments, devices such as bio-mechanical arms/legs may have photovoltaic cells disposed as a film, skin, or flexible material on a surface of the device and may use available lighting. In embodiments, as the bio-mechanical arm/leg moves, the film, skin, or flexible material may be exposed to light. In embodiments, the photovoltaic facility may be part of clothing and may provide power to the bio-mechanical arm/leg. In embodiments, the rotation sensor in the wheel of an automobile may have photovoltaic cells disposed as a film or skin on the interior (e.g. dashboard) or exterior (e.g. hood, roof, trunk). Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, devices such as manufacturing machinery or rotary engines may have photovoltaic cells disposed as a skin or film on an exposed surface of the device or may be disposed on deployable units that may provide the required amount of power for the rotation sensor. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the rotation sensor.

Figure 70:
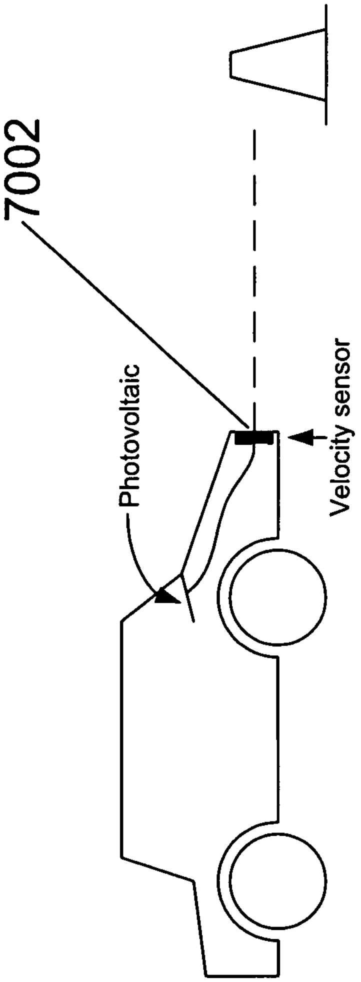
FIG. 70 shows a photovoltaic velocity sensor according to the principles of the present invention.

In embodiments of the invention, a photovoltaic velocity sensor 7002 may measure the linear velocity of an object as shown in FIG. 70. In embodiments, the velocity sensor may use at least one method of measuring velocity. For example, cable extension, magnetic induction, microwave, optical, piezoelectric, radar, strain gauge, or ultrasonic devices may be used to measure linear speed. In embodiments, velocity sensor devices may be used in automobile speedometers, airplanes, rockets, boats, trains, radar guns, or other devices that measure linear velocity. In embodiments, velocity sensors may provide velocity feedback to a controller, display, computer, or network of computers.

In embodiments, devices such as automobile speedometers or radar guns may have photovoltaic cells disposed as a film or skin on an exposed surface of the device and may use available lighting. In embodiments, the velocity sensor for the automobile speedometer may have photovoltaic cells disposed as a film or skin on the interior (e.g. dashboard) or exterior (e.g. hood, roof, trunk). Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, devices such as airplanes, rockets, boats, or trains may have photovoltaic cells disposed as a skin or film on an exposed surface of the device or may be disposed on deployable units that may provide the required amount of power for the velocity sensor. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the velocity sensor.

Figure 71:
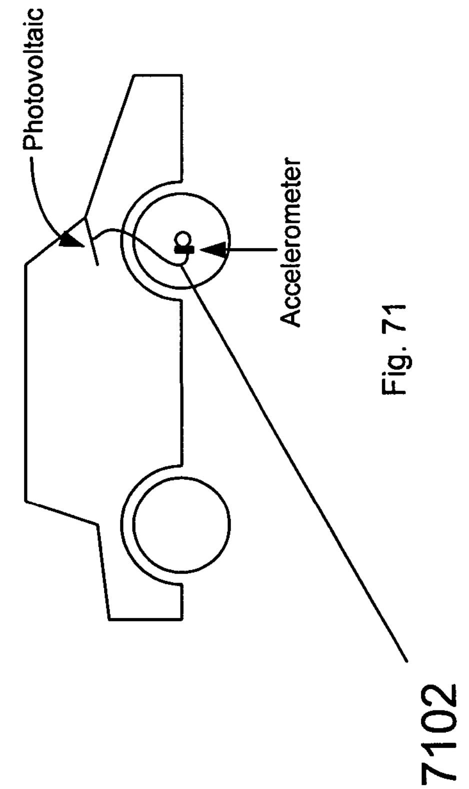
FIG. 71 shows a photovoltaic accelerometer according to the principles of the present invention.

In embodiments of the invention, an photovoltaic accelerometer 7102 may measure the dynamic acceleration of an object as shown in FIG. 71. In embodiments, an accelerometer may measure one-dimensional motion. In embodiments, accelerometers may be used in devices such as automobiles, elevators, amusement park rides, seismometers, aircraft, satellites, or other objects that measure acceleration. In embodiments, the accelerometer may provide feedback to a controller, display, computer, or computer network.

In embodiments, devices such as automobiles, amusement park rides, and seismometers may have photovoltaic cells disposed as a film or skin on an exposed surface of the device and may use available lighting. In embodiments, the accelerometer for the automobile may have photovoltaic cells disposed as a film or skin on the interior (e.g. dashboard) or exterior (e.g. hood, roof, trunk). Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use.

In embodiments, devices such as elevators, aircraft, or satellites may have photovoltaic cells disposed as a skin or film on an exposed surface of the device or may be disposed on deployable units that may provide the required amount of power for the accelerometer. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the accelerometer.

Figure 72:
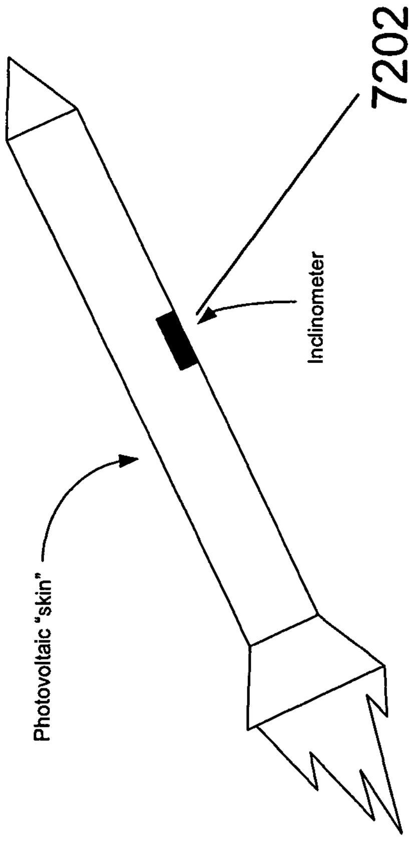
FIG. 72 shows a photovoltaic inclinometer according to the principles of the present invention.

In embodiments of the invention, a photovoltaic inclinometer 7202 may measure the inclination of an object in relation to a position as shown in FIG. 72. In embodiments, inclinometers may be used in devices such as antennas, rockets, satellites, dams, slope measurements, tunneling, or other devices that require dynamic inclination measurements. In embodiments, the inclinometer may provide angle information feedback to a controller, display, computer, or computer network.

In embodiments, devices such as antennas, rockets, satellites, dams, slope measurements, or tunneling may have photovoltaic cells disposed as a skin, film, or flexible material on an exposed surface of the device or may be disposed on deployable units that may provide the required amount of power for the inclinometer. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the inclinometer.

Figure 73:
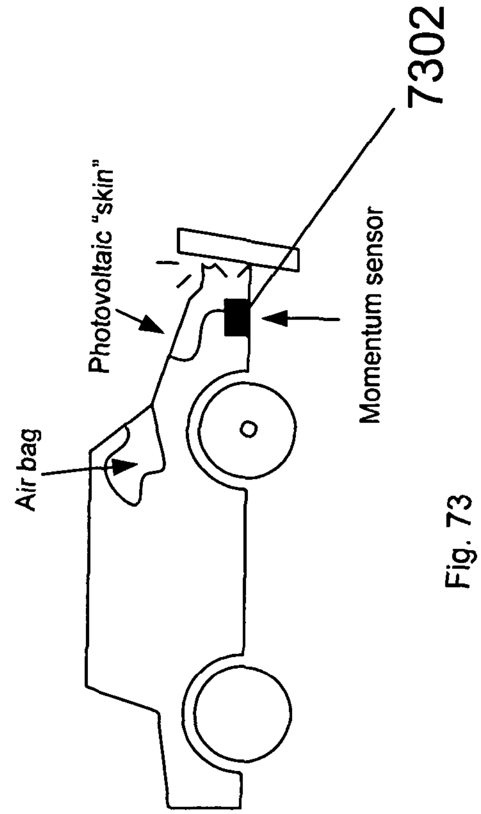
FIG. 73 shows a photovoltaic momentum sensor according to the principles of the present invention.

In embodiments of the invention, a photovoltaic momentum sensor 7302 may measure the linear momentum of an object in relation to a position as shown in FIG. 73. In embodiments, a momentum sensor may measure impact momentum of one object upon another object. In embodiments, momentum sensors may be in devices such as solar dust collectors, automobiles (e.g. collision detection for air bags), aircraft (e.g. black box data collectors), or other devices to measure momentum. In embodiments, the momentum sensor may provide momentum feedback to a controller, computer, or computer network.

In embodiments, devices such as solar dust collectors, automobiles (e.g. collision detection for air bags), and aircraft (e.g. black box data collectors) may have photovoltaic cells disposed as a film or skin on an exposed surface of the device and may use available lighting. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, devices may use a recharging unit with a photovoltaic facility and then be detached from the photovoltaic facility recharge unit for use. In embodiments, these devices may also have photovoltaic cells disposed on deployable units that may provide the required amount of power for the momentum sensor. In embodiments, the deployable units may unfold, fan out, be stacked in an offset pattern, be positioned on a flat surface, or may be angled to take advantage of a light source. In embodiments, the deployable photovoltaic facilities may be able to adjust the number of units exposed to a light source manually or automatically. In embodiments, the photovoltaic facilities may be capable of automatically tracking a light source to maintain the required power to the momentum sensor.

Figure 74:
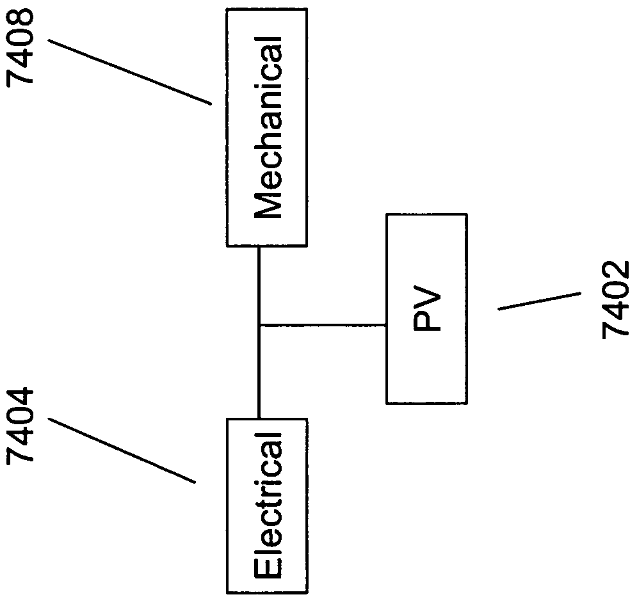
FIG. 74 shows a photovoltaic facility associated with an electrical sensor and a mechanical sensor according to the principles of the present invention.

FIG. 74 illustrates a photovoltaic facility 7402 in association with an electrical sensor 7404 and a mechanical sensor 7408. While the illustration depicts a parallel electrical association, the electrical configuration may be a series or other style connection. In embodiments, the photovoltaic may be associated with more than two sensor facilities. In embodiments, the photovoltaic facility 7402 may be a photovoltaic facility as described herein.

Figure 75:
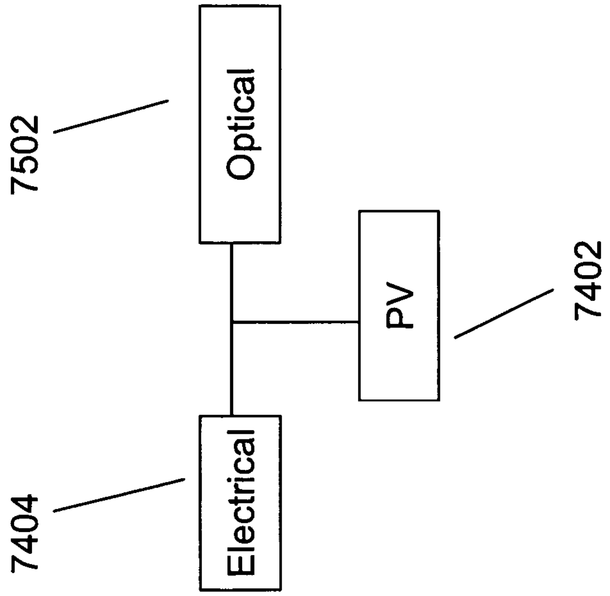
FIG. 75 shows a photovoltaic facility associated with an electrical sensor and an optical sensor according to the principles of the present invention.

FIG. 75 illustrates a photovoltaic facility 7402 in association with an electrical sensor 7404 and a optical sensor 7502. While the illustration depicts a parallel electrical association, the electrical configuration may be a series or other style connection. In embodiments, the photovoltaic may be associated with more than two sensor facilities. In embodiments, the photovoltaic facility 7402 may be a photovoltaic facility as described herein.

Figure 76:
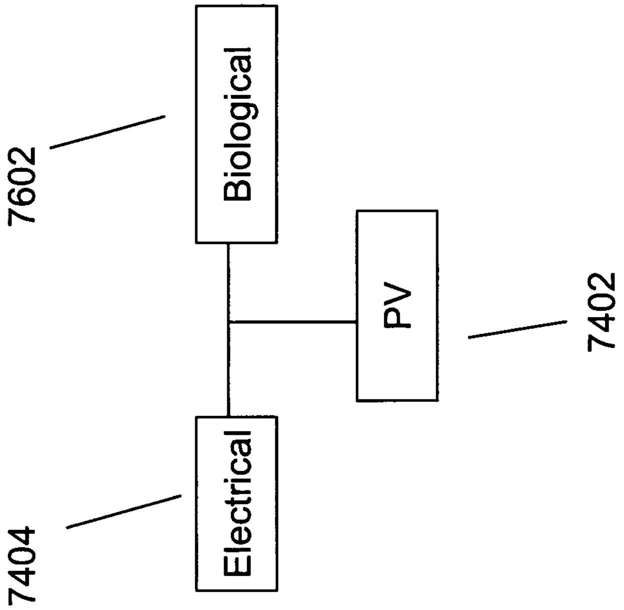
FIG. 76 shows a photovoltaic facility associated with an electrical sensor and a biological sensor according to the principles of the present invention.

FIG. 76 illustrates a photovoltaic facility 7402 in association with an electrical sensor 7404 and a biological sensor 7602. While the illustration depicts a parallel electrical association, the electrical configuration may be a series or other style connection. In embodiments, the photovoltaic may be associated with more than two sensor facilities. In embodiments, the photovoltaic facility 7402 may be a photovoltaic facility as described herein.

Figure 77:
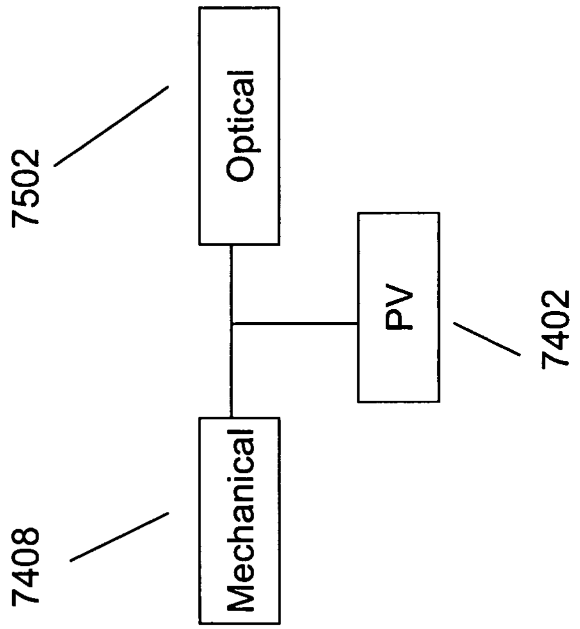
FIG. 77 shows a photovoltaic facility associated with a mechanical sensor and an optical sensor according to the principles of the present invention.

FIG. 77 illustrates a photovoltaic facility 7402 in association with a mechanical sensor 7408 and a optical sensor 7502. While the illustration depicts a parallel electrical association, the electrical configuration may be a series or other style connection. In embodiments, the photovoltaic may be associated with more than two sensor facilities. In embodiments, the photovoltaic facility 7402 may be a photovoltaic facility as described herein.

Figure 78:
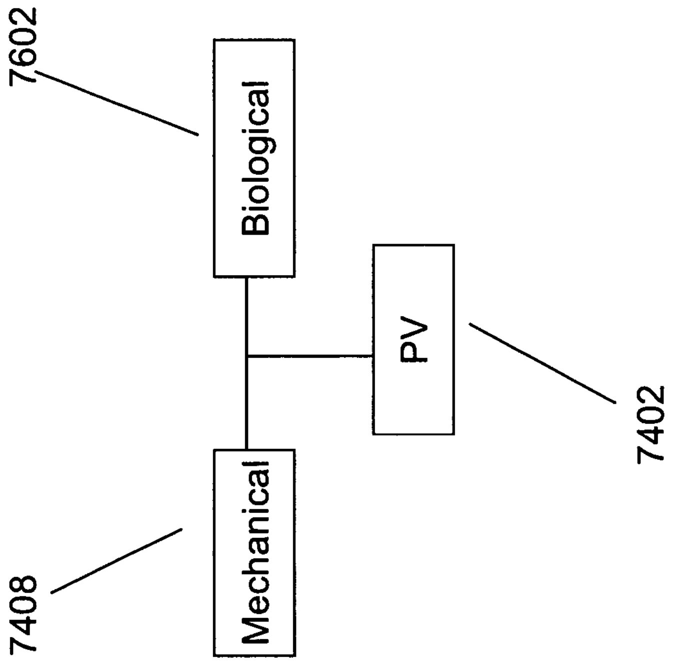
FIG. 78 shows a photovoltaic facility associated with a mechanical sensor and a biological sensor according to the principles of the present invention.

FIG. 78 illustrates a photovoltaic facility 7402 in association with a mechanical sensor 7408 and a biological sensor 7602. While the illustration depicts a parallel electrical association, the electrical configuration may be a series or other style connection. In embodiments, the photovoltaic may be associated with more than two sensor facilities. In embodiments, the photovoltaic facility 7402 may be a photovoltaic facility as described herein.

Figure 79:
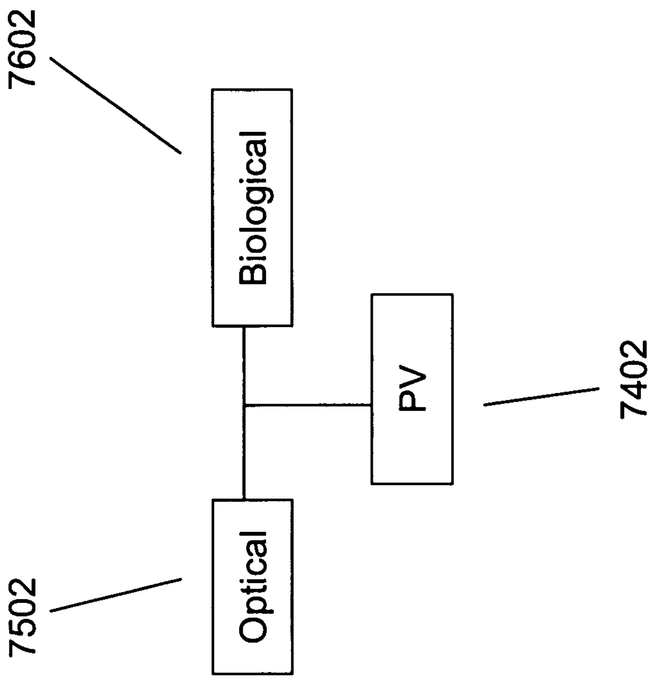
FIG. 79 shows a photovoltaic facility associated with an optical sensor and a biological sensor according to the principles of the present invention.

FIG. 79 illustrates a photovoltaic facility 7402 in association with an optical sensor 7502 and a biological sensor 7602. While the illustration depicts a parallel electrical association, the electrical configuration may be a series or other style connection. In embodiments, the photovoltaic may be associated with more than two sensor facilities. In embodiments, the photovoltaic facility 7402 may be a photovoltaic facility as described herein.

Figure 80:
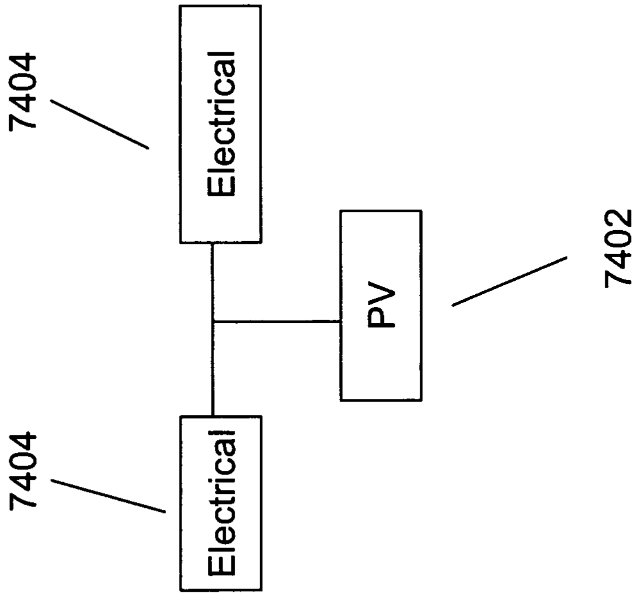
FIG. 80 shows a photovoltaic facility associated with two electrical sensors according to the principles of the present invention.

FIG. 80 illustrates a photovoltaic facility 7402 in association with two electrical sensors 7404. While the illustration depicts a parallel electrical association, the electrical configuration may be a series or other style connection. In embodiments, the photovoltaic may be associated with more than two sensor facilities. In embodiments, the photovoltaic facility 7402 may be a photovoltaic facility as described herein.

Figure 81:
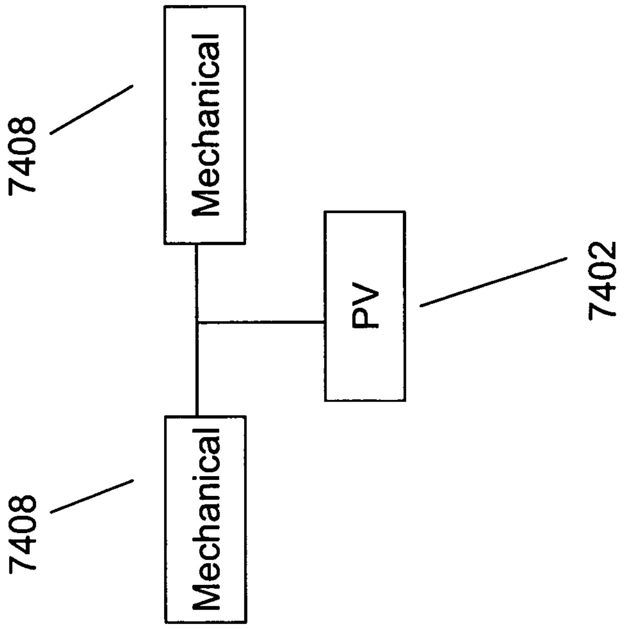
FIG. 81 shows a photovoltaic facility associated with two mechanical sensors according to the principles of the present invention.

FIG. 81 illustrates a photovoltaic facility 7402 in association with two mechanical sensors 7408. While the illustration depicts a parallel electrical association, the electrical configuration may be a series or other style connection. In embodiments, the photovoltaic may be associated with more than two sensor facilities. In embodiments, the photovoltaic facility 7402 may be a photovoltaic facility as described herein.

Figure 82B:
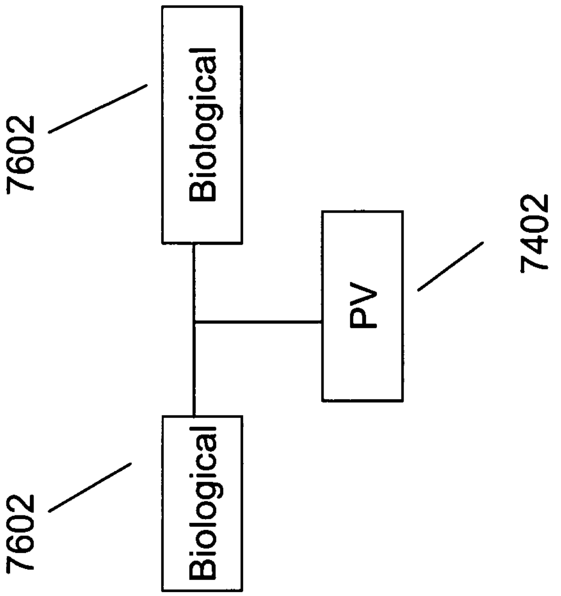
FIG. 82B shows a photovoltaic facility associated with two biological sensors according to the principles of the present invention.
Figure 82A:
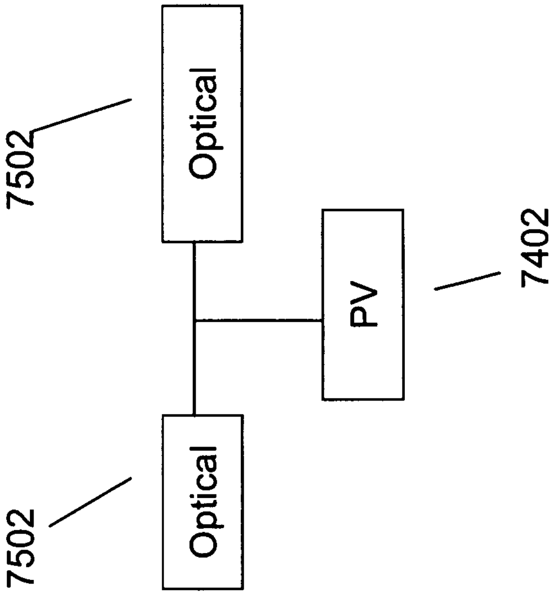
FIG. 82A shows a photovoltaic facility associated with two optical sensors according to the principles of the present invention.

FIG. 82A illustrates a photovoltaic facility 7402 in association with two optical sensors 7502. While the illustration depicts a parallel electrical association, the electrical configuration may be a series or other style connection. In embodiments, the photovoltaic may be associated with more than two sensor facilities. In embodiments, the photovoltaic facility 7402 may be a photovoltaic facility as described herein.

FIG. 82B illustrates a photovoltaic facility 7402 in association with two biological sensors 7602. While the illustration depicts a parallel electrical association, the electrical configuration may be a series or other style connection. In embodiments, the photovoltaic may be associated with more than two sensor facilities. In embodiments, the photovoltaic facility 7402 may be a photovoltaic facility as described herein.

Figure 83:
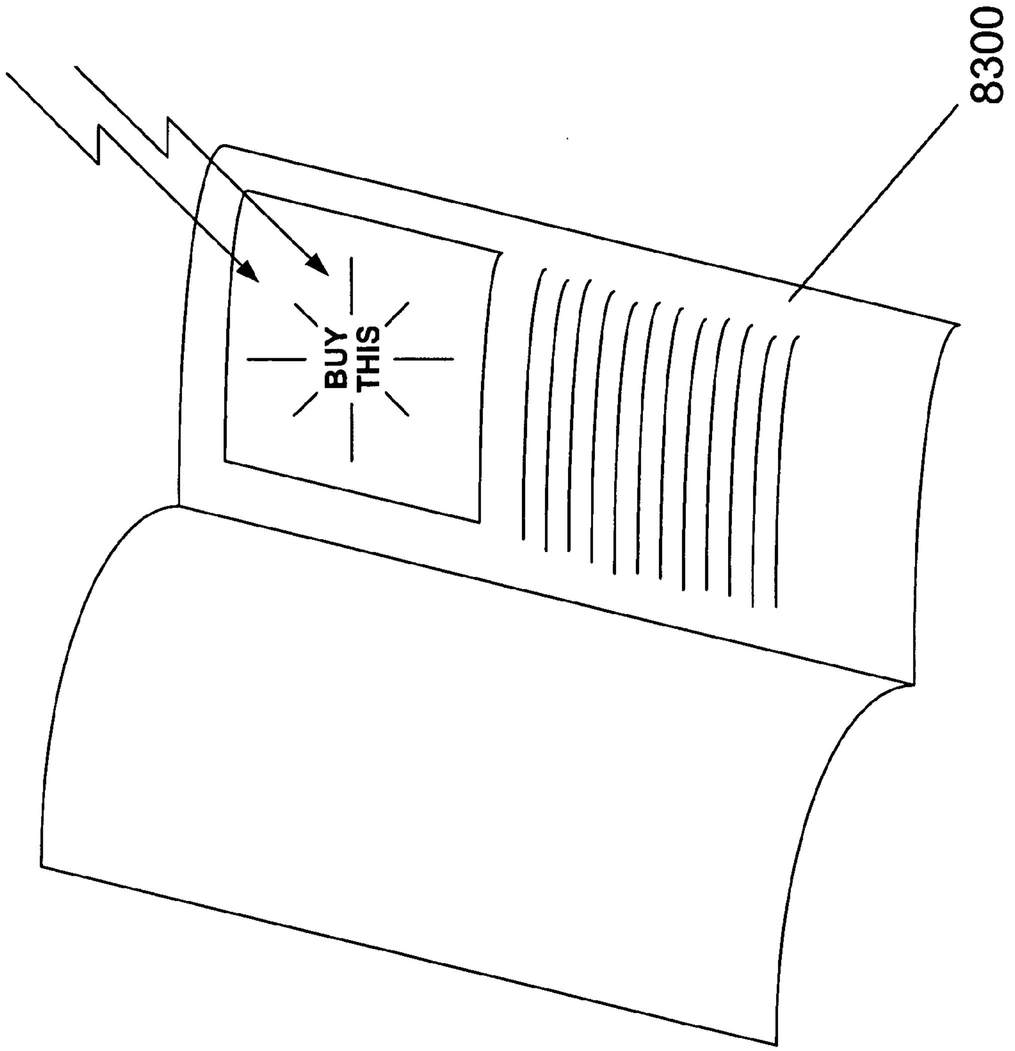
FIG. 83 shows a photovoltaic facility associated with printed content according to the principles of the present invention.

FIG. 83 shows a photovoltaic facility associated with printed content 8300. As shown in FIG. 83, a flexible photovoltaic facility may be incorporated into a magazine or other printed material. For example, when a reader turns to a page of a magazine containing the photovoltaic facility, the photovoltaic facility may generate electrical energy from ambient light and apply the electrical energy to power a visual display, such as an advertisement, chart, or other graphic, using light-emitting diodes, organic light-emitting diodes, or other low-power display technologies suitable for use within a magazine. More generally, the device may be used in similar fashion to provide electric-powered displays within printed materials such as books, magazines, journals, newspapers, and so on. A photovoltaic facility may be disposed on a fold out page that permits it to be expanded in order to present a larger surface area to the available light source. The device may also, or instead, be placed on a cover page or back page of a magazine to power a visual display to attract purchasers to the magazine on a newsstand or other resale location. In embodiments, the photovoltaic facility may be printed onto the page, either simultaneously with the printing of other content or before or after printing other content on the page. In embodiments the photovoltaic facility may be substantially transparent, or it may be transparent to certain desired wavelengths of light, so as to permit viewing of content of selected colors to be viewed, notwithstanding the presence of the photovoltaic facility on the page. In embodiments a development kit may be provided for enabling a content provider such as an author, commercial graphics designer, or publisher to associate a photovoltaic facility with an item of printed content, such as any of the items described throughout this disclosure. In one aspect, there is described herein a method of providing printed material that includes associating a photovoltaic facility with printed material, wherein the photovoltaic facility provides energy for an item that is associated with content of the printed material. The content may include, for example, an advertisement, an informational graphic, or a self-lighted text, and the item may be a lighted or animated display within the content.

Figure 84:
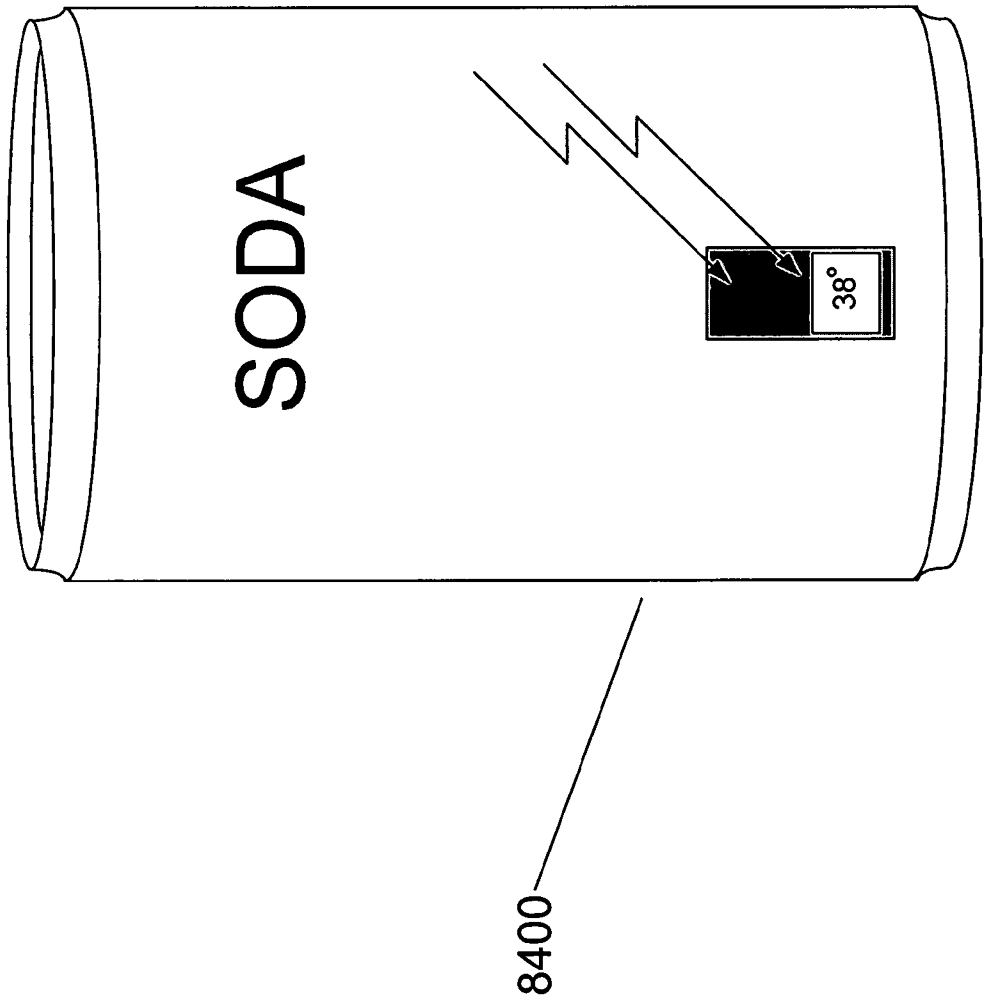
FIG. 84 shows a photovoltaic facility associated with a beverage container according to the principles of the present invention.

FIG. 84 shows a photovoltaic facility associated with a beverage container 8400. As shown in FIG. 84, a photovoltaic facility may be incorporated into a cup, mug, soda bottle, soda can, or other beverage container. The photovoltaic facility may generate electricity from ambient light and be associated with a number of other systems to provide functions associated with the beverage container. For example, the photovoltaic facility may generate electricity to power a thermosensor (such as a thermocouple), processor, and display that sense a temperature of a liquid within the beverage container and display an indication of the temperature. The indication of temperature may be, for example, an animated thermometer, a display of alphanumeric text indicating degrees such as Celsius or Fahrenheit, a status bar with a range of temperatures (e.g., cold, cool, room temperature, warm, hot), or an alphanumeric display of text indicating suitability of drinking temperature of a warm or cool beverage. For perishable beverages such as dairy or fruit juices, the photovoltaic facility may power a sensor that tracks temperature over time and generates a caution indication when the drink may have spoiled. The photovoltaic facility may also, or instead, generate electrical energy from ambient light and apply the electrical energy to power a visual display, such as an advertisement, chart, or other graphic, using light-emitting diodes, organic light-emitting diodes, or other low-power display technologies suitable for incorporation into a grocery item or other consumer good. The photovoltaic facility may power a visual display to attract purchasers to the beverage container on a store shelf or other resale location. The photovoltaic facility may be printed onto the beverage container, either simultaneously with the printing of other content, or before or after printing other content on the container. This process may be incorporated into a manufacturing process, such as when graphical content is placed on aluminum sheets that are to be formed into cans. In embodiments the photovoltaic facility may be substantially transparent, or it may be transparent to certain desired wavelengths of light, so as to permit viewing of content of selected colors to be viewed, notwithstanding the presence of the photovoltaic facility on the beverage container.

In embodiments a development kit may be provided for enabling a content provider such as a beverage maker, commercial graphics designer, or bottling facility to associate a photovoltaic facility with a beverage container, such as any of the items described throughout this disclosure. As described above, there is also disclosed herein a method for making a beverage container, including associating a photovoltaic facility with the beverage container and associating the photovoltaic facility with a display, wherein the photovoltaic facility provides power to the display. The photovoltaic facility may be adhered in part to the beverage container and may fold open to expose a larger surface to ambient light to provide additional energy to the display and any other associated electronics.

Figure 85:
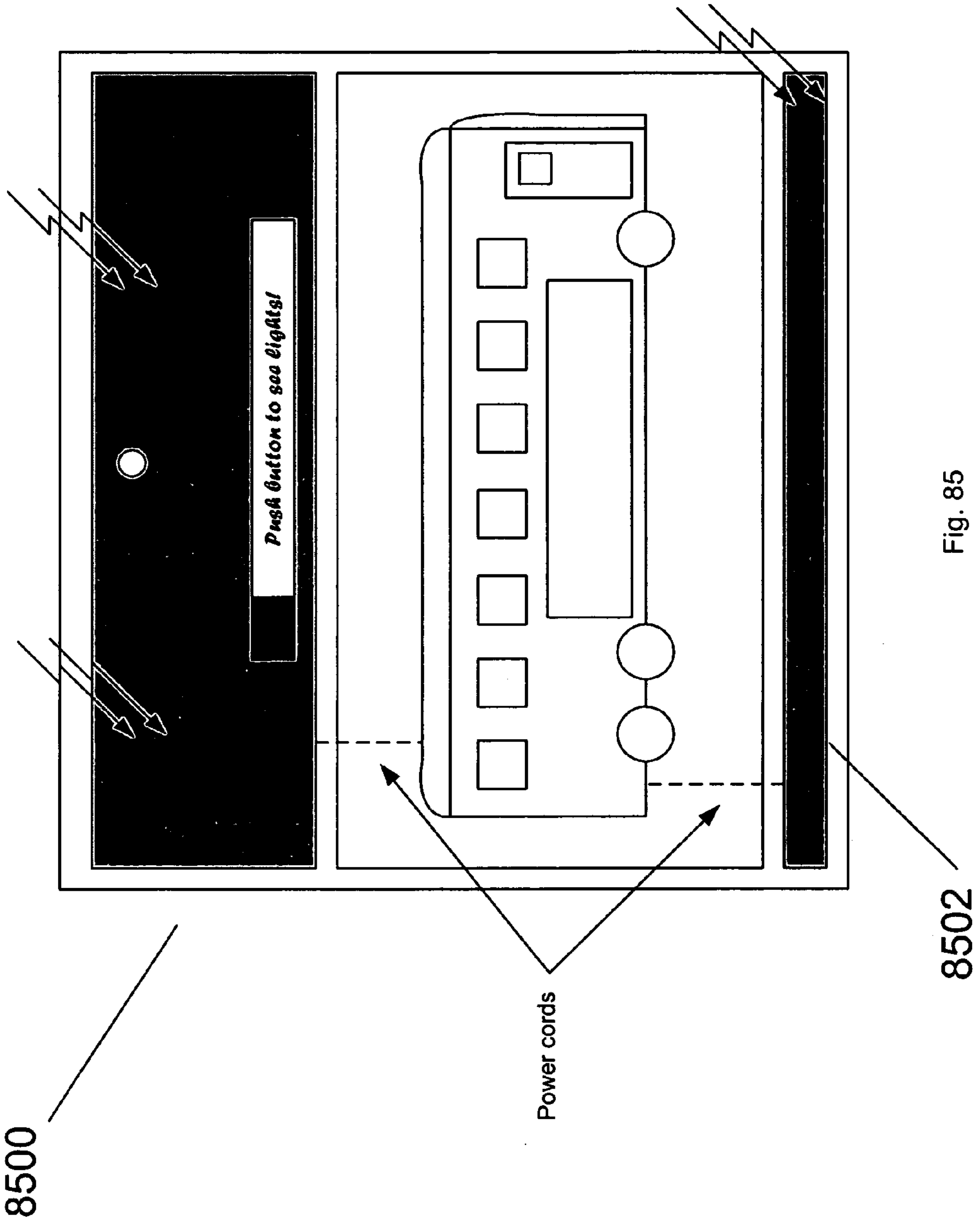
FIG. 85 shows a photovoltaic facility incorporated into a "try me" feature of a packaged electrical device according to the principles of the present invention.

FIG. 85 shows a photovoltaic facility incorporated into a “try me” feature of a packaged electrical device 8500. The electrical device may be a toy, game, instrument, musical device, doll, stuffed animal, and so on. “Try me” features may include buttons to activate audio-visual output from the device, or it may include electro-mechanical systems such as robotic components, animatronic features, game play, and the like. For example, the photovoltaic facility 8502 may be incorporated into the packaging for the device, such as on a panel or panels of a cardboard container. The photovoltaic facility may, for example, provide power from ambient light to recharge a battery or other energy source associated with the device, thus improving the life and availability of the “try me” feature. The photovoltaic facility may also provide power for advertisements or other active display features as described generally above. In embodiments, the photovoltaic facility may be printed onto the packaging, either simultaneously with the printing of other content, or before or after printing other content on the page. In embodiments the photovoltaic facility may be substantially transparent, or it may be transparent to certain desired wavelengths of light, so as to permit viewing of content of selected colors to be viewed, notwithstanding the presence of the photovoltaic facility on the package. In embodiments a development kit may be provided for enabling a toy manufacturer, designer, or marketing professional to associate a photovoltaic facility with an item of packaging, such as any of the items described throughout this disclosure. In one aspect, there is described herein a method of providing packaging for an electronic device that includes associating a photovoltaic facility with a package, wherein the photovoltaic facility provides energy for an item that is associated with printed material on the package or an electronic device contained within the package. The printed material may include, for example, an advertisement, an informational graphic, or a self-lighted text, and the electronic device may include any electronic device that might usefully employ a try me feature including, but not limited to, toys, games, instruments, music players, personal electronic devices such as electronic organizers or calculators, and so on.

Figure 86:
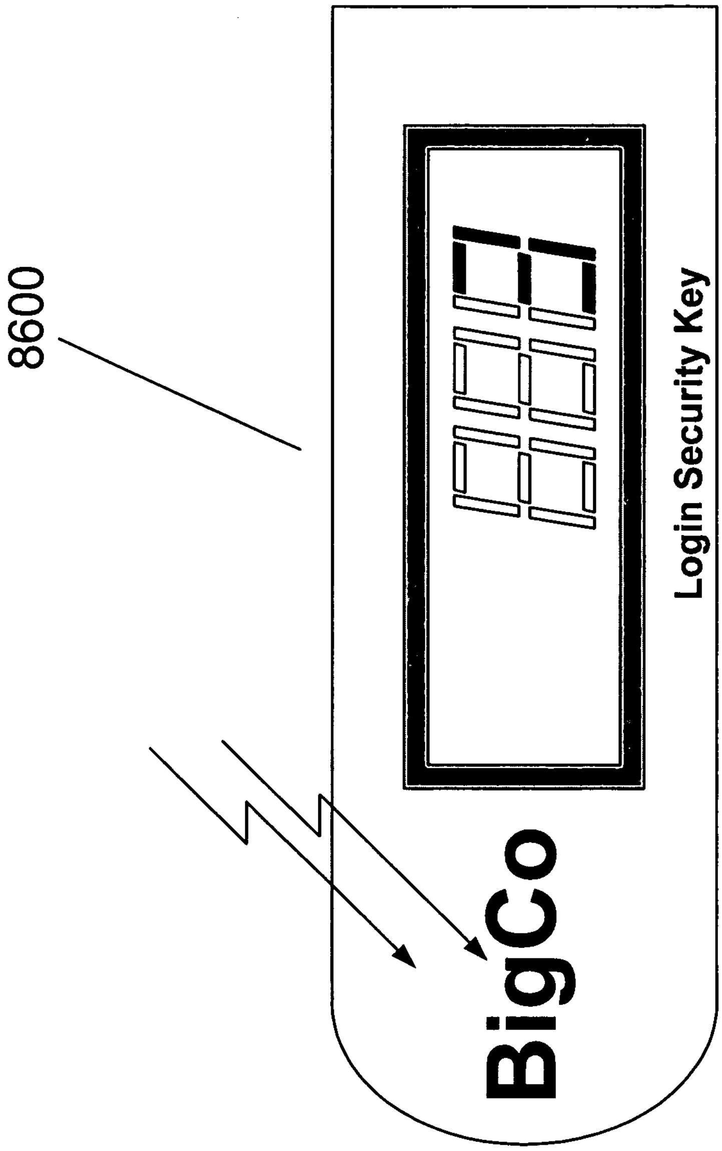
FIG. 86 shows a radio frequency identification (RFID) device printed with a photovoltaic facility according to the principles of the present invention.

FIG. 86 shows a radio frequency identification (RFID) device 8600 printed with a photovoltaic facility. Many RFID cards used in security applications and the like are printed with graphics such as corporate logos, photographs, or other indicia. The printing operation may include a photovoltaic facility for powering the RFID device in, for example, active RFID technology applications. Similarly, security devices that require accurate clocks or other timing devices, such as SecureID cards that generate a passcode using a current time and/or a personal identification number entered by a user, may be powered or recharged by a photovoltaic facility printed on a surface thereof. Still more generally, any product may be printed with one or more photovoltaic facilities on an exterior surface to capture electrical energy from ambient light. The energy may be used generally for recharging a battery or other energy source associated with the device or to provide electric powered displays on the device using, for example, the light emitting diodes, organic light emitting diodes, or other low-power display technologies. In the RFID example provided above, a method of fabricating an RFID device may include printing a photovoltaic facility on a surface thereof and associating the photovoltaic facility with an energy source within the RFID device.

Figure 87:
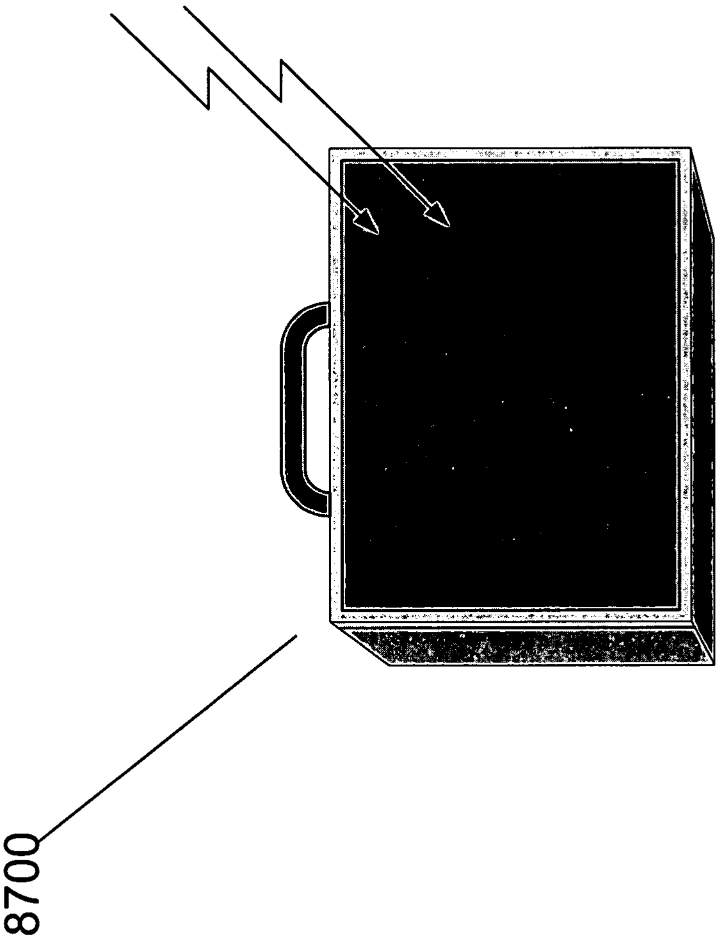
FIG. 87 shows a portable power source using one or more photovoltaic facilities according to the principles of the present invention.

FIG. 87 shows a portable power source 8700 using one or more photovoltaic facilities. In general a portable power source may include a case with photovoltaic facilities that may be deployed therefrom, such as by unrolling or unfolding a number of panels of photovoltaic facilities from the portable power source. In other embodiments, an expanding frame may be provided for the photovoltaic facility, such as an umbrella structure, a portable movie screen structure, a fan or accordion structure, a tent or tarpaulin structure, or a spring-loaded roll within a case for the portable power source. The photovoltaic facilities may be connected to the case and/or separate from the case (with electrical connectors for coupling the photovoltaic facilities to the case and/or power supply).

The case may be a suitcase, backpack, valise, crate, or other portable or semi-portable device, depending in part upon the amount of electrical energy desired therefrom. The case may also include one or more batteries or other energy storage devices that store or buffer unused power from the photovoltaic facilities. In addition, any number of power conversion systems may be incorporated into the case. Thus, for example, using techniques known to those of ordinary skill in the art, electrical output from the deployed photovoltaic facility may be provided as 110V AC power, 220V AC power, 12V DC power, 5V DC power, or electrical power in any other delivery form, including, for example three-phase power or high-frequency AC output. The case may also include any number of outlets conforming to various industrial standards or local practices, and it may include a control panel for selecting among outputs, such as switching between 110V and 220V. Control circuitry may also provide user feedback, such as by indicating when more photovoltaic facilities are needed to maintain a desired output or battery charge. In certain embodiments, stacks of photovoltaic facilities may be employed to capture energy from different wavelengths of incident light, provided the photovoltaic facilities are selected to pass wavelengths for underlying photovoltaic facilities.

Figure 88:
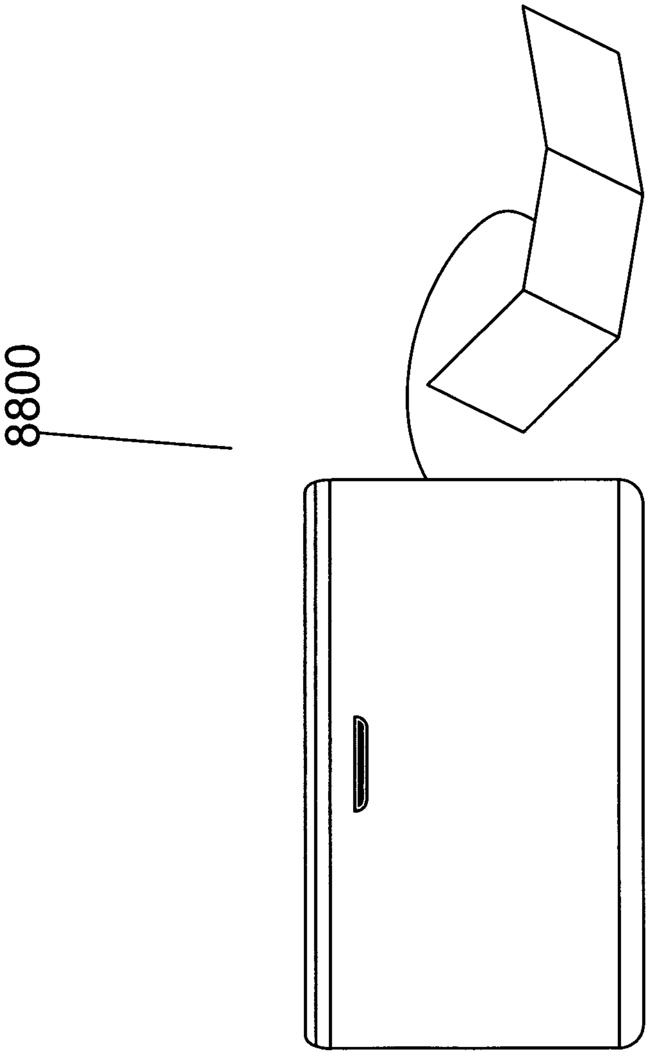
FIG. 88 shows a portable power supply for a computer according to the principles of the present invention.

FIG. 88 shows a portable power supply for a computer 8800. A portable computer such as a laptop is typically carried in a computer case that provides, for example, cushioning to protect the computer and a number of pockets for carrying computer accessories, documents, and so forth. One or more photovoltaic facilities may be conveniently and usefully integrated into such a computer case to extend battery charge for a stored computer contained therein. The photovoltaic facility may be provided, for example, on a spring-loaded roll that may be withdrawn from a pocket in the computer case. A photovoltaic facility may also, or instead, be folded and fit into a pocket of the computer case, with an electrical connection coupling the photovoltaic facility to a power conversion system within the computer case. The power conversion system may include an inverter for generating 110 V or other alternating current output from the electrical energy provided by the photovoltaic facility. In such an embodiment, the computer case may include a conventional 110 V electrical outlet. In other embodiments, the power conversion system may provide direct DC output for coupling to an electrical input of the computer, typically 5V DC or 12V DC. While an energy storage system such as a battery may also be included in the computer case, it will be appreciated that this component may be readily omitted because a laptop or portable computer typically includes its own battery. However, in one embodiment, the power conversion system may recharge a spare battery for the computer stored within the case.

With sufficient ambient light and or sufficient surface area of the photovoltaic facilities, the photovoltaic facilities may power a computer without drawing down the charge in the computer's battery. In one embodiment, the computer case may include a visually displayed power meter that indicates what portion of the computer's electrical requirements are being met by the photovoltaic facility. A user may thus increase the number or surface area of photovoltaic facilities (limited in one sense by the physical space available to the user) until all of the energy requirements are being met by the photovoltaic facilities. Even where all requirements cannot be met, the photovoltaic facilities may significantly increase the operating life of a charged battery. In other embodiments, additional photovoltaic facilities may be integrated into exterior surfaces of the computer case or exterior surfaces of the computer itself.

While the computer case described above is one useful application of the systems described herein, it will be appreciated that numerous other portable electronic devices can benefit from similar cases including photovoltaic facilities. Thus, for example, like cases may be provided for portable televisions, portable radios, portable CD players, portable DVD players, lightweight and/or portable computer printers, and so on.

Figure 89:
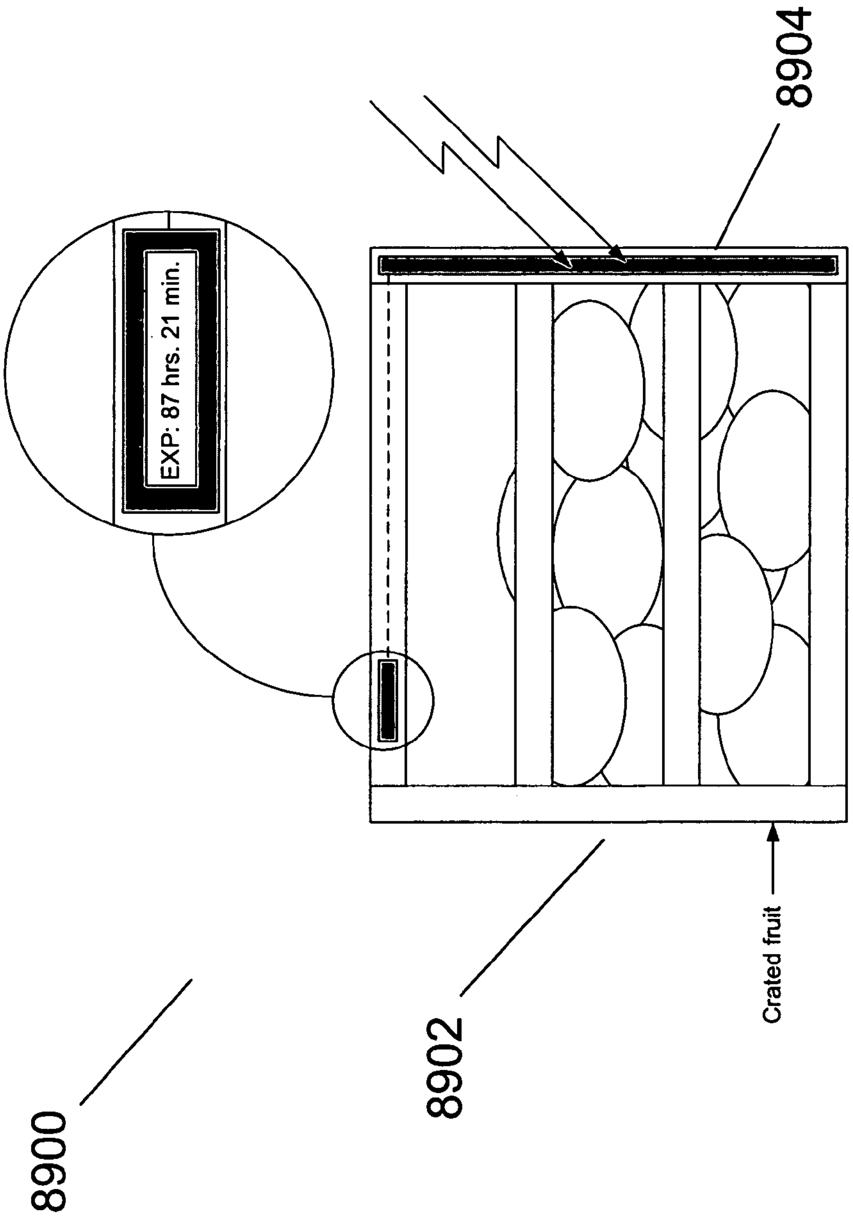
FIG. 89 shows a photovoltaic facility in a perishable goods monitoring system according to the principles of the present invention.

FIG. 89 shows a photovoltaic facility in a perishable goods monitoring system 8900. The system may be integrated into, for example, individual packages or items of perishable goods or into crates or other containers 8902 designed for transporting and storage of larger quantities of the goods. In one embodiment, the photovoltaic facility 8904 may maintain power, or charge, on an energy storage device such as a battery, for operation of a timer or clock that tracks an approaching expiration date. The perishable goods monitoring system may include other components in various combinations, such as a processor, a radio frequency communications system, a display (e.g., for displaying status information), and one or more sensors, to provide varying types of monitoring. For example, the system may communicate with an external source of time using, for example, radio frequency communications when ambient light is available and the photovoltaic facility can provide electricity. In such embodiments, the system may power on in response to ambient light, retrieve remote time information, determine using the processor whether expiration has occurred, and generate a display of the status of the items being monitored. The display may include any visual display including liquid crystal displays, light-emitting diodes, organic light-emitting diodes, or other low-power display technologies, as well as any other display technologies. The visual display may include literal information, such as days until expiration, analytical information derived from the literal information such as textual descriptions (e.g., "good", "bad", or "questionable"), or metaphorical information, such as a green light/yellow light/red light display. In other embodiments, a sensor, such as a temperature sensor, humidity sensor, pressure sensor, motion sensor, and/or ultraviolet light sensor may track environmental conditions of the perishable goods over a period of time and generate an appropriate display when the goods have spoiled or are at risk of spoiling. Such systems may be particularly useful in outdoor cargo areas where goods may be stored for an extended period. In one embodiment, such systems include a battery that is recharged by the photovoltaic facilities whenever ambient light is available.

Figure 89A:
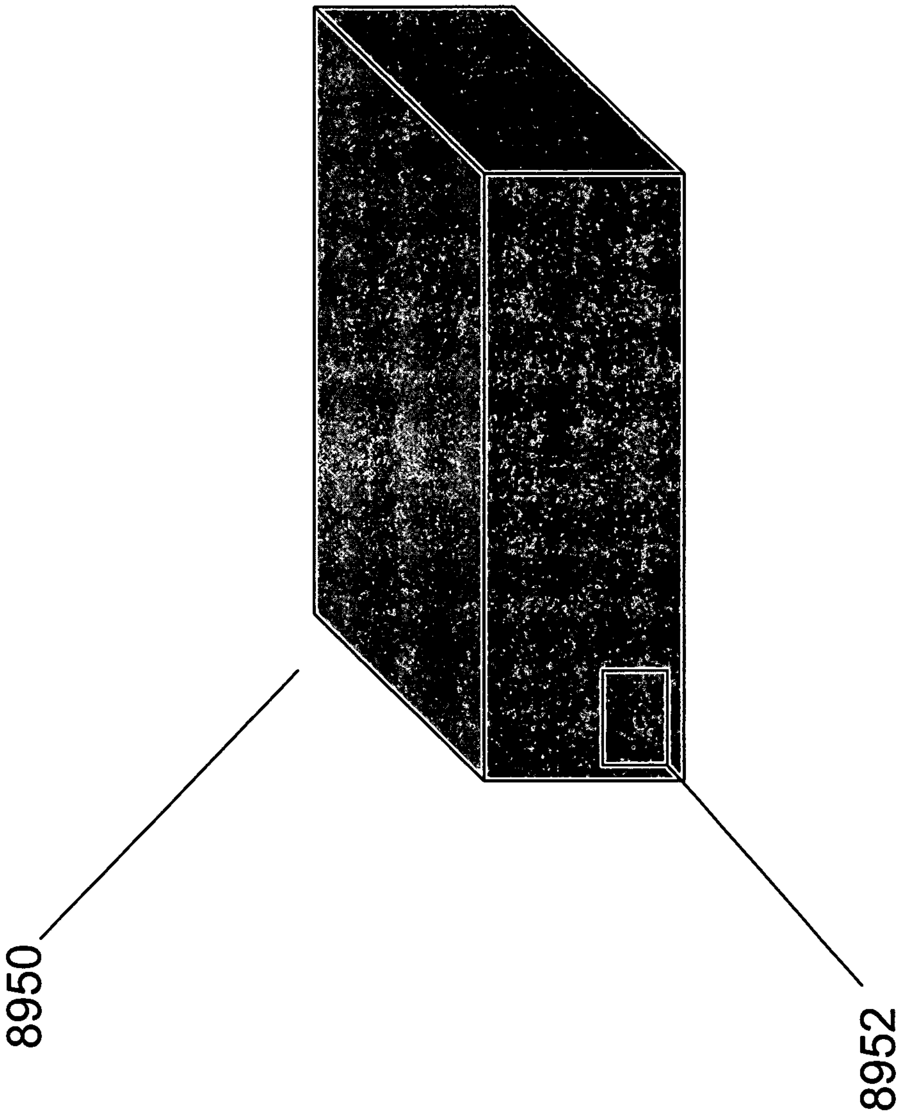
FIG. 89A shows a photovoltaic facility integrated into a portable cooler according to the principles of the present invention.

FIG. 89A shows a photovoltaic facility 8952 integrated into a portable cooler 8950. The portable cooler may include an insulated container and an electric cooling device. The cooler may also include one or more photovoltaic facilities that may be deployed by a user to provide electrical power to the cooling device. For example, one or more sleeves or pockets may be disposed on vertical exterior surfaces of the cooler for holding folded photovoltaic facilities. The photovoltaic facilities may be removed and unfolded to expose them to ambient light. While folding is not necessary for operation of the portable cooler, it will be readily appreciated that a greater surface area, and thus more energy capture, may be achieved by a photovoltaic facility that unfolds over a larger area. Similarly, the photovoltaic facilities may be rolled into tubes integrated into sides of the cooler or provided as a separate accessory that plugs into the portable cooler. In other embodiments, an expanding frame may be provided for one or more of the photovoltaic facilities, such as an umbrella structure, a portable movie screen structure, a fan or accordion structure, a tent or tarpaulin structure, or a spring-loaded roll within a case for the portable power source. Additionally, any of the other folded, rolled, or otherwise segmented or compacted structures described herein may be usefully employed with the portable cooler described herein to provide a densely packed, portable photovoltaic facility that can be deployed into a large-surface area structure. A battery or other energy storage device may be included to provide additional electrical energy for cooling and/or to capture surplus electrical energy generated by the photovoltaic facilities. A controller may be included to manage battery life and or cooling. The controller may, for example, monitor charge on the energy storage device and electrical energy being generated by the photovoltaic facilities and may permit a user to select cooling profiles such as maximum cooling, maximum battery life, a certain duration of active cooling, or combinations of these.

Figure 90:
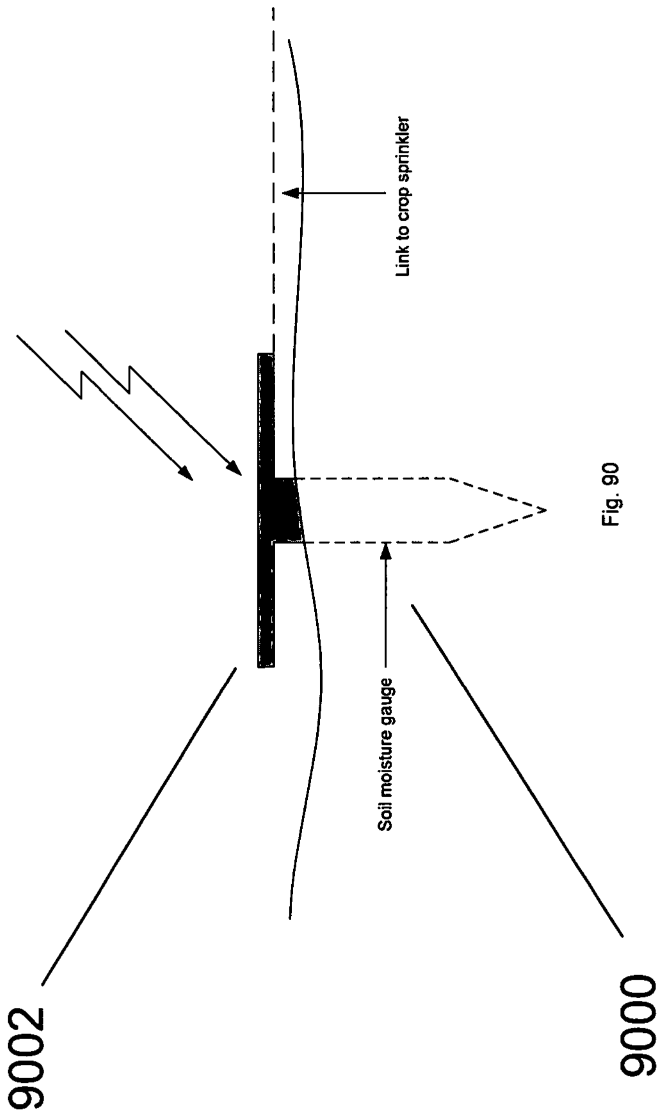
FIG. 90 shows an agricultural or farm monitoring system using a photovoltaic facility according to the principles of the present invention.

FIG. 90 shows an agricultural or farm monitoring system 9000 using a photovoltaic facility 9002. The system may be housed in a weather-tight container for protection of individual components. In one embodiment, the photovoltaic facility may maintain power, or charge, on an energy storage device such as a battery, for operation of the system. The agricultural monitoring system may include other components in various combinations to provide various types of monitoring, such as a processor, a radio frequency communications system, a display (e.g., for displaying status information), and one or more humidity sensors, soil sensors, light sensors, or other sensors for monitoring an agricultural environment. For example, the system may include a radio frequency communication system for communicating, for example, with an external source of time when ambient light is available and the photovoltaic facility can provide electricity. The system may also use such a radio frequency communication system to convey monitoring and status information, and it may participate in a network of such monitoring systems deployed throughout an agricultural and/or farming environment. The network may carry control information based on measurements of the monitoring system, such as by activating a sprinkler system in an area to address dry soil. In some embodiments, the system may power on in response to ambient light, take measurements, and transmit sensor data. A display may be provided for display of the status of items being monitored. The display may include any visual display including liquid crystal displays, light-emitting diodes, organic light-emitting diodes, or other low-power display technologies, as well as any other display technologies. The visual display may include literal information, such as inches of rainfall, analytical information derived from the literal information such as textual descriptions (e.g., "dry", "moist", "acidic", and so forth), or metaphorical information, such as an image of a plant showing relative health.

Various sensors may be included in such a monitoring system. For example, moisture sensors may be used to detect soil moisture at various soil depths. Sensors may also detect soil nutrients, insect infestations, sunlight, temperature, air humidity, and any other factors that may affect plant growth and health, or it may suggest specific responsive measures. In one embodiment, the monitoring system may include a battery that is recharged by the photovoltaic facilities whenever ambient light is available. A number of such systems may be deployed in an agricultural or farming environment, and foldable, rollable, or otherwise collapsible photovoltaic facilities may be provided for convenient set-up, take-down, and redeployment of each monitoring system.

Figure 91:
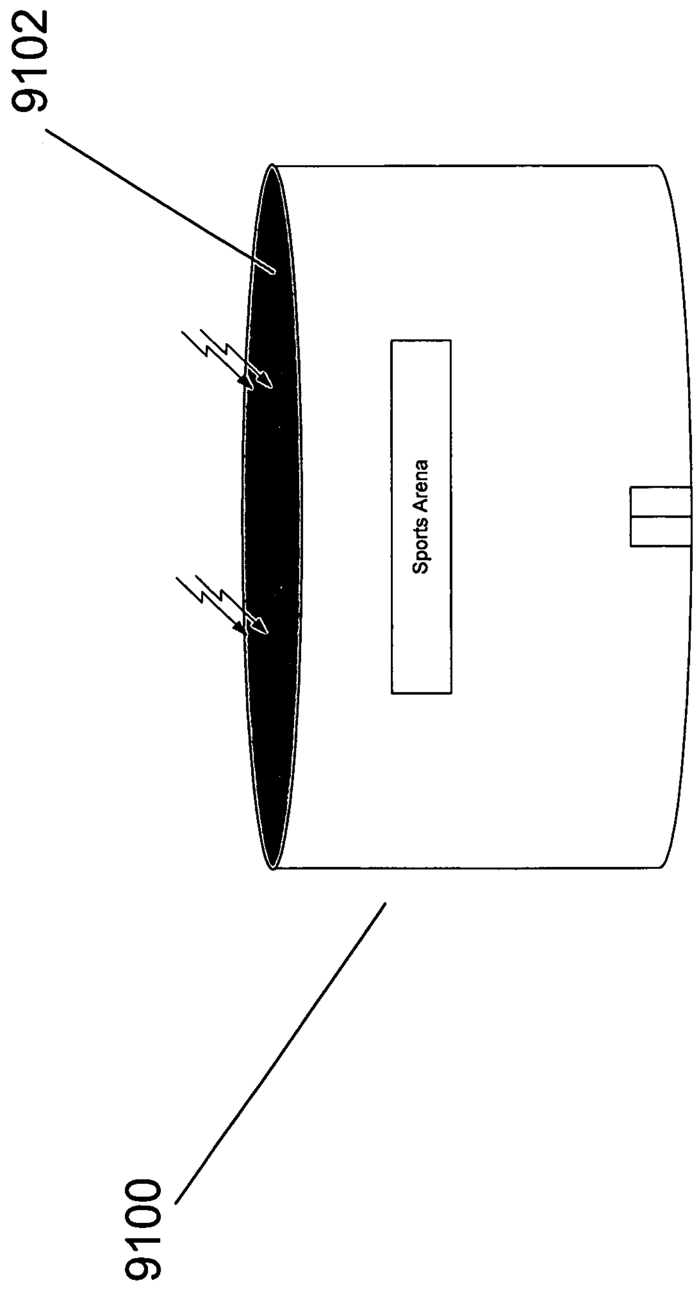
FIG. 91 shows a power supply system for a sports venue using a photovoltaic facility according to the principles of the present invention.

FIG. 91 shows a power supply system for a sports venue 9100 using a photovoltaic facility 9102. Opaque, transparent, or translucent photovoltaic facilities may be usefully deployed over sporting venues, either as a shade or on top of a closed structure such as a tent, dome, indoor arena, or the like. Such a covering may serve a dual purpose of providing shade and electrical power, or it may simply serve as a power source for an arena. Electricity generated by an area of photovoltaic facilities may be stored and used, for example, to provide electricity for lighting, public address systems, signs, scoreboards, concession stands, and so on while a game or event is in progress. Thus there is disclosed herein a sports venue covering that provides electrical energy. A power conversion system may be included to convert resulting electrical energy into any suitable, useable form. An energy storage device may also be included to capture excess electrical energy for later use.

Figure 92:
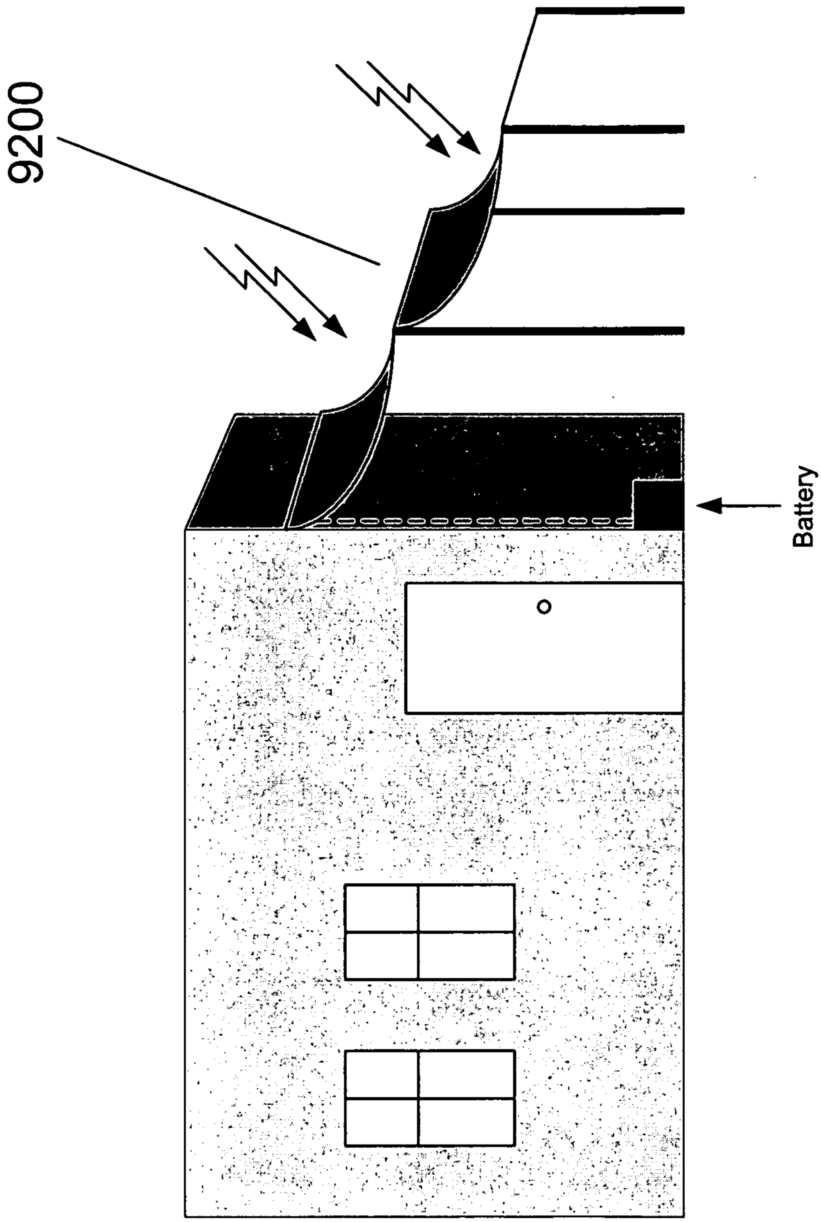
FIG. 92 shows a power supply system for an outdoor working environment using a photovoltaic facility according to the principles of the present invention.

FIG. 92 shows a power supply system for an outdoor working environment using a photovoltaic facility 9200. In certain environments, such as cigar tobacco farms, tobacco may be shaded before use as a cigar wrapper. In such environments, opaque photovoltaic facilities may be usefully deployed as tents, awnings, or other coverings or shades to serve a dual purpose of providing shade and electrical power. More generally, in warm sunny environments, opaque photovoltaic facilities may be used to simultaneously provide shade and generate electrical power. The electrical power may be used for functions ancillary to shading, such as operation of fans, air conditioners, or other active cooling devices, or simply as a source of electrical power. Thus there is disclosed herein a sunshade that provides electrical energy. A power conversion system may be included to convert resulting electrical energy into any suitable, useable form. An energy storage device may also be included to capture excess electrical energy for later use.

Figure 93:
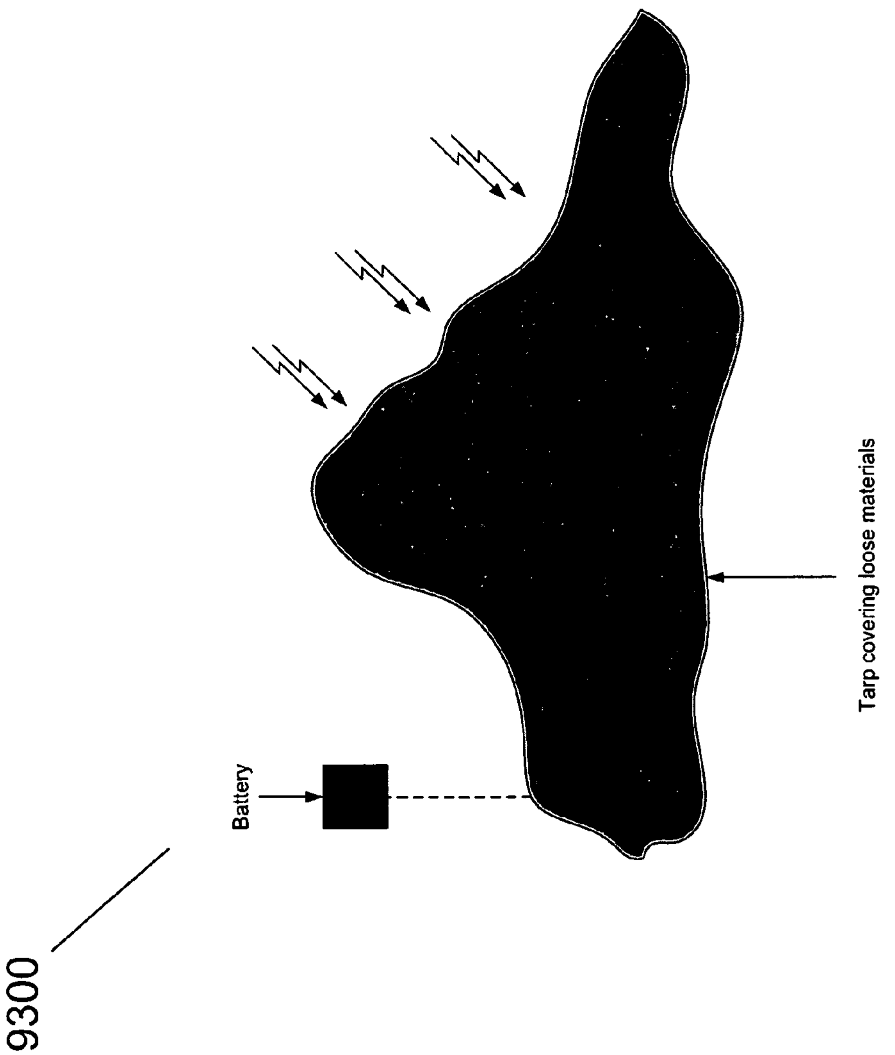
FIG. 93 shows a power supply system integrated with an outdoor covering material according to the principles of the present invention.

FIG. 93 shows a power supply system integrated with an outdoor covering material 9300. In certain environments, such as dumps, recycling or transfer stations, landfills, and the like, large areas of ground or mounds of material may be periodically covered, so as to shield against rain or sun. For example, piles of salt used to de-ice roadways are typically heaped in covered areas to avoid saturation while not in use. In such environments, large sheets of photovoltaic facilities may be usefully deployed as tents, awnings, or other coverings to serve a dual purpose of providing shielding from the elements and generating electrical power. In sunny environments, these photovoltaic facilities may be used to provide substantial electrical power, which may be stored or used in any desired manner. A power conversion system may be included to convert resulting electrical energy into any suitable, useable form. An energy storage device may also be included to capture excess electrical energy for later use.

Figure 94:
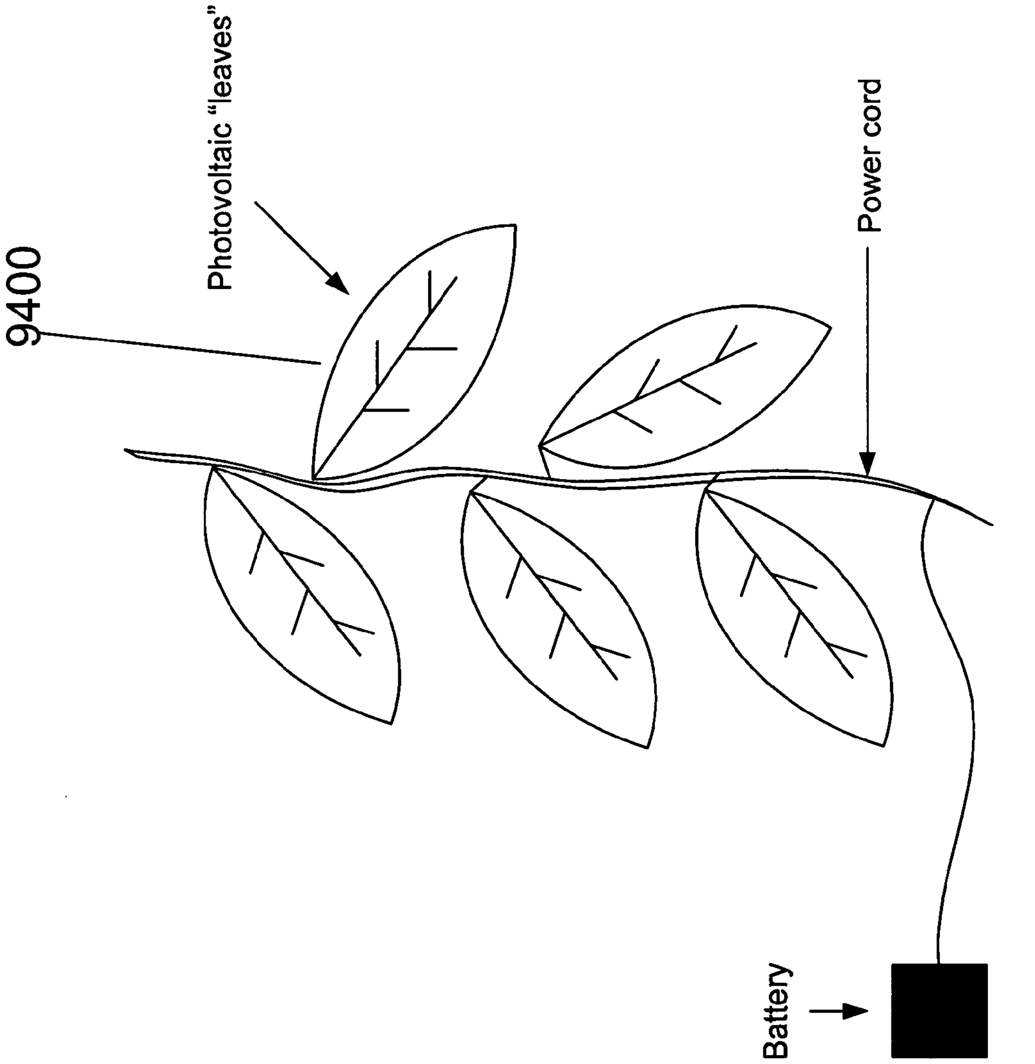
FIG. 94 shows a photovoltaic associated a natural or stylized appearance of a leaf of a plant, forming a photovoltaic leaf according to the principles of the present invention.

In embodiments, a photovoltaic facility may be fashioned in a natural or stylized appearance of a leaf of a plant, forming a photovoltaic leaf 9400, as illustrated in FIG. 94. The photovoltaic facility may be substantially transparent, or it may be transparent to certain desired wavelengths of light, so as to permit viewing of a particular color of a substrate associated with the photovoltaic facility. For example, without limitation, the substrate may be a flexible facility and may be the color green, providing for a natural, leaf-like appearance. In this example, the photovoltaic facility may be both disposed on the substrate and transparent to the color green, providing for a photovoltaic leaf with natural, leaf-like appearance. An electrical conduit facility may be fashioned in a natural or stylized appearance of a stem, trunk, or stalk of the plant, forming a conductive core. The photovoltaic leaf may be physically connected to the conductive core, providing a photovoltaic plant. The photovoltaic plant may be associated with a rechargeable battery. In some embodiments, the photovoltaic plant may further comprise a plurality of photovoltaic leaves connected to the conductive core. In other embodiments, the photovoltaic plant may yet further comprise a plurality of conductive cores connected to each other in various configurations, providing a natural or stylized branching appearance. The photoelectric plant may be disposed in hostile territory as a covert power source for a sensor associated with the photoelectric plant. The photoelectric plant may, in another embodiment, be disposed in a garden as a camouflaged power source to a sensor associated with the garden, such as a soil moisture sensor. In yet another embodiment, the photoelectric plant may be associated with a light. In this embodiment, the photoelectric plant may charge the rechargeable battery when incoming light allows and may illuminate an area from time to time. Alternatively, the photoelectric plant may provide an entertaining lighting effect from time to time. Other applications of the photoelectric plant will be apparent from the preceding discussion.

Figure 95:
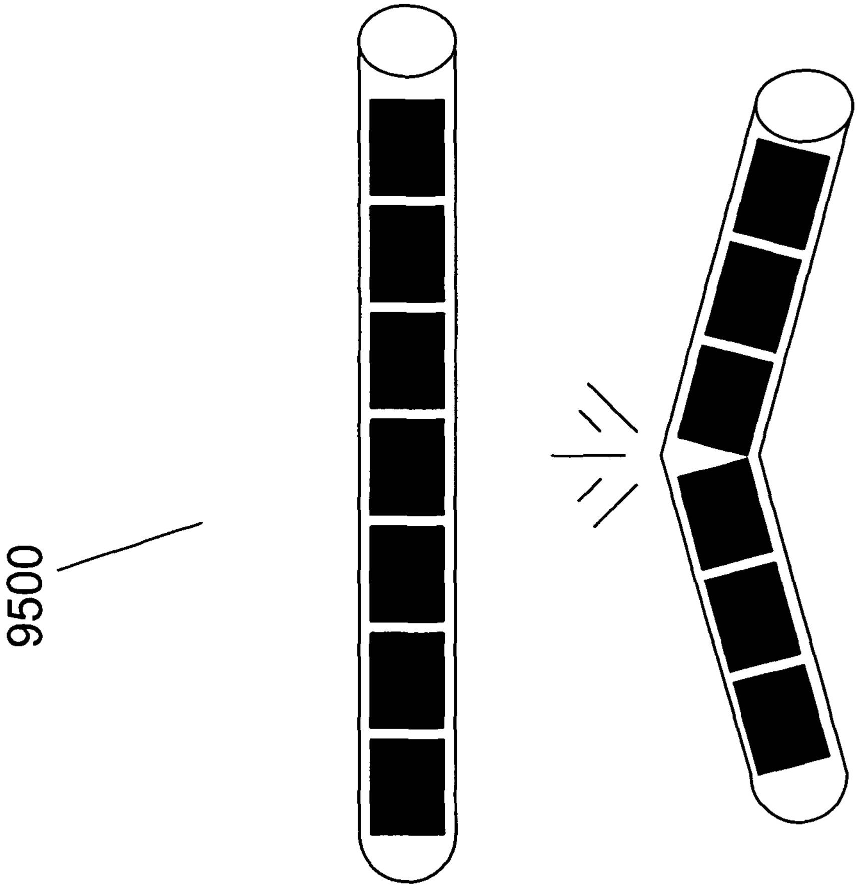
FIG. 95 shows a photovoltaic facility disposed on a flexible facility according to the principles of the present invention.

In embodiments, a first photovoltaic facility may be disposed on a flexible facility 9500 in a configuration that may provide a variable current or voltage, as illustrated in FIG. 95. The variability of a current or a voltage provided by the photovoltaic facility may depend upon the degree to which the flexible facility is flexed. This variability of the current or voltage may comprise an electrical output that may be associated with the degree to which the flexible facility is flexed. Given a physical nature of the photovoltaic facility, which is described elsewhere herein, the electrical output may also be directly proportional to the intensity of light shining on the photovoltaic facility. As the object of the present invention may be to detect only the degree to which the flexible facility is flexed, this method may further provide a normalized value associated only with the degree to which the flexible facility is flexed. This aspect of the method may comprise a second photovoltaic facility that may be disposed on the flexible facility. The second photovoltaic facility may be configured to provide a reference electrical output that may not significantly depend upon the degree to which the flexible facility is flexed. The electrical output and the reference electrical output may be provided to a normalizing facility, which may comprise an integrated circuit, an analog circuit, or a digital circuit. The normalizing facility may provide an output that may be associated with a normalized value that may be associated with the degree to which flexible facility is flexed. Alternatively, the first photovoltaic facility may be disposed on a flexible facility in a configuration that may provide a binary current or voltage that may transition between logical states as the flexible facility is flexed beyond a first degree of flex or as the flexible facility is relaxed beyond a second particular degree of flex. In one application, the electrical output is associated with a collision detection facility on a mobile robot. In another application the electrical output is associated with a flexing body motion of a person wearing an item of clothing instrumented with the flexible facility.

Figure 96:
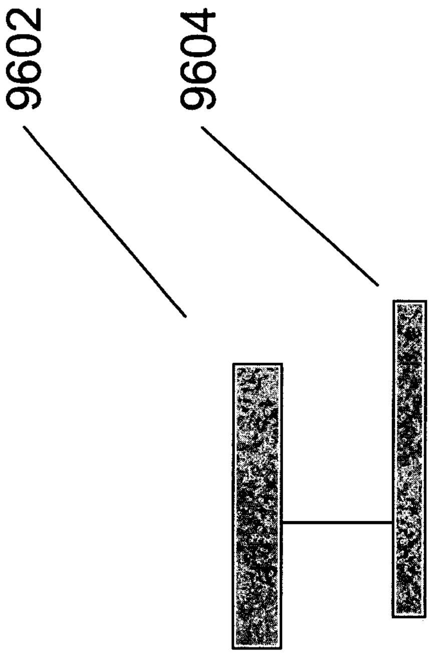
FIG. 96 shows a photovoltaic a nanoscale cantilever sensor according to the principles of the present invention.

In embodiments, a photovoltaic facility 9602 may be associated with a nanoscale cantilever sensor 9604, which may comprise a piezoresistive cantilever providing an electrical output. One such embodiment is illustrated in FIG. 96. The sensor, by its nature, may be a low-power device and may receive power from the photovoltaic facility. The photovoltaic facility and nanoscale cantilever sensor may be disposed on a flexible facility, a rigid facility, a rollout facility, a fold-out facility, or any other suitable facility. In one application, the nanoscale cantilever sensor may be used to detect a trace level of a biomolecule, for example by associating the electrical output with the drag through a solution of a biomolecule attached to a functionalized surface of the cantilever. In another embodiment, the nanoscale cantilever may provide a sensor output that is associated with tiny changes in a surface stress of the facility onto which the nanoscale cantilever sensor is disposed. In yet another embodiment, the nanoscale cantilever sensor may comprise a nanometer-size magnetic tip providing for the detection of an individual electron buried below a surface of a sample. In still yet another embodiment, the nanoscale cantilever sensor may be coated with a DNA probe associated with a specific protein, providing a site to which the specific protein may bind and cause the cantilever to flex, resulting in a change in the electrical output. Other applications of nanoscale cantilever sensors are known in the art or will be apparent from this discussion.

Figure 97:
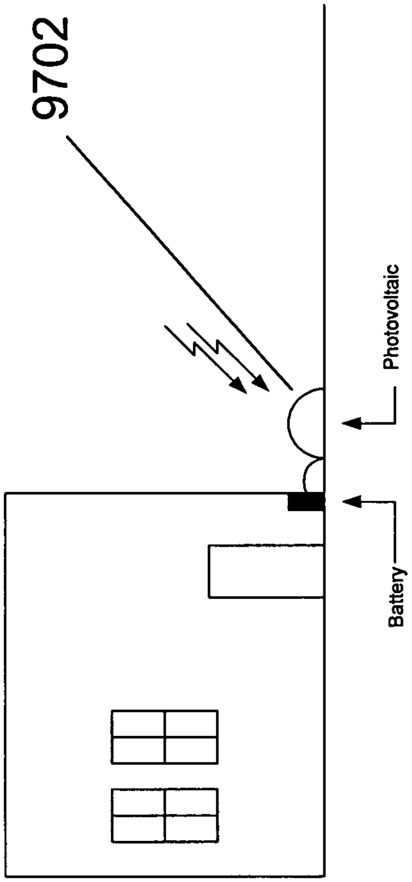
FIG. 97 shows a photovoltaic facility adapted for power generation provided many inclinations of the sun according to the principles of the present invention.

In embodiments, a photovoltaic facility may have a shape and an orientation that allows for outdoor power generation provided any inclination of the sun. One such embodiment is illustrated in FIG. 97. In one embodiment, the photovoltaic facility may be a sphere 9702 with an arbitrary orientation. In another embodiment, the photovoltaic facility may be a cone with the base of the cone oriented toward the surface of the Earth. In yet another embodiment, the photovoltaic facility may be a lampshade with the base of the lampshade oriented toward the surface of the Earth. In still yet another embodiment, the photovoltaic facility may be a cylinder with a base of the cylinder oriented toward the surface of the Earth. The surface of the Earth may comprise any form of land or water. In one application, the photovoltaic facility comprises a package capable of being airdropped. In this application, the package is designed to provide the orientation, as specified above, upon reaching the surface of the Earth. For example, without limitation, the center of gravity of the package may be disposed toward the base of the package; the aerodynamics of the package may be such that the package is likely to impact the Earth at the orientation; and/or the package may eject or otherwise deploy the photovoltaic facility after impacting the surface of the Earth, where the ejection or deployment may be designed to provide the photovoltaic facility with the orientation. In another application, the photovoltaic facility comprises a buoy. In this application, the buoy may contain ballast to provide the photovoltaic facility with the orientation, which may be subject to a varying offset due to winds and waves. In all applications, the purpose of the photovoltaic facility may be to charge a battery and/or power a sensor.

Figure 98:
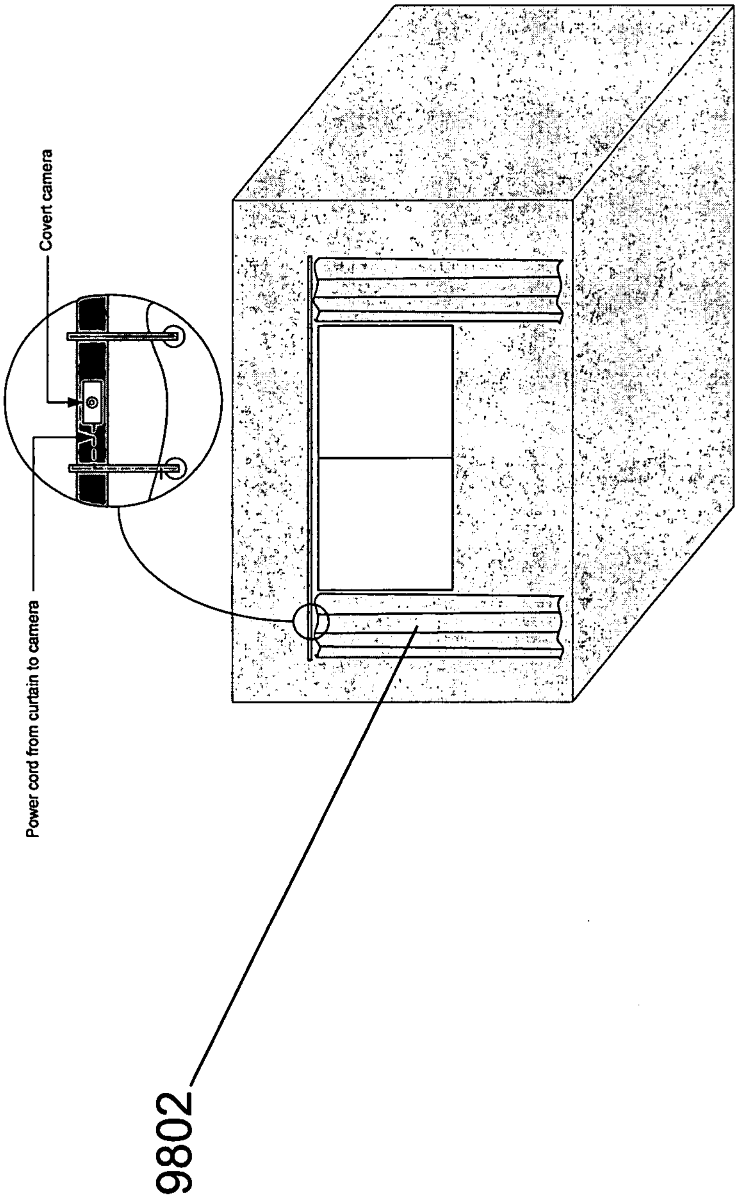
FIG. 98 shows a photovoltaic fiber woven into a fabric according to the principles of the present invention.
Figure 98A:
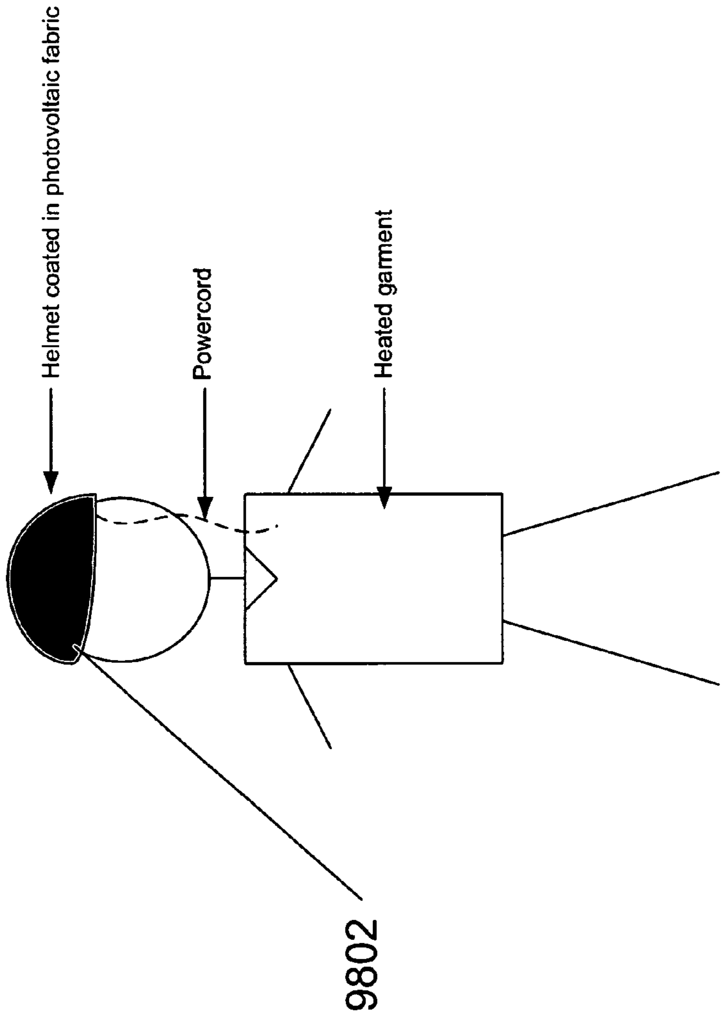
Figure 98C:
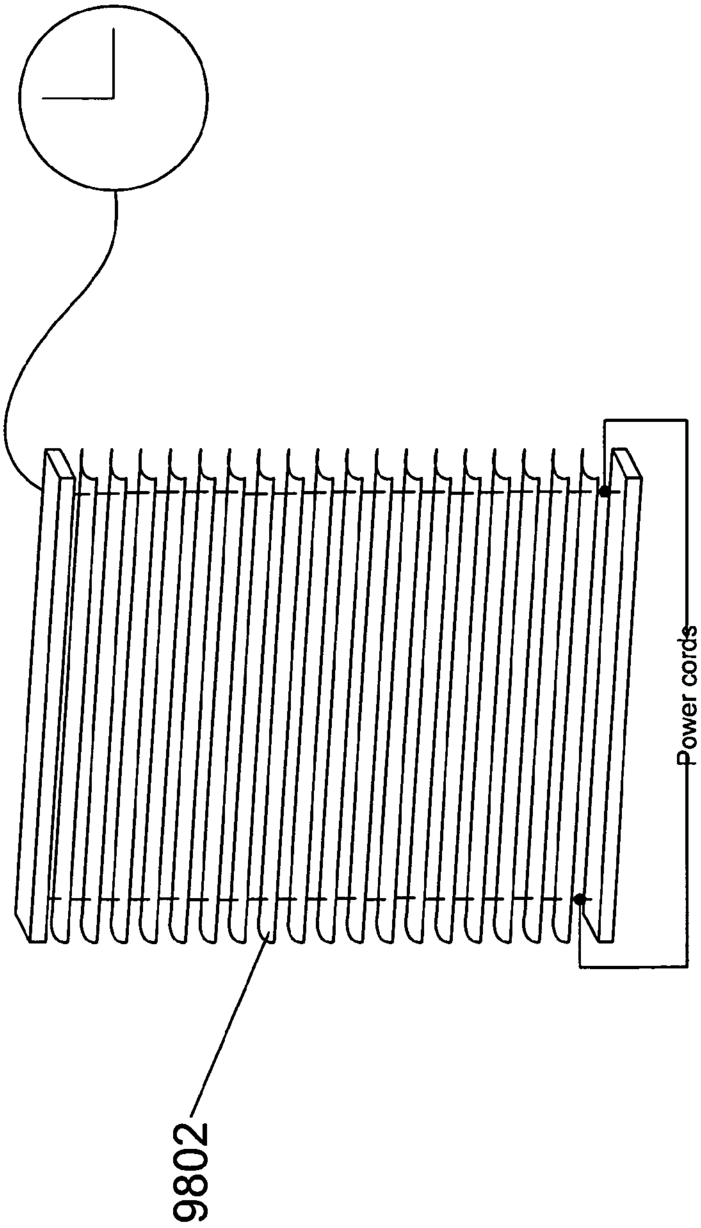

In embodiments, a photovoltaic fiber may be woven into a fabric 9802. One such embodiment is illustrated in FIG. 98. Other such embodiments are illustrated in FIG. 98A and FIG. 98B This fabric, then, is a photovoltaic fabric that may be incorporated into a garment, such as a military uniform. Alternatively, the photovoltaic fabric may be incorporated into a drapery, rug, blind, or other fabric object used to adorn the interior of a building. Generally, the photovoltaic fabric may be incorporated into any object normally or optionally containing fabric. In any case, one purpose for including the photovoltaic fiber into a fabric may be to allow the fabric to charge a battery. For example, in one application, it may be desirable to charge a small battery that powers a covert camera: Certain espionage scenarios may not allow the installation of a power cable and may require more energy than may be stored by any practicable small, single charge battery. The covert camera, in this example and without limitation, may be disposed in a room wherein the drapery in the room comprises the photovoltaic fabric. By connecting the photovoltaic fabric to the covert camera and small battery, it may be possible to power the covert camera for a time significantly longer than is possible with a small, single charge battery. For another example, in a second application, it may be desirable for a dismounted soldier to be outfitted with a sensor comprising, without limitation, a biometric sensor. In this case, the sensor may be powered by a photovoltaic fabric and the fabric may for the soldier's uniform. Other embodiments will be apparent from the preceding description.

Figure 99:
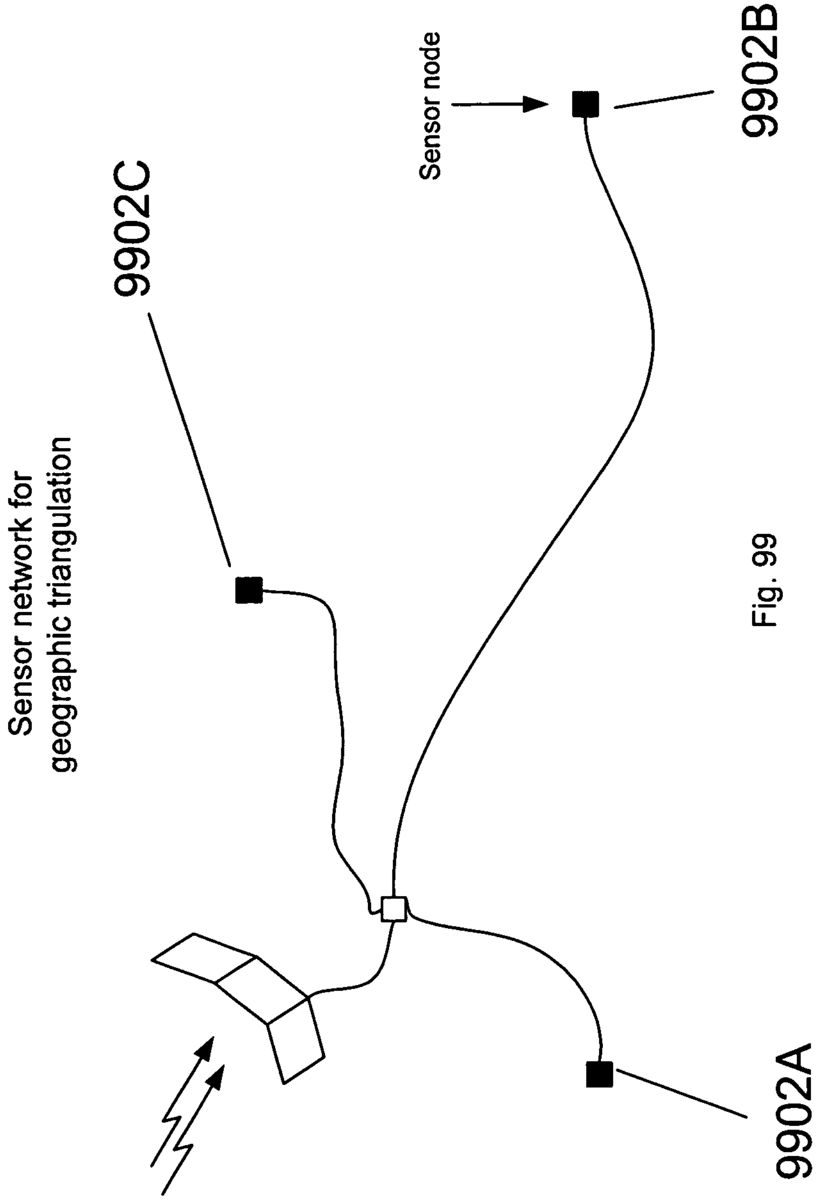
FIG. 99 shows a photovoltaic facility associated with a sensor node according to the principles of the present invention.

In embodiments, a photovoltaic facility may be associated with a sensor node 9902A, 9902B, and 9902C, which may receive power from the photovoltaic facility. One such embodiment is illustrated in FIG. 99. The sensor node may be associated with other sensor nodes in a sensor network. The sensor network may comprise a communication facility, which may be wired or wireless. In the case that the communication facility is wireless, it may comprise an infrastructure including an access point or may comprise a point-to-point, ad hoc network. The sensor node may be airdropped into place, hand placed, or autonomously placed by an automaton such as a robot. In one embodiment, the purpose of the sensor network is to monitor an area for troops or machinery. In this case, the sensor node may comprise a microphone or microphone array, a visible camera, an infrared camera, a compass, a magnetometer, a seismometer, and/or a global positioning system facility. The sensor node may further comprise a data processing facility capable of classifying and/or establishing a bearing to a detected target of interest. In one example, the detected target of interest may be a tank. The tank may be idling, unseen, under foliage. The sensor node may share the classification and bearing information via the communication facility to the rest of the sensor network. Through a process, such as triangulation, the network of sensors may establish a geographic fix on the tank and track its progress through the sensor array. Other examples should be clear from this example. In any case, the photovoltaic facility may be disposed on the sensor node or may be tethered to the sensor node via a conductive wire.

Figure 100:
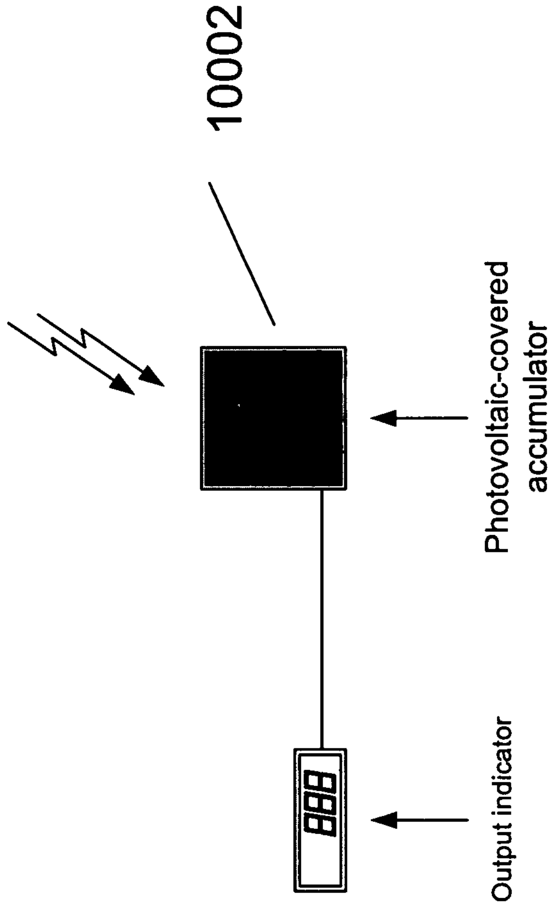
FIG. 100 shows a photovoltaic facility associated with an accumulator according to the principles of the present invention.

In embodiments, a photovoltaic facility may be associated with an accumulator 10002. The accumulator may provide a cumulative output value associated with the quantity of light received by the photovoltaic facility. One such embodiment is illustrated in FIG. 100. The photovoltaic facility may be sensitive to one select wavelength, for example and without limitation UVA or UVB. In one embodiment, the cumulative output value is provided to a display facility, which may be powered by the photovoltaic facility. The display facility may be a liquid crystal display, a light emitting diode display, an organic light emitting diode display, a flexible organic light emitting diode display, a projection display, a holographic display, or any other practicable display. In another embodiment, the cumulative output value is provided to an alarm facility that issues an alarm when the cumulative output value reaches a particular value. The alarm may be visual, aural, tactile (such as a vibration), or any other suitable alarm. In yet another embodiment, the cumulative output value is provided to an external computing facility that may store, process, and/or forward the cumulative output value. The computing facility may be an application and/or database server that is part of a three-tier Web system that presents information associated with the cumulative output value to a person via a user interface rendered by a Web browser. In all embodiments, the photovoltaic facility associated with the accumulator may provide a warning facility to the person who is being exposed to potentially hazardous levels of sunlight. The warning facility may measure the quantity of harmful rays impacting an area associated with a person and may issue an indication of the measured quantity and/or may issue an alarm when the measured quantity exceeds a limit quantity. The warning facility may be disposed on an adhesive strip, which may be affixed to the person or an item of the person's clothing. In another embodiment, the warning system may be an integral part of a hat or other item of the person's clothing that is likely to be exposed to sunlight. Other embodiments of the warning facility will be apparent from the preceding discussion.

Figure 101:
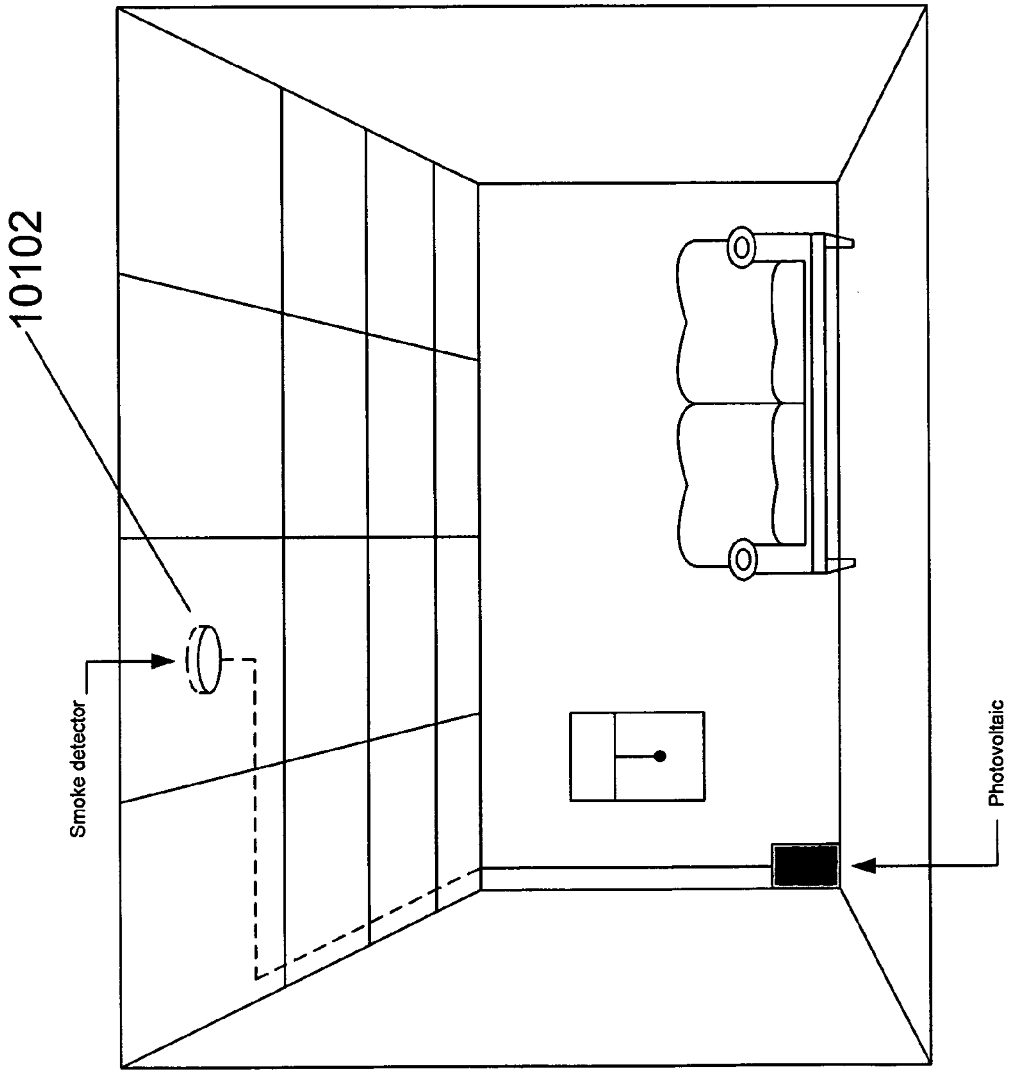
FIG. 101 illustrates a photovoltaic sensor assembly according to the principles of the present invention.

FIG. 101 illustrates a photovoltaic sensor assembly according to the principles of the present invention. In embodiments a sensor may detect one or more of smoke, fire, and heat 10102. Such a sensor may be associated with a photovoltaic facility which may directly or indirectly act as an energy source for such sensor in any of the various configurations described throughout this disclosure. The smoke, fire, and/or heat sensor may be located in a home environment, a non-home environment, an industrial environment, a factory, and/or a workplace. The smoke, fire, and/or heat sensor may be mobile and capable of functioning in a vehicle, such as an automobile, a truck, a recreational vehicle, an airplane, a helicopter, a blimp, a boat, or a hovercraft. The smoke, fire, and/or heat sensor may monitor an environment occupied by humans, such as the cabin of an aircraft or the floor of a factory. The smoke, fire, and/or heat sensor may monitor an environment not normally occupied by humans, such as a fuel tank or engine compartment. The smoke, fire, and/or heat sensor may be part of a network of smoke, fire, and/or heat sensors or other sensors. The network of sensors may enable the monitoring of large areas. The network of sensors may feed information to one or more central points on the network.

The smoke sensor may sense particles in the air or may react to obstruction of light sources as a result of smoke. The sensor may rely on algorithms to distinguish light obstructions attributable to smoke from those attributable to other sources. The fire sensor may detect light of certain wavelengths or flicker frequency known to be attributable to fire. The heat detector may respond to changes in temperature in a given area or in the rate of change of the temperature in a given area.

The smoke, fire, and/or heat sensor and associated photovoltaic facility may comprise a single unit which may be portable. The unit may be mountable on any number of surfaces through the use of adhesives, magnets, suction cups, screws, and fasteners. An individual or team may carry a single unit with them for the duration of a project or activity. For example a surface mineral exploration crew could equip their helicopter with a unit. The unit could then be transferred to the bus used to transport the crew to their campsite. The campsite could then be outfitted with the unit in order to provide monitoring while the crew sleeps.

Figure 102:
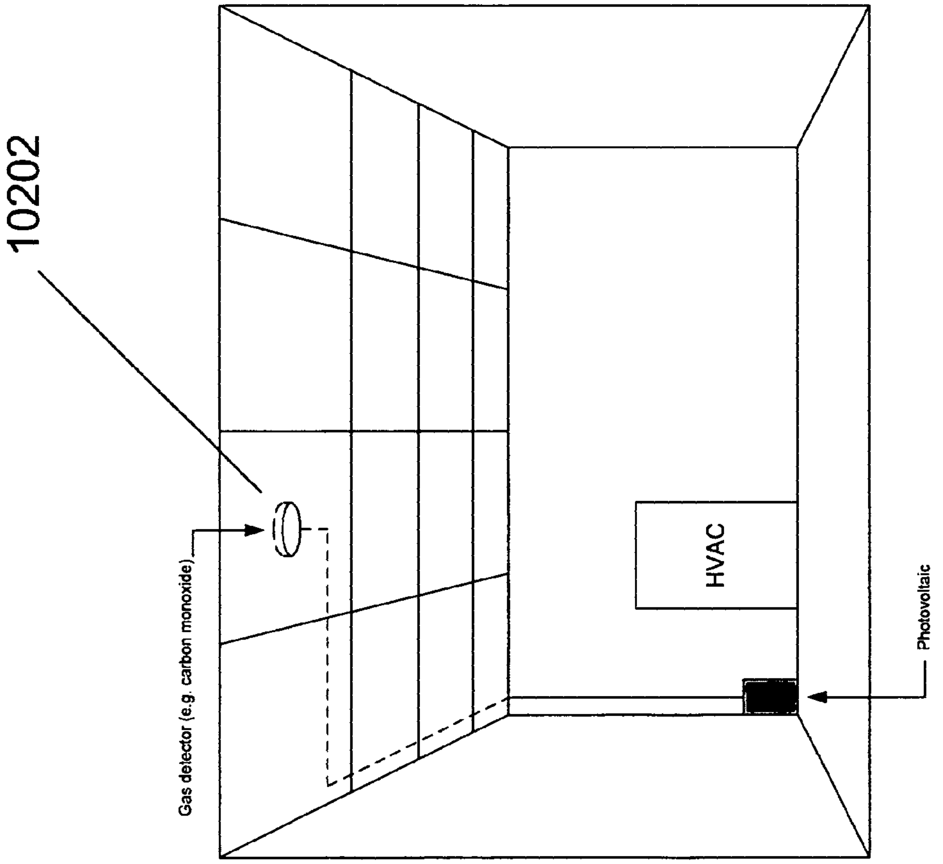
FIG. 102 illustrates a photovoltaic sensor assembly according to the principles of the present invention.

FIG. 102 illustrates a photovoltaic sensor assembly according to the principles of the present invention. In embodiments a sensor may detect the presence, absence, and/or one or more characteristics of a vapor and/or gas 10202. Such a sensor may be associated with a photovoltaic facility which may directly or indirectly act as an energy source for such a sensor in any of the various configurations described throughout this disclosure. Certain characteristics of a vapor and/or gas that a sensor may detect and/or measure may include composition, moisture level, pressure, temperature, direction, speed, dispersion, density, reactivity, inertness, acidity, concentration, and source.

In other embodiments a vapor and/or gas may be channeled over the photovoltaic facility. The vapor and/or gas may serve to concentrate light or light of a certain wavelength. A sensor powered by the photovoltaic facility may function in a feedback loop to assist with optimizing the flow and concentration of the vapor and/or gas so as to maximize the energy generated by the photovoltaic facility.

The vapor and/or gas sensor coupled with the photovoltaic facility may also be attached to a weather balloon. The sensor may measure certain characteristics of atmospheric vapors and/or gases for meteorological purposes. The sensor and photovoltaic apparatus may include a battery capable of being recharged by the photovoltaic facility so as to enable monitoring in low light conditions. The vapor and/or gas sensor coupled with the photovoltaic facility may also be used to measure vapors and/or gases at chemical spill sites, in laboratories, or in the engine room or compartment of a vehicle.

Figure 103:
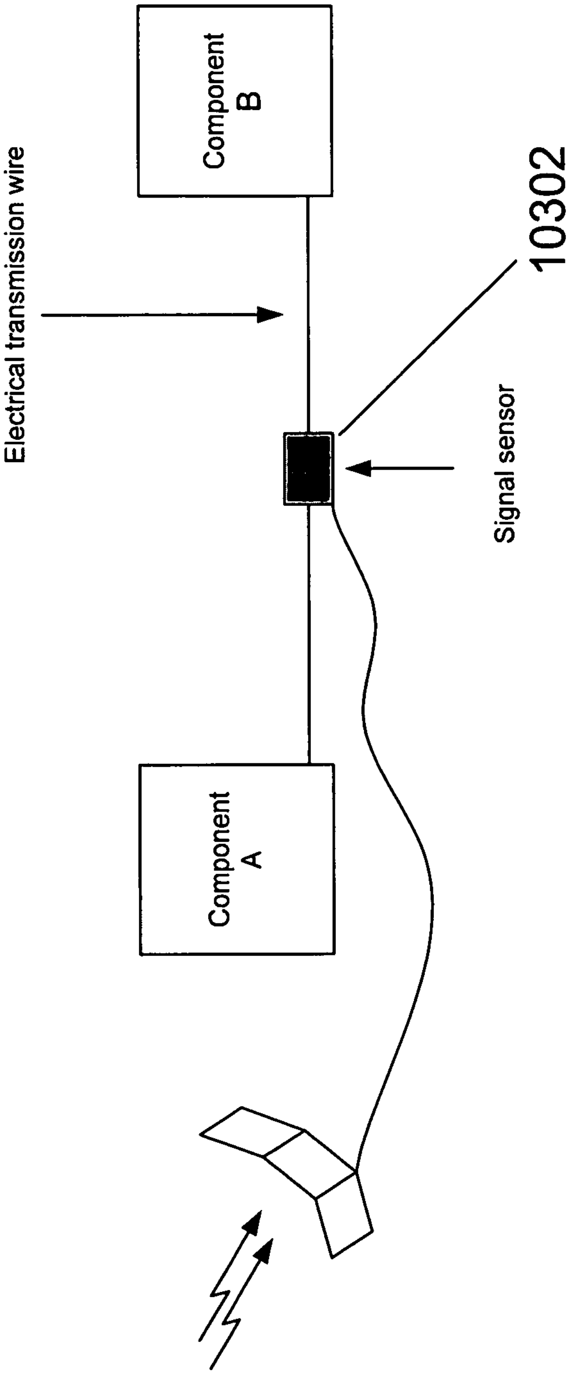
FIG. 103 illustrates a photovoltaic sensor assembly according to the principles of the present invention.

FIG. 103 illustrates a photovoltaic sensor assembly according to the principles of the present invention. In embodiments a sensor may detect the presence, absence, and/or one or more characteristics of a signal 10302. Such a sensor may be associated with a photovoltaic facility which may directly or indirectly act as an energy source for such a sensor in any of the various configurations described throughout this disclosure. The signal may be any signal from another sensor, a cable signal, a phone signal, a satellite signal, a telecommunications signal, a voice signal, an analog signal, a digital signal, an electrical signal, and a mechanical signal. The sensor may react to the signal. For example, the sensor may cause a device powered by the photovoltaic facility to turn on or off, or enter into standby mode, based on the signal it receives. This functionality may result in decreased power consumption by the device. In addition, the sensor may respond to signals from a network of sensors, reacting only when a variety of conditions are met simultaneously or in a particular sequence.

Figure 104:
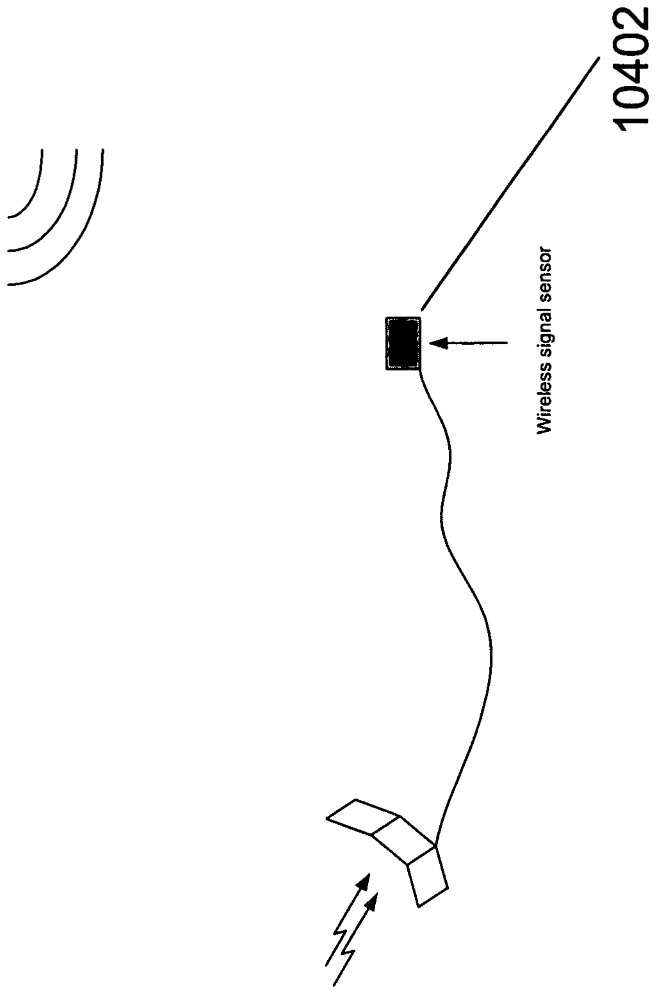
FIG. 104 illustrates a photovoltaic sensor assembly according to the principles of the present invention.

FIG. 104 illustrates a photovoltaic sensor assembly according to the principles of the present invention. In embodiments a signal sensor may detect the presence, absence, and/or one or more characteristics of a wireless signal 10402. A signal sensor may be used to detect signals for wireless protocols such as IEEE 802.11, jNetX, Bluetooth, Blackberry, TracerPlus, or other wireless communication protocol. Devices using a signal sensor may be wireless network routers, PDAs, Pocket PCs, cell phones, two-way communication devices, cell phone earbuds, or other devices that communicate wirelessly. The signal may be from any signal source capable of broadcasting a signal. The signal sensor may react to a detected signal to enable/disable the device or enter a device sleep mode.

In embodiments, photovoltaic cells may be disposed as a skin, film, or flexible material that may be applied to the structure of a device, for example a wireless network router, a PDA, a Pocket PC, a cell phone, a two-way communication device, or a cell phone earbud. In embodiments, these devices may use an attachment (e.g. key chain); this attachment may have a photovoltaic skin, film, or flexible material applied to it, and the photovoltaic may provide power to the device. Alternatively, a photovoltaic may charge a re-charger for the device, where the re-charger has an interface to receive power from the photovoltaic facility and a charging interface for the device. The device may include an energy storage capacity, such as a rechargeable battery.

Figure 105:
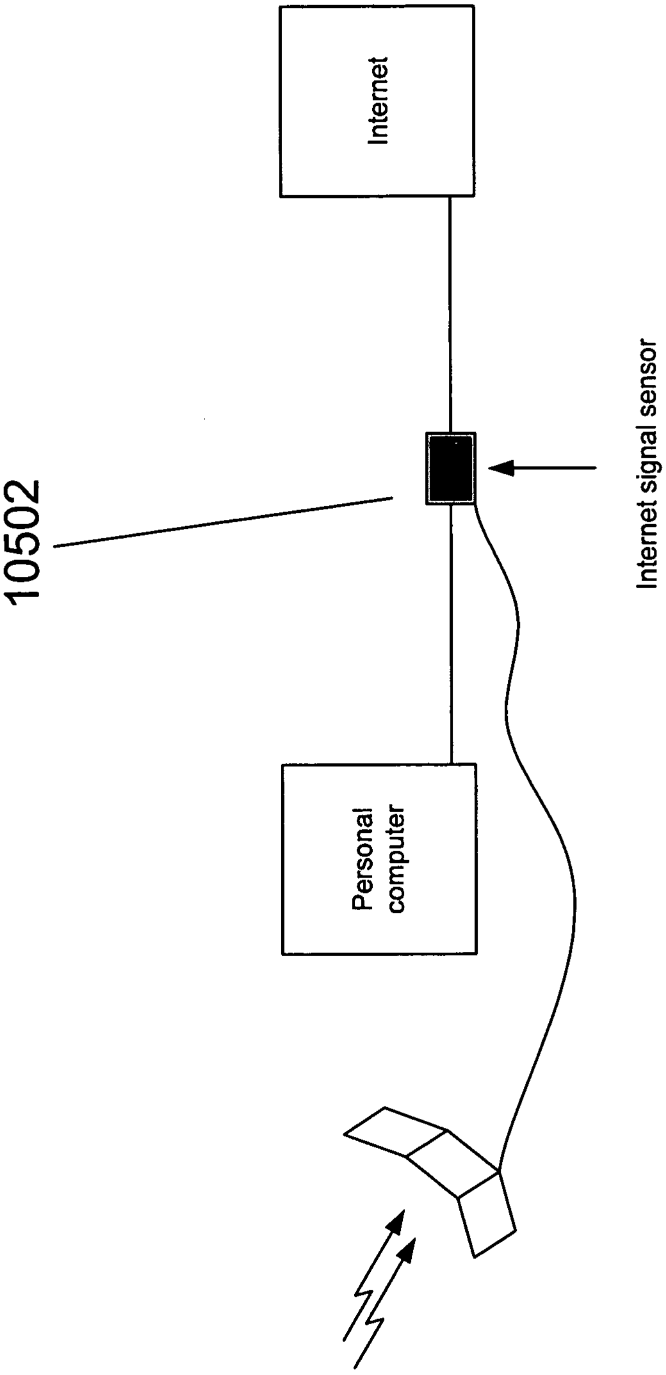
FIG. 105 illustrates a photovoltaic sensor assembly according to the principles of the present invention.

FIG. 105 illustrates a photovoltaic sensor assembly according to the principles of the present invention. In embodiments, an internet signal sensor 10502 may detect a signal for wired or wireless communication methods. The sensor may be used to detect bandwidth, encryption type, security information, network accessed, or other information provided by the connecting internet protocol. Devices that may use an internet signal sensor may be a network router, computer network interface card (NIC), network switches, network hubs, cell phones, PDAs, Pocket PCs, or other devices capable of communication with the internet. The internet signal sensor may react to a detected signal by enabling or disabling various interfaces. For example, a low speed connection may be detected and the appropriate network protocol activated for communication. Another example is that, if the connection is of poor quality, the internet sensor may slow down the communication rate to provide for acceptable communication.

In embodiments, photovoltaic cells may be disposed as a skin, film, or flexible material that may be applied to the structure of a device, for example a network router, a computer network interface card (NIC), a network switch, a network hub, a cell phone, a PDA, and a Pocket PC. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, these devices may have photovoltaic cells disposed on deployable units that may provide the required amount of power for the electronic sensor. The deployable units may unfold, fan out, be stacked in an offset pattern, be positioned on a flat surface, or may be angled to take advantage of a light source. The deployable photovoltaic facilities may be able to adjust the surface of units exposed to a light source manually or automatically. The photovoltaic facilities may be capable of automatically tracking a light source to maintain the required power to the electronic sensor.

Figure 106:
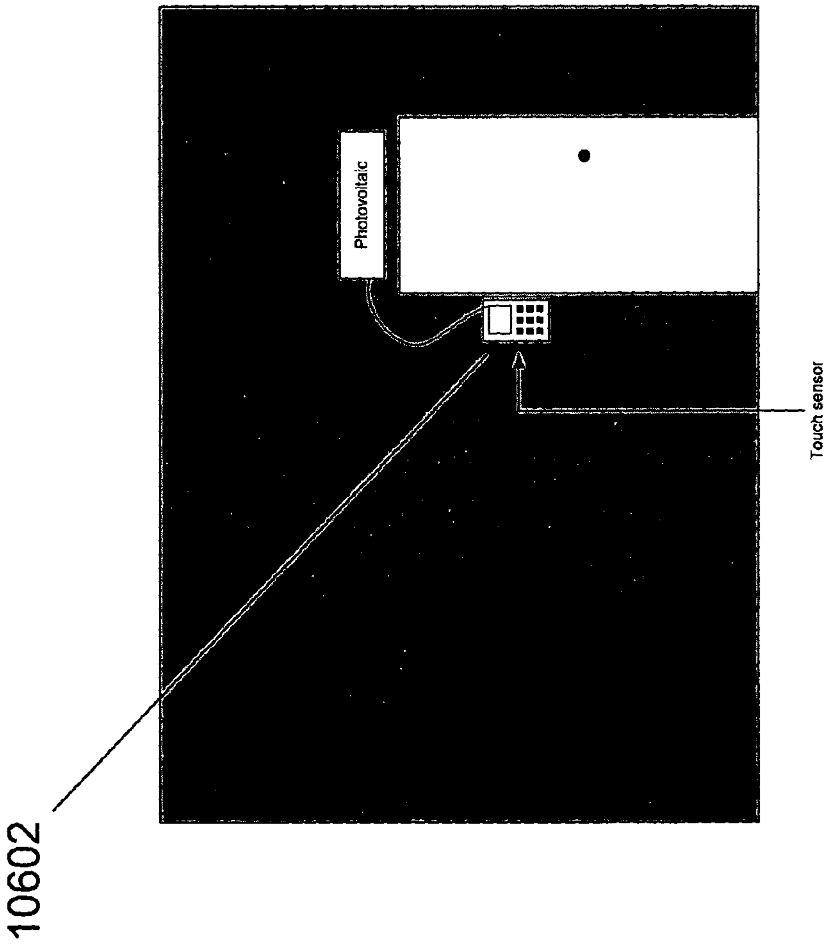
FIG. 106 illustrates a photovoltaic sensor assembly according to the principles of the present invention.

FIG. 106 illustrates a photovoltaic sensor assembly according to the principles of the present invention. In embodiments, sensors may provide feedback if detecting a touch or contact with another object. In embodiments, touch/contact sensors 10602 may detect if the contact has made or removed from another object and may open or close an electrical circuit.

In embodiments, touch sensors may be used in devices such as industrial panels, appliance controls, light switches, elevator buttons, robotics, or other devices for detecting a touch. For example, an appliance may have time set by pressing a set of touch buttons on a panel.

In embodiments, contact sensors may be used in devices such as control panels, security systems, or other devices that detect whether objects are in contact. For example, a network administrator may want the information if a control panel door has been opened. As another example, security systems may have sensors to detect when a window or door has been opened.

In embodiments, photovoltaic cells may be disposed as a skin, film, or flexible material that may be applied to the structure of a device, for example industrial panels, appliance controls, light switches, elevator buttons, or robotics. In embodiments, industrial or appliance controls may have the photovoltaic on the face of the touch panel itself. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, the devices listed above may have photovoltaic cells disposed on deployable units that may provide the required amount of power for the electronic sensor. The deployable units may unfold, fan out, be stacked in an offset pattern, be positioned on a flat surface, or may be angled to take advantage of a light source. The deployable photovoltaic facilities may be able to adjust the surface of units exposed to a light source manually or automatically. The photovoltaic facilities may be capable of automatically tracking a light source to maintain the required power to the electronic sensor.

Figure 107:
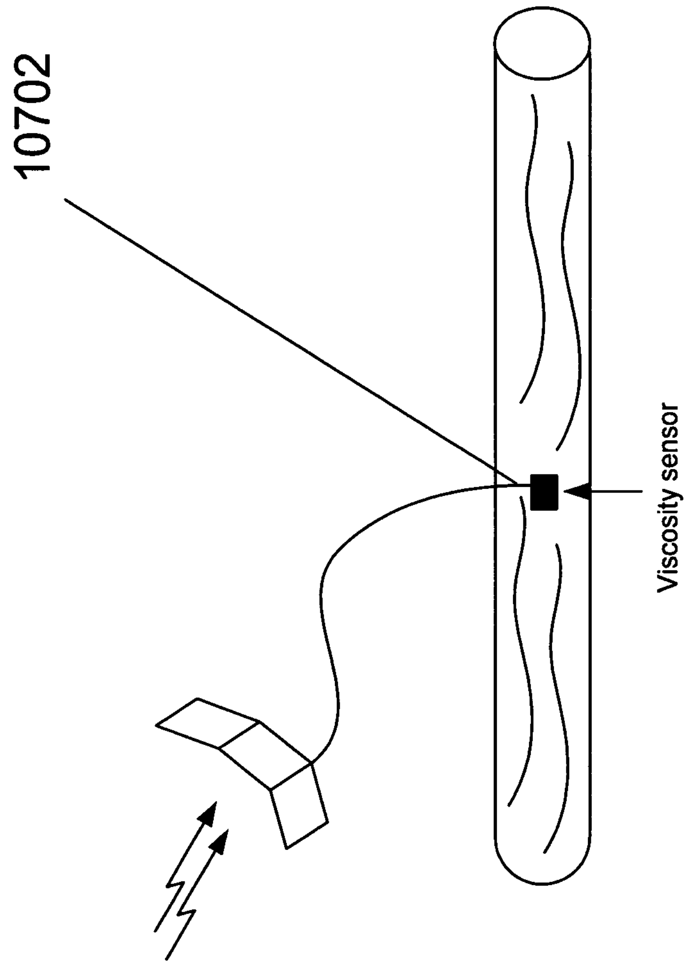
FIG. 107 illustrates a photovoltaic sensor assembly according to the principles of the present invention.

FIG. 107 illustrates a photovoltaic sensor assembly according to the principles of the present invention. In embodiments, viscosity sensors 10702 may provide feedback of the properties of a fluid. Viscosity is the measurement of the ability of a fluid to flow and then provide a constant resistance. In embodiments, viscosity applies to all fluids such as oil, gas, water, body fluids, fluid mixtures, or other fluids. In embodiments, viscosity sensors may be used in devices such as medical devices for processing/testing blood, oil pipelines, oil/gas refineries, photographic fluid controls, manufacturing fluid controls, or other devices that measure and control fluid flow. In embodiments, the viscosity sensor may indicate that a fluid viscosity is out of an acceptable range and signal a control or display for action to be taken.

In embodiments, photovoltaic cells may be disposed as a skin, film, or flexible material that may be applied to the structure of these devices. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, the devices listed above may have photovoltaic cells disposed on deployable units that may provide the required amount of power for the sensor. The deployable units may unfold, fan out, be stacked in an offset pattern, be positioned on a flat surface, or may be angled to take advantage of a light source. The deployable photovoltaic facilities may be able to adjust the surface of units exposed to a light source manually or automatically. The photovoltaic facilities may be capable of automatically tracking a light source to maintain the required power to the sensor.

Figure 108:
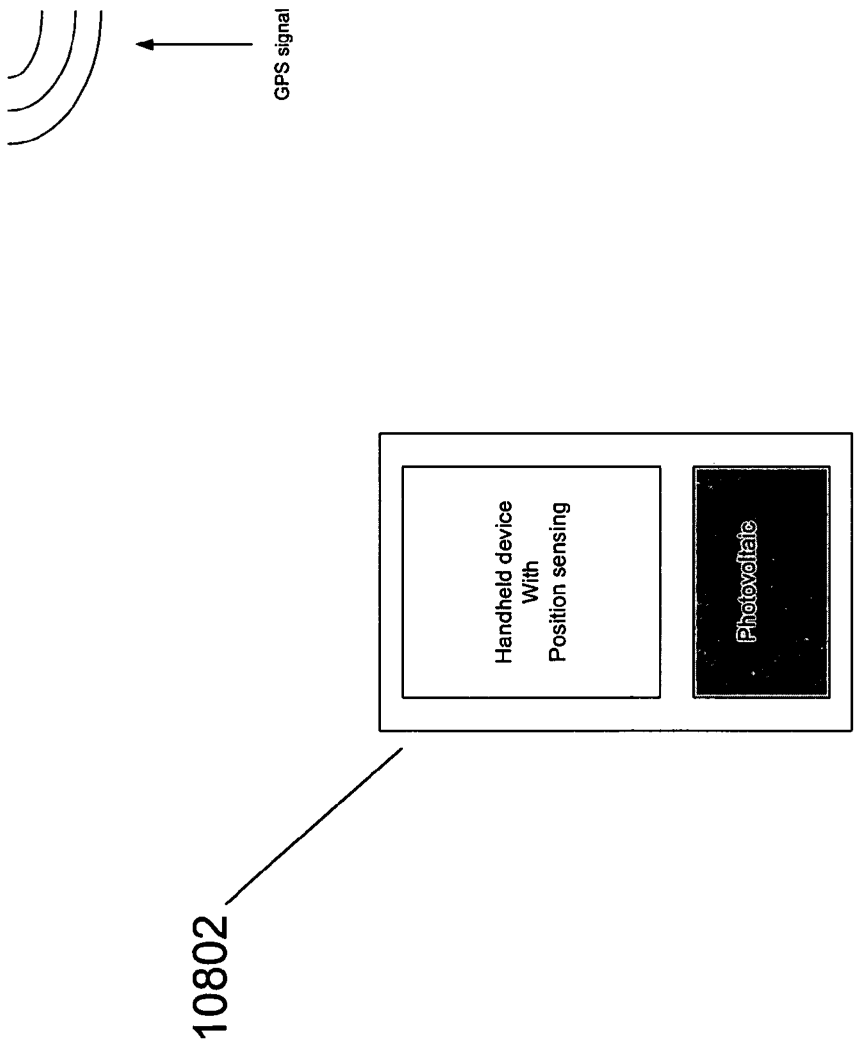
FIG. 108 illustrates a photovoltaic sensor assembly according to the principles of the present invention.

FIG. 108 illustrates a photovoltaic sensor assembly according to the principles of the present invention. In embodiments, a position sensor 10802 may determine the position of an object by the strength of a magnetic field or by communication with a GPS broadcasting device. In embodiments position sensors may provide compass heading, longitude/latitude, position on a map, or other positioning display. In embodiments, position sensors may be used in automobiles, GPS devices, PDA devices, Pocket PCs, boats, aircraft, rockets, or other devices for positioning an object. For example, an automobile may have a GPS device to display the position of the automobile in relation to a map.

In embodiments, photovoltaic cells may be disposed as a skin, film, or flexible material that may be applied to the structure of these devices. In embodiments, an automobile may have the photovoltaic applied to an interior (e.g. dashboard) or exterior (hood, roof, trunk). In embodiments, aircraft, boats and rockets may have the photovoltaic applied to the skin of the vehicle. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, the devices listed above may have photovoltaic cells disposed on deployable units that may provide the required amount of power for the sensor. The deployable units may unfold, fan out, be stacked in an offset pattern, be positioned on a flat surface, or may be angled to take advantage of a light source. The deployable photovoltaic facilities may be able to adjust the surface of units exposed to a light source manually or automatically. The photovoltaic facilities may be capable of automatically tracking a light source to maintain the required power to the sensor.

Figure 109:
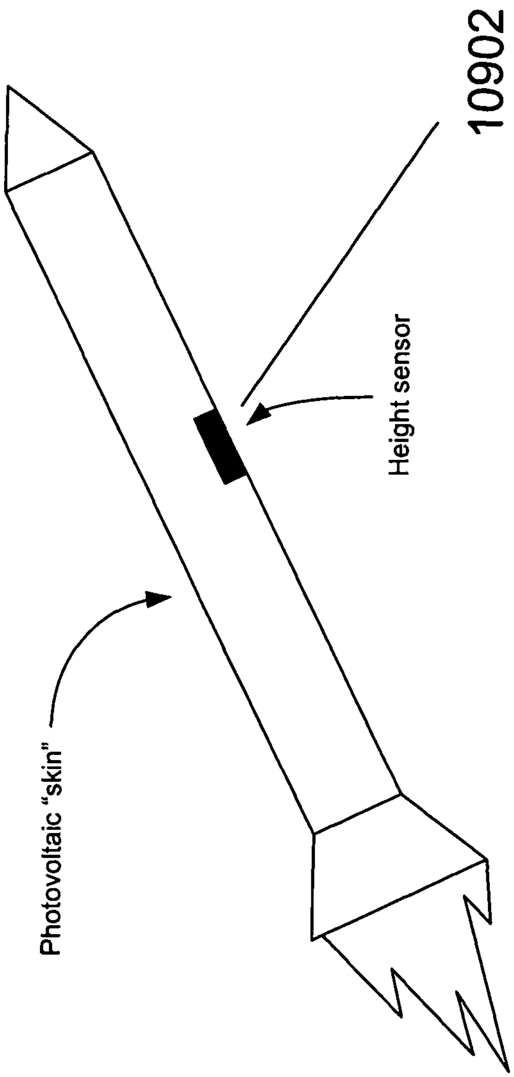
FIG. 109 illustrates a photovoltaic sensor assembly according to the principles of the present invention.

FIG. 109 illustrates a photovoltaic sensor assembly according to the principles of the present invention. In embodiments, height sensors 10902 may measure the vertical motion of an object in relation to a set position. In embodiments, height sensors may be used to measure machinery motions (e.g. grinding, drilling, milling, turning), wave height measurements, atmospheric height measurements, or other objects requiring height measurements. In embodiments, devices that may use height sensors are machinery scales, wave buoys, aircraft, or other height devices. In embodiments, height sensors may provide digital/analog feedback to a controller, computer, network of computers, or other device for display/calculations.

In embodiments, photovoltaic cells may be disposed as a skin, film, or flexible material that may be applied to the structure of these devices. In embodiments, aircraft may have the photovoltaic applied to the skin of the vehicle. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, the devices listed above may have photovoltaic cells disposed on deployable units that may provide the required amount of power for the sensor. The deployable units may unfold, fan out, be stacked in an offset pattern, be positioned on a flat surface, or may be angled to take advantage of a light source. The deployable photovoltaic facilities may be able to adjust the surface of units exposed to a light source manually or automatically. The photovoltaic facilities may be capable of automatically tracking a light source to maintain the required power to the sensor.

Figure 110:
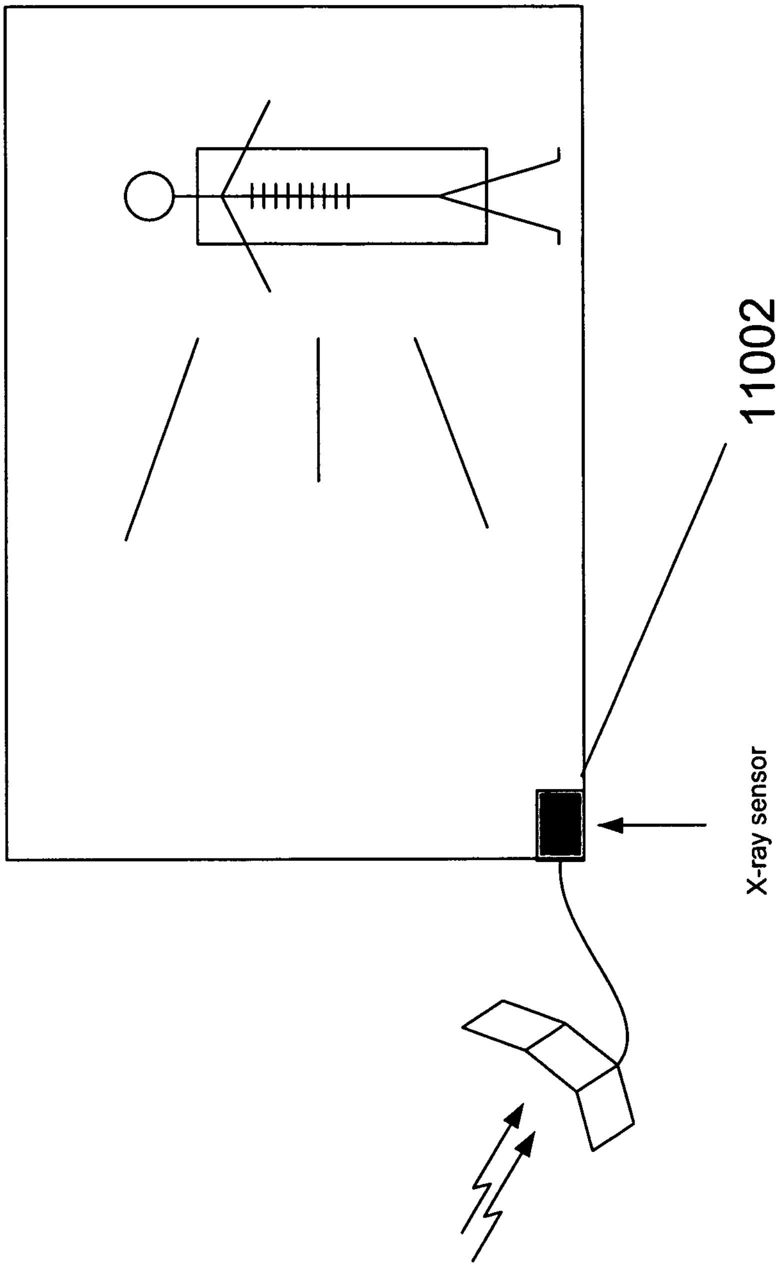
FIG. 110 illustrates a photovoltaic sensor assembly according to the principles of the present invention.

FIG. 110 illustrates a photovoltaic sensor assembly according to the principles of the present invention. In embodiments, ray sensors 11002 (e.g. gamma or X-ray) may detect energy such as photons that may travel in a space. In embodiments, gamma rays or X-rays may originate from man made or natural sources. In embodiments, gamma rays/X-rays may be used in devices such as medical X-ray, mammography, radiology, X-ray fluorescence, archeology dating, nuclear plant monitoring, uranium/plutonium detection, or other similar devices. In embodiments, gamma ray/X-ray sensors may provide the level of gamma or X rays received from a source and provide this information to a controller, computer, or computer network.

In embodiments, photovoltaic cells may be disposed as a skin, film, or flexible material that may be applied to the structure of these devices. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, the devices listed above may have photovoltaic cells disposed on deployable units that may provide the required amount of power for the sensor. The deployable units may unfold, fan out, be stacked in an offset pattern, be positioned on a flat surface, or may be angled to take advantage of a light source. The deployable photovoltaic facilities may be able to adjust the surface of units exposed to a light source manually or automatically. The photovoltaic facilities may be capable of automatically tracking a light source to maintain the required power to the sensor.

Figure 111:
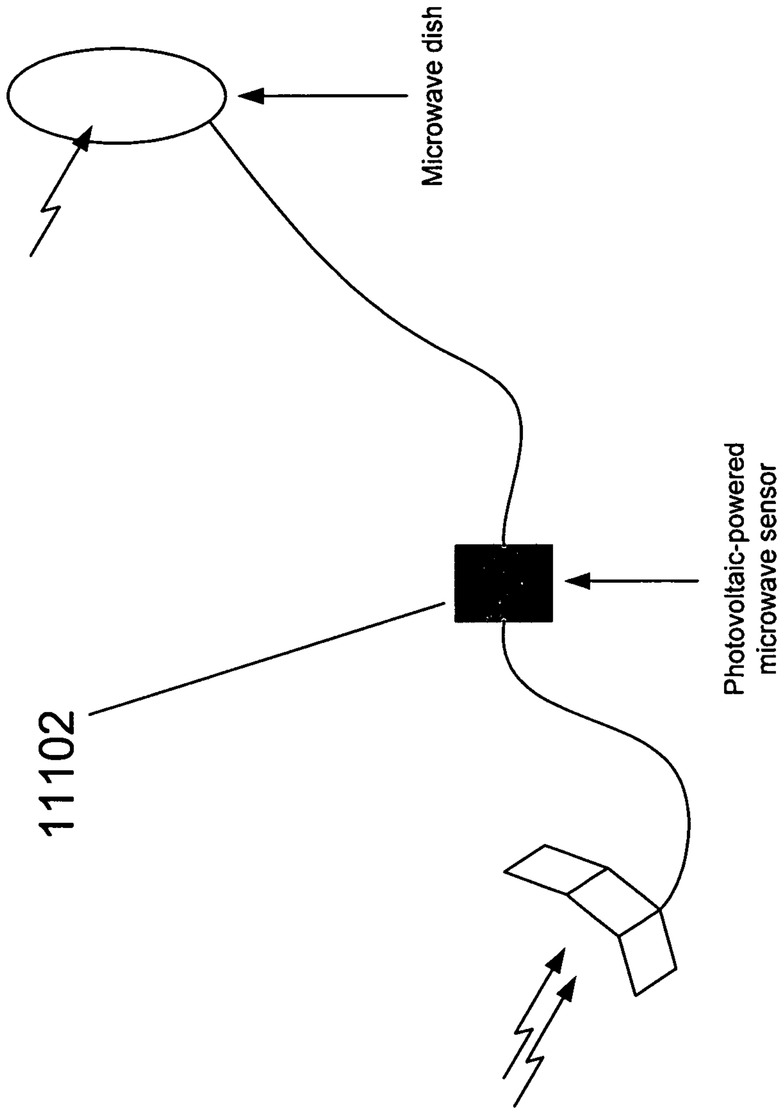
FIG. 111 illustrates a photovoltaic sensor assembly according to the principles of the present invention.

FIG. 111 illustrates a photovoltaic sensor assembly according to the principles of the present invention. In embodiments, microwave sensors 11102 may detect microwaves from another source or a reflected microwave from an object. In embodiments, microwaves may be broadcast, and reflected microwaves may be analyzed for the presence of objects in the broadcast area. In embodiments, a microwave sensor may be able to detect if a microwave has been transmitted to the sensor or in the area of the sensor. In embodiments, devices that may use microwaves may be crosswalk pedestrian detectors, automatic doors, radar detectors, microwave transmitter detectors, or other devices to detect microwaves. In embodiments, a microwave sensor may provide a feedback to a controller or computer that activates another device.

In embodiments, photovoltaic cells may be disposed as a skin, film, or flexible material that may be applied to the structure of these devices. Alternatively, a photovoltaic may charge a re-charger for the device, where the re-charger has an interface to receive power from the photovoltaic facility and a charging interface for the device. The device may include an energy storage capacity, such as a rechargeable battery. In embodiments, the devices listed above may have photovoltaic cells disposed on deployable units that may provide the required amount of power for the sensor. The deployable units may unfold, fan out, be stacked in an offset pattern, be positioned on a flat surface, or may be angled to take advantage of a light source. The deployable photovoltaic facilities may be able to adjust the surface of units exposed to a light source manually or automatically. The photovoltaic facilities may be capable of automatically tracking a light source to maintain the required power to the sensor.

In embodiments, other sensors may be adapted to be associated with photovoltaic such as an ultraviolet sensor, an infrared sensor, a proximity sensor, a distance sensor, a range sensor, a motion sensor, a mote, a marker, a powered marker, a signal emitter, a powered signal emitter, a signal receiver, a powered signal receiver, a chemical sensor, a hazardous material sensor, a hazardous vapor sensor, a biohazard sensor, a bacteria sensor, a virus sensor, an anthrax detector, a nerve gas sensor, a poisonous gas sensor, a carbon monoxide detector, a light sensor, an energy sensor, or other sensor.

Figure 112:
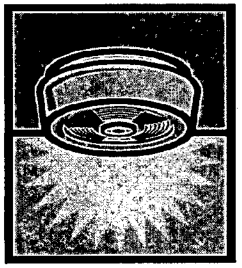
FIG. 112 illustrates a photovoltaic sensor facility in a home environment according to the principles of the present invention.
Figure 112:
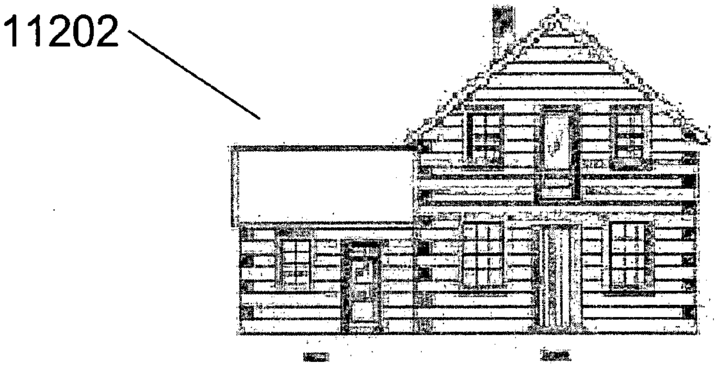
Figure 113:
FIG. 113 illustrates a photovoltaic sensor facility in a government environment according to the principles of the present invention.
Figure 113:
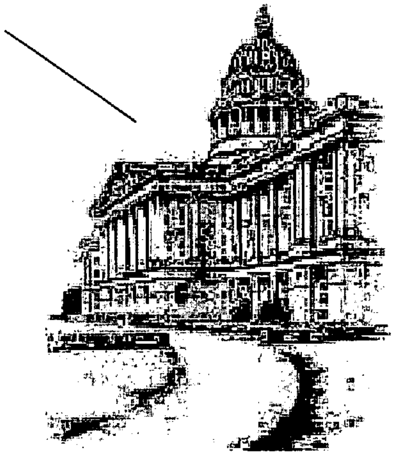
Figure 114:
FIG. 114 illustrates a photovoltaic sensor facility in a office environment according to the principles of the present invention.
Figure 114:
Figure 115:
FIG. 115 illustrates a photovoltaic sensor facility in a hospital environment according to the principles of the present invention.
Figure 115:
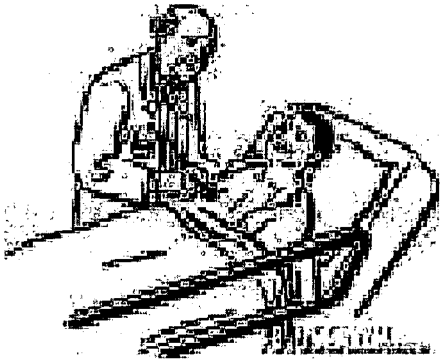
Figure 116:
FIG. 116 illustrates a photovoltaic sensor facility in a industrial environment according to the principles of the present invention.
Figure 116:
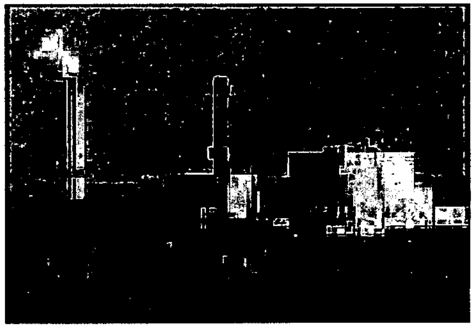
Figure 117:
FIG. 117 illustrates a photovoltaic sensor facility in a storage environment according to the principles of the present invention.
Figure 117:
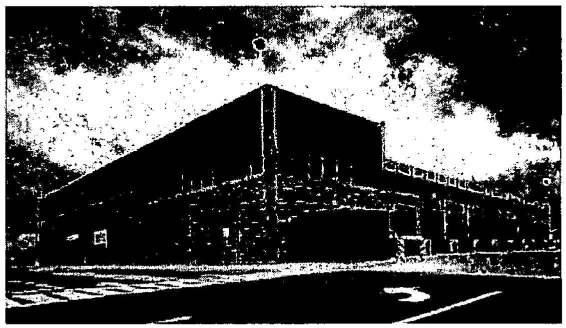
Figure 118:
Figure 118:
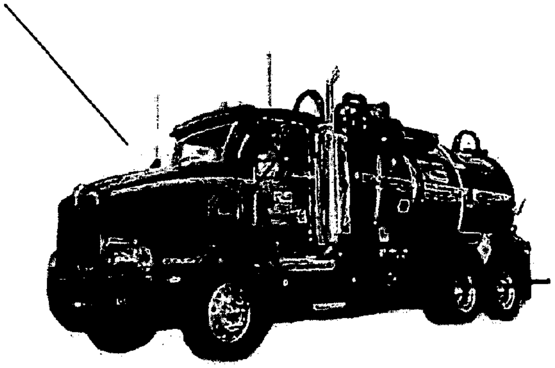
Figure 119:
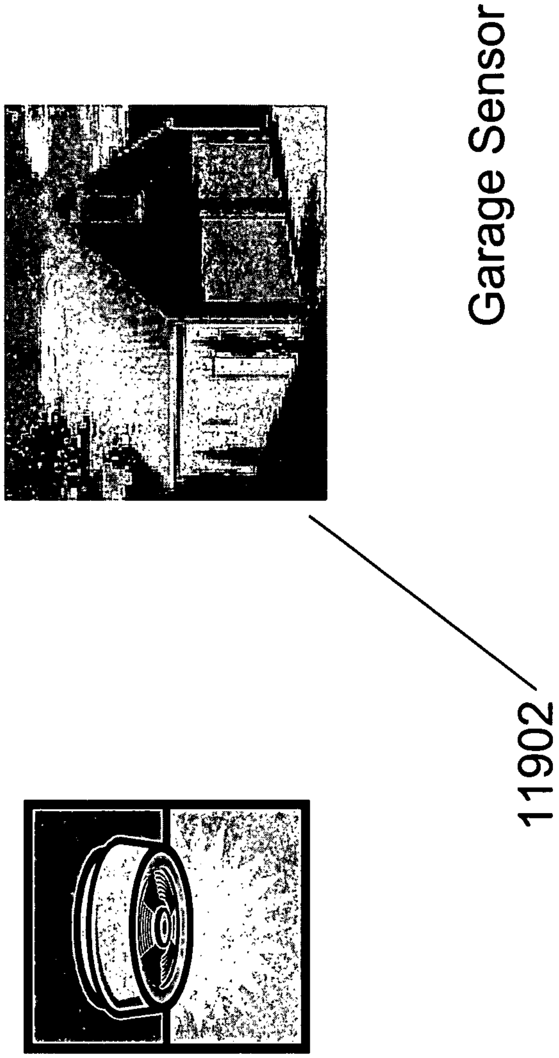
Figure 120:

Embodiments of the present invention relate to environments where photovoltaic sensor facilities according to the principles of the present invention may be deployed. For example, FIG. 112 illustrates such systems in a home environment 11202. In embodiments, the photovoltaic sensor may be used to provide detection of various events (e.g. those conditions illustrated herein, such as gas, smoke, entry, exit, waste, spills, structural events, timing, or other sensed conditions). FIG. 113 illustrates such systems in a government facility setting 11302. In embodiments, the photovoltaic sensor facility may be used in a government facility to sense conditions as described herein. FIG. 114 illustrates such systems in an office facility setting 11402. In embodiments, the photovoltaic sensor facility may be used in an office facility to sense conditions as described herein. FIG. 115 illustrates such systems in a hospital setting 11502. In embodiments, the photovoltaic sensor facility may be used in a hospital facility to sense conditions as described herein. FIG. 116 illustrates such systems in an industrial setting. In embodiments, the photovoltaic sensor facility may be used in an industrial setting 11602 to sense conditions as described herein. FIG. 117 illustrates such systems in a storage facility setting 11702. In embodiments, the photovoltaic sensor facility may be used in a storage facility to sense conditions as described herein. FIG. 118 illustrates such systems in a hazard reclamation setting 11802. In embodiments, the photovoltaic sensor facility may be used in a hazard reclamation setting to sense conditions as described herein. FIG. 119 illustrates such systems in a garage setting 11902. In embodiments, the photovoltaic sensor facility may be used in a garage setting to sense conditions as described herein. FIG. 120 illustrates such systems in a station setting 12002. In embodiments, the photovoltaic sensor facility may be used in a station setting to sense conditions as described herein.

In embodiments, the photovoltaic systems described herein may be combined and offered as a kit. The kit may be offered for sale in a channel appropriate for the applications and environments (e.g. a home photovoltaic sensor facility offered for sale through commercial and consumer market channels).

While the invention has been described in connection with certain preferred embodiments, it should be understood that other embodiments would be recognized by one of ordinary skill in the art, and are incorporated by reference herein.

The entire contents of the following U.S. Patent Applications are hereby incorporated by reference: U.S. Ser. No. 10/258,708; U.S. Ser. No. 10/258,709; U.S. Ser. No. 10/258,713; U.S. Ser. No. 10/351,607; U.S. Ser. No. 10/057,394; U.S. Ser. No. 60/351,691; U.S. Ser. No. 60/353,138; U.S. Ser. No. 60/368,832; U.S. Ser. No. 60/400,289; U.S. Ser. No. 10/350,913; U.S. Ser. No. 10/350,912; U.S. Ser. No. 10/350,812; U.S. Ser. No. 60/390,071; U.S. Ser. No. 60/396,173; U.S. Ser. No. 10/350,800; U.S. Ser. No. 10/351,298; U.S. Ser. No. 60/427,642; U.S. Ser. No. 10/351,260; U.S. Ser. No. 10/351,249; U.S. Ser. No. 10/350,919; U.S. Ser. No. 10/351,264; U.S. Ser. No. 10/351,265; U.S. Ser. No. 10/351,251; U.S. Ser. No. 10/351,250; U.S. Ser. No. 10/486,116; U.S. Ser. No. 10/494,560; U.S. Ser. No. 10/498,484; U.S. Ser. No. 10/504,091; U.S. Ser. No. 10/509,935; U.S. Ser. No. 10/515,159; U.S. Ser. No. 10/723,554; U.S. Ser. No. 10/395,823; U.S. Ser. No. 10/897,268; U.S. Ser. No. 60/495,302; U.S. Ser. No. 11/000,276; U.S. Ser. No. 60/526,373; U.S. Ser. No. 11/033,217; U.S. Ser. No. 60/546,818; U.S. Ser. No. 10/522,862; U.S. Ser. No. 60/575,971; U.S. Ser. No. 60/576,033; U.S. Ser. No. 60/589,423; U.S. Ser. No. 60/590,312; U.S. Ser. No. 60/590,313; U.S. Ser. No. 60/637,844; U.S. Ser. No. 60/638,070; U.S. Ser. No. 60/664,298; U.S. Ser. No. 60/663,985; U.S. Ser. No. 60/664,114; and U.S. Ser. No. 60/664,336.

What is claimed is:

1. A method comprising:

providing a sensor in association with a photovoltaic facility to form a sensor-pv facility, the photovoltaic facility comprising first, second, and third photovoltaic cells, the second photovoltaic cell having a first corner and a second corner opposite the first corner; and providing the sensor-pv facility in a kit to be deployed in a home environment, wherein the first and second photovoltaic cells are joined at the first corner by a first connection that can rotate so that the first and second photovoltaic cells can rotate over each other;

the second and third photovoltaic cells are joined at the second corner by a second connection that can rotate so that the second and third photovoltaic cells can rotate over each other; and the first connection comprises an electrical connection between the first and second photovoltaic cells or the second connection comprises an electrical connection between the second and third photovoltaic cells;

the photovoltaic cells are rectangular and the second corner is diagonally opposite the first corner.

2. A system comprising:

a sensor in association with a photovoltaic facility to form a sensor-pv facility, the photovoltaic facility comprising first, second, and third photovoltaic cells, the second photovoltaic cell having a first corner and a second corner opposite different from the first corner; and a kit including the sensor-pv facility to be deployed in a home environment, wherein the first and second photovoltaic cells are joined at the first corner by a first connection that can rotate so that the first and second photovoltaic cells can rotate over each other;

the second and third photovoltaic cells are joined at the second corner by a second connection that can rotate so that the second and third photovoltaic cells can rotate over each other; and the first connection comprises an electrical connection between the first and second photovoltaic cells or the second connection comprises an electrical connection between the second and third photovoltaic cells;

the photovoltaic cells are rectangular and the second corner is diagonally opposite the first corner.

* * * * *